(12) United States Patent
Jang et al.

(10) Patent No.: US 12,184,040 B2
(45) Date of Patent: Dec. 31, 2024

(54) LASER EMITTING UNIT AND LiDAR DEVICE USING THE SAME

(71) Applicant: SOS LAB Co., Ltd., Gwangju (KR)

(72) Inventors: Jun Hwan Jang, Seongnam-si (KR); Hee Sun Yoon, Incheon (KR); Chan M Lim, Yongin-si (KR); Hoon Il Jeong, Chungcheongnam-do (KR); Chang Mo Jeong, Seoul (KR); Jai Hi Cho, Seoul (KR)

(73) Assignee: SOS Lab Co., Ltd., Gwangju (KR)

( * ) Notice: Subject to any disclaimer, the term of this patent is extended or adjusted under 35 U.S.C. 154(b) by 796 days.

(21) Appl. No.: 17/334,066

(22) Filed: May 28, 2021

(65) Prior Publication Data

US 2021/0288472 A1    Sep. 16, 2021

Related U.S. Application Data

(63) Continuation of application No. 17/005,806, filed on Aug. 28, 2020, now Pat. No. 11,063,408.
(Continued)

(30) Foreign Application Priority Data

Dec. 18, 2019   (KR) .................. 10-2019-0169501
Dec. 20, 2019   (KR) .................. 10-2019-0171660
(Continued)

(51) Int. Cl.
*H01S 5/024*        (2006.01)
*G01S 7/481*        (2006.01)
(Continued)

(52) U.S. Cl.
CPC ............ *H01S 5/423* (2013.01); *G01S 7/4815* (2013.01); *G01S 17/08* (2013.01); *G01S 17/931* (2020.01);
(Continued)

(58) Field of Classification Search
CPC ........ H01S 5/423; H01S 5/0233; H01S 5/026; H01S 5/04256; G01S 7/4815
See application file for complete search history.

(56) References Cited

U.S. PATENT DOCUMENTS 10,761,195 B2    9/2020   Donovan
11,063,408 B2    7/2021   Jang et al.
(Continued)

FOREIGN PATENT DOCUMENTS

EP    2610978 A2    7/2013
EP    3588702 A1    1/2020
(Continued)

OTHER PUBLICATIONS

International Search Report and Written Opinion, re PCT Application No. PCT/KR2020/009982, dated Jan. 6, 2021, 8 pages.
(Continued)

*Primary Examiner* — Yuanda Zhang
(74) *Attorney, Agent, or Firm* — Knobbe, Martens, Olson & Bear, LLP

(57) ABSTRACT

A vertical cavity surface emitting laser (VCSEL) array, comprising: a first sub-array includes a plurality of VCSEL units arranged along a first axis, and wherein the first sub-array includes: first VCSEL unit includes a first upper contact and a first bottom contact; and a second VCSEL unit includes a second upper contact and a second bottom contact; a first contact electrically connected to the first upper contact and the second bottom contact; and a second contact electrically connected to the second upper contact and the first bottom contact, wherein the first VCSEL unit is operated when a first voltage is applied to the first contact and a second voltage smaller than the first voltage is applied to the second contact, and wherein the second VCSEL unit
(Continued)

is operated when the second voltage is applied to the first contact and the first voltage is applied to the second contact.

17 Claims, 144 Drawing Sheets

Related U.S. Application Data

(60) Provisional application No. 62/893,080, filed on Aug. 28, 2019.

(30) Foreign Application Priority Data

| Feb. 7, 2020 | (KR) | .................. | 10-2020-0015002 |
| Feb. 28, 2020 | (KR) | .................. | 10-2020-0025574 |
| Apr. 9, 2020 | (KR) | .................. | 10-2020-0043639 |

(51) Int. Cl.
| *G01S 17/08* | (2006.01) |
| *G01S 17/931* | (2020.01) |
| *H01S 5/026* | (2006.01) |
| *H01S 5/042* | (2006.01) |
| *H01S 5/10* | (2021.01) |
| *H01S 5/183* | (2006.01) |
| *H01S 5/42* | (2006.01) |

(52) U.S. Cl.
CPC .......... *H01S 5/0264* (2013.01); *H01S 5/0421* (2013.01); *H01S 5/04256* (2019.08); *H01S 5/1071* (2013.01); *H01S 5/18311* (2013.01); *H01S 5/18361* (2013.01)

(56) References Cited

U.S. PATENT DOCUMENTS

| 2007/0195415 A1 | 8/2007 | Cho et al. |
| 2012/0287677 A1 | 11/2012 | Wheatley et al. |
| 2015/0362585 A1 | 12/2015 | Ghosh et al. |
| 2016/0072258 A1 | 3/2016 | Seurin et al. |
| 2016/0245911 A1 | 8/2016 | Wang et al. |
| 2017/0365984 A1 | 12/2017 | Lipson |
| 2019/0011562 A1 | 1/2019 | Pacala et al. |
| 2019/0199063 A1 | 6/2019 | Barve et al. |
| 2019/0310375 A1* | 10/2019 | Finkelstein ........... G01S 7/4868 |
| 2019/0363520 A1 | 11/2019 | Laflaquiere et al. |
| 2020/0326425 A1 | 10/2020 | Donovan et al. |

FOREIGN PATENT DOCUMENTS

| JP | H07-183579 A | 7/1995 |
| JP | 2002-316327 A | 10/2002 |
| KR | 10-2007-0110810 A | 11/2007 |
| KR | 10-2017-0062093 A | 6/2017 |
| KR | 10-2017-0114242 A | 10/2017 |
| KR | 10-2017-0126872 A | 11/2017 |
| KR | 10-2017-0138648 A | 12/2017 |
| KR | 10-2018-0128447 A | 12/2018 |
| KR | 10-2019-0035899 A | 4/2019 |
| KR | 10-2019-0049871 A | 5/2019 |
| KR | 10-2019-0054484 A | 5/2019 |
| WO | WO 2019/022941 A1 | 1/2019 |
| WO | WO 2019/099490 A1 | 5/2019 |
| WO | WO 2019/115149 A1 | 6/2019 |

OTHER PUBLICATIONS

Search Report dated Aug. 21, 2023 in European Application No. 20856997.0.

International Search Report and Written Opinion, with English Translation, re PCT Application No. PCT/KR2020/015923, dated Apr. 26, 2021.

International Search Report and Written Opinion, with English Translation, re PCT Application No. PCT/KR2020/015926, dated Apr. 29, 2021.

Korean Office Action, with English Translation, KR Application No. 10-2020-0061856, dated Jan. 15, 2024.

Korean Office Action, with English Translation, KR Application No. 10-2020-0151369, dated Nov. 24, 2023.

\* cited by examiner

130

150

FIG. 31
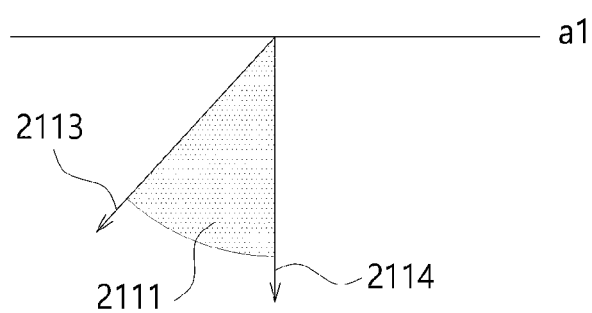
(a)
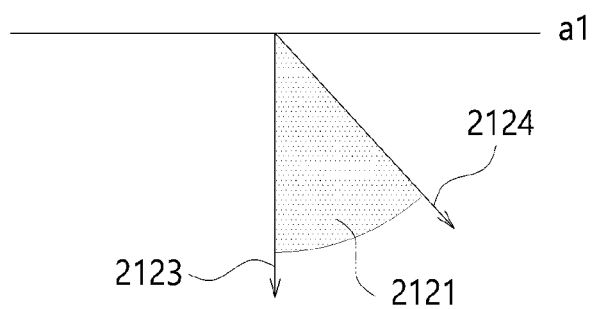
(b)

FIG. 34
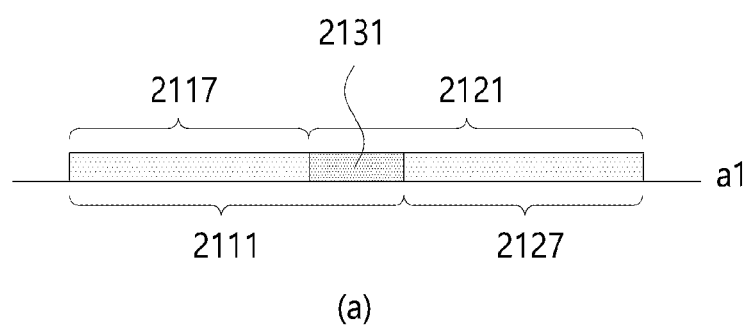
(a)
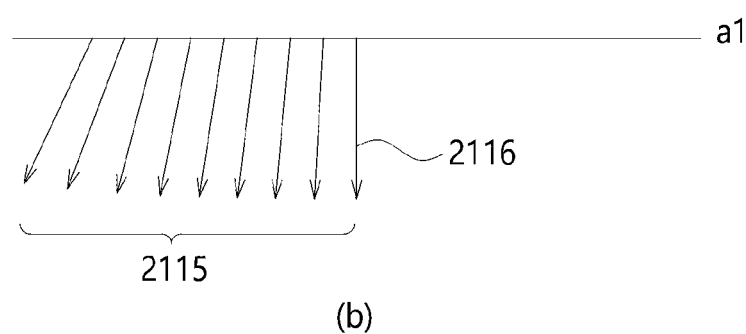
(b)
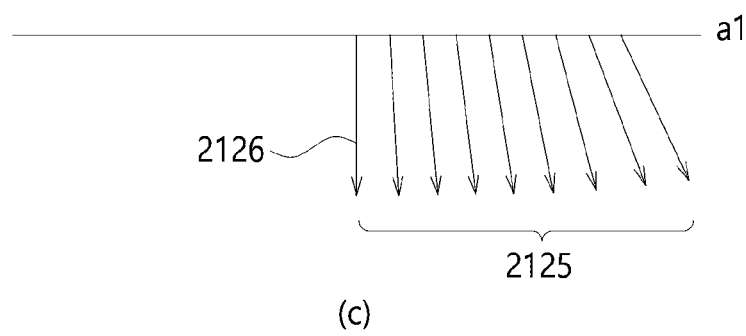
(c)

FIG. 99

|   4570 | 4580 |   |   |
|---|---|---|---|
| 1 | 7 | 3 | 5 |
| 9 | 15 | 11 | 13 |
| 4 | 6 | 2 | 8 |
| 12 | 14 | 10 | 16 |

(a)

|   4570 | 4580 |   |   |
|---|---|---|---|
| 1 | 9 | 2 | 10 |
| 13 | 5 | 14 | 6 |
| 3 | 11 | 4 | 12 |
| 15 | 7 | 16 | 8 |

(b)

FIG. 132
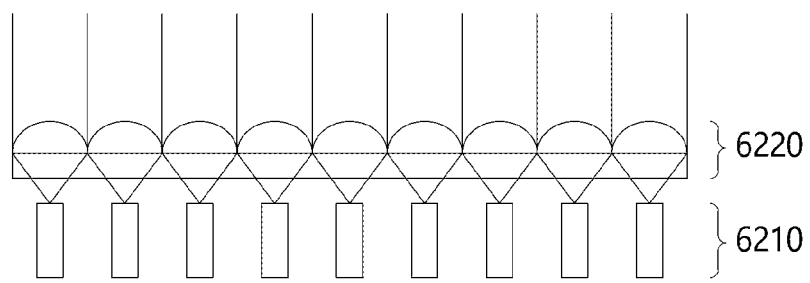
(a)
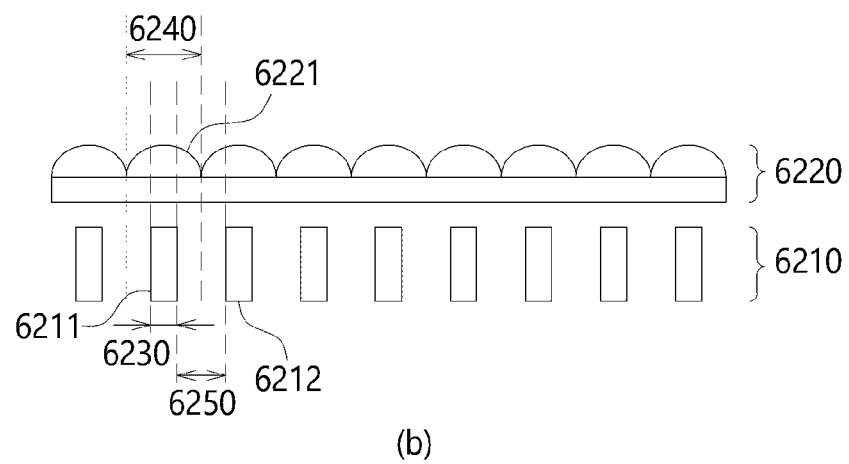
(b)

FIG. 133
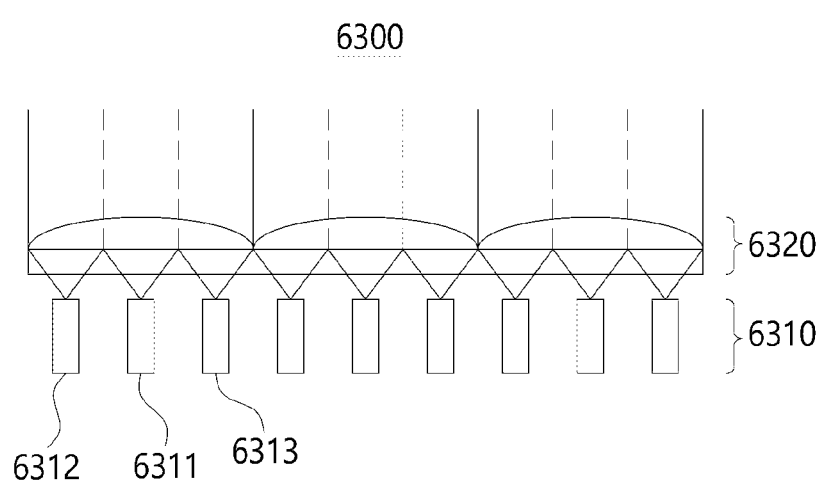
(a)
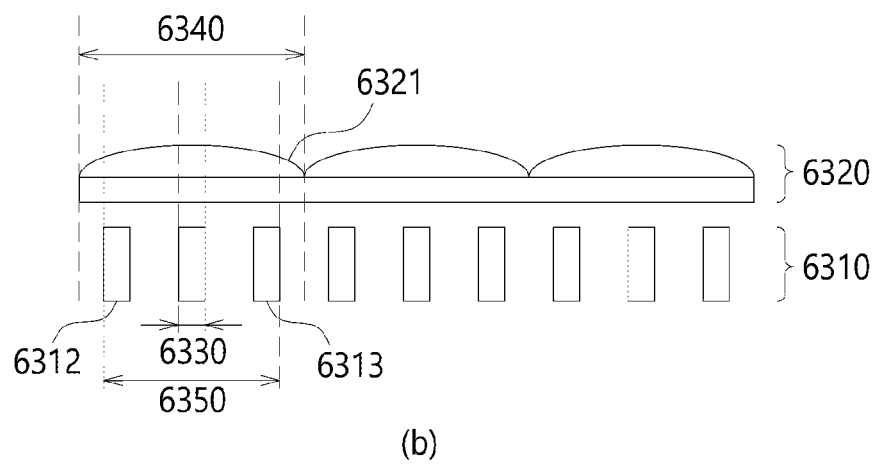
(b)

7000

7001

FIG. 142
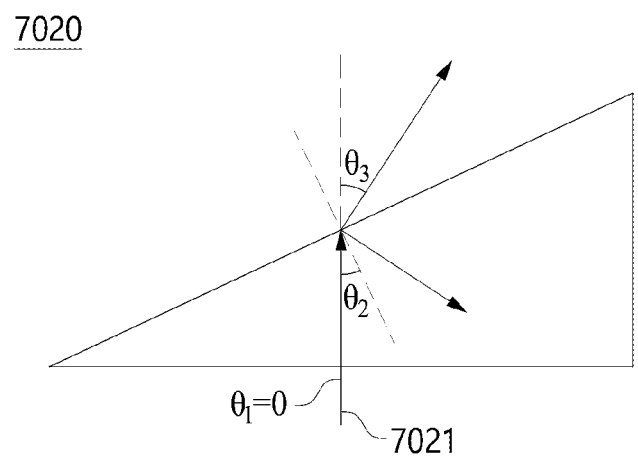
(a)
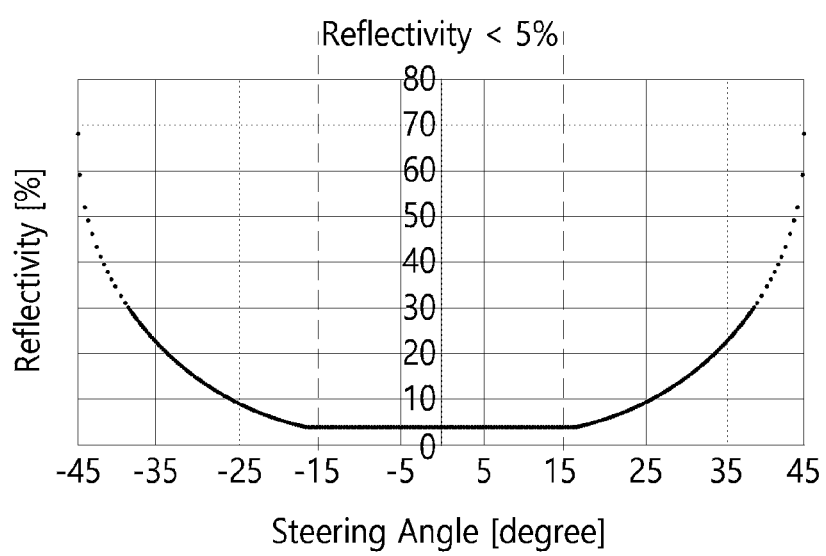
(b)

LASER EMITTING UNIT AND LiDAR DEVICE USING THE SAME

CROSS-REFERENCE TO RELATED APPLICATIONS AND STATEMENT REGARDING GOVERNMENT SPONSORED RESEARCH OR DEVELOPMENT

This is a continuation application of U.S. patent application Ser. No. 17/005,806, filed on Aug. 28, 2020, issued on Jul. 13, 2021 as U.S. Pat. No. 11,063,408, which claims priority to and the benefit of U.S. Patent Application No. 62/893,080 filed on Aug. 28, 2019, Korean Patent Application No. 10-2019-0169501, filed on Dec. 18, 2019, Korean Patent Application No. 10-2019-0171660, filed on Dec. 20, 2019, Korean Patent Application No. 10-2020-0015002, filed on Feb. 7, 2020, Korean Patent Application No. 10-2020-0025574, filed on Feb. 28, 2020, and Korean Patent Application No. 10-2020-0043639, filed on Apr. 9, 2020, which are incorporated by reference in their entirety. This application is also associated with a project entitled "Development of integrated platform technology for fire and disaster management in underground utility tunnel based on digital twin" as project number RS-2020-II200061.

TECHNICAL FIELD

The present disclosure relates to a vertical-cavity surface-emitting laser (VCSEL) array, and more particularly, to a VCSEL array including VCSEL units with improved laser beam power efficiency.

BACKGROUND

A vertical-cavity surface-emitting laser (VCSEL) is a semiconductor laser diode that emits laser beams perpendicularly to an upper surface. A VCSEL can be used in the field of short-distance optical communication, image sensing and in the field of light detection and ranging (LiDAR) that detects a distance to an object using laser.

SUMMARY OF THE INVENTION

The present disclosure is directed to providing a vertical-cavity surface-emitting laser (VCSEL) array capable of improving laser beam power efficiency.

The present disclosure is also directed to providing a VCSEL array having a structure for the efficient operation of VCSEL units.

The present disclosure is also directed to providing a VCSEL array disposed on a wafer to have an efficient yield.

According to an embodiment, a Light Detection And Ranging (LiDAR) device comprises a laser emitting unit configured to emit a laser to an object and disposed on a first side of a first body; and a sensor unit configured to receive the laser reflected by the object, wherein the laser emitting unit includes a first Vertical Cavity Surface Emitting Laser (VCSEL) array, wherein the first VCSEL array includes a first VCSEL unit configured to emit a laser beam to a first direction, and a second VCSEL unit configured to emit a laser beam to a second direction, and a second VCSEL array, wherein the second VCSEL array includes a third VCSEL unit configured to emit a laser beam to the first direction, wherein the first VCSEL unit is disposed apart from the second VCSEL unit at a first distance, and wherein a distance between the first VCSEL unit and the third VCSEL unit is equal to or less than the first distance.

According to another embodiment, a Light Detection And Ranging (LiDAR) device comprises a laser emitting unit configured to a laser to an object and disposed on a first side of a first body, and a sensor unit configured to receive the laser reflected by the object, wherein the laser emitting unit includes a first Vertical Cavity Surface Emitting Laser (VCSEL) array, wherein the first VCSEL array includes a first VCSEL unit configured to emit a laser beam having a first divergence angle, and a second VCSEL unit configured to emit a laser beam having a second divergence angle, and a first optic configured to collimate the laser, and a second optic configured to steer the laser beam toward a preset direction, wherein the second optic includes a first sub-optic configured to steer the laser beam output from the first VCSEL unit in a first direction, and a second sub-optic configured to steer the laser beam output from the second VCSEL unit in a second direction, wherein an angle between the first direction and the second direction is less than half of the sum of the first angle and the second angle so as not to generate a region in which no laser is irradiated from the laser emitting unit.

According to an embodiment, an illuminator comprises a laser emitting unit configured to emit a laser to an object and disposed on a first side of a first body, wherein the laser emitting unit includes a first Vertical Cavity Surface Emitting Laser (VCSEL) array, wherein the first VCSEL array includes a first VCSEL unit configured to emit a laser beam to a first direction, and a second VCSEL unit configured to emit a laser beam to a second direction, and a second VCSEL array, wherein the second VCSEL array includes a third VCSEL unit configured to emit a laser beam to the first direction, wherein the first VCSEL unit is disposed apart from the second VCSEL unit at a first distance, and wherein a distance between the first VCSEL unit and the third VCSEL unit is equal to or less than the first distance.

According to another embodiment, an illuminator comprises a laser emitting unit configured to emit a laser to an object and disposed on a first side of a first body, wherein the laser emitting unit includes a first Vertical Cavity Surface Emitting Laser (VCSEL) array, wherein the first VCSEL array includes a first VCSEL unit configured to emit a laser beam having a first divergence angle and a second VCSEL unit configured to emit a laser beam having a second divergence angle, a first optic configured to collimate the laser beam, and a second optic configured to steer the laser beam toward a preset direction, wherein the second optic includes a first sub-optic configured to steer the laser beam output from the first VCSEL unit in a first direction, and a second sub-optic configured to steer the laser beam output from the second VCSEL unit in a second direction, wherein an angle between the first direction and the second direction is less than half of the sum of the first angle and the second angle so as not to generate a region in which no laser is irradiated from the laser emitting unit.

According to an embodiment, a Light Detection And Ranging (LiDAR) device comprises a laser emitting unit for emitting a laser to an object and disposed on a first side of a first body, and a sensor unit configured to receive the laser reflected by the object, wherein the laser emitting unit comprises a first Vertical Cavity Surface Emitting Laser (VCSEL) array, wherein the first VCSEL array configured to emit a laser beam to form a first horizontal Field Of View (FOV), and a second VCSEL array, wherein the second VCSEL array configured to emit a laser beam to form a second horizontal FOV, wherein the first horizontal FOV and the second horizontal FOV overlap on a first region based on the first axis in which the first axis is the horizontal axis of the first side, wherein the first region includes the FOV formed by the first VCSEL array emitting the laser beam in direction perpendicular to the first side and included in the first horizontal FOV, and wherein the first region includes the FOV formed by the second VCSEL array emitting the laser beam in direction perpendicular to the first side and included in the second horizontal FOV.

According to an embodiment, a distance calculation method using a Light Detection And Ranging (LiDAR) device comprising laser emitting units, a sensor unit and a controller, the method comprises obtaining a emission time at which the first laser emitting unit emits the laser beam to an object, obtaining a receiving time of the received laser beam reflected from the object, calculating a flight distance of the received laser beam based on the emission time and the receiving time, and obtaining a distance from the object to a reference point based on the flight distance, wherein the reference point is based on a first virtual line and a second virtual line, wherein the first virtual line is perpendicular to the first laser emitting unit and extends in the opposite to the emitting direction of the laser beam emitted from the first laser emitting unit, and wherein the second virtual line is perpendicular to a second laser emitting unit and extends in the opposite to the emitting direction of the laser beam emitted from the second laser emitting unit.

According to an embodiment, a Light Detection And Ranging (LiDAR) device comprises a laser emitting unit for emitting a laser to an object, a sensor unit configured to receive the laser reflected by the object, and a controller, the controller configured to obtain a emission time at which the laser emitting unit emits the laser beam and a receiving time of the received laser beam, and calculate, based on a flight distance of the received laser beam based on the emission time and the receiving time, a distance from a reference point to the object, wherein the reference point is defined based on a first virtual line and a second virtual line, wherein the first virtual line is perpendicular to the first laser emitting unit and extends in the opposite to the emitting direction of the laser beam emitted from the first laser emitting unit, and wherein the second virtual line is perpendicular to a second laser emitting unit and extends in the opposite to the emitting direction of the laser beam emitted from the second laser emitting unit.

According to an embodiment, a vertical cavity surface emitting laser (VCSEL) comprises a first Distributed Bragg Reflector (DBR) layer, a second DBR layer, an active layer configured to emit a laser beam, wherein the active layer disposed between the first DBR layer and the second DBR layer, a contact region disposed on the first DBR layer, and a reflector disposed on the contact region, wherein the reflector has a first surface facing to the contact region, wherein the first surface reflects the laser beam emitted from the active layer through the contact region.

According to an embodiment, a Light Detection And Ranging (LiDAR) device comprises a laser emitting unit configured to emit a laser toward an object, wherein the laser emitting unit comprises a plurality of VCSEL emitter, and a sensor unit configured to receive the laser reflected by the object, wherein the VCSEL emitter includes a first Distributed Bragg Reflector (DBR) layer, a second DBR layer, an active layer configured to emit a laser beam, wherein the active layer disposed between the first DBR layer and the second DBR layer, a contact region disposed on the first DBR layer, and a reflector disposed on the contact region, wherein the reflector has a first surface facing to the contact region, wherein the first surface reflects the laser beam emitted from the active layer through the contact region.

According to an embodiment, a vertical cavity surface emitting laser (VCSEL) array comprises a first sub-array includes a plurality of VCSEL units arranged along a first axis, and wherein the first sub-array includes a first VCSEL unit includes a first upper contact and a first bottom contact, and a second VCSEL unit includes a second upper contact and a second bottom contact, a first contact electrically connected to the first upper contact and the second bottom contact, and a second contact electrically connected to the second upper contact and the first bottom contact, wherein the first VCSEL unit is operated when a first voltage is applied to the first contact and a second voltage smaller than the first voltage is applied to the second contact and wherein the second VCSEL unit is operated when the second voltage is applied to the first contact and the first voltage is applied to the second contact.

According to another embodiment, a vertical cavity surface emitting laser (VCSEL) array comprises a first sub-array includes a plurality of VCSEL units arranged along a first axis, wherein the first sub-array includes a first VCSEL unit includes a first upper Distributed Bragg Reflector (DBR) and a first bottom DBR; and a second VCSEL unit includes a second upper Distributed Bragg Reflector (DBR) and a second bottom DBR, a first contact electrically connected to the first upper DBR and the second upper DBR, and a second contact electrically connected to the first bottom DBR and the second bottom DBR, wherein the first upper DBR and the second bottom DBR are doped with P type, wherein the second upper DBR and the first bottom DBR are doped with N type, wherein the first VCSEL unit is operated when a first voltage is applied to the first contact and a second voltage smaller than the first voltage is applied to the second contact and wherein the second VCSEL unit is operated when the second voltage is applied to the first contact and the first voltage is applied to the second contact.

According to still another embodiment, a vertical cavity surface emitting laser (VCSEL) array comprises a first sub-array includes a plurality of VCSEL units arranged along a first axis, wherein the first sub-array includes a first VCSEL unit includes a first Distributed Bragg Reflector (DBR) and a second DBR, and a second VCSEL unit includes a third Distributed Bragg Reflector (DBR) and a fourth DBR, a first contact electrically connected to the first DBR and the third DBR, and a second contact electrically connected to the second DBR and the fourth DBR, wherein the first DBR and the fourth DBR are doped with a first property, wherein the second DBR and the third DBR are doped with a second property different from the first property, wherein a reflectance of the second DBR is greater than a reflectance of the first DBR, wherein a reflectance of the fourth DBR is greater than a reflectance of the third DBR, wherein the first VCSEL unit is operated when a first voltage is applied to the first contact and a second voltage smaller than the first voltage is applied to the second contact and wherein the second VCSEL unit is operated when the second voltage is applied to the first contact and the first voltage is applied to the second contact.

According to an embodiment, a Light Detection And Ranging (LiDAR) device comprises a laser emitting unit configured to emit a laser toward an object, and a sensor unit configured to receive the laser reflected by the object, wherein the laser emitting unit includes a first sub-array includes a plurality of VCSEL units arranged along a first axis, and wherein the first sub-array includes a first VCSEL unit includes a first upper contact and a first bottom contact, and a second VCSEL unit includes a second upper contact and a second bottom contact, a first contact electrically connected to the first upper contact and the second bottom contact, and a second contact electrically connected to the second upper contact and the first bottom contact, wherein the first VCSEL unit is operated when a first voltage is applied to the first contact and a second voltage smaller than the first voltage is applied to the second contact and wherein the second VCSEL unit is operated when the second voltage is applied to the first contact and the first voltage is applied to the second contact.

According to another embodiment, a Light Detection And Ranging (LiDAR) device comprises a laser emitting unit configured to emit a laser toward an object, and a sensor unit configured to receive the laser reflected by the object, wherein the laser emitting unit includes a first sub-array includes a plurality of VCSEL units arranged along a first axis, wherein the first sub-array includes a first VCSEL unit includes a first upper Distributed Bragg Reflector (DBR) and a first bottom DBR, and a second VCSEL unit includes a second upper Distributed Bragg Reflector (DBR) and a second bottom DBR, a first contact electrically connected to the first upper DBR and the second upper DBR, and a second contact electrically connected to the first bottom DBR and the second bottom DBR, wherein the first upper DBR and the second bottom DBR are doped with P type, wherein the second upper DBR and the first bottom DBR are doped with N type, wherein the first VCSEL unit is operated when a first voltage is applied to the first contact and a second voltage smaller than the first voltage is applied to the second contact and wherein the second VCSEL unit is operated when the second voltage is applied to the first contact and the first voltage is applied to the second contact.

According to an embodiment, a vertical cavity surface emitting laser (VCSEL) array comprises a first sub-array includes a first VCSEL unit and a second VCSEL unit, wherein the first VCSEL unit and the second VCSEL unit are arranged along a first axis, a common contact connected to the first sub-array, a first contact electrically connected to a one end of the common contact, and a second contact electrically connected to the other end of the common contact to decrease a combined resistance of a first resistance and a second resistance, wherein the first resistance is the resistance between the one end of the first contact and the first VCSEL unit, and wherein the second resistance is the resistance between the first VCSEL unit and the second VCSEL unit, wherein the first VCSEL unit is adjacent to the one end of the common contact than the second VCSEL unit, and wherein the second VCSEL unit is adjacent to the other end of the common contact than the first VCSEL unit.

According to another embodiment, a vertical cavity surface emitting laser (VCSEL) array comprises a first sub-array includes a first VCSEL unit and a second VCSEL unit, wherein the first VCSEL unit and the second VCSEL unit are arranged along a first axis, a common contact connected to the first sub-array, a first contact electrically connected to a one end of the common contact, and a second contact electrically connected to the other end of the common contact to decrease a difference between a first combined resistance of the first VCSEL unit and a second combined resistance of the second VCSEL unit, wherein the first combined resistance is combined resistance of a first resistance and a second resistance, wherein the first resistance is the resistance between the one end of the common contact and the first VCSEL unit, wherein the second resistance is the resistance between the first VCSEL unit and the other end of the common contact wherein the second combined resistance is combined resistance of a third resistance and a fourth resistance, wherein the third resistance is the resistance between the one end of the common contact and the second VCSEL unit, and wherein the fourth resistance is the resistance between the second VCSEL unit and the other end of the common contact.

According to an embodiment, a Light Detection And Ranging (LiDAR) device comprises a laser emitting unit configured to emit a laser toward an object, and a sensor unit configured to receive the laser reflected by the object, wherein the laser emitting unit includes a first sub-array includes a first VCSEL unit and a second VCSEL unit, wherein the first VCSEL unit and the second VCSEL unit are arranged along a first axis, a common contact connected to the first sub-array, a first contact electrically connected to a one end of the common contact, and a second contact electrically connected to the other end of the common contact to decrease a combined resistance of a first resistance and a second resistance, wherein the first resistance is the resistance between the one end of the first contact and the first VCSEL unit, and wherein the second resistance is the resistance between the first VCSEL unit and the second VCSEL unit, wherein the first VCSEL unit is adjacent to the one end of the common contact than the second VCSEL unit, wherein the second VCSEL unit is adjacent to the other end of the common contact than the first VCSEL unit.

According to another embodiment, a Light Detection And Ranging (LiDAR) device comprises a laser emitting unit configured to emit a laser toward an object, and a sensor unit configured to receive the laser reflected by the object, wherein the laser emitting unit includes a first sub-array includes a first VCSEL unit and a second VCSEL unit, wherein the first VCSEL unit and the second VCSEL unit are arranged along a first axis, a common contact connected to the first sub-array, a first contact electrically connected to a one end of the common contact, and a second contact electrically connected to the other end of the common contact to decrease a difference between a first combined resistance of the first VCSEL unit and a second combined resistance of the second VCSEL unit, wherein the first combined resistance is combined resistance of a first resistance and a second resistance, wherein the first resistance is the resistance between the one end of the common contact and the first VCSEL unit, wherein the second resistance is the resistance between the first VCSEL unit and the other end of the common contact, wherein the second combined resistance is combined resistance of a third resistance and a fourth resistance, wherein the third resistance is the resistance between the one end of the common contact and the second VCSEL unit, and wherein the fourth resistance is the resistance between the second VCSEL unit and the other end of the common contact.

According to another embodiment, a lidar (light detection and ranging) device for measuring a distance using a laser beam, comprising: a laser emitting unit including a plurality of laser emitting elements for emitting a laser beam, a detecting unit configured to receive a reflected laser beam, wherein the laser emitting unit includes first laser emitting element and second laser emitting element, wherein a first laser beam emitted from the first laser emitting element and a second laser beam emitted from the second laser emitting element are emitted to have a first light density and a second light density respectively, in a first region spaced a first distance from the lidar device, wherein a second distance between the lidar device and a second region where the first laser beam and the second laser beam overlap is determined based on a third distance between the first laser emitting element and the second laser emitting element, wherein the third distance is set so that a light density of a portion where the first and second laser beams overlap in the second region is equal to or less than the first light density, wherein a size of the portion where the first and second laser beam overlap is increased as a distance from the lidar device increases, wherein the third distance is set so that the size of the portion where the first and second laser beam overlap is 80% or more of a irradiation area of the first laser beam at 100 m from the lidar device, and wherein the second distance is greater than the first distance.

According to another embodiment, a laser emitting device, comprising: a first VCSEL (Vertical Cavity Surface Emitting Laser) unit including at least one VCSEL emitter and configured to emit a first laser beam irradiated in a first direction, a second VCSEL unit including at least one VCSEL emitter and configured to emit a second laser beam irradiated in a second direction, a third VCSEL unit includes at least one VCSEL emitter and configured to emit a third laser beam irradiated in the first direction, a fourth VCSEL unit includes at least one VCSEL emitter and configured to emit a fouth laser beam irradiated in the second direction and a controller configured to control the first, second, third and fourth VCSEL units, wherein the controller operates the first and third VCSEL units to emit the first and third lasers, and turns off the second and fourth VCSEL units at a first time, wherein the controller operates the second and fourth VCSEl units to emit the second and fourth lasers, and turns off the first and third VCSEL units at a second time different from the first time, wherein the first and third VCSEL units are spaced apart by a first distance, wherein the second and fourth VCSEL units are spaced apart by a second distance, wherein the first and second VCSEL units are spaced apart by a third distance, wherein the third distance is smaller than the first and second distances.

According to another embodiment, a laser emitting device, comprising: a first VCSEL (Vertical Cavity Surface Emitting Laser) unit includes at least one VCSEL emitter and configured to emit a first laser beam irradiated in a first direction, a second VCSEL unit includes at least one VCSEL emitter and configured to emit a second laser beam irradiated in a second direction, a third VCSEL unit includes at least one VCSEL emitter and configured to emit a third laser beam irradiated in the first direction, a fourth VCSEL unit includes at least one VCSEL emitter and configured to emit a fouth laser beam irradiated in the second direction and a controller configured to control the first, second, third and fourth VCSEL units, wherein the controller operates the first and third VCSEL units to emit the first and third lasers, and turns off the second and fourth VCSEL units at a first time, wherein the controller operates the second and fourth VCSEl units to emit the second and fourth lasers, and turns off the first and third VCSEL units at a second time different from the first time, wherein the first and second VCSEL unit are included in a first VCSEL array and the third and fourth VCSEL unit are included in a second VCSEL array, wherein the first and second VCSEL array are arranged on the same plane.

According to another embodiment, a lidar (light detection and ranging) device for measuring a distance using a laser beam, comprising: a first VCSEL (Vertical Cavity Surface Emitting Laser) unit includes at least one VCSEL emitter and configured to emit a first laser beam irradiated in a first direction, a second VCSEL unit includes at least one VCSEL emitter and configured to emit a second laser beam irradiated in a second direction, a third VCSEL unit includes at least one VCSEL emitter and configured to emit a third laser beam irradiated in the first direction, a fourth VCSEL unit includes at least one VCSEL emitter and configured to emit a fouth laser beam irradiated in the second direction, a detecting unit configured to receive a reflected laser beam and a controller configured to control the first VCSEL unit, the second VCSEL unit, the third VCSEL unit and the fourth VCSEL unit and obtain a distance information related to an object, wherein the controller controls the first VCSEL unit to emit the first laser beam in a first direction at a first time and the second VCSEL unit to emit the second laser beam in a second direction, when the distance information is not obtained by using the first laser beam emitted at the first time, the controller controls the first and third VCSEL unit to emit the first and third laser beam in the first direction at a third time, when the distance information is obtained by using the second laser beam emitted at the second time, the controller controls the second VCSEL unit to emit the second laser beam in the second direction at a fourth time.

According to another embodiment, a method for measuring a distance using a laser beam emitted from a VCSEL unit including at least one of a VCSEL emitter, comprising: emitting a first laser beam irradiated in a first direction, by operating a first VCSEL unit at a first time, emitting a second laser beam irradiated in a second direction, by operating a second VCSEL unit at a second time, emitting the fisrt laser beam and a third laser beam irradiated in the first direction, by operating the first VCSEL unit and a third VCSEL unit at a third time, measuring a first distance for a first object using the first and third laser beams emitted at the third time, emitting the second laser beam, by operating the second VCSEL unit at a fourth time, and measuring a second distance for a second object using the second laser beam emitted at the fourth time, wherein the first distance is greater than the second distance.

According to another embodiment, an autonomous vehicle that can drive using detecting an object aroud the vehicle, comprising: a vehicle body, a lidar (light detection and ranging) device and wherein the lidar device is comprising: a first VCSEL (Vertical Cavity Surface Emitting Laser) unit including at least one VCSEL emitter and configured to emit a first laser beam irradiated in a first direction, a second VCSEL unit including at least one VCSEL emitter and configured to emit a second laser beam irradiated in a second direction, a third VCSEL unit includes at least one VCSEL emitter and configured to emit a third laser beam irradiated in the first direction, a fourth VCSEL unit includes at least one VCSEL emitter and configured to emit a fouth laser beam irradiated in the second direction and a controller configured to control the first, second, third and fourth VCSEL units, wherein at a first time the controller operates the first and third VCSEL units to emit the first and third lasers, and turns off the second and fourth VCSEL units, and wherein at a second time different from the first time the controller operates the second and fourth VCSEL units to emit the second and fourth lasers, and turns off the first and third VCSEL units.

According to another embodiment, a laser emitting device, comprising: a VCSEL (Vertical Cavity Surface Emitting Laser) array including a first VCSEL unit and a second VCSEL unit, wherein the first VCSEL unit includes a first VCSEL emitter and a second VCSEL emitter, and the second VCSEL unit includes a third VCSEL emitter and a fourth VCSEL emitter, a micro-lens array configured to collimate a laser beam emitted from the VCSEL array, a prism array configured to steer the laser beam collimated from the micro-lens array, wherein the micro-lens array includes a first micro-lens element disposed corresponding to the first VCSEL emitter, a second micro-lens element disposed corresponding to the second VCSEL emitter, a third micro-lens element disposed corresponding to the third VCSEL emitter and a fourth micro-lens element disposed corresponding to the fourth VCSEL emitter, wherein the prism array includes a first prism element and a second prism element, wherein the first prism element is disposed corresponding to the first VCSEL unit and configured to steer a first laser beam emitted from the first VCSEL unit at a first angle, wherein the second prism element is disposed corresponding to the second VCSEL unit and configured to steer a second laser beam emitted from the second VCSEL unit at a second angle, wherein the first and second VCSEL emitters share a first N-contact and a first P-contact, wherein the third and fourth VCSEL emitters share a second N-contact and a second P-contact, wherein the first and second angle are is different from each other.

According to another embodiment, a laser emitting device, comprising: a VCSEL (Vertical Cavity Surface Emitting Laser) array including a first VCSEL emitter, a micro-lens array configured to collimate a laser beam emitted from the VCSEL array, a prism array configured to steer the laser beam collimated from the micro-lens array, wherein the micro-lens array includes a first micro-lens element configured to collimate a first laser beam emitted from the first VCSEL emitter, wherein the first laser beam collimated from the first micro-lens element has divergence angle $\theta_D$, wherein the prism array includes a first prism element configured to steer the first laser beam, wherein when a refractive index of the first prism element is n, and an inclination angle of the first prism element is $\theta$, the inclination angle of the first prism element is formed to satisfy the following equation:

$$\theta \leq \sin^{-1}\left(\frac{1}{n}\right) - \frac{\theta_D}{2}.$$

According to another embodiment, a laser emitting device, comprising: a VCSEL (Vertical Cavity Surface Emitting Laser) array including a first VCSEL unit wherein the first VCSEL unit includes a first VCSEL emitter and a second VCSEL emitter, a micro-lens array configured to collimate a laser beam emitted from the VCSEL array, a prism array configured to steer the laser beam collimated from the micro-lens array, wherein the micro-lens array includes a first micro-lens element disposed corresponding to the first VCSEL emitter, a second micro-lens element disposed corresponding to the second VCSEL emitter wherein the micro-lens array includes a first micro-lens unit disposed corresponding to the first VCSEL unit and including the first micro-lens element and the second micro-lens element, wherein the prism array includes a first prism element disposed corresponding to the first VCSEL unit and configured to steer a first laser beam emitted from the first VCSEL unit at a first angle, wherein a diameter of the first VCSEL unit is smaller than a diameter of the first micro-lens unit and the diameter of the first micro-lens unit is smaller than the length of one side of the first prism element.

According to another embodiment, a LiDAR (Light detection and ranging) device, comprising: a laser emitting unit configured to emit a laser beam, a detector configured to receive the laser beam scattered by an object, a controller configured to control the operation of the laser emitting unit and the detector, and obtain a distance from the object based on the laser beam received by the detector, wherein the laser emitting unit comprising: a VCSEL (Vertical Cavity Surface Emitting Laser) array including a first VCSEL unit and a second VCSEL unit wherein the first VCSEL unit includes a first VCSEL emitter and a second VCSEL emitter, and the second VCSEL unit includes a third VCSEL emitter and a fourth VCSEL emitter, a collimation component configured to collimate a laser beam emitted from the VCSEL array, a steering component configured to steer the laser beam collimated from the collimation component, wherein the first and second VCSEL emitters share a first N-contact and a first P-contact, wherein the third and fourth VCSEL emitters share a second N-contact and a second P-contact, wherein the controller is configured to electrically connect the first N-contact and the first P-contact so that the first laser beam is emitted from the first VCSEL unit at a first time, and wherein the controller is configured to electrically connect the second N-contact and the second P-contact so that the second laser beam is emitted from the second VCSEL unit at a second time different from the first time.

Solutions of the present disclosure are not limited to the above-mentioned solutions, and solutions that have not been mentioned will be clearly understood by those skilled in the art from the following description and the accompanying drawings.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which:

FIGS. 30 and 31 are diagrams showing a horizontal field of view (FOV) of a VCSEL module according to an embodiment when viewed from the top.

FIGS. 32 to 34 are diagrams showing a horizontal FOV of a VCSEL module according to an embodiment when viewed from the front.

FIG. 99 is a diagram showing an operation sequence of a VCSEL array according to an embodiment.

FIG. 132 is a diagram illustrating the configuration of a laser beam output unit according to an embodiment.

FIG. 133 is a diagram illustrating the configuration of a laser beam output unit according to an embodiment.

FIG. 142 is a diagram illustrating a steering component according to an embodiment.

DETAILED DESCRIPTION OF EXEMPLARY EMBODIMENTS

Figure 1:
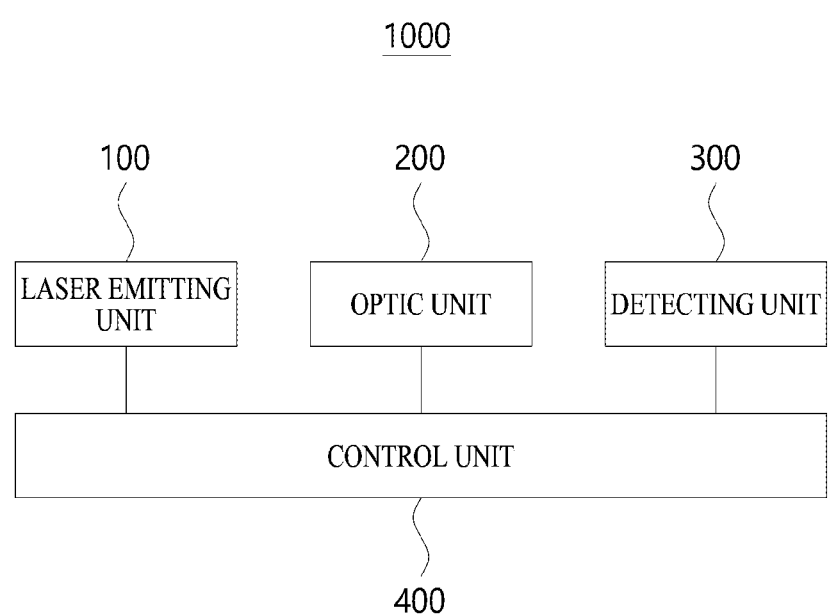
FIG. 1 is a diagram illustrating a light detection and ranging (LiDAR) device according to an embodiment.

Embodiments described in this specification are intended to clearly explain the spirit of the invention to those skilled in the art. Therefore, the present disclosure is not limited by the embodiments, and the scope of the present disclosure should be interpreted as encompassing modifications and variations without departing from the spirit of the invention.

Terms used in this specification are selected from among general terms, which are currently widely used, in consideration of functions in the present disclosure and may have meanings varying depending on intentions of those skilled in the art, customs in the field of art, the emergence of new technologies, or the like. If a specific term is used with a specific meaning, the meaning of the term will be described specifically. Accordingly, the terms used in this specification should not be defined as simple names of the components but be defined based on the actual meaning of the terms and the whole context throughout the present specification.

The accompanying drawings are to facilitate the explanation of the present disclosure, and the shape in the drawings may be exaggerated for the purpose of convenience of explanation, so the present disclosure should not be limited by the drawings.

When it is determined that detailed descriptions of well-known elements or functions related to the present disclosure may obscure the subject matter of the present disclosure, detailed descriptions thereof will be omitted herein as necessary.

According to an embodiment, there is provided a Light Detection And Ranging (LiDAR) device comprising a laser emitting unit configured to emit a laser to an object and disposed on a first side of a first body; and a sensor unit configured to receive the laser reflected by the object, wherein the laser emitting unit includes a first Vertical Cavity Surface Emitting Laser (VCSEL) array, wherein the first VCSEL array includes a first VCSEL unit configured to emit a laser beam to a first direction, and a second VCSEL unit configured to emit a laser beam to a second direction, and a second VCSEL array, wherein the second VCSEL array includes a third VCSEL unit configured to emit a laser beam to the first direction, wherein the first VCSEL unit is disposed apart from the second VCSEL unit at a first distance, and wherein a distance between the first VCSEL unit and the third VCSEL unit is equal to or less than the first distance.

Here, the first direction is perpendicular to the first side.

Here, the second VCSEL unit is adjacent to the first VCSEL unit.

Here, the third VCSEL unit is adjacent to the first VCSEL unit.

Here, the first VCSEL unit is disposed on an outermost side of the first VCSEL array and the third VCSEL unit is disposed on an outermost side of the second VCSEL array.

Here, the laser emitting unit includes a plurality of optics, and the optics includes a first optic configured to collimate the laser beam emitted from the first VCSEL array or the second VCSEL array, and a second optic configured to steer the laser beam toward a preset direction.

Here, the first optic disposed at a direction in which the laser beam is emitted from a laser emitting element of the laser emitting unit, the second optic disposed at a direction in which the laser beam output from the first optic, and the laser emitting element is included in the first VCSEL unit or the second VCSEL unit.

Here, the first VCSEL array includes a plurality of emitters, the first optic includes a plurality of sub-optics, and a first emitter among a plurality of emitters corresponds to a first sub-optic among a plurality of sub-optics.

Here, the first VCSEL unit includes a plurality of emitters, the first optic includes a plurality of sub-optics, and the first VCSEL unit corresponds to a first sub-optic among a plurality of sub-optics.

Here, the first VCSEL unit includes a plurality of emitters, the second optic includes a plurality of sub-optics and the first VCSEL unit corresponds to a first sub-optic among a plurality of sub-optics.

Here, the first optic is at least one of a lens, a microlens, a microlens array and a metasurface.

Here, the second optic is at least one of a lens, a microlens, a microlens array, a prism, a microprism, a microprism array and a metasurface.

Here, the LiDAR device further comprises a body group comprises a plurality of the bodies including the first body and the horizontal Field Of View (FOV) of the body group is the sum of a horizontal FOV of the plurality of the bodies.

Here, the LiDAR device further comprises a body group comprises a plurality of the bodies including the first body and the horizontal Field Of View (FOV) of the body group is defined based on a horizontal FOV of the plurality of the bodies and a steering angle and divergence of the laser emitted from the laser emitting unit.

According to another embodiment, there is provided a Light Detection And Ranging (LiDAR) device comprising a laser emitting unit configured to a laser to an object and disposed on a first side of a first body, and a sensor unit configured to receive the laser reflected by the object, wherein the laser emitting unit includes a first Vertical Cavity Surface Emitting Laser (VCSEL) array, wherein the first VCSEL array includes a first VCSEL unit configured to emit a laser beam having a first divergence angle, and a second VCSEL unit configured to emit a laser beam having a second divergence angle, and a first optic configured to collimate the laser, and a second optic configured to steer the laser beam toward a preset direction, wherein the second optic includes a first sub-optic configured to steer the laser beam output from the first VCSEL unit in a first direction, and a second sub-optic configured to steer the laser beam output from the second VCSEL unit in a second direction, wherein an angle between the first direction and the second direction is less than half of the sum of the first angle and the second angle so as not to generate a region in which no laser is irradiated from the laser emitting unit.

Here, the first angle is equal to the second angle.

Here, the second VCSEL unit is adjacent to the first VCSEL unit.

Here, the first optic disposed at the direction in which the laser beam is emitted from a laser emitting element of the laser emitting unit, the second optic disposed at the direction in which the laser beam is output from the first optic, and the laser emitting element is included in the first VCSEL unit.

Here, the first VCSEL array includes a plurality of emitters, the first optic includes a plurality of sub-optic, and a first VCSEL emitter among a plurality of emitters corresponds to a third sub-optic among a plurality of sub-optic.

Here, the first VCSEL unit includes a plurality of emitters, the first optic includes a plurality of sub-optic, and the first VCSEL unit corresponds to a third sub-optic among a plurality of sub-optic.

Here, the first VCSEL unit includes a plurality of emitters, and wherein the first VCSEL unit corresponds to the first sub-optic.

Here, the first optic is at least one of a lens, a microlens, a microlens array and a metasurface.

Here, the second optic is at least one of a lens, a microlens, a microlens array, a prism, a microprism, a microprism array and a metasurface.

Here, the LiDAR device further comprises a body group comprises a plurality of the bodies including the first body and wherein the the horizontal Field Of View (FOV) of the body group is the sum of a horizontal FOV of the plurality of the bodies.

Here, the LiDAR device further comprises a body group comprises a plurality of the bodies including the first body and wherein the horizontal Field Of View (FOV) of the body group is defined based on a steering angle and divergence of the laser beam emitted from the laser emitting unit.

Here, the laser emitting unit further includes a second VCSEL array, the second VCSEL array includes a third VCSEL unit configured to emit a laser beam having a third divergence angle, the first optic configured to collimate the laser beam emitted from the second VCSEL array, the second optic configured to steer the laser beam output emitted from the second VCSEL array, the second optic includes a third sub-optic that steers the laser beam output from the third VCSEL unit in a third direction, and the angle between the first direction and the third direction is less than half of the sum of the first angle and the third angle so as not to generate a region in which no laser is irradiated from the laser emitting unit.

Here, the first direction and the third direction are symmetrical to a second side perpendicular to the first side.

Here, the first VCSEL unit is disposed apart from the second VCSEL unit at a first distance, and a distance between the first VCSEL unit and the third VCSEL unit is equal to or less than the first distance.

Here, the third VCSEL unit is adjacent to the first VCSEL unit.

Here, the first VCSEL unit is disposed on an outermost side of the first VCSEL array and the third VCSEL unit is disposed on an outermost side of the second VCSEL array.

According to an embodiment, there is provided an illuminator comprising a laser emitting unit configured to emit a laser to an object and disposed on a first side of a first body, wherein the laser emitting unit includes a first Vertical Cavity Surface Emitting Laser (VCSEL) array, wherein the first VCSEL array includes a first VCSEL unit configured to emit a laser beam to a first direction, and a second VCSEL unit configured to emit a laser beam to a second direction, and a second VCSEL array, wherein the second VCSEL array includes a third VCSEL unit configured to emit a laser beam to the first direction, wherein the first VCSEL unit is disposed apart from the second VCSEL unit at a first distance, and wherein a distance between the first VCSEL unit and the third VCSEL unit is equal to or less than the first distance.

According to another embodiment, there is provided an illuminator comprising a laser emitting unit configured to emit a laser to an object and disposed on a first side of a first body, wherein the laser emitting unit includes a first Vertical Cavity Surface Emitting Laser (VCSEL) array, wherein the first VCSEL array includes a first VCSEL unit configured to emit a laser beam having a first divergence angle and a second VCSEL unit configured to emit a laser beam having a second divergence angle, a first optic configured to collimate the laser beam, and a second optic configured to steer the laser beam toward a preset direction, wherein the second optic includes a first sub-optic configured to steer the laser beam output from the first VCSEL unit in a first direction, and a second sub-optic configured to steer the laser beam output from the second VCSEL unit in a second direction, wherein an angle between the first direction and the second direction is less than half of the sum of the first angle and the second angle so as not to generate a region in which no laser is irradiated from the laser emitting unit.

According to an embodiment, there is provided a Light Detection And Ranging (LiDAR) device comprising a laser emitting unit for emitting a laser to an object and disposed on a first side of a first body, and a sensor unit configured to receive the laser reflected by the object, wherein the laser emitting unit comprises a first Vertical Cavity Surface Emitting Laser (VCSEL) array, wherein the first VCSEL array configured to emit a laser beam to form a first horizontal Field Of View (FOV), and a second VCSEL array, wherein the second VCSEL array configured to emit a laser beam to form a second horizontal FOV, wherein the first horizontal FOV and the second horizontal FOV overlap on a first region based on the first axis in which the first axis is the horizontal axis of the first side, wherein the first region includes the FOV formed by the first VCSEL array emitting the laser beam in direction perpendicular to the first side and included in the first horizontal FOV, and wherein the first region includes the FOV formed by the second VCSEL array emitting the laser beam in direction perpendicular to the first side and included in the second horizontal FOV.

Here, an irradiation angle of the emitted laser beam from the first VCSEL array for forming the first horizontal FOV and an irradiation angle of the emitted laser beam from the second VCSEL array for forming the second horizontal FOV is the same.

Here, the horizontal FOV of the laser emitting unit is determined based on the first horizontal FOV and the second horizontal FOV.

Here, the first VCSEL array configured to form a first vertical FOV, the second VCSEL array configured to form a second vertical FOV, and an irradiation angle of the emitted laser beam from the first VCSEL array for forming the first vertical FOV and an irradiation angle of the emitted laser beam from the second VCSEL array for forming the second vertical FOV is the same.

Here, a direction of laser beam irradiation of the first VCSEL array and a direction of laser beam irradiation of the second VCSEL array are symmetrical with respect to the second axis perpendicular to the first axis.

Here, a direction of laser beam irradiation of the first VCSEL array and a direction of laser beam irradiation of the second VCSEL array are symmetrical to each other based on a virtual second side perpendicular to the first side.

Here, the laser emitting unit includes a plurality of optics, a first optic of a plurality of optics configured to collimate a laser beam, and a second optic of a plurality of optics configured to steer a laser beam in one direction.

Here, the first optic is disposed in a direction in which the laser beam emitted from a laser emitting element of the laser emitting unit, and the second optic is disposed in a direction in which the laser beam is output from the first optic.

Here, the first VCSEL array includes a plurality of VCSEL emitters, the first optic includes a plurality of sub-optics, and a first emitter among a plurality of VCSEL emitters corresponds to a first sub-optic among a plurality of sub-optics.

Here, the first VCSEL array includes a plurality of VCSEL units includes a plurality of VCSEL emitters, the second optic includes a plurality of sub-optics, and the first VCSEL unit among a plurality of VCSEL units corresponds to a first sub-optic among a plurality of sub-optics.

Here, the first optic is at least one of a lens, a microlens, a microlens array and a metasurface.

Here, the second optic is at least one of a lens, a microlens, a microlens array, a prism, a microprism, a microprism array and a metasurface.

Here, the first horizontal FOV includes a first laser beam, which is the laser beam having a greater position value of a center of the laser beam with respect to the first axis among the outermost laser beams, the second horizontal FOV includes a second beam, which is the laser beam having a smaller position value of a center of the laser beam with respect to the first axis among the outermost laser beams, and a irradiation direction of the center of the first laser beam and the center of the second laser beam is the same.

Here, the irradiation of the center of the first laser beam and the center of the second laser beam is perpendicular to the first side.

Here, the first horizontal FOV includes a second region that does not overlap with the second horizontal FOV, the second horizontal FOV includes a third region that does not overlap with the first horizontal FOV, and an irradiation angle of the second region and the third region is the same.

Here, the angle of the first horizontal FOV is 15 degrees.

Here, the angle of the first horizontal FOV is 30 degrees.

Here, the LiDAR device further comprises a body group comprises a plurality of the bodies including the first body, the wherein the horizontal Field Of View (FOV) of body group is determined based on horizontal FOVs of a plurality of the bodies.

Here, the LiDAR device further comprises a body group comprises a plurality of the bodies including the first body, the horizontal FOV of the body group is determined based on the horizontal FOVs of the plurality of the bodies, a steering angle of the first VCSEL array and the second VCSEL array and divergence angle of the laser beam emitted from the laser emitting unit.

According to an embodiment, there is provided a distance calculation method using a Light Detection And Ranging (LiDAR) device comprising laser emitting units, a sensor unit and a controller, the method comprises obtaining a emission time at which the first laser emitting unit emits the laser beam to an object, obtaining a receiving time of the received laser beam reflected from the object, calculating a flight distance of the received laser beam based on the emission time and the receiving time, and obtaining a distance from the object to a reference point based on the flight distance, wherein the reference point is based on a first virtual line and a second virtual line, wherein the first virtual line is perpendicular to the first laser emitting unit and extends in the opposite to the emitting direction of the laser beam emitted from the first laser emitting unit, and wherein the second virtual line is perpendicular to a second laser emitting unit and extends in the opposite to the emitting direction of the laser beam emitted from the second laser emitting unit.

Here, the method further comprises obtaining the distance from the LiDAR device to the object based on the distance between the reference point and the object and the distance between the reference point and the first laser emitting unit.

Here, the method further comprises calculating a position of the object based on the distance between the first laser emitting unit and the object, the distance between the reference point and the second laser emitting unit and the angle between the first laser emitting unit and the second laser emitting unit.

Here, the reference point is a center point of a sphere having a diameter of a first distance, the first distance is a minimum distance from an intersection point of the first virtual line and the second virtual line to a third virtual line, and the third virtual line is perpendicular to a third laser emitting unit and extends in the opposite to the emitting direction of the laser beam emitted from the third laser emitting unit.

Here, the reference point is a center point of a sphere having a diameter of a first distance, the first distance is equal to a maximum distance among distances between intersections of the first virtual line, the second virtual line and a third virtual line, and the third virtual line is perpendicular to a third laser emitting unit extends in the opposite to the emitting direction of the laser beam emitted from the third laser emitting unit.

Here, the first virtual line includes a first point of the first laser emitting unit, and the second virtual line includes a second point of the second laser emitting unit.

Here, the first point is a center point of the first laser emitting unit, and the second point is a center point of the second laser emitting unit.

Here, a first coordinate of the first point calculated using a center point of the first laser emitting unit as an origin corresponds to a second coordinate of the second point calculated using a center point of the second laser emitting unit as an origin.

Here, the first laser emitting unit has an adjacent angle with the second laser emitting unit.

Here, the adjacent angle is 120 degrees.

Here, the adjacent angle is 150 degrees.

Here, the minimum distance from the reference point to the first laser emitting unit is equal to the minimum distance from the reference point to the second laser emitting unit.

Here, the minimum distance from the reference point to the first laser emitting unit is predetermined.

According to an embodiment, there is provided a Light Detection And Ranging (LiDAR) device comprising a laser emitting unit for emitting a laser to an object, a sensor unit configured to receive the laser reflected by the object, and a controller, the controller configured to obtain a emission time at which the laser emitting unit emits the laser beam and a receiving time of the received laser beam, and calculate, based on a flight distance of the received laser beam based on the emission time and the receiving time, a distance from a reference point to the object, wherein the reference point is defined based on a first virtual line and a second virtual line, wherein the first virtual line is perpendicular to the first laser emitting unit and extends in the opposite to the emitting direction of the laser beam emitted from the first laser emitting unit, and wherein the second virtual line is perpendicular to a second laser emitting unit and extends in the opposite to the emitting direction of the laser beam emitted from the second laser emitting unit.

According to an embodiment, there is provided a vertical cavity surface emitting laser (VCSEL) comprising a first Distributed Bragg Reflector (DBR) layer, a second DBR layer, an active layer configured to emit a laser beam, wherein the active layer disposed between the first DBR layer and the second DBR layer, a contact region disposed on the first DBR layer, and a reflector disposed on the contact region, wherein the reflector has a first surface facing to the contact region, wherein the first surface reflects the laser beam emitted from the active layer through the contact region.

Here, the contact region contacts to the first surface of the reflector.

Here, an area of the first surface is less than or equal to an area of the contact region.

Here, a width of the reflector is less than or equal to a width of the contact region.

Here, the reflector includes conductive material.

Here, the reflector includes silver (Ag) or aluminum (Al).

Here, the first surface includes a curved surface.

Here, the contact region includes titanium (Ti), chromium (Cr) or nickel (Ni).

Here, a reflectance of the reflector is greater than a reflectance of the contact region.

Here, a thickness of the contact region is less than 5 nm.

According to an embodiment, there is provided a Light Detection And Ranging (LiDAR) device comprising a laser emitting unit configured to emit a laser toward an object, wherein the laser emitting unit comprises a plurality of VCSEL emitter, and a sensor unit configured to receive the laser reflected by the object, wherein the VCSEL emitter includes a first Distributed Bragg Reflector (DBR) layer, a second DBR layer, an active layer configured to emit a laser beam, wherein the active layer disposed between the first DBR layer and the second DBR layer, a contact region disposed on the first DBR layer, and a reflector disposed on the contact region, wherein the reflector has a first surface facing to the contact region, wherein the first surface reflects the laser beam emitted from the active layer through the contact region.

According to an embodiment, there is provided a vertical cavity surface emitting laser (VCSEL) array comprising a first sub-array includes a plurality of VCSEL units arranged along a first axis, and wherein the first sub-array includes a first VCSEL unit includes a first upper contact and a first bottom contact, and a second VCSEL unit includes a second upper contact and a second bottom contact, a first contact electrically connected to the first upper contact and the second bottom contact, and a second contact electrically connected to the second upper contact and the first bottom contact, wherein the first VCSEL unit is operated when a first voltage is applied to the first contact and a second voltage smaller than the first voltage is applied to the second contact and wherein the second VCSEL unit is operated when the second voltage is applied to the first contact and the first voltage is applied to the second contact.

Here, the first upper contact and the second bottom contact are the same metal layer.

Here, the second upper contact and the first bottom contact are the same metal layer.

Here, the first voltage is positive voltage with respect to a reference voltage, wherein the second voltage is negative voltage with respect to the reference voltage.

Here, the VCSEL array further comprises a first wire electrically connected to the first contact, and a second wire electrically connected to the second contact.

Here, the first sub-array further includes a third VCSEL unit includes a third upper contact and a third bottom contact, and a fourth VCSEL unit includes a fourth upper contact and a fourth bottom contact, and the VCSEL array further comprises a third contact electrically connected to the third upper contact and the fourth bottom contact, the second contact electrically connected to the fourth upper contact and the third bottom contact, the third VCSEL unit is operated when a third voltage is applied to the second contact and a fourth voltage greater than the third voltage is applied to the fourth contact and the fourth VCSEL unit is operated when the fourth voltage is applied to the second contact and the third voltage is applied to the third contact.

Here, the VCSEL array further comprises a second sub-array includes a plurality of VCSEL units arranged along the first axis, wherein the first sub-array and the second sub-array are arranged along a second axis different from the first axis, and he second sub-array includes a third VCSEL unit includes a third upper contact and a third bottom contact, and a fourth VCSEL unit includes a fourth upper contact and a fourth bottom contact, and a third contact electrically connected to the third bottom contact and the fourth upper contact, the first contact electrically connected to the third upper contact and the fourth bottom contact, the fourth VCSEL unit is operated when a third voltage is applied to the first contact and a fourth voltage greater than the third voltage is applied to the third contact and the third VCSEL unit is operated when the fourth voltage is applied to the first contact and the third voltage is applied to the third contact.

According to another embodiment, there is provided a vertical cavity surface emitting laser (VCSEL) array comprising a first sub-array includes a plurality of VCSEL units arranged along a first axis, wherein the first sub-array includes a first VCSEL unit includes a first upper Distributed Bragg Reflector (DBR) and a first bottom DBR; and a second VCSEL unit includes a second upper Distributed Bragg Reflector (DBR) and a second bottom DBR, a first contact electrically connected to the first upper DBR and the second upper DBR, and a second contact electrically connected to the first bottom DBR and the second bottom DBR, wherein the first upper DBR and the second bottom DBR are doped with P type, wherein the second upper DBR and the first bottom DBR are doped with N type, wherein the first VCSEL unit is operated when a first voltage is applied to the first contact and a second voltage smaller than the first voltage is applied to the second contact and wherein the second VCSEL unit is operated when the second voltage is applied to the first contact and the first voltage is applied to the second contact.

Here, the first voltage is positive voltage with respect to a reference voltage, and the second voltage is negative voltage with respect to the reference voltage.

Here, the VCSEL array further comprises a common contact electrically connected to the first bottom DBR and the second contact electrically connected to the first bottom DBR and the second bottom DBR through the common contact.

Here, the VCSEL array further comprises a first wire electrically connected to the first contact, and a second wire electrically connected to the second contact.

Here, the VCSEL array further comprises a second sub-array includes a plurality of VCSEL units arranged along the first axis, wherein the first sub-array and the second sub-array are arranged along a second axis different from the first axis and wherein the second sub-array includes a third VCSEL unit includes a third upper DBR and a third bottom DBR, and a fourth VCSEL unit includes a fourth upper DBR and a fourth bottom DBR, and a third contact electrically connected to the third bottom DBR and the fourth bottom DBR, the third upper DBR and the fourth bottom DBR are doped with P type, the fourth upper DBR and the third bottom DBR are doped with N type, the first contact electrically connected to the third upper DBR and the fourth upper DBR, the fourth VCSEL unit is operated when a third voltage is applied to the first contact and a fourth voltage greater than the third voltage is applied to the third contact and the third VCSEL unit is operated when the fourth voltage is applied to the first contact and the third voltage is applied to the third contact.

Here, the VCSEL array further comprises a third wire electrically connected to the third contact.

According to still another embodiment, there is provided a vertical cavity surface emitting laser (VCSEL) array comprising a first sub-array includes a plurality of VCSEL units arranged along a first axis, wherein the first sub-array includes a first VCSEL unit includes a first Distributed Bragg Reflector (DBR) and a second DBR, and a second VCSEL unit includes a third Distributed Bragg Reflector (DBR) and a fourth DBR, a first contact electrically connected to the first DBR and the third DBR, and a second contact electrically connected to the second DBR and the fourth DBR, wherein the first DBR and the fourth DBR are doped with a first property, wherein the second DBR and the third DBR are doped with a second property different from the first property, wherein a reflectance of the second DBR is greater than a reflectance of the first DBR, wherein a reflectance of the fourth DBR is greater than a reflectance of the third DBR, wherein the first VCSEL unit is operated when a first voltage is applied to the first contact and a second voltage smaller than the first voltage is applied to the second contact and wherein the second VCSEL unit is operated when the second voltage is applied to the first contact and the first voltage is applied to the second contact.

According to an embodiment, there is provided a Light Detection And Ranging (LiDAR) device comprising a laser emitting unit configured to emit a laser toward an object, and a sensor unit configured to receive the laser reflected by the object, wherein the laser emitting unit includes a first sub-array includes a plurality of VCSEL units arranged along a first axis, and wherein the first sub-array includes a first VCSEL unit includes a first upper contact and a first bottom contact, and a second VCSEL unit includes a second upper contact and a second bottom contact, a first contact electrically connected to the first upper contact and the second bottom contact, and a second contact electrically connected to the second upper contact and the first bottom contact, wherein the first VCSEL unit is operated when a first voltage is applied to the first contact and a second voltage smaller than the first voltage is applied to the second contact and wherein the second VCSEL unit is operated when the second voltage is applied to the first contact and the first voltage is applied to the second contact.

According to another embodiment, there is provided a Light Detection And Ranging (LiDAR) device comprising a laser emitting unit configured to emit a laser toward an object, and a sensor unit configured to receive the laser reflected by the object, wherein the laser emitting unit includes a first sub-array includes a plurality of VCSEL units arranged along a first axis, wherein the first sub-array includes a first VCSEL unit includes a first upper Distributed Bragg Reflector (DBR) and a first bottom DBR, and a second VCSEL unit includes a second upper Distributed Bragg Reflector (DBR) and a second bottom DBR, a first contact electrically connected to the first upper DBR and the second upper DBR, and a second contact electrically connected to the first bottom DBR and the second bottom DBR, wherein the first upper DBR and the second bottom DBR are doped with P type, wherein the second upper DBR and the first bottom DBR are doped with N type, wherein the first VCSEL unit is operated when a first voltage is applied to the first contact and a second voltage smaller than the first voltage is applied to the second contact and wherein the second VCSEL unit is operated when the second voltage is applied to the first contact and the first voltage is applied to the second contact.

According to an embodiment, there is provided a vertical cavity surface emitting laser (VCSEL) array comprising a first sub-array includes a first VCSEL unit and a second VCSEL unit, wherein the first VCSEL unit and the second VCSEL unit are arranged along a first axis, a common contact connected to the first sub-array, a first contact electrically connected to a one end of the common contact, and a second contact electrically connected to the other end of the common contact to decrease a combined resistance of a first resistance and a second resistance, wherein the first resistance is the resistance between the one end of the first contact and the first VCSEL unit, and wherein the second resistance is the resistance between the first VCSEL unit and the second VCSEL unit, wherein the first VCSEL unit is adjacent to the one end of the common contact than the second VCSEL unit, and wherein the second VCSEL unit is adjacent to the other end of the common contact than the first VCSEL unit.

Here, a first voltage is applied to the first contact and a second voltage having the same magnitude as the first voltage is applied to the second contact.

Here, the VCSEL array further comprises a first wire connects the common contact and the first contact, and a second wire connects the common contact and the second contact.

Here, the first resistance includes the resistance of the first wire.

Here, the second resistance includes the resistance of the second wire.

Here, the VCSEL array further comprises a second sub-array includes the first VCSEL unit and a third VCSEL unit, wherein the first VCSEL unit and the third VCSEL unit are arranged along a second axis different from the first axis, a third contact disposed adjacent to one end of the second sub-array, and a fourth contact disposed adjacent to the other end of the second sub-array, the first VCSEL unit electrically connected to the third contact, and the third VCSEL unit electrically connected to the fourth contact.

Here, a third voltage is applied to the third contact and a fourth voltage having the same magnitude as the first voltage is applied to the fourth contact.

Here, one of a negative voltage and a positive voltage is applied to the first contact and the second contact, and the other is applied to the third contact and the fourth contact.

Here, the VCSEL array further comprises a third sub-array includes a third VCSEL unit and a fourth VCSEL unit, wherein the third VCSEL unit and the fourth VCSEL unit are arranged along the first axis, a fifth contact disposed adjacent to one end of the third sub-array, and a sixth contact disposed adjacent to the other end of the third sub-array, the third VCSEL unit electrically connected to the fifth contact, the fourth VCSEL unit electrically connected to the six contact, and a voltage is applied to the first contact, the second contact, the third contact and the fourth contact and no voltage is applied to the fifth contact and the sixth contact in order to operate the first VCSEL unit and not to operate the third VCSEL unit.

According to another embodiment, there is provided a vertical cavity surface emitting laser (VCSEL) array comprising a first sub-array includes a first VCSEL unit and a second VCSEL unit, wherein the first VCSEL unit and the second VCSEL unit are arranged along a first axis, a common contact connected to the first sub-array, a first contact electrically connected to a one end of the common contact, and a second contact electrically connected to the other end of the common contact to decrease a difference between a first combined resistance of the first VCSEL unit and a second combined resistance of the second VCSEL unit, wherein the first combined resistance is combined resistance of a first resistance and a second resistance, wherein the first resistance is the resistance between the one end of the common contact and the first VCSEL unit, wherein the second resistance is the resistance between the first VCSEL unit and the other end of the common contact wherein the second combined resistance is combined resistance of a third resistance and a fourth resistance, wherein the third resistance is the resistance between the one end of the common contact and the second VCSEL unit, and wherein the fourth resistance is the resistance between the second VCSEL unit and the other end of the common contact.

Here, the first VCSEL unit is adjacent to the one end of the common contact than the second VCSEL unit, and the second VCSEL unit is adjacent to the other end of the common contact than the first VCSEL unit.

Here, a first voltage is applied to the first contact and a second voltage having the same magnitude as the first voltage is applied to the second contact.

Here, the VCSEL array further comprises a first wire connects the common contact and the first contact, and a second wire connects the common contact and the second contact.

Here, the first resistance includes the resistance of the first wire.

Here, the fourth resistance includes the resistance of the second wire.

Here, the VCSEL array further comprises a second sub-array includes the first VCSEL unit and a third VCSEL unit, wherein the first VCSEL unit and the third VCSEL unit are arranged along a second axis different from the first axis, a third contact disposed adjacent to one end of the second sub-array, and a fourth contact disposed adjacent to the other end of the second sub-array, the first VCSEL unit electrically connected to the third contact, and the third VCSEL unit electrically connected to the fourth contact.

Here, wherein a third voltage is applied to the third contact and a fourth voltage having the same magnitude as the first voltage is applied to the fourth contact.

Here, one of a negative voltage and a positive voltage is applied to the first contact and the second contact, and the other is applied to the third contact and the fourth contact.

Here, the VCSEL array further comprises a third sub-array includes a third VCSEL unit and a fourth VCSEL unit, wherein the third VCSEL unit and the fourth VCSEL unit are arranged along the first axis, a fifth contact disposed adjacent to the one end of the third sub-array, and a sixth contact disposed adjacent to the other end of the third sub-array, the third VCSEL unit electrically connected to the fifth contact, the fourth VCSEL unit electrically connected to the sixth contact, and a voltage is applied to the first contact, the second contact, the third contact and the fourth contact and no voltage is applied to the fifth contact and the sixth contact in order to operate the first VCSEL unit and not to operate the third VCSEL unit.

According to an embodiment, there is provided a Light Detection And Ranging (LiDAR) device comprising a laser emitting unit configured to emit a laser toward an object, and a sensor unit configured to receive the laser reflected by the object, wherein the laser emitting unit includes a first sub-array includes a first VCSEL unit and a second VCSEL unit, wherein the first VCSEL unit and the second VCSEL unit are arranged along a first axis, a common contact connected to the first sub-array, a first contact electrically connected to a one end of the common contact, and a second contact electrically connected to the other end of the common contact to decrease a combined resistance of a first resistance and a second resistance, wherein the first resistance is the resistance between the one end of the first contact and the first VCSEL unit, and wherein the second resistance is the resistance between the first VCSEL unit and the second VCSEL unit, wherein the first VCSEL unit is adjacent to the one end of the common contact than the second VCSEL unit, wherein the second VCSEL unit is adjacent to the other end of the common contact than the first VCSEL unit.

According to another embodiment, there is provided a Light Detection And Ranging (LiDAR) device comprising a laser emitting unit configured to emit a laser toward an object, and a sensor unit configured to receive the laser reflected by the object, wherein the laser emitting unit includes a first sub-array includes a first VCSEL unit and a second VCSEL unit, wherein the first VCSEL unit and the second VCSEL unit are arranged along a first axis, a common contact connected to the first sub-array, a first contact electrically connected to a one end of the common contact, and a second contact electrically connected to the other end of the common contact to decrease a difference between a first combined resistance of the first VCSEL unit and a second combined resistance of the second VCSEL unit, wherein the first combined resistance is combined resistance of a first resistance and a second resistance, wherein the first resistance is the resistance between the one end of the common contact and the first VCSEL unit, wherein the second resistance is the resistance between the first VCSEL unit and the other end of the common contact, wherein the second combined resistance is combined resistance of a third resistance and a fourth resistance, wherein the third resistance is the resistance between the one end of the common contact and the second VCSEL unit, and wherein the fourth resistance is the resistance between the second VCSEL unit and the other end of the common contact.

According to another embodiment, there is provided a lidar (light detection and ranging) device for measuring a distance using a laser beam, comprising: a laser emitting unit including a plurality of laser emitting elements for emitting a laser beam, a detecting unit configured to receive a reflected laser beam, wherein the laser emitting unit includes first laser emitting element and second laser emitting element, wherein a first laser beam emitted from the first laser emitting element and a second laser beam emitted from the second laser emitting element are emitted to have a first light density and a second light density respectively, in a first region spaced a first distance from the lidar device, wherein a second distance between the lidar device and a second region where the first laser beam and the second laser beam overlap is determined based on a third distance between the first laser emitting element and the second laser emitting element, wherein the third distance is set so that a light density of a portion where the first and second laser beams overlap in the second region is equal to or less than the first light density, wherein a size of the portion where the first and second laser beam overlap is increased as a distance from the lidar device increases, wherein the third distance is set so that the size of the portion where the first and second laser beam overlap is 80% or more of a irradiation area of the first laser beam at 100 m from the lidar device, and wherein the second distance is greater than the first distance.

Here, wherein the first light density is a reference light density that does not affect human eye health.

Here, wherein the first distance is a reference distance for measuring eye-safety standards.

Here, wherein the plurality of laser emitting elements comprise VCSEL (Vertical Cavity Surface Emitting Laser) unit including plurality of VCSEL emitters.

Here, wherein the third distance is set so that the size of the portion where the first and second laser beam overlap is 90% or more of the irradiation area of the first laser beam at 200 m from the lidar device.

Here, further comprising: a controller configured to control the first laser emitting element and the second laser emitting element and obtain a distance information related to an object, wherein the controller controls the first laser emitting element to emit the first laser beam in a first direction at a first time, and when the distance information is not obtained by using the first laser beam emitted at the first time, the controller controls the first and second laser emitting element to emit the first and second laser beam in the first direction at a second time different from the first time, and when the distance information is obtained by using the first laser beam emitted at the first time, the controller controls the first laser emitting element to emit the first laser beam in the first direction at a third time different from the first time.

Here, wherein the laser emitting unit further include third laser emitting element and forth laser emitting element, wherein a third laser beam emitted from the third laser emitting element and a fourth laser beam emitted from the fourth laser emitting element are emitted to have a third light density and a fourth light density respectively, in the first region, wherein the first laser emitting unit, the second laser emitting unit and the third laser emitting unit is arranged so that a light density of a portion where the first, second and third laser beams overlap is equal to or less than the first light density Here, wherein the first light density is a reference light density that does not affect human eye health.

Here, further comprising: a controller configured to control the first laser emitting element, the second laser emitting element and the third laser emitting element and obtain a distance information related to an object, wherein the controller controls the first laser emitting element to emit the first laser beam in a first direction at a first time, and when the distance information is not obtained by using the first laser beam emitted at the first time, the controller controls the first and second laser emitting element to emit the first and second laser beam in the first direction at a second time different from the first time, when the distance information is obtained by using the first laser beam emitted at the first time, the controller controls the first laser emitting element to emit the first laser beam in the first direction at a third time different from the first time, when the distance information is not obtained by using the first and second laser beam emitted at the second time, the controller controls the first, second and third laser emitting element to emit the first, second and third laser beam in the first direction at fourth time different from the first time, and when the distance information is obtained by using the first and second laser beam emitted at the seoncd time, the controller controls the first and second laser emitting element to emit the first and second laser beam in the first direction at fifth time different from the first time.

According to another embodiment, there is provided a laser emitting device, comprising: a first VCSEL (Vertical Cavity Surface Emitting Laser) unit including at least one VCSEL emitter and configured to emit a first laser beam irradiated in a first direction, a second VCSEL unit including at least one VCSEL emitter and configured to emit a second laser beam irradiated in a second direction, a third VCSEL unit includes at least one VCSEL emitter and configured to emit a third laser beam irradiated in the first direction, a fourth VCSEL unit includes at least one VCSEL emitter and configured to emit a fouth laser beam irradiated in the second direction and a controller configured to control the first, second, third and fourth VCSEL units, wherein the controller operates the first and third VCSEL units to emit the first and third lasers, and turns off the second and fourth VCSEL units at a first time, wherein the controller operates the second and fourth VCSEl units to emit the second and fourth lasers, and turns off the first and third VCSEL units at a second time different from the first time, wherein the first and third VCSEL units are spaced apart by a first distance, wherein the second and fourth VCSEL units are spaced apart by a second distance, wherein the first and second VCSEL units are spaced apart by a third distance, wherein the third distance is smaller than the first and second distances.

Here, wherein the first distance and the second distance is different from each other.

Here, the first, second, third and fourth VCSEL unit are arranged such that the first and third laser beams and the second and fourth laser beams overlap each other at least 10 cm from the laser emitting device.

Here, the first, second, third and fourth VCSEL unit are included in one VCSEL array.

Here, wherein the first distance is set so that the size of the portion where the first and third laser beams overlap is 80% or more of a irradiation area of the first laser beam at 100 m from the lidar device.

Here, wherein the second distance is set so that the size of the portion where the second and fourth laser beams overlap is 80% or more of a irradiation area of the second laser beam at 100 m from the lidar device.

According to another embodiment, there is provided a laser emitting device, comprising: a first VCSEL (Vertical Cavity Surface Emitting Laser) unit includes at least one VCSEL emitter and configured to emit a first laser beam irradiated in a first direction, a second VCSEL unit includes at least one VCSEL emitter and configured to emit a second laser beam irradiated in a second direction, a third VCSEL unit includes at least one VCSEL emitter and configured to emit a third laser beam irradiated in the first direction, a fourth VCSEL unit includes at least one VCSEL emitter and configured to emit a fouth laser beam irradiated in the second direction and a controller configured to control the first, second, third and fourth VCSEL units, wherein the controller operates the first and third VCSEL units to emit the first and third lasers, and turns off the second and fourth VCSEL units at a first time, wherein the controller operates the second and fourth VCSEl units to emit the second and fourth lasers, and turns off the first and third VCSEL units at a second time different from the first time, wherein the first and second VCSEL unit are included in a first VCSEL array and the third and fourth VCSEL unit are included in a second VCSEL array, wherein the first and second VCSEL array are arranged on the same plane.

Here, wherein a position in the first VCSEL array of the first VCSEL unit corresponds to a position in the second VCSEL array of the third VCSEL unit.

Here, wherein a position in the first VCSEL array of the first VCSEL unit does not correspond to a position in the second VCSEL array of the third VCSEL unit.

Here, wherein the first VCSEL array and the second VCSEL array are arranged on the same plane.

Here, wherein the first VCSEL array includes a first steering component and the second VCSEL array includes a second steering component, wherein the shapes of the first and second steering components are identical to each other.

Here, wherein the size of a portion where the first and third laser beams overlap is 80% or more of a irradiation area of the first laser beam at 100 m from the lidar device.

Here, wherein the size of a portion where the second and fourth laser beams overlap is 80% or more of a irradiation area of the second laser beam at 100 m from the lidar device.

According to another embodiment, there is provided, a lidar (light detection and ranging) device for measuring a distance using a laser beam, comprising: a first VCSEL (Vertical Cavity Surface Emitting Laser) unit includes at least one VCSEL emitter and configured to emit a first laser beam irradiated in a first direction, a second VCSEL unit includes at least one VCSEL emitter and configured to emit a second laser beam irradiated in a second direction, a third VCSEL unit includes at least one VCSEL emitter and configured to emit a third laser beam irradiated in the first direction, a fourth VCSEL unit includes at least one VCSEL emitter and configured to emit a fouth laser beam irradiated in the second direction, a detecting unit configured to receive a reflected laser beam and a controller configured to control the first VCSEL unit, the second VCSEL unit, the third VCSEL unit and the fourth VCSEL unit and obtain a distance information related to an object, wherein the controller controls the first VCSEL unit to emit the first laser beam in a first direction at a first time and the second VCSEL unit to emit the second laser beam in a second direction, when the distance information is not obtained by using the first laser beam emitted at the first time, the controller controls the first and third VCSEL unit to emit the first and third laser beam in the first direction at a third time, when the distance information is obtained by using the second laser beam emitted at the second time, the controller controls the second VCSEL unit to emit the second laser beam in the second direction at a fourth time.

Here, wherein the first and third VCSEL units are spaced apart by a second distance or more so that the fisrt and third laser beams overlap at a first distance or more from the lidar device, and wherein the second and fourth VCSEL units are spaced apart by a third distance or more so that the second and fourth laser beams overlap at the first distance or more from the lidar device.

Here, the first distance is a reference distance for measuring eye-safety standards.

Here, wherein a distance between the first and the third VCSEL unit is set so that a size of a portion where the first and the third laser beam overlap is 80% or more of a irradiation area of the first laser beam at 100 m from the lidar device and a size of the portion where the first and the third laser beam overlap is 90% or more of the irradiation area of the first laser beam at 200 m from the lidar device.

According to another embodiment, there is provided a method for measuring a distance using a laser beam emitted from a VCSEL unit including at least one of a VCSEL emitter, comprising: emitting a first laser beam irradiated in a first direction, by operating a first VCSEL unit at a first time, emitting a second laser beam irradiated in a second direction, by operating a second VCSEL unit at a second time, emitting the fisrt laser beam and a third laser beam irradiated in the first direction, by operating the first VCSEL unit and a third VCSEL unit at a third time, measuring a first distance for a first object using the first and third laser beams emitted at the third time, emitting the second laser beam, by operating the second VCSEL unit at a fourth time, and measuring a second distance for a second object using the second laser beam emitted at the fourth time, wherein the first distance is greater than the second distance.

According to another embodiment, there is provided an autonomous vehicle that can drive using detecting an object aroud the vehicle, comprising: a vehicle body, a lidar (light detection and ranging) device and wherein the lidar device is comprising: a first VCSEL (Vertical Cavity Surface Emitting Laser) unit including at least one VCSEL emitter and configured to emit a first laser beam irradiated in a first direction, a second VCSEL unit including at least one VCSEL emitter and configured to emit a second laser beam irradiated in a second direction, a third VCSEL unit includes at least one VCSEL emitter and configured to emit a third laser beam irradiated in the first direction, a fourth VCSEL unit includes at least one VCSEL emitter and configured to emit a fouth laser beam irradiated in the second direction and a controller configured to control the first, second, third and fourth VCSEL units, wherein at a first time the controller operates the first and third VCSEL units to emit the first and third lasers, and turns off the second and fourth VCSEL units, and wherein at a second time different from the first time the controller operates the second and fourth VCSEL units to emit the second and fourth lasers, and turns off the first and third VCSEL units.

Here, wherein the first and third VCSEL units are spaced apart by a second distance or more so that the fisrt and third laser beams overlap at a first distance or more from the lidar device, and wherein the second and fourth VCSEL units are spaced apart by a third distance or more so that the second and fourth laser beams overlap at the first distance or more from the lidar device.

According to another embodiment, there is provided a laser emitting device, comprising: a VCSEL (Vertical Cavity Surface Emitting Laser) array including a first VCSEL unit and a second VCSEL unit, wherein the first VCSEL unit includes a first VCSEL emitter and a second VCSEL emitter, and the second VCSEL unit includes a third VCSEL emitter and a fourth VCSEL emitter, a micro-lens array configured to collimate a laser beam emitted from the VCSEL array, a prism array configured to steer the laser beam collimated from the micro-lens array, wherein the micro-lens array includes a first micro-lens element disposed corresponding to the first VCSEL emitter, a second micro-lens element disposed corresponding to the second VCSEL emitter, a third micro-lens element disposed corresponding to the third VCSEL emitter and a fourth micro-lens element disposed corresponding to the fourth VCSEL emitter, wherein the prism array includes a first prism element and a second prism element, wherein the first prism element is disposed corresponding to the first VCSEL unit and configured to steer a first laser beam emitted from the first VCSEL unit at a first angle, wherein the second prism element is disposed corresponding to the second VCSEL unit and configured to steer a second laser beam emitted from the second VCSEL unit at a second angle, wherein the first and second VCSEL emitters share a first N-contact and a first P-contact, wherein the third and fourth VCSEL emitters share a second N-contact and a second P-contact, wherein the first and second angle are is different from each other.

Here, wherein the first N-contact and the second N-contact are electrically connected to each other, but the first P-contact and the second P-contact are not electrically connected to each other.

Here, wherein the first P-contact and the second P-contact are electrically connected to each other, but the first N-contact and the second N-contact are not electrically connected to each other.

Here, a diameter of the first micro-lens element is larger than a diameter of the first VCSEL emitter and is set based on a distance between the first VCSEL emitter and the second VCSEL emitter.

Here, wherein the laser emitting device includes a controller configured to control the VCSEL array, wherein the controller is configured to electrically connect the first N-contact and the first P-contact so that the first laser beam is emitted from the first VCSEL unit at a first time, and wherein the controller is configured to electrically connect the second N-contact and the second P-contact so that the second laser beam is emitted from the second VCSEL unit at a second time different from the first time.

Here, wherein a direction of the first laser beam irradiated from the laser emitting device at the first time and a direction of the second laser beam irradiated from the laser emitting device at the second time are different from each other.

According to another embodiment, there is provided a laser emitting device, comprising: a VCSEL (Vertical Cavity Surface Emitting Laser) array including a first VCSEL emitter, a micro-lens array configured to collimate a laser beam emitted from the VCSEL array, a prism array configured to steer the laser beam collimated from the micro-lens array, wherein the micro-lens array includes a first micro-lens element configured to collimate a first laser beam emitted from the first VCSEL emitter, wherein the first laser beam collimated from the first micro-lens element has divergence angle, $\theta_D$, wherein the prism array includes a first prism element configured to steer the first laser beam, wherein when a refractive index of the first prism element is n, and an inclination angle of the first prism element is $\theta$, the inclination angle of the first prism element is formed to satisfy the following equation:

$$\theta \leq \sin^{-1}\left(\frac{1}{n}\right) - \frac{\theta_D}{2}$$

Here, wherein when the first laser beam is steered through the first prism element at a first angle about a normal of the prism array, the first angle is set to 25 degrees or less so that a reflectance of the first laser beam reflected by the first prism element is 10% or less.

Here, wherein the VCSEL array includes a second VCSEL emitter configured to emit a second laser beam, wherein the micro-lens array includes a second micro-lens element configured to collimate the second laser beam, wherein the first prism element is arranged to steer the first and second laser beams at the same angle.

Here, wherein the VCSEL array includes a third VCSEL emitter configured to emit a third laser beam, wherein the micro-lens array includes a third micro-lens element configured to collimate the third laser beam, wherein the prism array includes a second prism element configured to steer the third laser beam, wherein the third laser beam collimated from the third micro-lens element has divergence angle $\theta_{D2}$, wherein when a refractive index of the second prism element is n, and an inclination angle of the second prism element is $\theta_2$, the inclination angle of the second prism element is formed to satisfy $$\theta \leq \sin^{-1}\left(\frac{1}{m}\right) - \frac{\theta_{D2}}{2},$$

wherein an irradiation direction of the third laser beam is different from an irradiation direction of the first and second laser beams.

According to another embodiment, there is provided a laser emitting device, comprising: a VCSEL (Vertical Cavity Surface Emitting Laser) array including a first VCSEL unit wherein the first VCSEL unit includes a first VCSEL emitter and a second VCSEL emitter, a micro-lens array configured to collimate a laser beam emitted from the VCSEL array, a prism array configured to steer the laser beam collimated from the micro-lens array, wherein the micro-lens array includes a first micro-lens element disposed corresponding to the first VCSEL emitter, a second micro-lens element disposed corresponding to the second VCSEL emitter wherein the micro-lens array includes a first micro-lens unit disposed corresponding to the first VCSEL unit and including the first micro-lens element and the second micro-lens element, wherein the prism array includes a first prism element disposed corresponding to the first VCSEL unit and configured to steer a first laser beam emitted from the first VCSEL unit at a first angle, wherein a diameter of the first VCSEL unit is smaller than a diameter of the first micro-lens unit and the diameter of the first micro-lens unit is smaller than the length of one side of the first prism element.

Here, wherein a diameter of the first micro-lens element is larger than a diameter of the first VCSEL emitter, and is set based on a distance between the first VCSEL emitter and the second VCSEL emitter.

Here, wherein a diameter of the first micro-lens element is set to be less than or equal to sum of a diameter of the first VCSEL emitter and a distance between the first VCSEL emitter and the second VCSEL emitter.

Here, wherein the VCSEL array includes a second VCSEL unit including a third VCSEL emitter, wherein the micro-lens array includes a third micro-lens element disposed corresponding to the third VCSEL emitter, wherein the prism array includes a second prism element disposed corresponding to the second VCSEL unit and configured to steer a second laser beam emitted from the second VCSEL unit at a second angle, wherein a distance between the first VCSEL unit and the second VCSEL unit is greater than a distance between the first micro-lens unit and the second micro-lens unit and the distance between the first micro-lens unit and the second micro-lens unit is greater than a distance between the first prism element and the second prism element.

According to another embodiment, there is provided a LiDAR (Light detection and ranging) device, comprising: a laser emitting unit configured to emit a laser beam, a detector configured to receive the laser beam scattered by an object, a controller configured to control the operation of the laser emitting unit and the detector, and obtain a distance from the object based on the laser beam received by the detector, wherein the laser emitting unit comprising: a VCSEL (Vertical Cavity Surface Emitting Laser) array including a first VCSEL unit and a second VCSEL unit wherein the first VCSEL unit includes a first VCSEL emitter and a second VCSEL emitter, and the second VCSEL unit includes a third VCSEL emitter and a fourth VCSEL emitter, a collimation component configured to collimate a laser beam emitted from the VCSEL array, a steering component configured to steer the laser beam collimated from the collimation component, wherein the first and second VCSEL emitters share a first N-contact and a first P-contact, wherein the third and fourth VCSEL emitters share a second N-contact and a second P-contact, wherein the controller is configured to electrically connect the first N-contact and the first P-contact so that the first laser beam is emitted from the first VCSEL unit at a first time, and wherein the controller is configured to electrically connect the second N-contact and the second P-contact so that the second laser beam is emitted from the second VCSEL unit at a second time different from the first time.

Here, wherein the collimation component includes a first micro-lens element disposed corresponding to the first VCSEL emitter, a second micro-lens element disposed corresponding to the second VCSEL emitter, a third micro-lens element disposed corresponding to the third VCSEL emitter and a fourth micro-lens element disposed corresponding to the fourth VCSEL emitter, wherein a diameter of the first micro-lens element is larger than a diameter of the first VCSEL emitter, and is set based on a distance between the first VCSEL emitter and the second VCSEL emitter.

Here, wherein the collimation component includes a first micro-lens element disposed corresponding to the first VCSEL emitter, a second micro-lens element disposed corresponding to the second VCSEL emitter, wherein a diameter of the first micro-lens unit is larger than a diameter of the first VCSEL unit, and a distance between the first micro-lens unit and the second micro-lens unit is smaller than a distance between the first VCSEL unit and the second VCSEL unit.

Here, wherein the first N-contact and the second N-contact are electrically connected to each other, but the first P-contact and the second P-contact are not electrically connected to each other.

Here, wherein the first P-contact and the second P-contact are electrically connected to each other, but the first N-contact and the second N-contact are not electrically connected to each other.

Here, wherein the first laser beam collimated from the first micro-lens element has divergence angle $\theta_D$, wherein the prism array includes a first prism element configured to steer the first laser beam, wherein when a refractive index of the first prism element is n, and an inclination angle of the first prism element is θ, the inclination angle of the first prism element is formed to satisfy $$\theta \leq \sin^{-1}\left(\frac{1}{n}\right) - \frac{\theta_D}{2}.$$

Here, wherein when the first laser beam is steered through the first prism element at a first angle about a normal of the prism array, the first angle is set to 25 degrees or less so that a reflectance of the first laser beam reflected by the first prism element is 10% or less.

Hereinafter, a LiDAR device of the present disclosure will be described.

A LIDAR device is a device for detecting a distance to an object and the location of an object using a laser. For example, a LiDAR device may emit a laser beam. When the emitted laser beam is reflected by an object, the LiDAR device may receive the reflected laser beam and measure a distance between the object and the LiDAR device and the location of the object. In this case, the distance from the object and the location of the object may be expressed in a coordination system. For example, the distance from the object and the location of the object may be expressed in a spherical coordinate system (r, θ, φ). However, the present disclosure is not limited thereto, and the distance and location may be expressed in a Cartesian coordinate system (X, Y, Z) or a cylindrical coordinate system (r, θ, z).

Also, the LiDAR device may use laser beams output from the LiDAR device and reflected by an object in order to measure a distance from the object.

The LiDAR device according to an embodiment may use a time of flight (TOF) of a laser beam, which is the time taken by a laser beam to be detected after being emitted, in order to measure the distance from the object. For example, the LiDAR device may measure the distance from the object using a difference between a time value based on an emitting time of an emitted laser beam and a time value based on a detection time of a detected laser beam reflected by the object.

Also, the LiDAR device may measure the distance from the object using a difference between a time value at which an emitted laser beam is detected immediately without reaching an object and a time value based on a detection time of a detected laser beam reflected by the object.

There may be a difference between a time point at which the LiDAR device transmits a trigger signal for emitting a laser beam using a control unit and an actual emission time point, which is a time when the laser beam is actually emitted from a laser beam output element. Actually, no laser beam is emitted in a period between the time point of the trigger signal and the actual emission time point. Thus, when the period is included in the ToF of the laser beam, precision may be decreased.

The actual emission time point of the laser beam may be used to improve the precision of the measurement of the TOF of the laser beam. However, it may be difficult to determine the actual emission time point of the laser beam. Therefore, a laser beam should be directly delivered to a detecting unit as soon as or immediately after the laser beam is emitted from the laser emitting element without reaching the object.

For example, an optic may be disposed on an upper portion of the laser emitting element, and thus the optic may enable a laser beam emitted from the laser emitting element to be detected by a detecting unit immediately without reaching an object. The optic may be a mirror, a lens, a prism, a metasurface, or the like, but the present disclosure is not limited thereto. The optic may include one optic or a plurality of optics.

Also, for example, a detecting unit may be disposed on an upper portion of the laser emitting element, and thus a laser beam emitted from the laser emitting element may be detected by the detecting unit immediately without reaching an object. The detecting unit may be spaced a distance of 1 mm, 1 μm, 1 nm, or the like from the laser emitting element, but the present disclosure is not limited thereto. Alternatively, the detecting unit may be adjacent to the laser emitting element with no interval therebetween. An optic may be present between the detecting unit and the laser emitting element, but the present disclosure is not limited thereto.

Also, the LiDAR device according to an embodiment may use a triangulation method, an interferometry method, a phase shift measurement, and the like rather than the TOF method to measure a distance to an object, but the present disclosure is not limited thereto.

A LIDAR device according to an embodiment may be installed in a vehicle. For example, the LiDAR device may be installed on a vehicle's roof, hood, headlamp, bumper, or the like.

Also, a plurality of LiDAR devices according to an embodiment may be installed in a vehicle. For example, when two LiDAR devices are installed on a vehicle's roof, one LiDAR device is for monitoring an area in front of the vehicle, and the other one is for monitoring an area behind the vehicle, but the present disclosure is not limited thereto. Also, for example, when two LiDAR devices are installed on a vehicle's roof, one LiDAR device is for monitoring an area to the left of the vehicle, and the other one is for monitoring an area to the right of the vehicle, but the present disclosure is not limited thereto.

Also, the LiDAR device according to an embodiment may be installed in a vehicle. For example, when the LiDAR device is installed in a vehicle, the LiDAR device is for recognizing a driver's gesture while driving, but the present disclosure is not limited thereto. Also, for example, when the LiDAR device is installed inside or outside a vehicle, the LiDAR device is for recognizing a driver's face, but the present disclosure is not limited thereto.

A LIDAR device according to an embodiment may be installed in an unmanned aerial vehicle. For example, the LiDAR device may be installed in an unmanned aerial vehicle (UAV) System, a drone, a remotely piloted vehicle (RPV), an unmanned aircraft system (UAS), a remotely piloted air/aerial vehicle (RPAV), a remotely piloted aircraft system (RPAS), or the like.

Also, a plurality of LiDAR devices according to an embodiment may be installed in an unmanned aerial vehicle. For example, when two LiDAR devices are installed in an unmanned aerial vehicle, one LiDAR device is for monitoring an area in front of the unmanned aerial vehicle, and the other one is for monitoring an area behind the unmanned aerial vehicle, but the present disclosure is not limited thereto. Also, for example, when two LiDAR devices are installed in an unmanned aerial vehicle, one LiDAR device is for monitoring an area to the left of the aerial vehicle, and the other one is for monitoring an area to the right of the aerial vehicle, but the present disclosure is not limited thereto.

A LIDAR device according to an embodiment may be installed in a robot. For example, the LiDAR device may be installed in a personal robot, a professional robot, a public service robot, or other industrial robots or manufacturing robots.

Also, a plurality of LiDAR devices according to an embodiment may be installed in a robot. For example, when two LiDAR devices are installed in a robot, one LiDAR device is for monitoring an area in front of the robot, and the other one is for monitoring an area behind the robot, but the present disclosure is not limited thereto. Also, for example, when two LiDAR devices are installed in a robot, one LiDAR device is for monitoring an area to the left of the robot, and the other one is for monitoring an area to the right of the robot, but the present disclosure is not limited thereto.

Also, a LiDAR device according to an embodiment may be installed in a robot. For example, when the LiDAR device is installed in a robot, the LiDAR device is for recognizing a human face, but the present disclosure is not limited thereto.

Also, a LiDAR device according to an embodiment may be installed for industrial security. For example, the LiDAR device may be installed in a smart factory for the purpose of industrial security.

Also, a plurality of LiDAR devices according to an embodiment may be installed in a smart factory for the purpose of industrial security. For example, when two LiDAR devices are installed in a smart factory, one LiDAR device is for monitoring an area in front of the smart factory, and the other one is for monitoring an area behind the smart factory, but the present disclosure is not limited thereto. Also, for example, when two LiDAR devices are installed in a smart factory, one LiDAR device is for monitoring an area to the left of the smart factory, and the other one is for monitoring an area to the right of the smart factory, but the present disclosure is not limited thereto.

Also, a LiDAR device according to an embodiment may be installed for industrial security. For example, when the LiDAR device is installed for industrial security, the LiDAR device is for recognizing a human face, but the present disclosure is not limited thereto.

Various embodiments of elements of the LiDAR device will be described in detail below.

FIG. 1 is a diagram illustrating a LiDAR device according to an embodiment.

Referring to FIG. 1, a LiDAR device 1000 according to an embodiment may include a laser emitting unit 100.

In this case, the laser emitting unit 100 according to an embodiment may emit a laser beam.

Also, the laser emitting unit 100 may include one or more laser emitting elements. For example, the laser emitting unit 100 may include a single laser emitting element and may include a plurality of laser emitting elements. Also, when the laser emitting unit 100 includes a plurality of laser emitting elements, the plurality of laser emitting elements may constitute one array.

Also, the laser emitting unit 100 may include a laser diode (LD), a solid-state laser, a high power laser, a light-emitting diode (LED), a vertical-cavity surface-emitting laser (VCSEL), an external cavity diode laser (ECDL), and the like, but the present disclosure is not limited thereto.

Also, the laser emitting unit 100 may output a laser beam of a certain wavelength. For example, the laser emitting unit 100 may output a laser beam with a wavelength of 905 nm or a laser beam with a wavelength of 1550 nm. Also, for example, the laser emitting unit 100 may output a laser beam with a wavelength of 940 nm. Also, for example, the laser emitting unit 100 may output a laser beam with a plurality of wavelengths ranging between 800 nm and 1000 nm. Also, when the laser emitting unit 100 includes a plurality of laser emitting elements, some of the plurality of laser emitting elements may output a laser beam with a wavelength of 905 nm, and the others may output a laser beam with a wavelength of 1500 nm.

Referring to FIG. 1 again, the LiDAR device 1000 according to an embodiment may include an optic unit 200.

Herein, the optic unit may be variously expressed as a steering unit, a scanning unit, etc., but the present disclosure is not limited thereto.

In this case, the optic unit 200 according to an embodiment may change a flight path of a laser beam. For example, the optic unit 200 may change a flight path of a laser beam such that a laser beam emitted from the laser emitting unit 100 is directed to a scanning region. Also, for example, the optic unit 200 may change a flight path of laser beam such that a laser beam reflected by an object located in the scanning region is directed to a detecting unit.

In this case, the optic unit 200 according to an embodiment may change a flight path of laser beam by reflecting a laser beam. For example, the optic unit 200 may change flight path of a laser beam by reflecting a laser beam emitted from the laser emitting unit 100 such that the laser beam is directed to the scanning region. Also, for example, the optic unit 200 may change a flight path of laser beam such that a laser beam reflected by an object located in the scanning region is directed to the detecting unit.

Also, the optic unit 200 according to an embodiment may include various optic means to reflect laser beams. For example, the optic unit 200 may include a mirror, a resonance scanner, a micro-electromechanical system (MEMS) mirror, a voice coil motor (VCM), a polygonal mirror, a rotating mirror, or a galvano mirror, and the like, but the present disclosure is not limited thereto.

Also, the optic unit 200 according to an embodiment may change a flight path of laser beam by refracting laser beams. For example, the optic unit 200 may change a flight path of laser beam by refracting a laser beam emitted from the laser emitting unit 100 such that the laser beam is directed to the scanning region. Also, for example, the optic unit 200 may change a flight path of laser beam such that a laser beam reflected by an object located in the scanning region is directed to the detecting unit.

Also, the optic unit 200 according to an embodiment may include various optic means to refract laser beams. For example, the optic unit 200 may include lenses, prisms, microlenses, or microfluidic lenses, but the present disclosure is not limited thereto.

Also, the optic unit 200 according to an embodiment may change a flight path of laser beam by changing the phase of a laser beam. For example, the optic unit 200 may change a flight path of laser beam by changing the phase of a laser beam emitted from the laser emitting unit 100 such that the laser beam is directed to the scanning region. Also, for example, the optic unit 200 may change a flight path of laser beam such that a laser beam reflected by an object located in the scanning region is directed to the sensor unit.

Also, the optic unit 200 according to an embodiment may include various optic means to change the phase of a laser beam. For example, the optic unit 200 may include an optical phased array (OPA), a metalens, a metasurface, or the like, but the present disclosure is not limited thereto.

Also, the optic unit 200 according to an embodiment may include one or more optic means. Also, for example, the optic unit 200 may include a plurality of optic means.

Referring to FIG. 1 again, the LiDAR device 1000 according to an embodiment may include a detecting unit 300.

Herein, the detecting unit may be variously expressed as a light receiving unit, a sensor unit, etc., but the present disclosure is not limited thereto.

In this case, the detecting unit 300 according to an embodiment may detect laser beams. For example, the sensor unit may detect a laser beam reflected by an object located in the scanning region.

Also, the detecting unit 300 according to an embodiment may receive a laser beam and generate an electric signal based on the received laser beam. For example, the detecting unit 300 may detect a laser beam reflected by an object located in the scanning region and generate an electric signal based on the received laser beam. Also, for example, the detecting unit 300 may receive a laser beam reflected by an object located in the scanning region through one or more optical means and generate an electric signal based on the received laser beam. Also, for example, the detecting unit 300 may receive a laser beam reflected by an object located in the scanning region through an optical filter and generate an electric signal based on the received laser beam.

Also, the detecting unit 300 according to an embodiment may detect the laser beam based on the generated electric signal. For example, the detecting unit 300 may detect the laser beam by comparing the magnitude of the generated electric signal to a predetermined threshold, but the present disclosure is not limited thereto. Also, for example, the detecting unit 300 may detect the laser beam by comparing the rising edge, falling edge, or the median of the rising edge and the falling edge of the generated electric signal to a predetermined threshold, but the present disclosure is not limited thereto. Also, for example, the detecting unit 300 may detect the laser beam by comparing the peak value of the generated electric signal to a predetermined threshold, but the present disclosure is not limited thereto.

Also, the detecting unit 300 according to an embodiment may include various detecting elements. For example, the detecting unit 300 may include a PN photodiode, a phototransistor, a PIN photodiode, an avalanche photodiode (APD), a single-photon avalanche diode (SPAD), silicon photomultipliers (SiPM), a time-to-digital converter (TDC), a comparator, a complementary metal-oxide-semiconductor (CMOS), a charge-coupled device (CCD), or the like, but the present disclosure is not limited thereto.

For example, the detecting unit 300 may be a two-dimensional (2D) SPAD array, but the present disclosure is not limited thereto. Also, for example, the SPAD array may include a plurality of SPAD units, and each SPAD unit may include a plurality of SPAD pixels.

In this case, the detecting unit 300 may generate a histogram by accumulating a plurality of data sets based on output signals of the detecting elements N times using the 2D SPAD array. For example, the detecting unit 300 may use the histogram to detect a reception time point of a laser beam that is reflected by an object and received.

For example, the detecting unit 300 may use the histogram to determine the peak time point of the histogram as the reception time point at which the laser beam reflected by the object is received, but the present disclosure is not limited thereto. Also, for example, the detecting unit 300 may use the histogram to determine a time point at which the histogram is greater than or equal to a predetermined value as the reception time point at which the laser beam reflected by the object is received, but the present disclosure is not limited thereto.

Also, the detecting unit 300 according to an embodiment may include one or more detecting elements. For example, the detecting unit 300 may include a single detecting element and may also include a plurality of detecting elements.

Also, the detecting unit 300 according to an embodiment may include one or more optical elements. For example, the detecting unit 300 may include an aperture, a microlens, a converging lens, a diffuser, or the like, but the present disclosure is not limited thereto.

Also, the detecting unit 300 according to an embodiment may include one or more optical filters. The detecting unit 300 may detect a laser beam reflected by an object through an optical filter. For example, the detecting unit 300 may include a band-pass filter, a dichroic filter, a guided-mode resonance filter, a polarizer, a wedge filter, or the like, but the present disclosure is not limited thereto.

Referring to FIG. 1 again, the LiDAR device 1000 according to an embodiment may include a processor 400.

Herein, the processor may be variously expressed as a processor or the like, but the present disclosure is not limited thereto.

In this case, the processor 400 according to an embodiment may control the operation of the laser emitting unit 100, the optic unit 200, or the detecting unit 300.

Also, the processor 400 according to an embodiment may control the operation of the laser emitting unit 100.

For example, the processor 400 may control an emission time point of a laser emitting from the laser emitting unit 100. Also, the processor 400 may control the power of the laser emitting from the laser emitting unit 100. Also, the processor 400 may control the pulse width of the laser emitting from the laser emitting unit 100. Also, the processor 400 may control the cycle of the laser emitting from the laser emitting unit 100. Also, when the laser emitting unit 100 includes a plurality of laser emitting elements, the processor 400 may control the laser emitting unit 100 to operate some of the plurality of laser emitting elements.

Also, the processor 400 according to an embodiment may control the operation of the optic unit 200.

For example, the processor 400 may control the operating speed of the optic unit 200. In detail, the optic unit 200 may control the rotational speed of a rotating mirror when including the rotating mirror and may control the repetition cycle of a MEMS mirror when including the MEMS mirror, but the present disclosure is not limited thereto.

Also, for example, the processor 400 may control the operation status of the optic unit 200. In detail, the optic unit 200 may control the operation angle of a MEMS mirror when including the MEMS mirror, but the present disclosure is not limited thereto.

Also, the processor 400 according to an embodiment may control the operation of the detecting unit 300.

For example, the processor 400 may control the sensitivity of the detecting unit 300. In detail, the processor 400 may control the sensitivity of the detecting unit 300 by adjusting a predetermined threshold, but the present disclosure is not limited thereto.

Also, for example, the processor 400 may control the operation of the detecting unit 300. In detail, the processor 400 may control the turn-on and -off of the detecting unit 300, and when including a plurality of detecting elements, the processor 400 may control the operation of the detecting unit 300 to operate some of the plurality of detecting elements.

Also, the processor 400 according to an embodiment may determine a distance from the LiDAR device 1000 to an object located in a scanning region based on a laser beam detected by the detecting unit 300.

For example, the processor 400 may determine the distance to the object located in the scanning region based on a time point at which the laser beam is emitted from the laser emitting unit 100 and a time point at which the laser beam is detected by the detecting unit 300. Also, for example, the processor 400 may determine the distance to the object located in the scanning region based on a time point at which a laser beam emitted from the laser beam is detected by the detecting unit 300 immediately without reaching the object and a time point at which a laser beam reflected by the object is sensed by the detecting unit 300.

There may be a difference between a time point at which the LiDAR device 1000 transmits a trigger signal for emitting a laser beam using a processor 400 and an actual emission time point, which is a time when the laser beam is actually emitted from a laser emitting element. Actually, no laser beam is emitted in a period between the time point of the trigger signal and the actual emission time point. Thus, when the period is included in the ToF of the laser beam, precision may be decreased.

The actual emission time point of the laser beam may be used to improve the precision of the measurement of the TOF of the laser beam. However, it may be difficult to determine the actual emission time point of the laser beam. Therefore, a laser beam should be detected to the detecting unit 300 as soon as or immediately after the laser beam is emitted from a laser emitting element without reaching an object.

For example, an optic may be disposed on an upper portion of the laser emitting element, and thus the optic may enable a laser beam emitted from the laser emitting element to be detected by the detecting unit 300 directly without reaching an object. The optic may be a mirror, a lens, a prism, a metasurface, or the like, but the present disclosure is not limited thereto. The optic may include one optic or a plurality of optics.

Also, for example, the detecting unit 300 may be disposed on an upper portion of the laser emitting element, and thus a laser beam emitted from the laser emitting element may be detected by the detecting unit 300 directly without reaching an object. The detecting unit 300 may be spaced a distance of 1 mm, 1 μm, 1 nm, or the like from the laser emitting element, but the present disclosure is not limited thereto. Alternatively, the detecting unit 300 may be adjacent to the laser emitting element with no interval therebetween. An optic may be present between the detecting unit 300 and the laser emitting element, but the present disclosure is not limited thereto.

In detail, the laser emitting unit 100 may emit a laser beam, and the processor 400 may acquire a time point at which the laser beam is emitted from the laser emitting unit 100. When the laser beam emitted from the laser emitting unit 100 is reflected by an object located in the scanning region, the detecting unit 300 may detect a laser beam reflected by the object, and the processor 400 may acquire a time point at which the laser beam is detected by the detecting unit 300 and may determine a distance to the object located in the scan region based on the emission time point and the detection time point of the laser beam.

Also, in detail, the laser beam may be emitted from the laser emitting unit 100, and the laser beam emitted from the laser emitting unit 100 may be detected by the detecting unit 300 directly without reaching the object located in the scanning region. In this case, the processor 400 may acquire a time point at which the laser beam is detected without reaching the object. When the laser beam emitted from the laser emitting unit 100 is reflected by the object located in the scanning region, the detecting unit 300 may detect the laser beam reflected by the object, and the processor 400 may acquire the time point at which the laser beam is detected by the detecting unit 300. In this case, the processor 400 may determine the distance to the object located in the scanning region based on the detection time point of the laser beam that does not reach the object and the detection time point of the laser beam that is reflected by the object.

Figure 2:
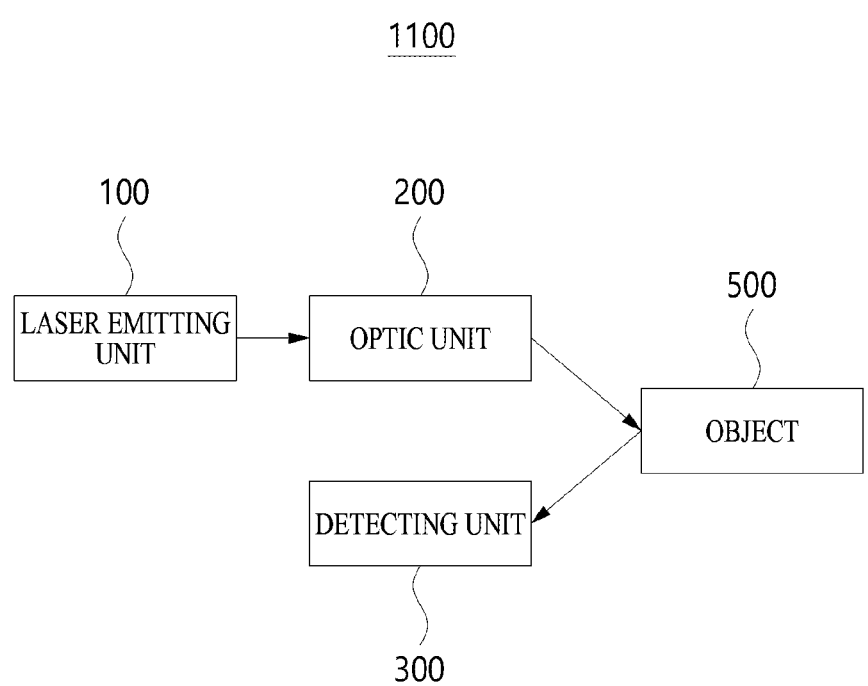
FIG. 2 is a diagram showing a LiDAR device according to an embodiment.

FIG. 2 is a diagram showing a LiDAR device according to an embodiment.

Referring to FIG. 2, a LiDAR device 1100 according to an embodiment may include a laser emitting unit 100, an optic unit 200, and a detecting unit 300.

The laser emitting unit 100, the optic unit 200, and the detecting unit 300 have been described with reference to FIG. 1, and thus a detailed description thereof will be omitted.

Various embodiments of a laser beam output unit including a VCSEL will be described in detail below.

Figure 3:
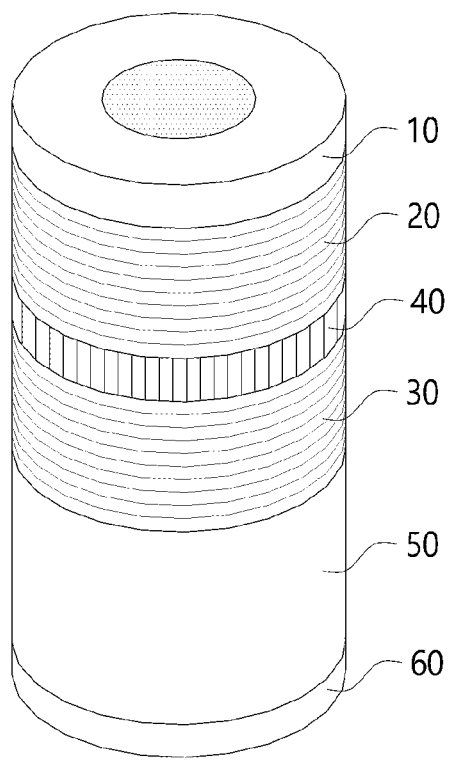
FIG. 3 is a diagram showing a laser emitting unit according to an embodiment.

FIG. 3 is a diagram showing a laser beam output unit according to an embodiment.

Referring to FIG. 3, a laser emitting unit 100 according to an embodiment may include a VCSEL emitter 110.

The VCSEL emitter 110 according to an embodiment may include an upper metal contact 10, an upper distributed Bragg reflector (DBR) layer 20, an active layer 40 (quantum well), a lower DBR layer 30, a substrate 50, and a lower metal contact 60.

Also, the VCSEL emitter 110 according to an embodiment may emit a laser beam perpendicularly to an upper surface. For example, the VCSEL emitter 110 may emit a laser beam perpendicularly to the surface of the upper metal contact 10. Also, for example, the VCSEL emitter 110 may emit a laser beam perpendicularly to the active layer 40.

The VCSEL emitter 110 according to an embodiment may include the upper DBR layer 20 and the lower DBR layer 30.

The upper DBR layer 20 and the lower DBR layer 30 according to an embodiment may include a plurality of reflective layers. For example, the plurality of reflective layers may be arranged such that a reflective layer with high reflectance alternates with a reflective layer with low reflectance. In this case, the thickness of the plurality of reflective layers may be a quarter of the wavelength of the laser beam emitted from the VCSEL emitter 110.

Also, the upper DBR layer 20 and the lower DBR layer 30 according to an embodiment may be doped in n-type or p-type. For example, the upper DBR layer 20 may be doped in p-type, and the lower DBR layer 30 may be doped in n-type. Alternatively, for example, the upper DBR layer 20 may be doped in n-type, and the lower DBR layer 30 may be doped in p-type.

Also, according to an embodiment, the substrate 50 may be disposed between the lower DBR layer 30 and the lower metal contact 60. The substrate 50 may be a p-type substrate when the lower DBR layer 30 is doped in p-type, and the substrate 50 may be an n-type substrate when the lower DBR layer 30 is doped in n-type.

The VCSEL emitter 110 according to an embodiment may include the active layer 40.

The active layer 40 according to an embodiment may be disposed between the upper DBR layer 20 and the lower DBR layer 30.

The active layer 40 according to an embodiment may include a plurality of quantum wells that generate laser beams. The active layer 40 may emit laser beams.

The VCSEL emitter 110 according to an embodiment may include a metal contact for electrical connection to a power source or the like. For example, the VCSEL emitter 110 may include the upper metal contact 10 and the lower metal contact 60.

Also, the VCSEL emitter 110 according to an embodiment may be electrically connected to the upper DBR layer 20 and the lower DBR layer 30 through the metal contact.

For example, when the upper DBR layer 20 is doped in p-type and the lower DBR layer 30 is doped in n-type, p-type power may be supplied to the upper metal contact 10 to electrically connect the VCSEL emitter 110 to the upper DBR layer 20, and n-type power may be supplied to the lower metal contact 60 to electrically connect the VCSEL emitter 110 to the lower DBR layer 30.

Also, for example, when the upper DBR layer 20 is doped in n-type and the lower DBR layer 30 is doped in p-type, n-type power may be supplied to the upper metal contact 10 to electrically connect the VCSEL emitter 110 to the upper DBR layer 20, and p-type power may be supplied to the lower metal contact 60 to electrically connect the VCSEL emitter 110 to the lower DBR layer 30.

The VCSEL emitter 110 according to an embodiment may include an oxidation area. The oxidation area may be disposed on an upper portion of the active layer.

The oxidation area according to an embodiment may have electrical insulation. For example, an electrical flow to the oxidation area may be restricted. For example, an electrical connection to the oxidation area may be restricted.

Also, the oxidation area according to an embodiment may serve as an aperture. In detail, since the oxidation area has electrical insulation, a beam generated from the active layer 40 may be emitted to only areas other than the oxidation area.

The laser emitting unit according to an embodiment may include a plurality of VCSEL emitters 110.

Also, the laser emitting unit according to an embodiment may turn on the plurality of VCSEL emitters 110 at once or individually.

The laser emitting unit according to an embodiment may emit laser beams of various wavelengths. For example, the laser emitting unit may emit a laser beam with a wavelength of 905 nm. Also, for example, the laser emitting unit may emit a laser beam with a wavelength of 1550 nm.

Also, the wavelength of the laser beam emitted from the laser emitting unit according to an embodiment may vary depending on the surrounding environment. For example, as the temperature of the surrounding environment increases, the wavelength of the laser beam emitted from the laser emitting unit may increase. Alternatively, for example, as the temperature of the surrounding environment decreases, the wavelength of the laser beam emitted from the laser emitting unit may decrease. The surrounding environment may include temperature, humidity, pressure, dust concentration, ambient light amount, altitude, gravity, acceleration, and the like, but the present disclosure is not limited thereto.

The laser emitting unit may emit a laser beam perpendicularly to a support surface. Alternatively, the laser emitting unit may emit a laser beam perpendicularly to an emission surface.

Figure 4:
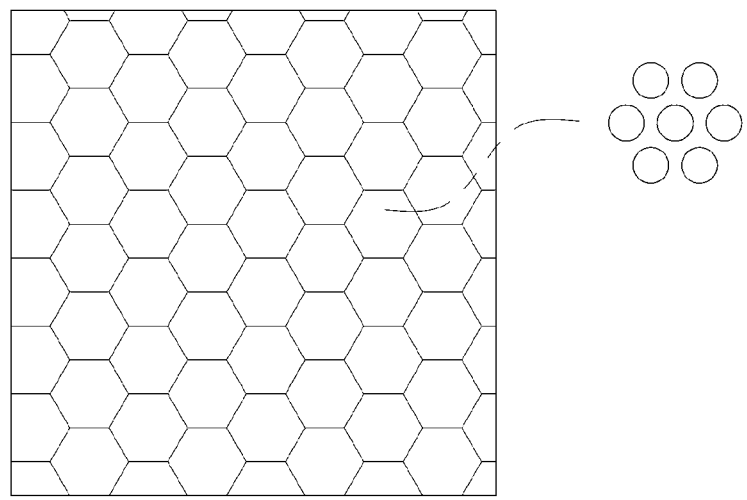
FIG. 4 is a diagram showing a vertical-cavity surface-emitting laser (VCSEL) unit according to an embodiment.

FIG. 4 is a diagram showing a VCSEL unit according to an embodiment.

Referring to FIG. 4, a laser emitting unit 100 according to an embodiment may include a VCSEL unit 130.

The VCSEL unit 130 according to an embodiment may include a plurality of VCSEL emitters 110. For example, the plurality of VCSEL emitters 110 may be arranged in a honeycomb structure, but the present disclosure is not limited thereto. In this case, one honeycomb structure may include seven VCSEL emitters 110, but the present disclosure is not limited thereto.

Also, the VCSEL emitters 110 included in the VCSEL unit 130 according to an embodiment may be oriented in the same direction. For example, 400 VCSEL emitters 110 included in one VCSEL unit 130 may be oriented in the same direction.

Also, the VCSEL unit 130 may be distinguished by the direction in which the laser beam is emitted. For example, when N VCSEL emitters 110 emit laser beams in a first direction and M VCSEL emitters 110 emit laser beams in a second direction, the N VCSEL emitters 110 may be distinguished as first VCSEL units, and the M VCSEL emitters 110 may be distinguished as second VCSEL units.

Also, the VCSEL unit 130 according to an embodiment may include a metal contact. For example, the VCSEL unit 130 may include a p-type metal and an n-type metal. Also, for example, a plurality of VCSEL emitters 110 included in the VCSEL unit 130 share the metal contact.

Figure 5:
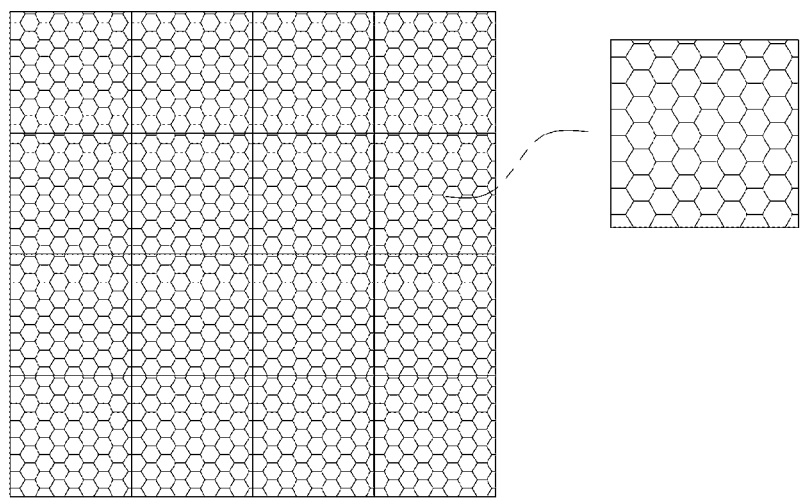
FIG. 5 is a diagram showing a VCSEL array according to an embodiment.

FIG. 5 is a diagram showing a VCSEL array according to an embodiment.

Referring to FIG. 5, a laser emitting unit 100 according to an embodiment may include a VCSEL array 150. FIG. 5 shows 8×8 VCSEL arrays, but the present disclosure is not limited thereto.

The VCSEL array 150 according to an embodiment may include a plurality of VCSEL units 130. For example, the plurality of VCSEL units 130 may be arranged in a matrix structure, but the present disclosure is not limited thereto. For example, the plurality of VCSEL units 130 may be an N×N matrix, but the present disclosure is not limited thereto. Also, for example, the plurality of VCSEL units 130 may be an N×M matrix, but the present disclosure is not limited thereto.

Also, the VCSEL array 150 according to an embodiment may include a metal contact. For example, the VCSEL array 150 may include a p-type metal and an n-type metal. In this case, the plurality of VCSEL units 130 may share the metal contacts or may have respective metal contacts rather than sharing the metal contacts.

Figure 6:
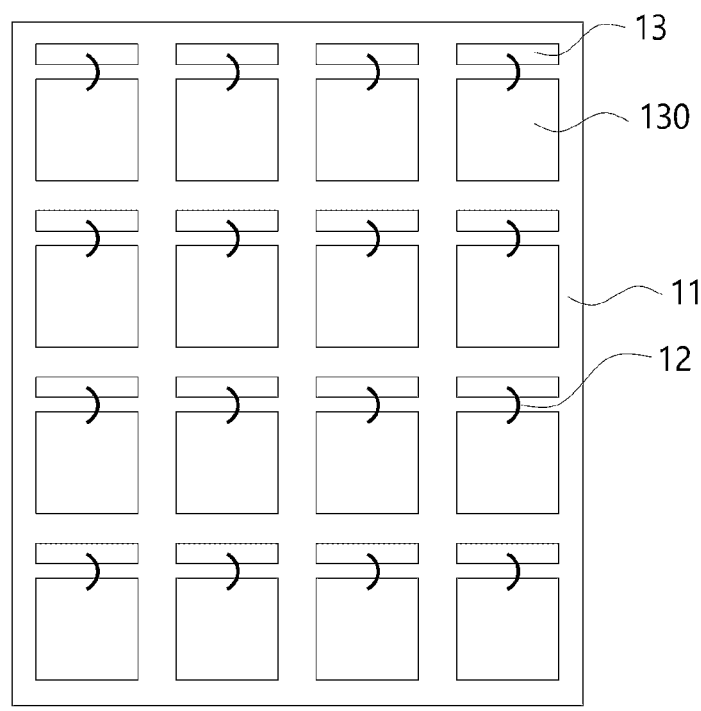
FIG. 6 is a diagram showing a VCSEL array and a metal contact according to an embodiment.

FIG. 6 is a diagram showing a VCSEL array and a metal contact according to an embodiment.

Figure 7:
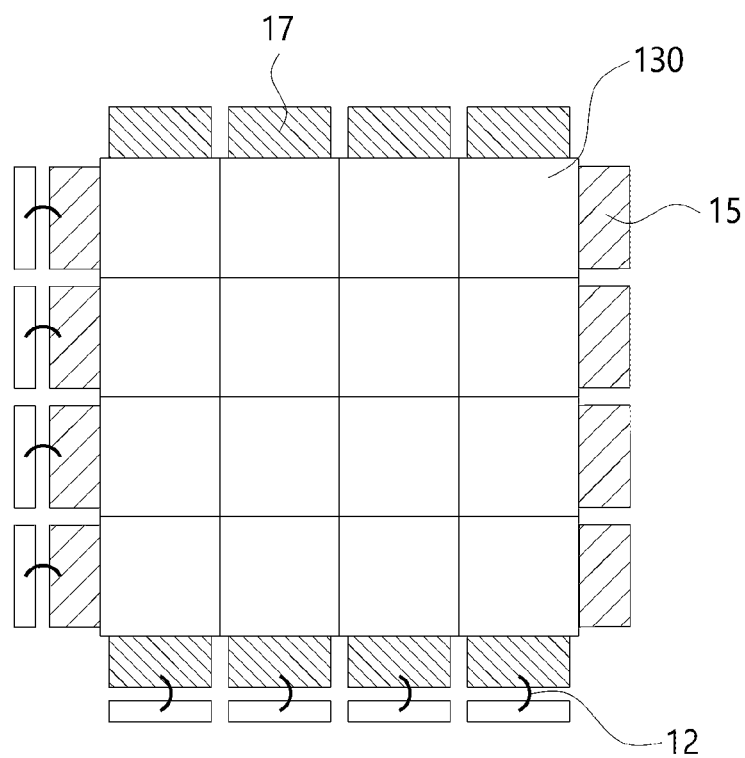
FIG. 7 is a diagram showing a VCSEL array according to an embodiment.

Referring to FIG. 6, a laser emitting unit 100 according to an embodiment may include a VCSEL array 151. FIG. 7 shows 4×4 VCSEL arrays, but the present disclosure is not limited thereto. The VCSEL array 151 may include a first metal contact 11, a wire 12, a second metal contact 13, and a VCSEL unit 130.

The VCSEL array 151 according to an embodiment may include a plurality of VCSEL units 130 arranged in a matrix structure. In this case, the plurality of VCSEL units 130 may be connected to the metal contacts independently. For example, the plurality of VCSEL units 130 may be connected to the first metal contact 11 together because the VCSEL units 130 share the first metal contact 11. However, the plurality of VCSEL units 130 may be connected to the second metal contact independently because the VCSEL units 130 do not share the second metal contact 13. Also, for example, the plurality of VCSEL units 130 may be connected to the first metal contact 11 directly and may be connected to the second metal contact 13 through wires 12. In this case, the number of wires 12 required may be equal to the number of VCSEL units 130. For example, when the VCSEL array 151 includes a plurality of VCSEL units 130 arranged in an N×M matrix structure, the number of wires 12 may be N*M.

Also, the first metal contact 11 and the second metal contact 13 according to an embodiment may be different from each other. For example, the first metal contact 11 may be an n-type metal, and the second metal contact 13 may be a p-type metal. On the contrary, the first metal contact 11 may be a p-type metal, and the second metal contact 13 may be an n-type metal.

FIG. 7 is a diagram showing a VCSEL array according to an embodiment.

Referring to FIG. 7, a laser emitting unit 100 according to an embodiment may include a VCSEL array 153. FIG. 7 shows 4×4 VCSEL arrays, but the present disclosure is not limited thereto.

The VCSEL array 153 according to an embodiment may include a plurality of VCSEL units 130 arranged in a matrix structure. In this case, the plurality of VCSEL units 130 may share a metal contact or may have respective metal contacts rather than sharing a metal contact. For example, the plurality of VCSEL units 130 may share a first metal contact 15 in units of rows. Also, for example, the plurality of VCSEL units 130 may share a second metal contact 17 in units of columns.

Also, the first metal contact 15 and the second metal contact 17 according to an embodiment may be different from each other. For example, the first metal contact 15 may be an n-type metal, and the second metal contact 17 may be a p-type metal. On the contrary, the first metal contact 15 may be a p-type metal, and the second metal contact 17 may be an n-type metal.

Also, the VCSEL unit 130 according to an embodiment may be electrically connected to the first metal contact 15 and the second metal contact 17 through wires 12.

There may be various methods of directing a laser beam emitted from a laser emitting unit to an object. Among the methods, a flash scheme uses a laser beam spreading toward an object through the divergence of the laser beam. In order to direct a laser beam to an object located at a remote distance, the flash scheme requires a high-power laser beam. The high-power laser beam requires a high voltage to be applied, thereby increasing power. Also, the high-power laser beam may damage human eyes, and thus there is a limit to the distance that can be measured by a LiDAR device using the flash scheme.

A scanning scheme is a scheme for directing a laser beam emitted from a laser emitting unit in a specific direction. The scanning scheme can reduce laser power loss by causing a laser beam to travel in a specific direction. Since the laser power loss can be reduced, the scanning scheme may have a longer distance that can be measured by a LiDAR device than the flash scheme even when the same laser power is used. Also, since the scanning scheme has lower laser power required to measure the same distance than the flash scheme, it is possible to improve safety for human eyes.

Laser beam scanning may include collimation and steering. For example, the laser beam scanning may collimate a laser beam and then steer the collimated laser beam. Also, for example, the laser beam scanning may steer a laser beam and then collmate the steered laser beam.

Various embodiments of an optic unit including a Beam Collimation and Steering Component (BCSC) will be described in detail below.

Figure 8:
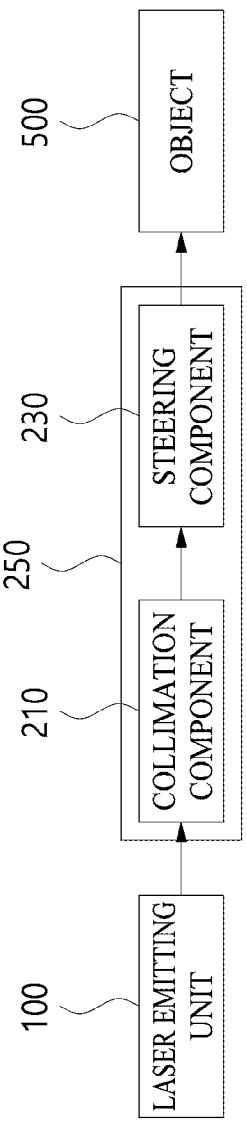
FIG. 8 is a diagram illustrating a LiDAR device according to an embodiment.

FIG. 8 is a diagram illustrating a LiDAR device according to an embodiment.

Referring to FIG. 8, a LiDAR device 1200 according to an embodiment may include a laser emitting unit 100 and an optic unit. In this case, the optic unit may include a BCSC 250. Also, the BCSC 250 may include a collimation component 210 and a steering component 230.

The BCSC 250 according to an embodiment may be configured as follows. The collimation component 210 may collimate a laser beam first, and then the collimated laser beam may be steered through the steering component 230. Alternatively, the steering component 230 may steer a laser beam first, and then the steered laser beam may be collimated through the collimation component 210.

Also, an optical path of the LiDAR device 1200 according to an embodiment is as follows. A laser beam emitted from the laser emitting unit 100 may be directed to the BCSC 250. The laser beam directed to the BCSC 250 may be collimated by the collimation component 210 and directed to the steering component 230. The laser beam directed to the steering component 230 may be steered and directed to an object. The laser beam directed to the object 500 may be reflected by the object 500 and directed to the detecting unit.

Even though laser beams emitted from the laser emitting unit have directivity, there may be some degree of divergence as the laser beams go straight. Due to the divergence, the laser beams emitted from the laser emitting unit may not be incident on the object, or even if the laser beams are incident, a very small number of laser beams may be incident.

When the degree of divergence of the laser beams is large, the amount of laser beam incident on the object decreases, and the amount of laser beam reflected by the object and directed to the detecting unit becomes very small due to the divergence. Thus, a desired measurement result may not be obtained. Alternatively, when the degree of divergence of the laser beams is large, a distance that can be measured by a LiDAR device may decrease, and thus a distant object may not be subjected to measurement.

Accordingly, by reducing the degree of divergence of a laser beam emitted from a laser emitting unit before the laser beam is incident on an object, it is possible to improve the efficiency of a LiDAR device. A collimation component of the present disclosure can reduce the degree of divergence of a laser beam. A laser beam having passed through the collimation component may become parallel light. Alternatively, a laser beam having passed through the collimation component may have a degree of divergence ranging from 0.4 degrees to 1 degree.

When the degree of divergence of a laser beam is reduced, the amount of light incident on an object may be increased. When the amount of light incident on an object is increased, the amount of light reflected by the object may be increased and thus it is possible to efficiently receive the laser beam. Also, when the amount of light incident on an object is increased, it is possible to measure an object at a great distance with the same beam power compared to before the laser beam is collimated.

Figure 9:
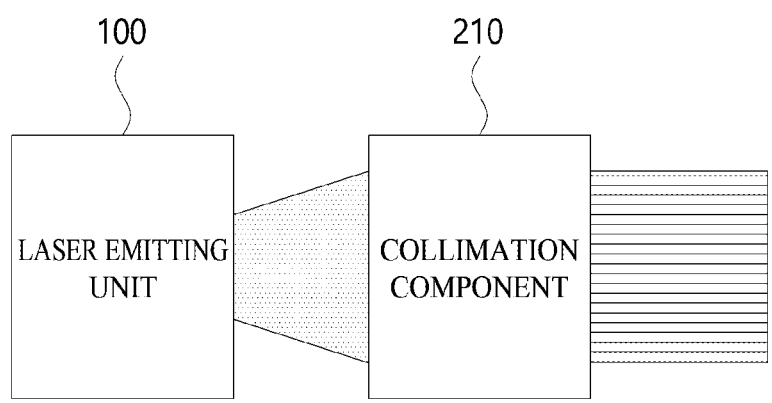
FIG. 9 is a diagram illustrating a collimation component according to an embodiment.

FIG. 9 is a diagram illustrating a collimation component according to an embodiment.

Referring to FIG. 9, a collimation component 210 according to an embodiment may be disposed in a direction in which a laser beam emitted from a laser emitting unit 100 emits. The collimation component 210 may adjust the degree of divergence of a laser beam. The collimation component 210 may reduce the degree of divergence of a laser beam.

For example, the angle of divergence of a laser beam emitted from the laser emitting unit 100 may range from 16 degrees to 30 degrees. In this case, after the laser beam emitted from the laser emitting unit 100 passes through the collimation component 210, the angle of divergence of the laser beam may range from 0.4 degrees to 1 degree.

Figure 10:
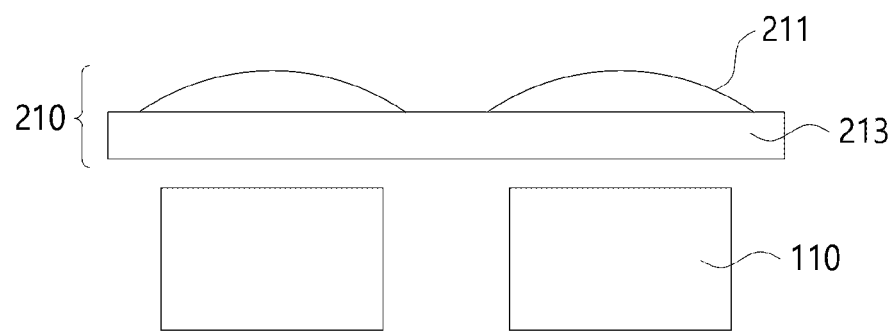
FIG. 10 is a diagram illustrating a collimation component according to an embodiment.

FIG. 10 is a diagram illustrating a collimation component according to an embodiment.

Referring to FIG. 10, a collimation component 210 according to an embodiment may include a plurality of microlenses 211 and a substrate 213.

The microlenses may have a diameter of millimeters (mm), micrometers (μm), nanometers (nm), picometers (pm), but the present disclosure is not limited thereto.

The plurality of microlenses 211 according to an embodiment may be disposed on the substrate 213. The plurality of microlenses 211 and the substrate 213 may be disposed above a plurality of VCSEL emitters 110. In this case, one of the plurality of microlenses 211 may correspond to one of the plurality of VCSEL emitters 110, but the present disclosure is not limited thereto.

Also, the plurality of microlenses 211 according to an embodiment may collimate a laser beams emitted from the plurality of VCSEL emitters 110. In this case, a laser beam emitted from one of the plurality of VCSEL emitters 110 may be collimated by one of the plurality of microlenses 211. For example, the angle of divergence of a laser beam emitted from one of the plurality of VCSEL emitters 110 may be decreased after the laser beam passes through one of the plurality of microlenses 211.

Also, the plurality of microlenses according to an embodiment may be a gradient index lens, a micro-curved lens, an array lens, a Fresnel lens, or the like.

Also, the plurality of microlenses according to an embodiment may be manufactured by a method such as molding, ion exchange, diffusion polymerization, sputtering, and etching.

Also, the plurality of microlenses according to an embodiment may have a diameter ranging from 130 μm to 150 μm. For example, the diameter of the plurality of lenses may be 140 μm. Also, the plurality of microlenses may have a thickness ranging from 400 μm to 600 μm. For example, the thickness of the plurality of microlenses may be 500 μm.

Figure 11:
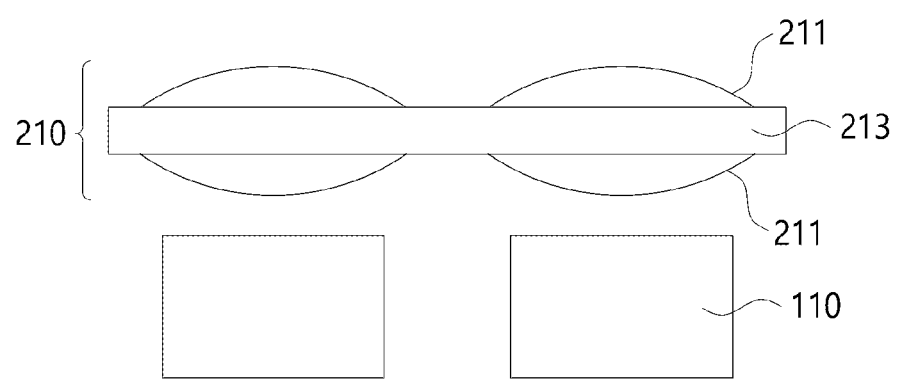
FIG. 11 is a diagram illustrating a collimation component according to an embodiment.

FIG. 11 is a diagram illustrating a collimation component according to an embodiment.

Referring to FIG. 11, a collimation component 210 according to an embodiment may include a plurality of microlenses 211 and a substrate 213.

The plurality of microlenses 211 according to an embodiment may be disposed on the substrate 213. For example, the plurality of microlenses 211 may be disposed on the front surface and the rear surface of the substrate 213. In this case, the optical axis of microlenses 211 disposed on the front surface of the substrate 213 may match the optical axis of microlenses 211 disposed on the rear surface of the substrate 213.

Figure 12:
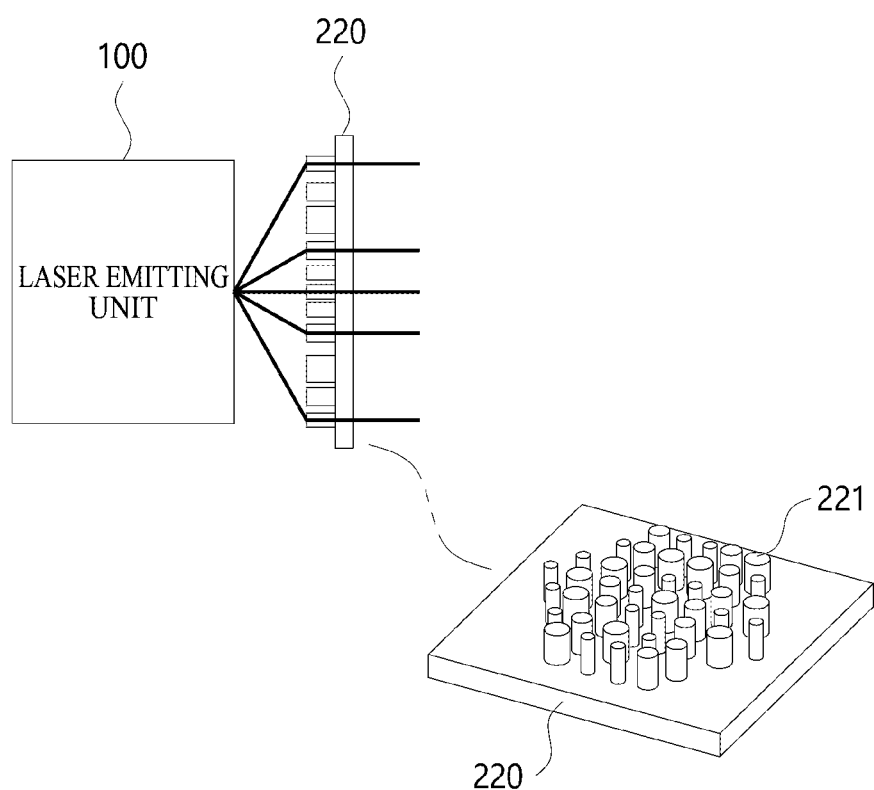
FIG. 12 is a diagram illustrating a collimation component according to an embodiment.

FIG. 12 is a diagram illustrating a collimation component according to an embodiment.

Referring to FIG. 12, the collimation component according to an embodiment may include a metasurface 220.

The metasurface 220 according to an embodiment may include a plurality of nanopillars 221. For example, the plurality of nanopillars 221 may be disposed on one side of the metasurface 220. Also, for example, the plurality of nanopillars 221 may be disposed on both sides of the metasurface 220.

The plurality of nanopillars 221 may have a subwavelength size. For example, a pitch between the plurality of nanopillars 221 may be less than the wavelength of a laser beam emitted from the laser emitting unit 100. Alternatively, the width, diameter, and height of the nanopillars 221 may be less than the size of the wavelength of the laser beam.

By adjusting the phase of a laser beam emitted from the laser emitting unit 100, the metasurface 220 may refract the laser beam. The metasurface 220 may refract laser beams emitted from the laser emitting unit 100 in various directions.

The metasurface 220 may collimate a laser beam emitted from the laser emitting unit 100. Also, the metasurface 220 may reduce the angle of divergence of a laser beam emitted from the laser emitting unit 100. For example, the angle of divergence of a laser beam emitted from the laser emitting unit 100 may range from 15 degrees to 30 degrees, and the angle of divergence of a laser beam having passed the metasurface 220 may range from 0.4 degrees to 1.8 degrees.

The metasurface 220 may be disposed on the laser emitting unit 100. For example, the metasurface 220 may be disposed to the side of the emission surface of the laser emitting unit 100.

Alternatively, the metasurface 220 may be deposited on the laser emitting unit 100. The plurality of nanopillars 221 may be formed on an upper portion of the laser emitting unit 100. The plurality of nanopillars 221 may form various nanopatterns on the laser emitting unit 100.

The nanopillars 221 may have various shapes. For example, the nanopillars 221 may have a cylindrical shape, a polygonal column shape, a conical shape, a polypyramid shape, or the like. Furthermore, the nanopillars 221 may have an irregular shape.

Figure 13:
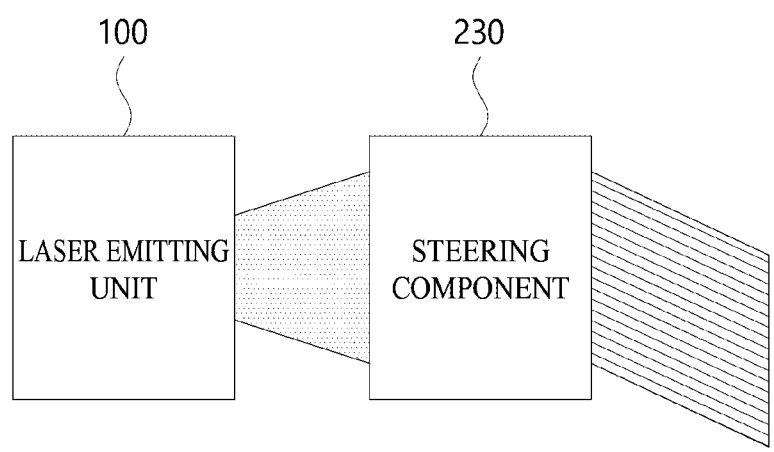
FIG. 13 is a diagram illustrating a steering component according to an embodiment.

FIG. 13 is a diagram illustrating a steering component according to an embodiment.

Referring to FIG. 13, a steering component 230 according to an embodiment may be disposed in a direction in which a laser beam emitted from a laser emitting unit 100 travels. The steering component 230 may adjust the direction of a laser beam. The steering component 230 may adjust an angle between a laser beam and an optical axis of a laser light source.

For example, the steering component 230 may steer the laser beam such that the angle between the laser beam and the optical axis of the laser light source ranges from 0 degrees to 30 degrees. Alternatively, for example, the steering component 230 may steer the laser beam such that the angle between the laser beam and the optical axis of the laser light source ranges from −30 degrees to 0 degrees.

Figure 14:
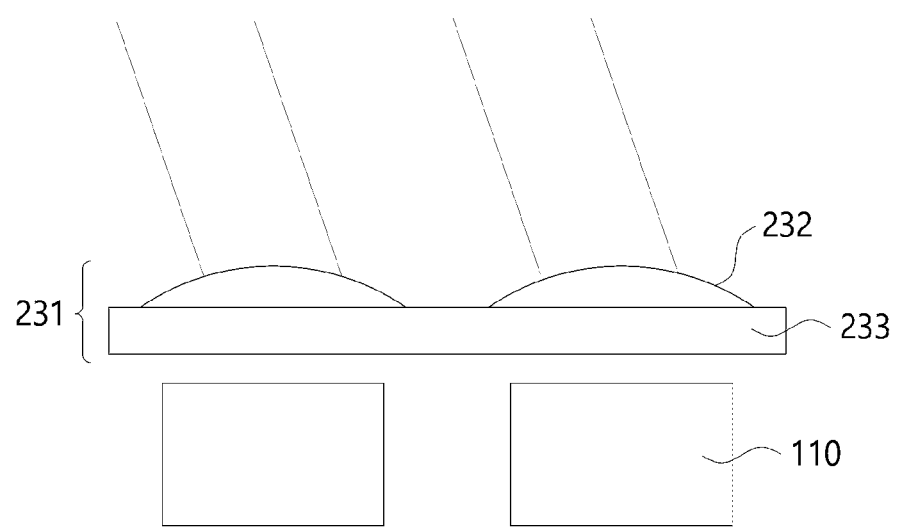
FIGS. 14 and 15 are diagrams illustrating a steering component according to an embodiment.
Figure 15:
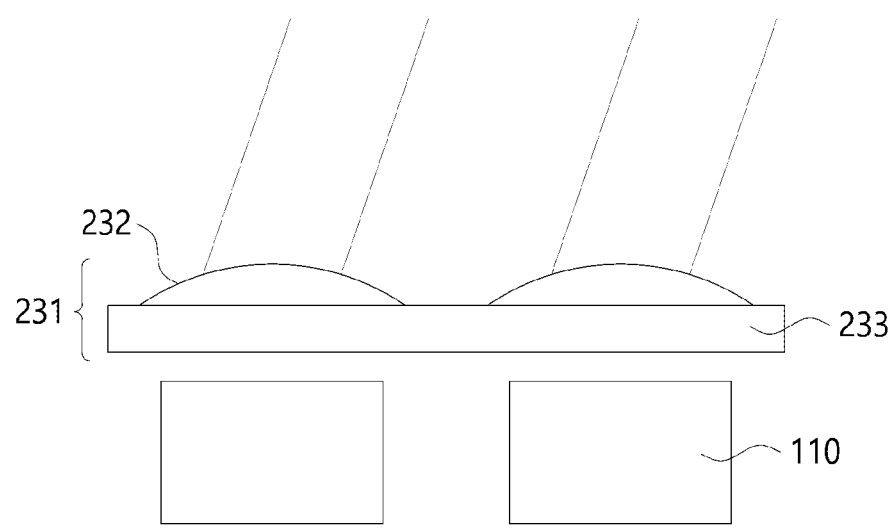

FIGS. 14 and 15 are diagrams illustrating a steering component according to an embodiment.

Referring to FIGS. 14 and 15, a steering component 231 according to an embodiment may include a plurality of microlenses 232 and a substrate 233.

The plurality of microlenses 232 according to an embodiment may be disposed on the substrate 233. The plurality of microlenses 232 and the substrate 233 may be disposed above a plurality of VCSEL emitters 110. In this case, one of the plurality of microlenses 232 may correspond to one of the plurality of VCSEL emitters 110, but the present disclosure is not limited thereto.

Also, the plurality of microlenses 232 according to an embodiment may steer laser beams emitted from the plurality of VCSEL emitters 110. In this case, a laser beam emitted from one of the plurality of VCSEL emitters 110 may be steered by one of the plurality of microlenses 232.

In this case, the optical axis of the microlens 232 may not match the optical axis of the VCSEL emitter 110. For example, referring to FIG. 14, when the optical axis of the VCSEL emitter 110 is inclined to the right with respect to the optical axis of the microlens 232, a laser beam emitted from the VCSEL emitter 110 through the microlens 232 may be directed to the left. Also, for example, referring to FIG. 15, when the optical axis of the VCSEL emitter 110 is inclined to the left with respect to the optical axis of the microlens 232, a laser beam emitted from the VCSEL emitter 110 through the microlens 232 may be directed to the right.

Also, as a distance between the optical axis of the microlens 232 and the optical axis of the VCSEL emitter 110 increases, the degree of steering of the laser beam may increase. For example, an angle between a laser beam and an optical axis of a laser light source may be larger when the distance between the optical axis of the microlens 232 and the optical axis of the VCSEL emitter 110 is 10 μm than when the distance is 1 μm.

Figure 16:
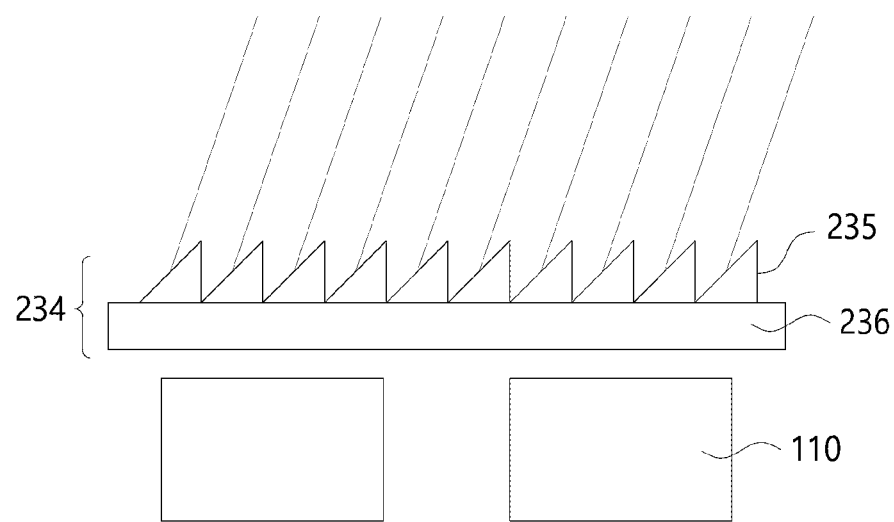
FIG. 16 is a diagram illustrating a steering component according to an embodiment.

FIG. 16 is a diagram illustrating a steering component according to an embodiment.

Referring to FIG. 16, a steering component 234 according to an embodiment may include a plurality of microprisms 235 and a substrate 236.

The plurality of microprisms 235 according to an embodiment may be disposed on the substrate 236. The plurality of microprisms 235 and the substrate 236 may be disposed above a plurality of VCSEL emitters 110. In this case, one of the plurality of microprisms 235 may correspond to one of the plurality of VCSEL emitters 110, but the present disclosure is not limited thereto.

Also, the plurality of microprisms 235 according to an embodiment may steer laser beams emitted from the plurality of VCSEL emitters 110. For example, the plurality of microprisms 235 may change an angle between a laser beam and an optical axis of a laser light source.

In this case, as the angle of a microprism 235 decreases, the angle between the laser beam and the optical axis of the laser light source increases. For example, a laser beam may be steered 35 degrees when the angle of the microprism 235 is 0.05 degrees and may be steered by 15 degrees when the angle of the microprism 235 is 0.25 degrees.

Also, the plurality of microprisms 235 according to an embodiment may include a Porro prism, an Amici roof prism, a pentaprism, a Dove prism, a retroreflector prism, or the like. Also, the plurality of microprisms 235 may be formed of glass, plastic, or fluorspar. Also, the plurality of microprisms 235 may be manufactured by a method such as molding and etching.

Figure 17:
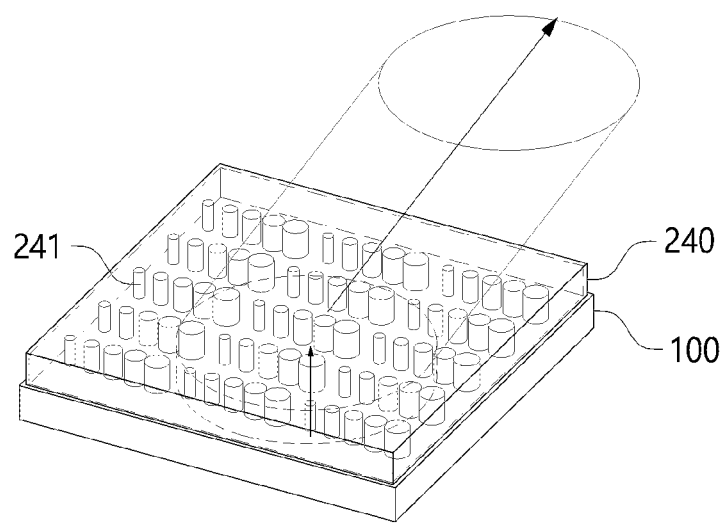
FIG. 17 is a diagram illustrating a steering component according to an embodiment.

FIG. 17 is a diagram illustrating a steering component according to an embodiment.

Referring to FIG. 17, the steering component according to an embodiment may include a metasurface 240.

The metasurface 240 may include a plurality of nanopillars 241. For example, the plurality of nanopillars 241 may be disposed on one side of the metasurface 240. Also, for example, the plurality of nanopillars 241 may be disposed on both sides of the metasurface 240.

By adjusting the phase of a laser beam emitted from the laser emitting unit 100, the metasurface 240 may refract the laser beam.

The metasurface 240 may be disposed on the laser emitting unit 100. For example, the metasurface 240 may be disposed to the side of the emission surface of the laser emitting unit 100.

Alternatively, the metasurface 240 may be deposited on the laser emitting unit 100. The plurality of nanopillars 241 may be formed on an upper portion of the laser emitting unit 100. The plurality of nanopillars 241 may form various nanopatterns on the laser emitting unit 100.

The nanopillars 241 may have various shapes. For example, the nanopillars 241 may have a shape such as a circular column, a polygonal column, a circular pyramid, and a polygonal pyramid. In addition, the nanopillars 241 may have an irregular shape.

The nanopillars 241 may form various nanopatterns. The metasurface 240 may steer a laser beam emitted from the laser emitting unit 100 based on the nanopatterns.

The nanopillars 241 may form nanopatterns based on various features. The features may include the width (hereinafter referred to as W), pitch (hereinafter referred to as P), height (hereinafter referred to as H), and the number per unit length of nanopillars 241.

A nanopattern formed based on various features and a method of steering a laser beam according to the nanopattern will be described below.

Figure 18:
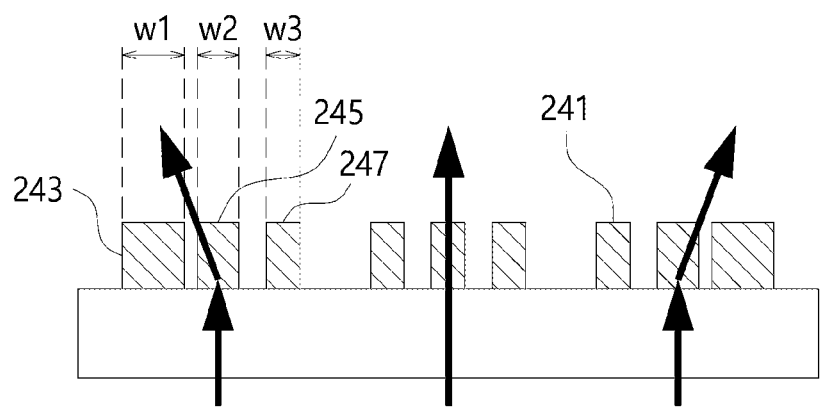
FIG. 18 is a diagram illustrating a metasurface according to an embodiment.

FIG. 18 is a diagram illustrating a metasurface according to an embodiment.

Referring to FIG. 18, a metasurface 240 according to an embodiment may include a plurality of nanopillars 241 with different widths W.

The plurality of nanopillars 241 may form nanopatterns based on the widths W. For example, the plurality of nanopillars 241 may be disposed to have widths increasing in one direction (W1, W2, and W3). In this case, a laser beam emitted from a laser emitting unit 100 may be steered in a direction in which the widths W of the nanopillars 241 increase.

For example, the metasurface 240 may include a first nanopillar 243 with a first width W1, a second nanopillar 245 with a second width W2, and a third nanopillar 247 with a third width W3. The first width W1 may be greater than the second width W2 and the third width W3. The second width W2 may be greater than the third width W3. That is, the widths W of the nanopillars 241 may decrease from the first nanopillar 243 to the third nanopillar 247. In this case, when the laser beam emitted from the laser emitting unit 100 passes through the metasurface 240, the laser beam may be steered between a first direction in which the laser beam is emitted from the laser emitting unit 100 and a second direction which is a direction from the third nanopillar 247 to the first nanopillar 243.

Meanwhile, the steering angle θ of the laser beam may vary depending on a change rate of the widths W of the nanopillars 241. Here, the change rate of the widths W of the nanopillars 241 may refer to a numerical value indicating the average change of the widths W of the plurality of nanopillars 241.

The change rate of the widths W of the nanopillars 241 may be calculated based on the difference between the first width W1 and the second width W2 and the difference between the second width W2 and the third width W3.

The difference between the first width W1 and the second width W2 may be different from the difference between the second width W2 and the third width W3.

The steering angle θ of the laser beam may vary depending on the widths W of the nanopillars 241.

In detail, the steering angle θ may increase as the change rate of the widths W of the nanopillars 241 increases.

For example, the nanopillars 241 may form a first pattern with a first change rate on the basis of the widths W. Also, the nanopillars 241 may form a second pattern with a second change rate smaller than the first change rate on the basis of the widths W.

In this case, a first steering angle caused by the first pattern may be greater than a second steering angle caused by the second pattern.

Meanwhile, the steering angle θ may range from −90 degrees to 90 degrees.

Figure 19:
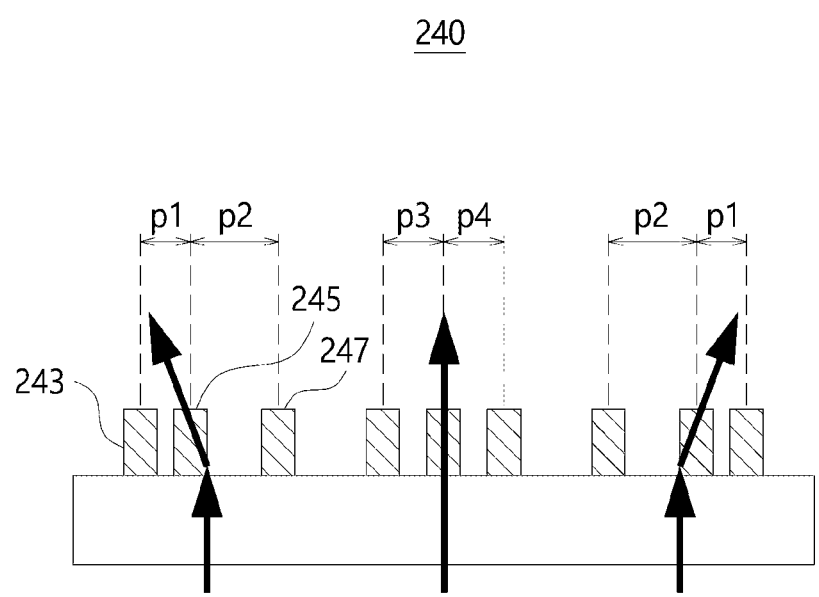
FIG. 19 is a diagram illustrating a metasurface according to an embodiment.

FIG. 19 is a diagram illustrating a metasurface according to an embodiment.

Referring to FIG. 19, a metasurface 240 according to an embodiment may include a plurality of nanopillars 241 with different pitches P between adjacent nanopillars 241.

The plurality of nanopillars 241 may form nanopatterns based on a change in the pitches P between the adjacent nanopillars 241. The metasurface 240 may steer a laser beam emitted from the laser emitting unit 100 based on the nanopatterns formed based on the change in the pitches P between the nanopillars 241.

According to an embodiment, the pitches P between the nanopillars 241 may decrease in one direction. Here, a pitch P may refer to a distance between the centers of two adjacent nanopillars 241. For example, a first pitch P may refer to a distance between the center of a first nanopillar 243 and the center of a second nanopillar 245. Alternatively, the first pitch P1 may be defined as the shortest distance between the first nanopillar 243 and the second nanopillar 245.

A laser beam emitted from a laser emitting unit 100 may be steered in a direction in which the pitches P between the nanopillars 241 decrease.

The metasurface 240 may include the first nanopillar 243, the second nanopillar 245, and the third nanopillar 247. In this case, the first pitch P1 may be acquired based on a distance between the first nanopillar 243 and the second nanopillar 245. Likewise, a second pitch P2 may be acquired based on a distance between the second nanopillar 245 and the third nanopillar 247. In this case, the first pitch P1 may be smaller than the second pitch P2. That is, the pitches P may increase from the first nanopillar 243 to the third nanopillar 247.

In this case, when the laser beam emitted from the laser emitting unit 100 passes through the metasurface 240, the laser beam may be steered between a first direction in which the laser beam is emitted from the laser emitting unit 100 and a second direction which is a direction from the third nanopillar 247 to the first nanopillar 243.

The steering angle θ of the laser beam may vary depending on the pitches P between the nanopillars 241.

In detail, the steering angle θ of the laser beam may vary depending on a change rate of the pitches P between the nanopillars 241. Here, the change rate of the pitches P between the nanopillars 241 may refer to a numerical value indicating the average change of the pitches P between adjacent nanopillars 241.

The steering angle θ of the laser beam may increase as the change rate of the pitches P between the nanopillars 241 increases.

For example, the nanopillars 241 may form a first pattern with a first change rate based on the pitches P. Also, the nanopillars 241 may form a second pattern with a second change rate based on the pitches P.

In this case, a first steering angle caused by the first pattern may be greater than a second steering angle caused by the second pattern.

Meanwhile, the above-described principle of steering a laser beam according to a change in the pitches P between the nanopillars 241 is similarly applicable even to a case in which the number per unit length of nanopillars 241 changes.

For example, when the number per unit length of nanopillars 241 changes, the laser beam emitted from the laser emitting unit 100 may be steered between the first direction in which the laser beam is emitted from the laser emitting unit 100 and the second direction in which the number per unit length of nanopillars 241 increases.

Figure 20:
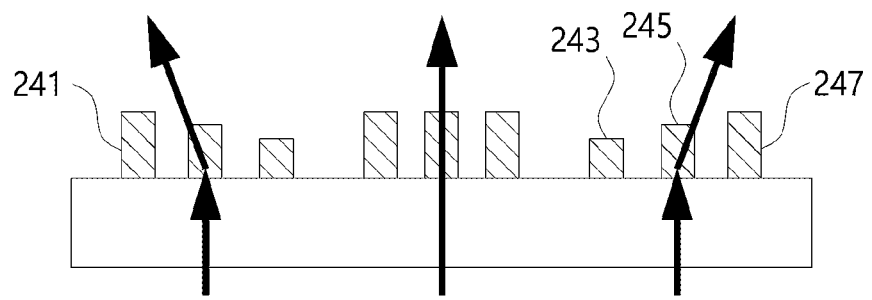
FIG. 20 is a diagram illustrating a metasurface according to an embodiment.

FIG. 20 is a diagram illustrating a metasurface according to an embodiment.

Referring to FIG. 20, a metasurface 240 according to an embodiment may include a plurality of nanopillars 241 with different heights H.

The plurality of nanopillars 241 may form nanopatterns on the basis of a change in the heights H of the nanopillars 241.

According to an embodiment, the heights H1, H2, and H3 of the plurality of nanopillars 241 may increase in one direction. A laser beam emitted from a laser emitting unit 100 may be steered in a direction in which the heights H of the nanopillars 241 increase.

For example, the metasurface 240 may include a first nanopillar 243 with a first height H1, a second nanopillar 245 with a second height H2, and a third nanopillar 247 with a third height H3. The third height H3 may be greater than the first height H1 and the second height H2. The second height H2 may be greater than the first height H1. That is, the heights H of the nanopillars 241 may increase from the first nanopillar 243 to the third nanopillar 247. In this case, when the laser beam emitted from the laser emitting unit 100 passes through the metasurface 240, the laser beam may be steered between the first direction in which the laser beam is emitted from the laser emitting unit 100 and the second direction which is a direction from the first nanopillar 243 to the third nanopillar 247.

The steering angle θ of the laser beam may vary depending on the heights H of the nanopillars 241.

In detail, the steering angle θ of the laser beam may vary depending on a change rate of the heights H of the nanopillars 241. Here, the change rate of the heights H of the nanopillars 241 may refer to a numerical value indicating the average change of the heights H of adjacent nanopillars 241.

The change rate of the heights H of the nanopillars 241 may be calculated based on the difference between the first height H1 and the second height H2 and the difference between the second height H2 and the third height H3. The difference between the first height H1 and the second height H2 may be different from the difference between the second height H2 and the third height H3.

The steering angle θ of the laser beam may increase as the change rate of the heights H2 of the nanopillars 241 increases.

For example, the nanopillars 241 may form a first pattern with a first change rate on the basis of the heights H. Also, the nanopillars 241 may form a second pattern with a second change rate on the basis of the heights H.

In this case, a first steering angle caused by the first pattern may be greater than a second steering angle caused by the second pattern.

A LIDAR device according to an embodiment may include an optic unit configured to direct a laser beam emitted from a laser emitting unit to an object.

The optic unit may include a beam collimation and steering component (BCSC) configured to collimate and steer a laser beam emitted from a laser beam output unit. The BCSC may include one component or a plurality of components.

Figure 21:
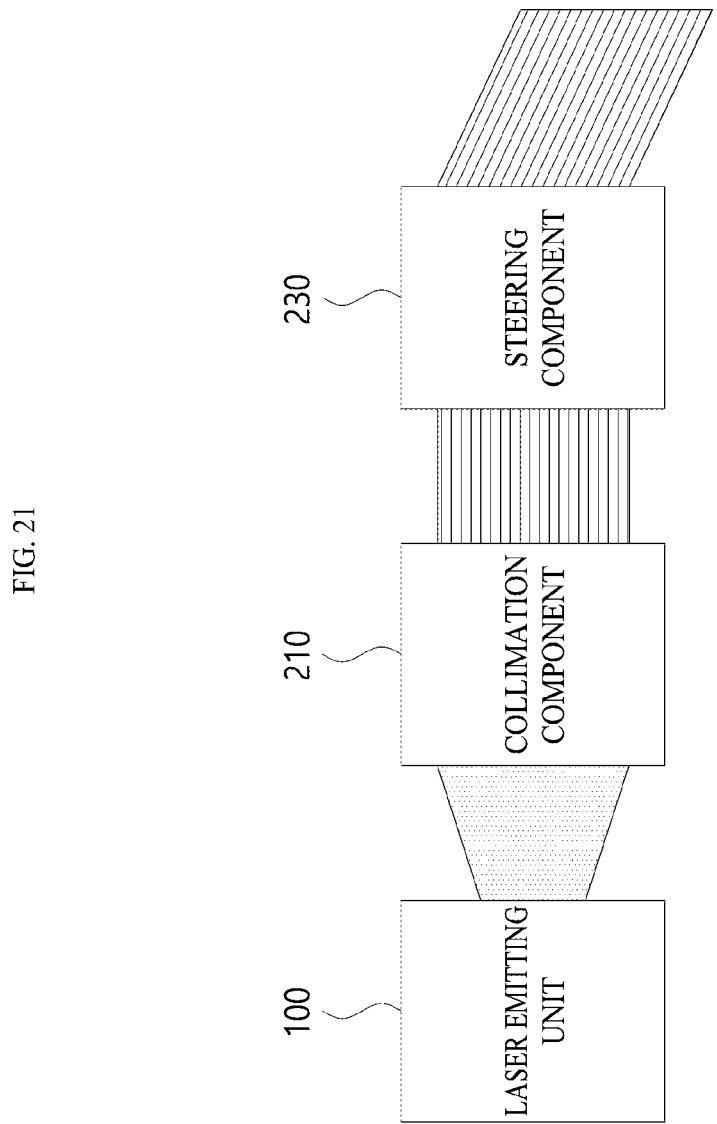
FIG. 21 is a diagram illustrating an optic unit according to an embodiment.

FIG. 21 is a diagram illustrating an optic unit according to an embodiment.

Referring to FIG. 21, the optic unit according to an embodiment may include a plurality of components. For example, the optic unit may include a collimation component 210 and a steering component 230.

According to an embodiment, the collimation component 210 may serve to collimate a beam emitted from a laser emitting unit 100, and the steering component 230 may serve to steer a collimated beam emitted from the collimation component 210. As a result, the laser beam emitted from the optic unit may travel in a predetermined direction.

The collimation component 210 may be a microlens or a metasurface.

When the collimation component 210 is a microlens, a microlens array may be disposed on one side of a substrate or on both sides of a substrate.

When the collimation component 210 is a metasurface, a laser beam may be collimated by a nanopattern formed by a plurality of nanopillars included in the metasurface.

The steering component 230 may be a microlens, a microprism, or a metasurface.

When the steering component 230 is a microlens, a microlens array may be disposed on one side of a substrate or on both sides of a substrate.

When the steering component 230 is a microprism, a laser beam may be steered by the angle of the microprism.

When the steering component 230 is a metasurface, a laser beam may be steered by a nanopattern formed by a plurality of nanopillars included in the metasurface.

Figure 22:
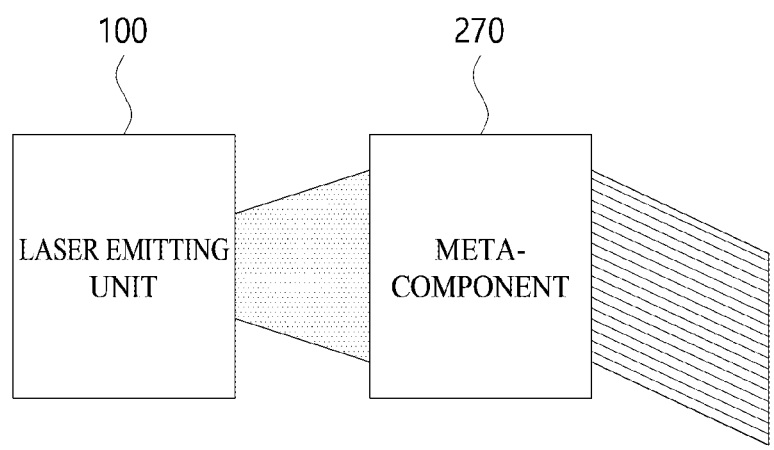
FIG. 22 is a diagram illustrating an optic unit according to an embodiment.

FIG. 22 is a diagram illustrating an optic unit according to an embodiment.

Referring to FIG. 22, the optic unit according to an embodiment may include one single component. For example, the optic unit may include a meta-component 270.

According to an embodiment, the meta-component 270 may collimate or steer a laser beam emitted from a laser emitting unit 100.

For example, the meta-component 270 may include a plurality of metasurfaces. One metasurface may collimate a laser beam emitted from the laser emitting unit 100, and another metasurface may steer a collimated laser beam. This will be described in detail below with reference to FIG. 23.

Alternatively, for example, the meta-component 270 may include one metasurface, which may collimate and steer a laser beam emitted from the laser emitting unit 100. This will be described in detail below with reference to FIG. 24.

Figure 23:
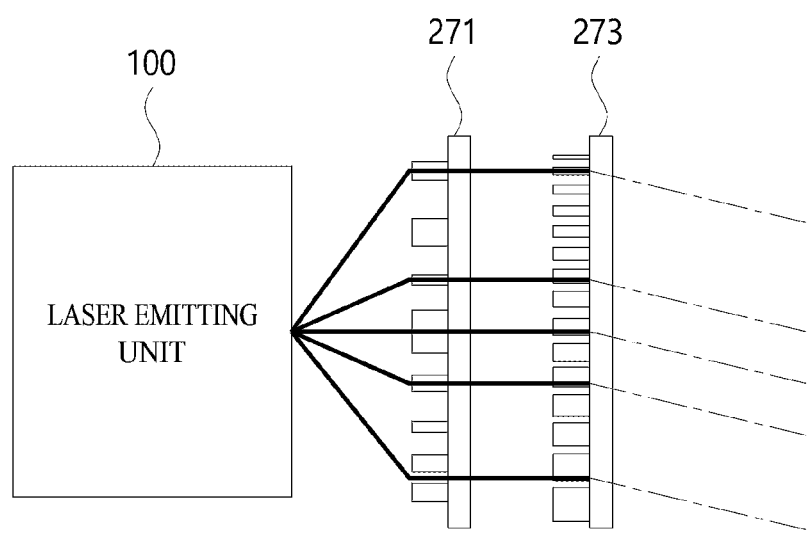
FIG. 23 is a diagram illustrating a meta component according to an embodiment.

FIG. 23 is a diagram illustrating a meta-component according to an embodiment.

Referring to FIG. 23, a meta-component 270 according to an embodiment may include a plurality of metasurfaces 271 and 273. For example, the meta-component 270 may include a first metasurface 271 and a second metasurface 273.

The first metasurface 271 may be disposed in a direction in which a laser beam is emitted from a laser emitting unit 100. The first metasurface 271 may include a plurality of nanopillars. The first metasurface 271 may form a nanopattern using the plurality of nanopillars. The first metasurface 271 may utilize the formed nanopattern to collimate a laser beam emitted from the laser emitting unit 100.

The second metasurface 273 may be disposed in a direction in which a laser beam is emitted from the first metasurface 271. The second metasurface 273 may include a plurality of nanopillars. The second metasurface 273 may form a nanopattern using the plurality of nanopillars. The second metasurface 273 may steer a laser beam emitted from the laser emitting unit 100 according to the formed nanopattern. For example, as shown in FIG. 23, the second metasurface 273 may steer the laser beam in a specific direction according to a change rate of the widths W of the plurality of nanopillars. Also, the second metasurface 273 may steer the laser beam in a specific direction according to the pitches P, the heights H, and the number per unit length of nanopillars.

Figure 24:
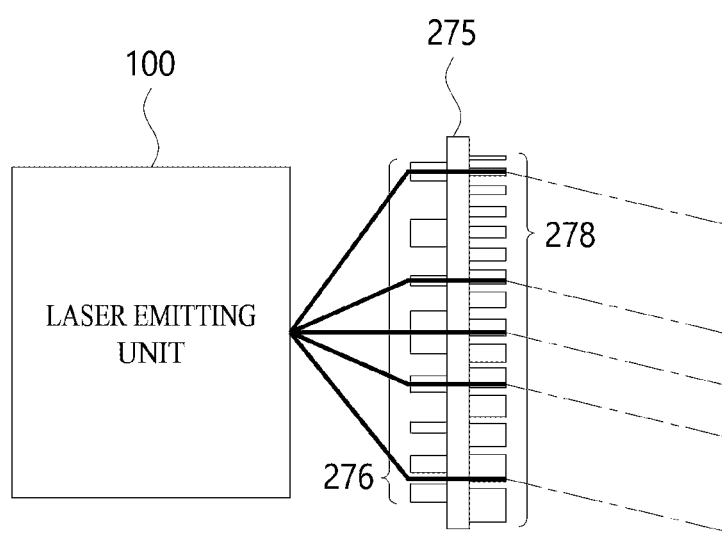
FIG. 24 is a diagram illustrating a meta component according to another embodiment.

FIG. 24 is a diagram illustrating a meta-component according to another embodiment.

Referring to FIG. 24, a meta-component 270 according to an embodiment may include one metasurface 274.

The metasurface 275 may include a plurality of nanopillars on both sides. For example, the metasurface 275 may include a first nanopillar set 276 on a first side and a second nanopillar set 278 on a second side.

The metasurface 275 may collimate a laser beam emitted from a laser emitting unit 100 and then steer the collimated laser beam using a plurality of nanopillars forming a nanopattern on each of the sides.

For example, the first nanopillar set 276 disposed on one side of the metasurface 275 may form a nanopattern. A laser beam emitted from the laser emitting unit 100 may be collimated by the nanopattern formed by the first nanopillar set 276. The second nanopillar set 278 disposed on the other side of the metasurface 275 may form a nanopattern. A laser beam having passed through the first nanopillar set 276 may be steered in a specific direction by the nanopattern formed by the second nanopillar set 278.

A LiDAR device according to an embodiment of the present disclosure will be described below.

Figure 25:
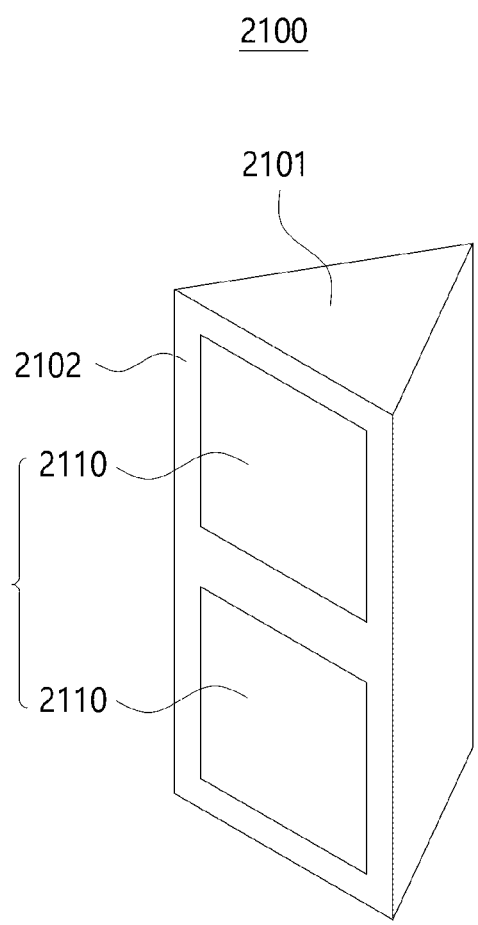
FIG. 25 is a diagram showing a VCSEL module according to an embodiment.

FIG. 25 is a diagram showing a VCSEL module according to an embodiment.

Referring to FIG. 25, a VCSEL module 2100 according to an embodiment may include a body 2101, a first face 2102, and a laser emitting unit 2130. Also, the laser beam output unit 2130 may include a first VCSEL array 2110 and a second VCSEL array 2120.

FIG. 25 shows a VCSEL module having the first VCSEL array 2110 and the second VCSEL array 2120 disposed vertically.

As an example, the laser emitting unit 2130 may include only one of the first VCSEL array 2110 and the second VCSEL array 2120. Alternatively, the first VCSEL array 2110 and the second VCSEL array 2120 may be disposed in the laser emitting unit 2130 horizontally. Alternatively, the laser emitting unit 2130 may include an additional VCSEL array in addition to the first VCSEL array 2110 and the second VCSEL array 2120.

The VCSEL module 2100 may include a laser emitting unit 2130, a detecting unit, and a processor. Also, the VCSEL module 2100 may include a plurality of optics.

The VCSEL module 2100 may have a plurality of faces. For example, the VCSEL module 2100 may have a shape such as a polygonal column, a circular column, a polygonal pyramid, and a circular pyramid, but the present disclosure is not limited thereto.

The VCSEL module 2100 may be made of synthetic resin, metal, or a combination thereof.

The laser emitting unit 2130 may be disposed on one face of the VCSEL module 2100. The laser emitting unit 2130 may include one laser emittng unit or a plurality of laser emitting units. When the laser emitting unit 2130 includes a plurality of laser emitting units, a first laser emitting unit and a second laser emitting unit included in the laser emiting unit 2130 may be disposed on the same face or on different faces.

Also, on one face of the VCSEL module 2100, the laser emitting unit 2130 may be disposed outside the VCSEL module 2100 or inside the VCSEL module 2100.

The VCSEL module 2100 may be transparent. For example, a face on which the laser emitting unit 2130 is disposed may be transparent.

According to an embodiment, when the laser emitting unit 2130 is disposed outside the VCSEL module 2100, the VCSEL module 2100 may be made of a transparent material so that a laser beam passes through the VCSEL module 2100 when the laser emitting unit 2130 emits the laser beam to the inside of the VCSEL module 2100.

Also, according to an embodiment, when the laser emitting unit 2130 is disposed inside the VCSEL module 2100, the VCSEL module 2100 may be made of a transparent material so that a laser beam passes through the VCSEL module 2100 when the laser emitting unit 2130 emits the laser beam to the outside of the VCSEL module 2100.

Also, a detecting unit may be disposed on one face of the VCSEL module 2100. The detecting unit may be one but may be plural. When there are multiple detecting units, a first detecting unit and a second detecting unit included in the detecting unit may be disposed on the same face or on different faces.

In the VCSEL module 2100, the face on which the laser emitting unit 2130 is disposed and the face on which the detecting unit is disposed may be the same or different.

The processor may be disposed on one face of the VCSEL module 2100. The face on which the processor is disposed and the face on which the laser emitting unit or the detecting unit is disposed may be the same or different.

Alternatively, the VCSEL module 2100 may accommodate the processor. Alternatively, the processor may be disposed outside the VCSEL module 2100.

According to an embodiment, the VCSEL module 2100 may use the processor to emit a laser beam from the laser emitting unit 2130. The VCSEL module 2100 may use the laser emitting unit 2130 to emit a laser beam to an object.

Also, the VCSEL module 2100 may acquire an emission time point of the laser beam. For example, the VCSEL module 2100 may use the processor to acquire an emission time point of the laser beam.

According to an embodiment, the VCSEL module 2100 emits a laser beam to an object. In this case, the laser beam emitted by the VCSEL module 2100 forms a certain field of view (FOV). The FOV may include a horizontal FOV or a vertical FOV.

The horizontal FOV may be along the horizontal axis of the module. Also, the vertical FOV may be along the vertical axis of the module.

Also, the FOV of the VCSEL module 2100 may be determined by the laser emitting unit 2130. For example, the horizontal FOV of the VCSEL module 2100 may be the horizontal FOV of the laser emitting unit 2130 or may be smaller than or equal to the sum of the horizontal FOVs of a plurality of laser emitting units, but the present disclosure is not limited thereto. Also, for example, the vertical FOV of the VCSEL module 2100 may be the vertical FOV of the laser emitting unit 2130 or may be smaller than or equal to the sum of the vertical FOVs of a plurality of laser emitting units, but the present disclosure is not limited thereto.

Also, the horizontal FOV of the VCSEL module 2100 may be defined based on the steering angle of the first VCSEL array 2110, the steering angle of the second VCSEL array 2120, and the divergence of the laser beam.

For example, when the horizontal FOV of each VCSEL array is 30 degrees, the horizontal FOV of the VCSEL module 2100 or the laser emitting unit 2130 may be 60 degrees or less, but the present disclosure is not limited thereto.

Also, for example, when the vertical FOV of each VCSEL array is 30 degrees, the vertical FOV of the VCSEL module 2100 or the laser emitting unit 2130 may be 30 degrees, but the present disclosure is not limited thereto.

Also, according to an embodiment, the VCSEL module 2100 may detect a laser beam reflected by an object. For example, the VCSEL module 2100 may use the detecting unit to detect a laser beam reflected by an object.

Also, the VCSEL module 2100 may acquire a detecting time point of the laser beam. For example, the VCSEL module 2100 may use the processor to acquire the detecting time point of the laser beam.

According to an embodiment, the processor may use the detecting unit to acquire the detecting time point of the laser beam.

For example, the processor may use a SPAD array to acquire the detecting time point of the laser beam, but the present disclosure is not limited thereto. In this case, the processor may use a histogram calculated by the SPAD array to acquire the reception time point of the laser beam, but the present disclosure is not limited thereto.

According to an embodiment, the VCSEL module 2100 has a first face 2102 on which the laser emitting unit 2130 is disposed. The first face may be disposed in a direction toward an object.

Also, one laser emitting unit 2130 may be disposed on the first face, or a plurality of laser emitting units 2130 may be disposed on the first face.

Also, a detecting unit may be disposed on the first face, but the present disclosure is not limited thereto.

Also, the first face may be flat or may be curved or stepped.

The laser emitting unit 2130 according to an embodiment may be disposed on one face of the VCSEL module 2100. For example, the laser emitting unit 2130 may be disposed on one face of the VCSEL module 2100 toward an object. For example, the laser emitting unit 2130 may be disposed on a first face 2102 of the VCSEL module 2100.

The laser emitting unit 2130 according to an embodiment may include a vertical-cavity surface-emitting laser (VCSEL). The VCSEL may be disposed on the first face 2102 of the VCSEL module 2100 to emit a laser beam perpendicularly to the first face 2102.

For example, the laser emitting unit 2130 may include a plurality of VCSEL emitters.

Also, for example, the laser emitting unit 2130 may include a plurality of VCSEL units, each of which includes a plurality of VCSEL emitters.

Also, for example, the laser emitting unit 2130 may include a plurality of VCSEL arrays, each of which includes a plurality of VCSEL units.

According to an embodiment, the laser emitting unit 2130 may emit a laser beam to an object. For example, the laser emitting unit 2130 may use the processor to emit a laser beam to an object.

Also, according to an embodiment, the laser emitting unit 2130 may include a first VCSEL array 2110 and a second VCSEL array 2120.

Also, according to an embodiment, the first VCSEL array 2110 and the second VCSEL array 2120 may be spaced apart from or adjacent to each other. For example, the first VCSEL array 2110 and the second VCSEL array 2120 may be spaced apart from or adjacent to the first face 2102 of the VCSEL module 2100.

According to an embodiment, the laser emitting unit 2130 emits a laser beam to an object. In this case, the laser beam emitted by the laser emitting unit 2130 forms a certain FOV. The FOV may include a horizontal FOV or a vertical FOV.

Also, the FOV of the laser emitting unit 2130 may be determined by the first VCSEL array 2110 and the second VCSEL array 2120. For example, the horizontal FOV of the laser emitting unit 2130 may be smaller than or equal to the sum of the horizontal FOVs of the first VCSEL array 2110 and the second VCSEL array 2120, but the present disclosure is not limited thereto. Also, for example, the vertical FOV of the laser emitting unit 2130 may be smaller than or equal to the sum of the vertical FOVs of the first VCSEL array 2110 and the second VCSEL array 2120, but the present disclosure is not limited thereto.

Also, the horizontal FOV of the VCSEL module 2100 may be defined based on the steering angle of the first VCSEL array 2110, the steering angle of the second VCSEL array 2120, and the divergence of the laser beam.

According to an embodiment, the first VCSEL array 2110 may be disposed on the VCSEL module 2100. For example, the first VCSEL array 2110 may be disposed on the first face 2102 of the VCSEL module 2100.

Also, according to an embodiment, the first VCSEL array 2110 may be a VCSEL unit or a VCSEL array including a plurality of VCSEL units.

Also, according to an embodiment, the first VCSEL array 2110 forms a certain FOV. For example, the first VCSEL array 2110 forms a horizontal FOV and a vertical FOV.

According to an embodiment, the second VCSEL array 2120 may be disposed on the VCSEL module 2100. For example, the second VCSEL array 2120 may be disposed on the first face 2102 of the VCSEL module 2100.

Also, according to an embodiment, the second VCSEL array 2120 may be a VCSEL unit or a VCSEL array including a plurality of VCSEL units.

Also, according to an embodiment, the second VCSEL array 2120 forms a certain FOV. For example, the second VCSEL array 2120 forms a horizontal FOV and a vertical FOV.

According to an embodiment, the first VCSEL array 2110 and the second VCSEL array 2120 may be the same or different.

For example, the first VCSEL array 2110 and the second VCSEL array 2120 may have the same number of VCSEL units or the same number of VCSEL emitters, but the present disclosure is not limited thereto. Also, for example, the FOVs or emission ranges of the first VCSEL array 2110 and the second VCSEL array 2120 may be the same, but the present disclosure is not limited thereto. Also, for example, the first VCSEL array 2110 and the second VCSEL array 2120 may have the same size or may be made of the same material, but the present disclosure is not limited thereto.

When the first VCSEL array 2110 and the second VCSEL array 2120 are the same, the second VCSEL array 2120 may be a 180-degree rotation of the first VCSEL array 2110, but the present disclosure is not limited thereto.

The first VCSEL array 2110 and the second VCSEL array 2120 may have the same FOV angle or different FOV angles.

When the FOV angle of the first VCSEL array 2110 and the FOV angle of the second VCSEL array 2120 are the same, the horizontal FOV of the first VCSEL array 2110 may be the same as the horizontal FOV of the second VCSEL array 2120. Also, the vertical FOV of the first VCSEL array 2110 may be the same as the vertical FOV of the second VCSEL array 2120.

The horizontal FOV of the first VCSEL array 2110 and the horizontal FOV of the second VCSEL array 2120 may have the same angle and different irradiation ranges. For example, when the horizontal FOV of the first VCSEL array 2110 and the horizontal FOV of the second VCSEL array 2120 have an angle of N°, the horizontal FOV emission range of the first VCSEL array 2110 may range from −N° to 0°, and the horizontal FOV emission range of the second VCSEL array 2120 may range from 0° to N°, but the present disclosure is not limited thereto.

Alternatively, the horizontal FOV of the first VCSEL array 2110 and the horizontal FOV of the second VCSEL array 2120 may partially overlap. For example, the horizontal FOV emission range of the first VCSEL array 2110 may be from −N° to M°, and the horizontal FOV emission range of the second VCSEL array 2120 may be from −M° to N°, but the present disclosure is not limited thereto.

According to an embodiment, the first VCSEL array 2110 and the second VCSEL array 2120 may be spaced apart from or adjacent to each other.

Figure 26:
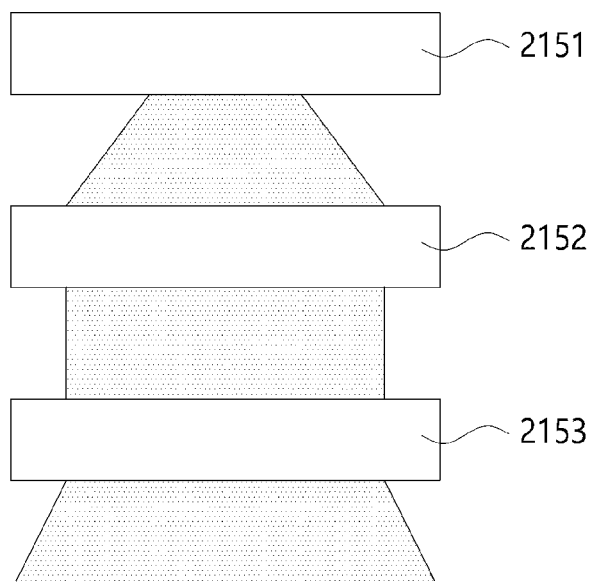
FIG. 26 is a diagram showing a laser emitting unit according to an embodiment.

FIG. 26 is a diagram showing a laser emitting unit according to an embodiment.

Referring to FIG. 26, a laser emitting unit 2150 according to an embodiment may include a laser emitting element 2151 and a plurality of optics, for example, a first optic 2152 and a second optic 2153.

According to an embodiment, the laser emitting unit 2130 may use an optic to change a flight path of a laser beam emitted from a laser emitting element.

The optic may include, for example, an optical phased array (OPA), a lens, a microlens, a microlens array, a prism, a microprism, a microprism array, and a metasurface.

The optic may collimate a laser beam emitted from a laser emitting element. Also, the optic may steer a laser beam emitted from a laser emitting element in one direction. Alternatively, the optic may collimate a laser beam emitted from a laser emitting element and then steer the collimated laser beam in one direction.

According to an embodiment, the laser emitting element 2151 may be one of a VCSEL emitter, a VCSEL unit, and a VCSEL array. The laser emitting element may be disposed on the first face 2102 of the body 2101 of the VCSEL module 2100.

According to an embodiment, the first optic 2152 may collimate a laser beam. Also, the second optic 2153 may steer a laser beam.

According to an embodiment, the first optic 2152 may be disposed in a direction in which a laser beam is emitted from the laser emitting element 2151. Also, the second optic 2153 may be disposed in a direction in which a laser beam is emitted from the first optic 2152, but the present disclosure is not limited thereto.

Also, according to an embodiment, the laser emitting element 2151, the first optic 2152, and the second optic 2153 may be spaced apart from or adjacent to one another.

Also, according to another embodiment, the functions of the first optic 2152 and the second optic 2153 may be implemented by another optic, but the present disclosure is not limited thereto.

Figure 27:
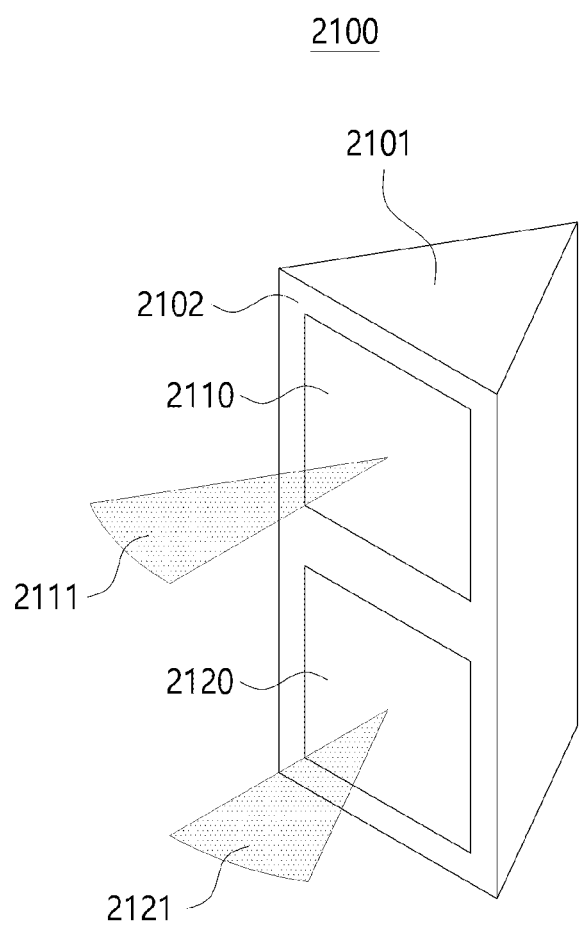
FIGS. 27 to 29 are diagrams showing a VCSEL module according to an embodiment.
Figure 28:
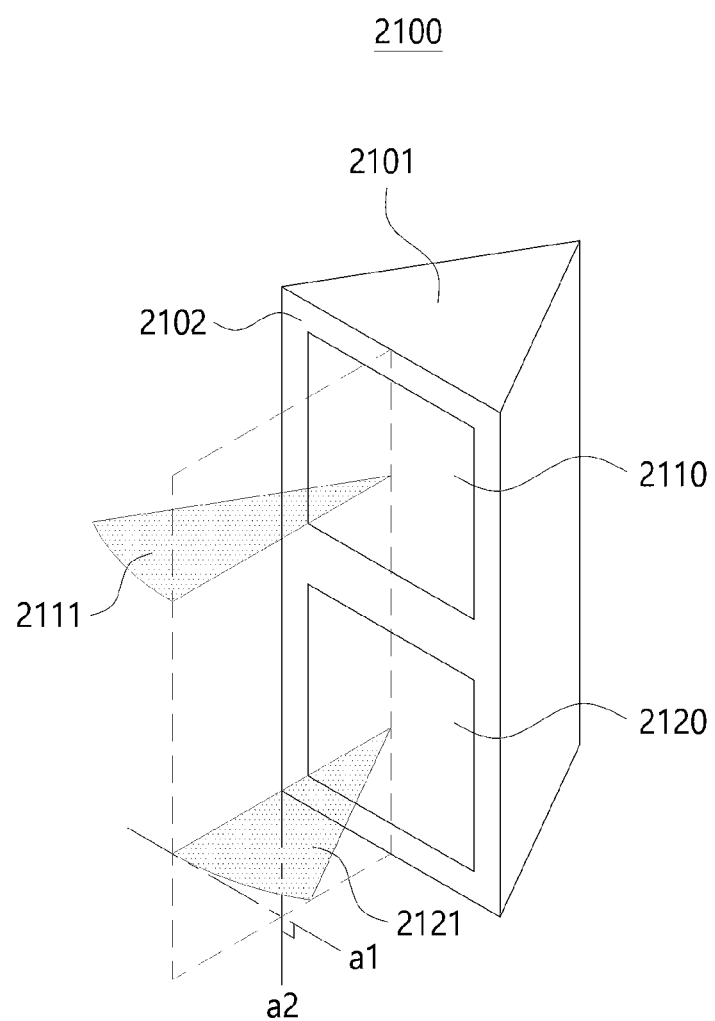
Figure 29:
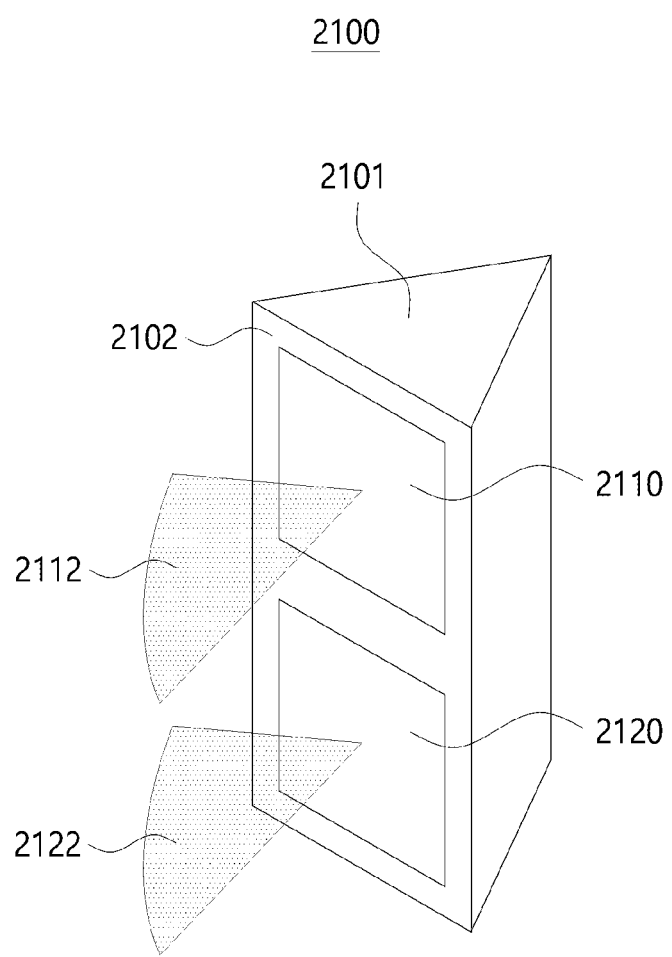

Referring to FIGS. 27 to 29, a VCSEL module 2100 according to an embodiment may include a body 2101, a first face 2102, and a laser emitting unit 2130. Also, the laser emitting unit 2130 may include a first VCSEL array 2110 and a second VCSEL array 2120.

As shown in FIG. 27, the first VCSEL array 2110 may form a first horizontal FOV 2111. Also, the second VCSEL array 2120 may form a second horizontal FOV 2121.

FIG. 27 shows that laser beams are emitted from one point, but this is a drawing illustrated for convenience in order to explain the horizontal FOV. The present disclosure is not limited thereto, and in the case of the VCSEL arrays 2110 and 2120, laser beams may be emitted not from one point but from several points.

The first horizontal FOV 2111 and the second horizontal FOV 2121 may overlap, but the present disclosure is not limited thereto.

As shown in FIG. 28, the first VCSEL array 2110 may form a first horizontal FOV 2111. Also, the second VCSEL array 2120 may form a second horizontal FOV 2121.

FIG. 28 shows that laser beams are emitted from one point, but this is a drawing illustrated for convenience in order to explain the horizontal FOV. The present disclosure is not limited thereto, and laser beams may be emitted to the VCSEL arrays 2110 and 2120 not from one point but from several points.

The horizontal axis of the first face 2102 of the VCSEL module 2100 may be defined as a first axis a1, and the vertical axis of the first face 2102 of the VCSEL module 2100 may be defined as a second axis a2. The first axis a1 and the second axis a2 may be orthogonal to each other.

The first horizontal FOV 2111 and the second horizontal FOV 2121 may be symmetrical with respect to the second axis a2, but the present disclosure is not limited thereto. Also, the first horizontal FOV 2111 and the second horizontal FOV 2121 may be symmetrical with respect to a face perpendicular to the first face 2102 of the VCSEL module 2100, but the present disclosure is not limited thereto.

According to an embodiment, the second VCSEL array 2120 may be a 180-degree rotation of the first VCSEL array 2110. Thus, a plurality of identical VCSEL arrays may be manufactured in a manufacturing process. Then, when the identical VCSEL arrays are placed in the VCSEL module 2100, one of the identical VCSEL arrays may be placed, and another one of the identical VCSEL arrays may be rotated 180 degrees with respect to the one identical VCSEL array and then placed in the VCSEL module.

As described above, the rotating of identical VCSEL arrays by 180 degrees and the placing of the VCSEL arrays can simplify a manufacturing process and can also increase steering efficiency because the steering ranges of the VCSEL arrays are symmetrical.

When a desired horizontal FOV for the VCSEL module is 2N degrees, the 2N degrees cannot be satisfied by the optic included in the laser emitting unit. For example, it is assumed that the desired horizontal FOV for the VCSEL module is 60 degrees. When the optic included in the laser emitting unit is a microprism as an example, a microprism with various angles should be included to form a steering angle of 60 degrees. However, actually, there may be difficulties in implementing the microprism to have a specific angle or less. When the angle of the microprism is less than or equal to the specific angle as an example, steering efficiency may be drastically reduced. For example, when the angle of the microprism is less than or equal to 0.25 degrees, the difficulty of the implementation may increase, and the steering efficiency may decrease, but the present disclosure is not limited thereto.

In order to solve such a problem, a plurality of VCSEL arrays may be used. For example, when the desired horizontal FOV for the VCSEL module is 2N degrees, a plurality of VCSEL arrays having a horizontal FOV of N degrees may be used.

For example, when the desired horizontal FOV for the VCSEL module is 60 degrees, the laser emitting unit may include two VCSEL arrays each having a horizontal FOV of 30 degrees. In this case, one of the plurality of VCSEL arrays may cover an FOV of 0 degrees at −30 degrees, and another one of the plurality of VCSEL arrays may cover an FOV of 30 degrees at 0 degrees. As a result, the horizontal FOV of the laser emitting unit may be formed to be 60 degrees. The horizontal FOV of the laser emitting unit may be the horizontal FOV of the VCSEL module, and as a result, the horizontal FOV of the VCSEL module may be formed to be 60 degrees.

As shown in FIG. 29, the first VCSEL array 2110 may form a first vertical FOV 2112. Also, the second VCSEL array 2120 may form a second vertical FOV 2122.

FIG. 29 shows that laser beams are emitted from one point, but this is a drawing illustrated for convenience in order to explain the vertical FOV. The present disclosure is not limited thereto, and in the case of the VCSEL arrays 2110 and 2120, laser beams may be emitted not from one point but from several points.

The first VCSEL array 2110 and the second VCSEL array 2120 may form vertical FOVs 2112 and 2122 along an axis perpendicular to the first face 2102. For example, the vertical FOVs 2112 and 2122 of the first VCSEL array 2110 and the second VCSEL array 2120 may be formed by a plurality of optics or one optic included in the laser emitting unit, but the present disclosure is not limited thereto.

The first vertical FOV 2112 and the second vertical FOV 2122 may have the same irradiation angle. For example, the first vertical FOV 2112 and the second vertical FOV 2122 may have an irradiation angle of 30 degrees, but the present disclosure is not limited thereto.

Also, the first vertical FOV 2112 and the second vertical FOV 2122 may overlap, but the present disclosure is not limited thereto.

According to an embodiment, the vertical FOV of the laser emitting unit may be less than or equal to the sum of the vertical FOVs of the first VCSEL array 2110 and the second VCSEL array 2120. According to an embodiment, the vertical FOV of the VCSEL module 2100 may be less than or equal to the sum of the vertical FOVs of the first VCSEL array 2110 and the second VCSEL array 2120.

Also, the vertical FOV of the VCSEL module 2100 may be defined based on the steering angle of the first VCSEL array 2110, the steering angle of the second VCSEL array 2120, and the divergence of the laser beam.

Figure 30:
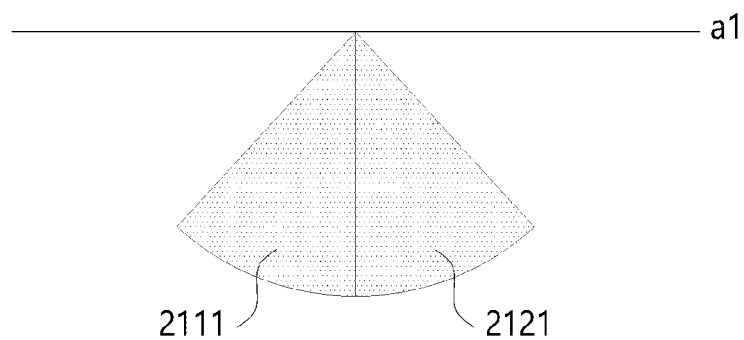

FIGS. 30 and 31 are diagrams showing a horizontal FOV of a VCSEL module according to an embodiment when viewed from the top.

Referring to FIGS. 30 and 31, a first VCSEL array 2110 and a second VCSEL array 2120 form horizontal FOVs with respect to a first axis a1. The first VCSEL array 2110 may form a first horizontal FOV 2111 with respect to the first axis a1. The second VCSEL array 2120 may form a second horizontal FOV 2121 with respect to the first axis a1.

The first horizontal FOV 2111 and the second horizontal FOV 2121 may overlap, but the present disclosure is not limited thereto.

Referring to FIG. 31, the first horizontal FOV 2111 may include outermost laser beams 2113, 2114, 2123, and 2124.

For example, the outermost laser beams may refer to laser beams of a VCSEL array having the maximum irradiation angle and the minimum irradiation angle, but the present disclosure is not limited thereto.

For example, a position value of a laser beam may be determined with respect to the first axis a1 on a virtual plane spaced apart from the VCSEL array. For example, a position value of the laser beam 2114 may be greater than a position value of the laser beam 2113 with respect to the first axis a1 on a virtual plane spaced apart from the VCSEL array.

For example, the first horizontal FOV 2111 may include the first laser beam 2114, which is a laser beam having a greater position value with respect to the first axis a1 among the outermost laser beams. Also, for example, the second horizontal FOV 2121 may include the second laser beam 2123, which is a laser beam having a smaller position value with respect to the first axis a1 among the outermost laser beams.

According to an embodiment, the first laser beam 2114 and the second laser beam 2123 may have the same traveling direction. In this case, the traveling directions of the first laser beam 2113 and the second laser beam 2123 may be perpendicular to the first axis a1. Also, the traveling directions of the first laser beam 2113 and the second laser beam 2123 may be perpendicular to the first face 2102.

Figure 32:
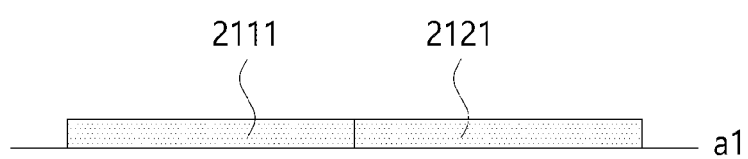
Figure 33:
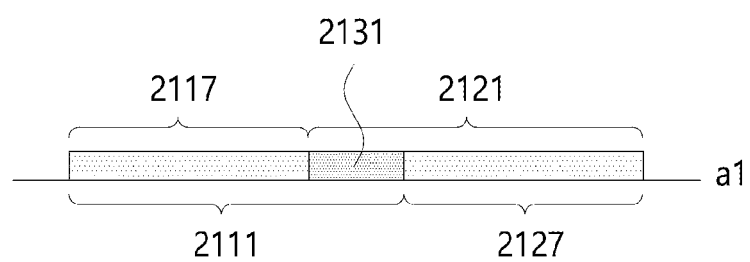

FIGS. 32 to 34 are diagrams showing a horizontal FOV of a VCSEL module according to an embodiment when viewed from the front.

Referring to FIGS. 32 to 34, a first VCSEL array 2110 and a second VCSEL array 2120 form horizontal FOVs with respect to a first axis a1. The first VCSEL array 2110 may form a first horizontal FOV 2111 with respect to the first axis a1. The second VCSEL array 2120 may form a second horizontal FOV 2121 with respect to the first axis a1.

The first horizontal FOV 2111 and the second horizontal FOV 2121 may overlap, but the present disclosure is not limited thereto.

Referring to FIG. 33, the first horizontal FOV 2111 may include a first region 2131 and a second region 2117. The first region 2131 may be a region overlapping with the second horizontal FOV 2121. The second region 2117 may be a region not overlapping with the second horizontal FOV 2121.

The second horizontal FOV 2121 may include a first region 2131 and a third region 2127. The first region 2131 may be a region overlapping with the first horizontal FOV 2121. The third region 2127 may be a region not overlapping with the first horizontal FOV 2121.

Referring to FIG. 34, the first horizontal FOV 2111 may be formed by a laser beam 2116 irradiated in a direction perpendicular to the first face 2102 and a laser beam 2115 irradiated in a direction not perpendicular to the first face 2102.

The laser beam 2116 irradiated in the direction perpendicular to the first face 2102 and the laser beam 2115 irradiated in the direction not perpendicular to the first face 2102 may be emitted by an optic or by placing a VCSEL emitter included in a VCSEL array. That is, the direction of the laser beam may be determined by an optic or by placing a VCSEL emitter.

Referring to FIG. 34, the laser beam 2116 irradiated in the direction perpendicular to the first face 2102 is shown as one arrow, but the present disclosure is not limited thereto. A plurality of laser beams may be irradiated in the direction perpendicular to the first face 2102.

Also, the second horizontal FOV 2121 may be formed by a laser beam 2126 irradiated in the direction perpendicular to the first face 2102 and a laser beam 2125 irradiated in the direction not perpendicular to the first face 2102.

The first region 2131 may be a region where the first horizontal FOV 2111 and the second horizontal FOV 2121 overlap.

According to an embodiment, the first region 2131 may be formed by laser beams irradiated in several directions in order to form a horizontal FOV.

For example, the first region 2131 may be a region formed by the laser beam 2116 irradiated in the direction perpendicular to the first face 2102 among the laser beams forming the first horizontal FOV 2111. Also, the first region 2131 may be a region formed by the laser beam 2115 irradiated in the direction not perpendicular to the first face 2102 among the laser beams forming the first horizontal FOV 2111.

Also, for example, the first region 2131 may be a region formed by the laser beam 2126 irradiated in the direction perpendicular to the first face 2102 among the laser beams forming the second horizontal FOV 2121. Also, the first region 2131 may be a region formed by the laser beam 2125 irradiated in the direction not perpendicular to the first face 2102 among the laser beams forming the second horizontal FOV 2121.

The description of the horizontal FOV of the VCSEL module 2100 with reference to FIGS. 30 to 34 is applicable even to VCSEL modules 2200 shown in FIGS. 36 to 39.

Figure 35:
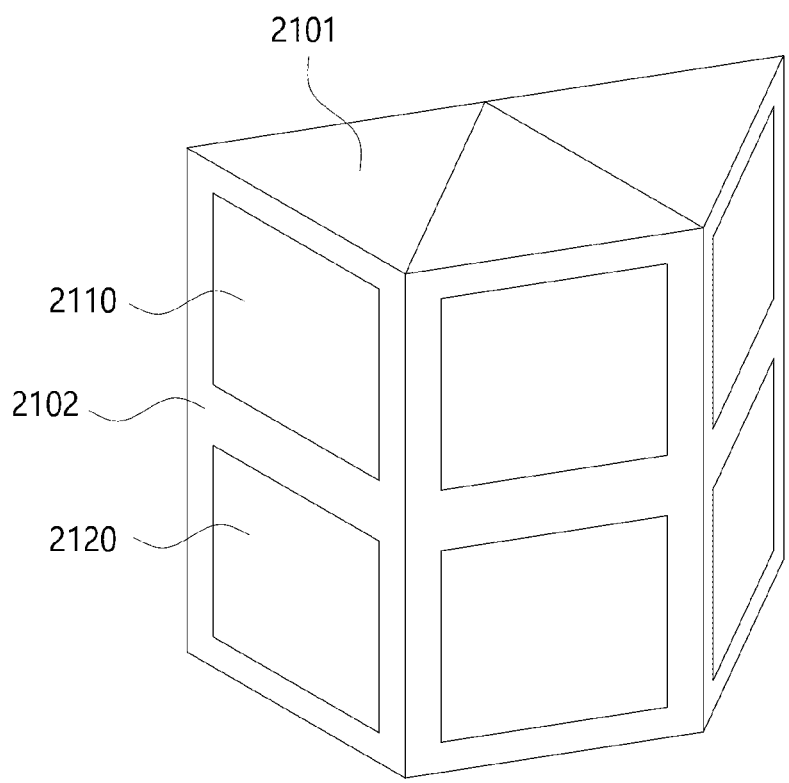
FIG. 35 is a diagram showing a LiDAR device according to an embodiment.

FIG. 35 is a diagram showing a LiDAR device according to an embodiment.

Referring to FIG. 35, a LiDAR device 2001 according to an embodiment may include a plurality of VCSEL modules 2100.

The LiDAR device 2001 according to an embodiment may be in a form in which the plurality of VCSEL modules 2100 are adjacent to one another or in a form in which the plurality of VCSEL modules 2100 are spaced apart from one another. For example, when the LiDAR device 2001 is in the form in which the plurality of VCSEL modules 2100 are adjacent to one another, the adjacent VCSEL modules 2100 may share one face.

Also, in the LiDAR device 2001 according to an embodiment, the first face 2102 on which laser emitting units 2130 of the adjacent VCSEL modules 2100 are disposed may be bent at an angle or curved or may be unbent or flat.

Also, when the horizontal FOV of the VCSEL module is N°, the LiDAR device 2001 according to an embodiment may include M/N VCSEL modules in order to satisfy an angle of M°, which is the horizontal FOV of the whole LiDAR device desired by a user.

For example, when the horizontal FOV of the VCSEL module is 60°, the LiDAR device 2001 according to an embodiment may include three VCSEL modules in order to satisfy 180°, which is the horizontal FOV of the whole LiDAR device desired by a user. In this case, the 60-degree horizontal FOV of the VCSEL module may be formed by a plurality of VCSEL arrays. For example, the 60-degree horizontal FOV of the VCSEL module may be formed by two VCSEL arrays with a horizontal FOV of 30 degrees. In this case, the LiDAR device may include three VCSEL modules with a horizontal FOV of 60 degrees each including two VCSEL arrays with a horizontal FOV of 30 degrees.

FIGS. 36 to 39 are diagrams showing a VCSEL module according to another embodiment.

Referring to FIGS. 36 to 39, a VCSEL module 2200 according to an embodiment may include a body 2201, a first face 2202, and a laser emitting unit 2230. Also, the laser emitting unit 2230 may include a first VCSEL array 2210 and a second VCSEL array 2220.

Figure 36:
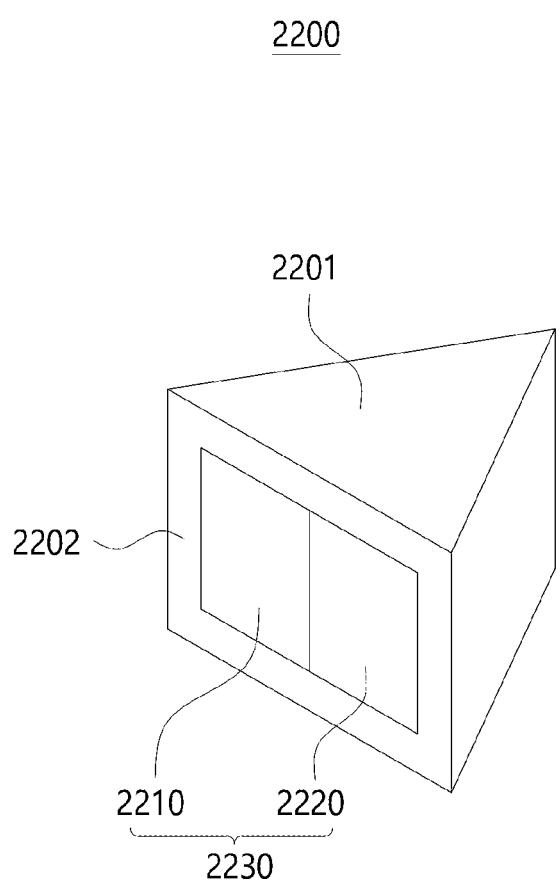
FIGS. 36 to 39 are diagrams showing a VCSEL module according to another embodiment.

FIG. 36 shows a VCSEL module having the first VCSEL array 2210 and the second VCSEL array 2220 disposed horizontally, but the present disclosure is not limited thereto.

A description of the VCSEL module 2200 may overlap with the above description of the VCSEL module 2100, and thus a detailed description thereof will be omitted.

A description of the body 2201 may overlap with the above description of the body 2101, and thus a detailed description thereof will be omitted.

A description of the first face 2202 may overlap with the above description of the face 2102, and thus a detailed description thereof will be omitted.

A description of the laser emitting unit 2230 may overlap with the above description of the laser emitting unit 2130, and thus a detailed description thereof will be omitted.

A description of the first VCSEL array 2210 may overlap with the above description of the first VCSEL array 2110, and thus a detailed description thereof will be omitted.

A description of the second VCSEL array 2220 may overlap with the above description of the second VCSEL array 2120, and thus a detailed description thereof will be omitted.

Referring to FIG. 36, the laser emitting unit 2230 of the VCSEL module 2200 may include the first VCSEL array 2210 and the second VCSEL array 2220.

According to an embodiment, the first VCSEL array 2210 may include a first VCSEL unit configured to emit a laser beam in a first direction. Also, the first VCSEL array 2210 may include a second VCSEL unit configured to emit a laser beam in a second direction.

In this case, the first direction and the second direction may be the same or different. For example, the difference between the first direction and the second direction may be 0.104 degrees, but the present disclosure is not limited thereto.

According to an embodiment, the second VCSEL array 2220 may include a third VCSEL unit configured to emit a laser beam in a third direction.

In this case, the third direction may be the same as or different from the first direction. For example, the first direction and the third direction may be directions perpendicular to the first face 2202 of the VCSEL module 2200, but the present disclosure is not limited thereto.

According to an embodiment, the first VCSEL unit and the second VCSEL unit may not be spaced apart from each other or may be spaced at a first interval. Also, the first VCSEL unit and the second VCSEL unit may be adjacent to each other. Also, the first VCSEL unit and the second VCSEL unit may be spaced at a first interval and adjacent to each other. Also, for example, the first VCSEL unit and the second VCSEL unit may be neighboring each other at a first interval.

Also, the first VCSEL unit and the third VCSEL unit may not be spaced apart or may be spaced at a certain interval. In this case, the interval between the first VCSEL unit and the third VCSEL unit may be less than or equal to the first interval, which is an interval between the first VCSEL unit and the second VCSEL unit. Also, the first VCSEL unit and the third VCSEL unit may be adjacent to each other. For example, the first VCSEL unit and the third VCSEL unit may be adjacent to each other and at an interval less than or equal to the first interval. Also, for example, the first VCSEL unit and the third VCSEL unit may be neighboring each other at an interval less than or equal to the first interval.

According to another embodiment, the first VCSEL unit may be the outermost VCSEL unit of the first VCSEL array. For example, the first VCSEL unit may be a VCSEL unit disposed on the rightmost of the first VCSEL array, but the present disclosure is not limited thereto.

Also, the third VCSEL unit may be the outermost VCSEL unit of the second VCSEL array. For example, the third VCSEL unit may be a VCSEL unit disposed on the leftmost side of the second VCSEL array.

In this case, the interval between the first VCSEL unit and the third VCSEL unit may be less than or equal to the first interval. When the interval between the first VCSEL unit and the third VCSEL unit exceeds the first interval, a dead zone, to which no laser beam is irradiated, may be formed between the first VCSEL array and the second VCSEL array. In order to prevent a dead zone from being formed between the first VCSEL array and the second VCSEL array, the interval between the first VCSEL unit and the third VCSEL unit may be adjusted.

The interval between the first VCSEL unit and the third VCSEL unit may be defined based on the steering angle of the first VCSEL unit, the steering angle of the third VCSEL unit, and the divergence angle of a laser beam.

For example, when the steering angle of the first VCSEL unit and the steering angle of the third VCSEL unit are perpendicular to the first face 2202, the interval between the first VCSEL unit and the third VCSEL unit may be the first interval, but the present disclosure is not limited thereto.

Figure 37:
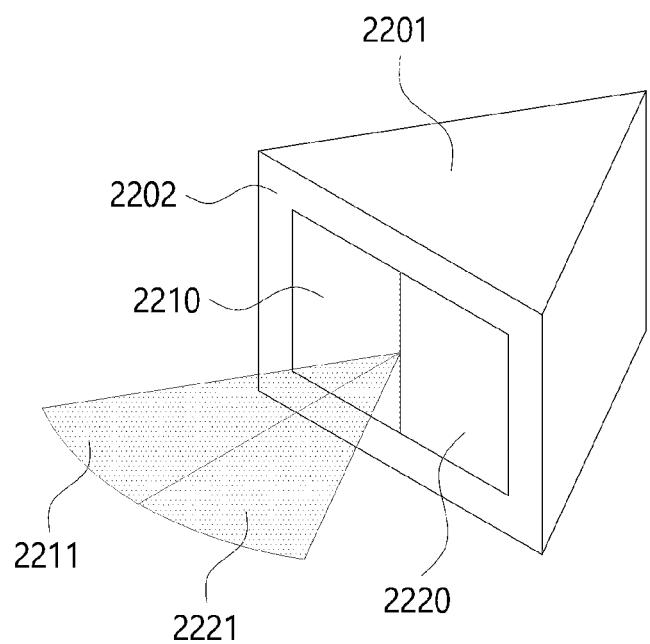

As shown in FIG. 37, the first VCSEL array 2210 may form a first horizontal FOV 2211. Also, the second VCSEL array 2220 may form a second horizontal FOV 2221.

The first horizontal FOV 2211 and the second horizontal FOV 2221 may overlap, but the present disclosure is not limited thereto.

Figure 38:
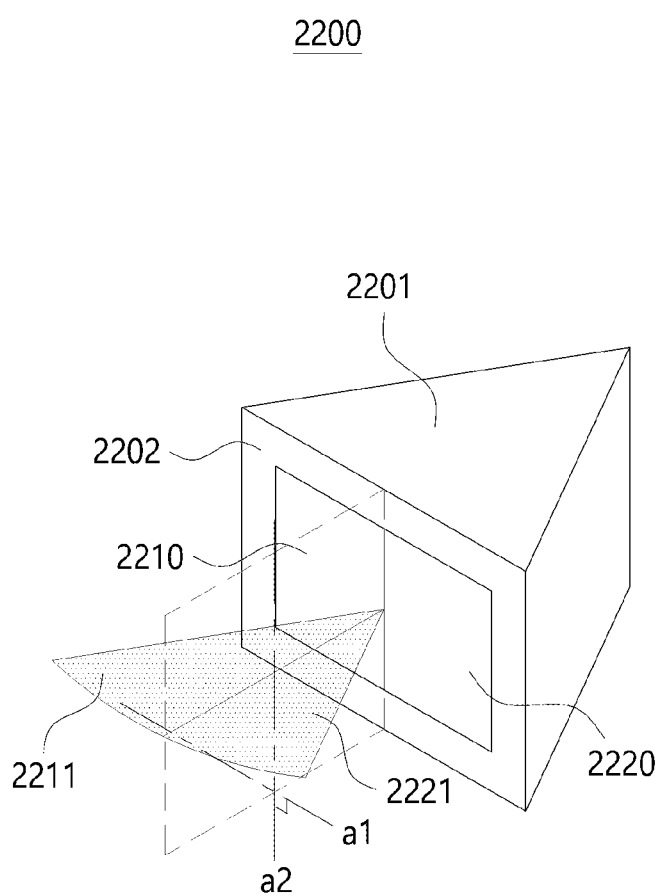

As shown in FIG. 38, the first VCSEL array 2210 may form a first horizontal FOV 2211. Also, the second VCSEL array 2220 may form a second horizontal FOV 2221.

The first face 2202 of the VCSEL module 2200 may be parallel to a first axis a1 and perpendicular to a second axis a2. The first axis a1 and the second axis a2 may be orthogonal to each other.

The first horizontal FOV 2211 and the second horizontal FOV 2221 may be symmetrical with respect to the second axis a2, but the present disclosure is not limited thereto. Also, the first horizontal FOV 2211 and the second horizontal FOV 2221 may be symmetrical with respect to a face perpendicular to the first face 2202 of the VCSEL module 2200, but the present disclosure is not limited thereto.

According to an embodiment, the second VCSEL array 2220 may be a 180-degree rotation of the first VCSEL array 2210. Thus, a plurality of identical VCSEL arrays may be manufactured in a manufacturing process. Then, when the identical VCSEL arrays are disposed in the VCSEL module 2200, one of the identical VCSEL arrays may be disposed, and another one of the identical VCSEL arrays may be rotated 180 degrees with respect to the one identical VCSEL array and then disposed in the VCSEL module.

As described above, the rotating of identical VCSEL arrays by 180 degrees and the placing of the VCSEL arrays can simplify a manufacturing process and can also increase steering efficiency because the steering ranges of the VCSEL arrays are symmetrical.

When the desired horizontal FOV for the VCSEL module is 2N degrees, the 2N degrees cannot be satisfied by the optic included in the laser emitting unit. For example, it is assumed that the desired horizontal FOV for the VCSEL module is 60 degrees. When the optic included in the laser emitting unit is a microprism as an example, a microprism with various angles should be included to form a steering angle of 60 degrees. However, actually, there may be difficulties in implementing a microprism having a specific angle or less. When the angle of the microprism is less than or equal to the specific angle as an example, steering efficiency may be drastically reduced. For example, when the angle of the microprism is less than or equal to 0.25 degrees, the difficulty of the implementation may increase, and the steering efficiency may decrease, but the present disclosure is not limited thereto.

In order to solve such a problem, a plurality of VCSEL arrays may be used. For example, when the desired horizontal FOV for the VCSEL module is 2N degrees, a plurality of VCSEL arrays having a horizontal FOV of N degrees may be used.

For example, when the desired horizontal FOV for the VCSEL module is 60 degrees, the laser emitting unit may include two VCSEL arrays each having a horizontal FOV of 30 degrees. In this case, one of the plurality of VCSEL arrays may cover an FOV of 0 degrees at −30 degrees, and another one of the plurality of VCSEL arrays may cover an FOV of 30 degrees at 0 degrees. As a result, the horizontal FOV of the laser emitting unit may be formed to be 60 degrees. The horizontal FOV of the laser emitting unit may be the horizontal FOV of the VCSEL module, and as a result, the horizontal FOV of the VCSEL module may be formed to be 60 degrees.

Figure 39:
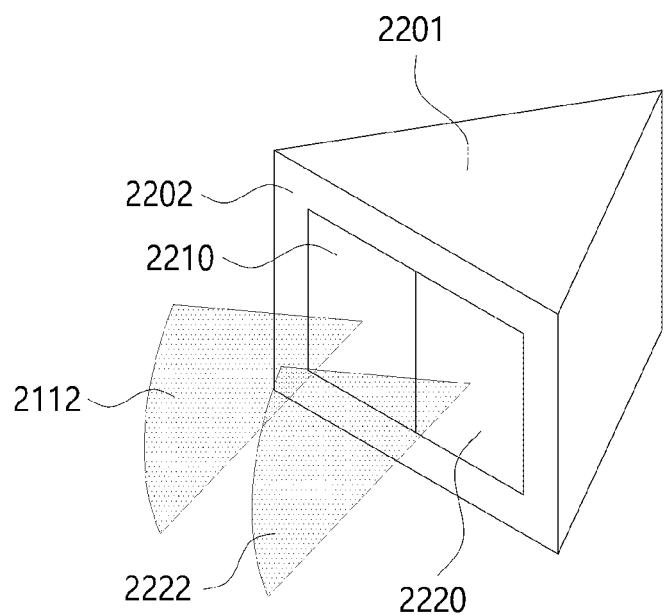

As shown in FIG. 39, the first VCSEL array 2210 may form a first vertical FOV 2212. Also, the second VCSEL array 2220 may form a second vertical FOV 2222.

The first vertical FOV 2212 and the second vertical FOV 2222 may have the same irradiation angle. For example, the first vertical FOV 2112 and the second vertical FOV 2122 may have an irradiation angle of 30 degrees, but the present disclosure is not limited thereto.

Also, the first vertical FOV 2112 and the second vertical FOV 2122 may overlap, but the present disclosure is not limited thereto.

The description of the horizontal FOV of the VCSEL module 2200 with reference to FIGS. 36 to 30 may be the same as the description of the horizontal FOV of the VCSEL module 2100 with reference to FIGS. 30 to 34.

Figure 40:
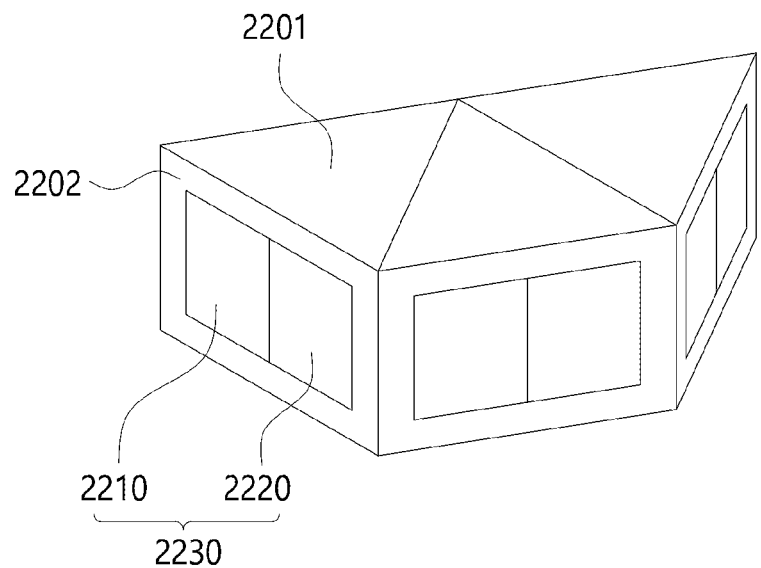
FIG. 40 is a diagram showing a LiDAR device according to another embodiment.

FIG. 40 is a diagram showing a LiDAR device according to another embodiment.

Referring to FIG. 40, a LiDAR device 2002 according to an embodiment may include a plurality of VCSEL modules 2200.

The LiDAR device 2002 according to an embodiment may be in a form in which the plurality of VCSEL modules 2200 are adjacent to one another or in a form in which the plurality of VCSEL modules 2200 are spaced apart from one another. For example, when the LiDAR device 2002 is in the form in which the plurality of VCSEL modules 2200 are adjacent to one another, the adjacent VCSEL modules 2200 may share one face.

Also, the first face 2202 of the LiDAR device 2002 according to an embodiment on which laser emitting units 2230 of the adjacent VCSEL modules 2200 are disposed may be bent at an angle or curved or may be unbent or flat.

Also, when the horizontal FOV of the VCSEL module 2200 is N°, the LiDAR device 2002 according to an embodiment may include M/N VCSEL modules 2200 in order to satisfy an angle of M°, which is the horizontal FOV of the whole LiDAR device desired by a user.

For example, when the horizontal FOV of the VCSEL module 2200 is 60°, the LiDAR device 2002 according to an embodiment may include three VCSEL modules 2200 in order to satisfy 180°, which is the horizontal FOV of the whole LiDAR device desired by a user. In this case, the 60-degree horizontal FOV of the VCSEL module may be formed by a plurality of VCSEL arrays. For example, the 60-degree horizontal FOV of the VCSEL module may be formed by two VCSEL arrays with a horizontal FOV of 30 degrees. In this case, the LiDAR device may include three VCSEL modules with a horizontal FOV of 60 degrees each including two VCSEL arrays with a horizontal FOV of 30 degrees.

A reference point for distance measurement of a LiDAR device will be described in detail below.

The LiDAR device may include a plurality of VCSEL modules. The LiDAR device may emit a laser beam to an object through the plurality of VCSEL modules. The LiDAR device may receive a laser beam reflected by the object through the plurality of VCSEL modules. The LiDAR device may form an FOV through the plurality of VCSEL modules.

When the LiDAR device includes a plurality of VCSEL modules, a reference point for measuring a distance from the LiDAR device to the object may vary. For example, there may be a reference point for each of the plurality of VCSEL modules, and the positions of the reference points may be different. When there are various reference points, a calculated distance between the LiDAR device and the object may vary depending on the position of the VCSEL module even at the same distance.

In order to solve such a problem, when the LiDAR device includes a plurality of VCSEL modules, a fixed reference point may be determined as a distance calculation reference, and a distance may be calculated based on the reference point.

Also, a plurality of VCSEL arrays may be included in a VCSEL module of the LiDAR device. The VCSEL module may emit laser beams to an object through the plurality of VCSEL arrays. The VCSEL module may receive laser beams which are emitted from the plurality of VCSEL arrays and then reflected by the object. The VCSEL module may form an FOV through the plurality of VCSEL arrays.

When the VCSEL module includes a plurality of VCSEL arrays, a reference point for measuring a distance from the LiDAR device to the object may vary. For example, there may be a reference point for each of the plurality of VCSEL arrays, and the positions of the reference points may be different. When there are various reference points, a calculated distance between the LiDAR device and the object may vary depending on the position of the VCSEL array even at the same distance.

As described above, there may be a reference point for each of the plurality of VCSEL arrays, and a problem of all the positions of the reference points being different may also be applied to a plurality of VCSEL units. There may be a reference point for each of the plurality of VCSEL units, and the positions of the reference points may be different. When there are various reference points, a calculated distance between the LiDAR device and the object may vary depending on the position of the VCSEL unit even at the same distance.

In order to solve such a problem, when the VCSEL module includes a plurality of VCSEL arrays, a fixed reference point may be determined as a distance calculation reference, and a distance may be calculated based on the reference point. Alternatively, when the VCSEL array includes a plurality of VCSEL units, the VCSEL array may determine a fixed reference point, which is a distance calculation reference, and calculate a distance based on the reference point.

Figure 41:
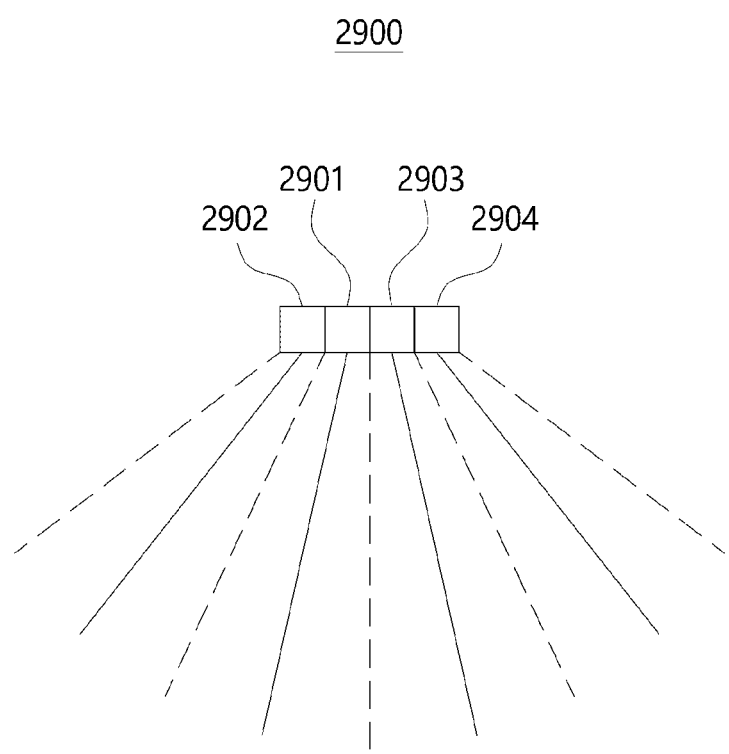
FIGS. 41 and 42 are diagrams showing a laser emitting unit according to an embodiment.
Figure 42:
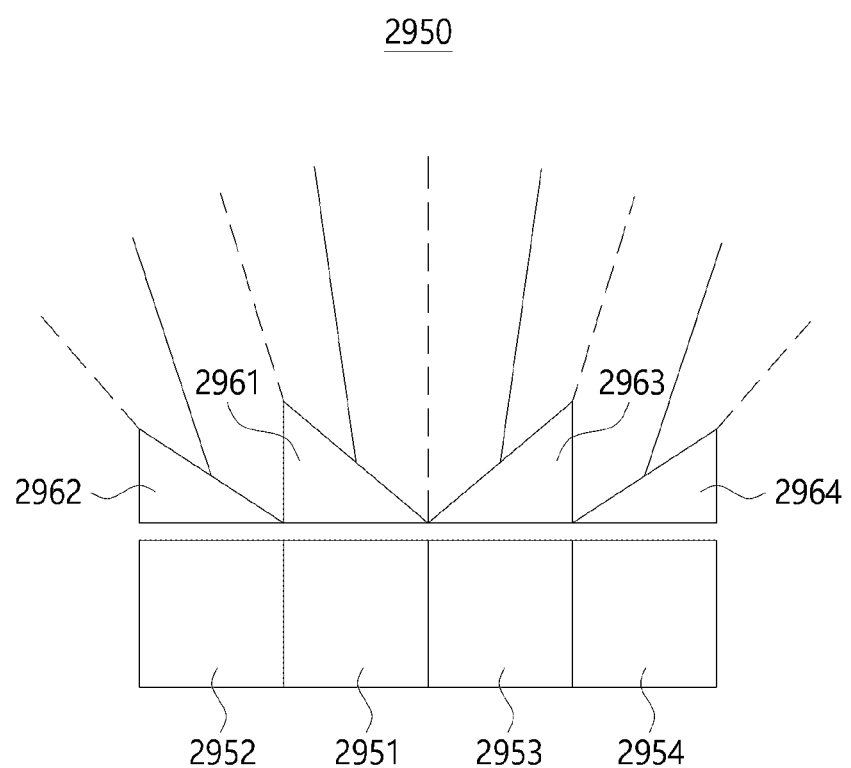

FIGS. 41 and 42 are diagrams showing a laser emitting unit according to an embodiment.

Referring to FIG. 41, a laser emitting unit 2900 according to an embodiment may include a plurality of VCSEL arrays. For example, the laser emitting unit 2900 may include a first VCSEL array and a second VCSEL array.

The first VCSEL array may include a plurality of VCSEL units. For example, the first VCSEL array may include a first VCSEL unit 2901 and a second VCSEL unit 2902.

The second VCSEL array may include a plurality of VCSEL units. For example, the second VCSEL array may include a third VCSEL unit 2903 and a fourth VCSEL unit 2904.

The first VCSEL array and the second VCSEL array may be placed on the same substrate. The first VCSEL array and the second VCSEL array may be placed on the same printed circuit board (PCB).

The first VCSEL array and the second VCSEL array may be the same. Alternatively, the second VCSEL array may be a 180-degree rotation of the first VCSEL array.

The first VCSEL unit 2901 may emit a laser beam in a first direction. Also, the first VCSEL unit 2901 may emit a laser beam with a divergence angle equal to a first angle.

The second VCSEL unit 2902 may emit a laser beam in a second direction. Also, the first VCSEL unit 2901 may emit a laser beam with a divergence angle equal to a second angle.

The third VCSEL unit 2903 may emit a laser beam in a third direction. Also, the third VCSEL unit 2903 may emit a laser beam with a divergence angle equal to a third angle.

The fourth VCSEL unit 2904 may emit a laser beam in a fourth direction. Also, the fourth VCSEL unit 2904 may emit a laser beam with a divergence angle equal to a fourth angle.

Referring to FIG. 41, the center of a laser beam emitted from each VCSEL unit may be expressed with a solid line, and a divergence beam may be expressed with a dotted line.

An angle between the center of the laser beam emitted from the first VCSEL unit 2901 and the center of the laser beam emitted from the second VCSEL unit 2902 may be less than or equal to the sum of half of the first angle and half of the second angle. Alternatively, the angle between the center of the laser beam emitted from the first VCSEL unit 2901 and the center of the laser beam emitted from the second VCSEL unit 2902 may be less than or equal to half of the sum of the first angle and the second angle.

When the angle between the center of the laser beam emitted from the first VCSEL unit 2901 and the center of the laser beam emitted from the second VCSEL unit 2902 is greater than half of the sum of the first angle and the second angle, a dead zone, to which no laser beam is irradiated, may occur between the laser beam emitted from the first VCSEL unit 2901 and the laser beam emitted from the second VCSEL unit 2902.

When a dead zone is formed, no laser beam is irradiated to an object present in the dead zone, and thus it is not possible to obtain distance information of the object. Accordingly, in order to eliminate the dead zone, the laser beam emitted from the first VCSEL unit 2901 and the laser beam emitted from the second VCSEL unit 2902 may travel in contact with each other or may overlap at least partially.

For example, the first VCSEL unit 2901 may emit a collimation beam in a first direction and emit a divergence beam in a second direction and a third direction. Also, the second VCSEL unit 2902 may emit a collimation beam in a fourth direction and emit a divergence beam in a third direction and a fifth direction. Also, the third VCSEL unit 2903 may emit a collimation beam in a sixth direction and emit a divergence beam in a second direction and a seventh direction.

Also, for example, the divergence beam of the first VCSEL unit 2901 and the divergence beam of the third VCSEL unit 2903 may be emitted in the same direction. In this case, the divergence beam of the first VCSEL unit 2901 and the divergence beam of the third VCSEL unit 2903 may be emitted in a direction perpendicular to a face on which the laser emitting unit is disposed.

Referring to FIG. 42, a laser emitting unit 2950 according to an embodiment may include a plurality of VCSEL arrays. For example, the laser emitting unit 2950 may include a first VCSEL array and a second VCSEL array.

Also, the laser emitting unit 2950 according to an embodiment may include an optic configured to steer a laser beam emitted from a VCSEL array.

The first VCSEL array may include a plurality of VCSEL units. For example, the first VCSEL array may include a first VCSEL unit 2951 and a second VCSEL unit 2952.

The second VCSEL array may include a plurality of VCSEL units. For example, the second VCSEL array may include a third VCSEL unit 2953 and a fourth VCSEL unit 2954.

The optic may include a plurality of sub-optics. For example, the optic may include a first sub-optic 2961 configured to steer a laser beam emitted from the first VCSEL unit 2951. Also, for example, the optic may include a second sub-optic 2962 configured to steer a laser beam emitted from the second VCSEL unit 2952. Also, for example, the optic may include a third sub-optic 2963 configured to steer a laser beam emitted from the third VCSEL unit 2953. Also, for example, the optic may include a fourth sub-optic 2964 configured to steer a laser beam emitted from the fourth VCSEL unit 2954.

The first sub-optic 2961 may emit a laser beam in a first direction. Also, the first sub-optic 2961 may emit a laser beam with a divergence angle equal to a first angle.

The second sub-optic 2962 may emit a laser beam in a second direction. Also, the second sub-optic 2962 may emit a laser beam with a divergence angle equal to a second angle.

The third sub-optic 2963 may emit a laser beam in a third direction. Also, the third sub-optic 2963 may emit a laser beam with a divergence angle equal to a third angle.

The fourth sub-optic 2964 may emit a laser beam in a fourth direction. Also, the fourth sub-optic 2964 may emit a laser beam with a divergence angle equal to a fourth angle.

Referring to FIG. 42, the center of a laser beam emitted from each VCSEL unit may be expressed with a solid line, and a divergence beam may be expressed with a dotted line.

An angle between the center of a laser beam emitted from the first VCSEL unit 2901 through the first sub-optic 2961 and the center of a laser beam emitted from the second VCSEL unit 2902 through the second sub-optic 2962 may be less than or equal to the sum of half of the first angle and half of the second angle. Alternatively, an angle between the center of the laser beam emitted from the first VCSEL unit 2901 and the center of the laser beam emitted from the second VCSEL unit 2902 may be less than or equal to half of the sum of the first angle and the second angle.

When the angle between the center of the laser beam emitted from the first VCSEL unit 2901 through the first sub-optic 2961 and the center of the laser beam emitted from the second VCSEL unit 2902 through the second sub-optic 2962 is greater than half of the sum of the first angle and the second angle, a dead zone, to which no laser beam is irradiated, may occur between the laser beam emitted from the first VCSEL unit 2901 and the laser beam emitted from the second VCSEL unit 2902.

When a dead zone is formed, no laser beam is irradiated to an object present in the dead zone, and thus it is not possible to obtain distance information of the object. Accordingly, in order to eliminate the dead zone, the laser beam emitted from the first VCSEL unit 2901 and the laser beam emitted from the second VCSEL unit 2902 may travel in contact with each other or may overlap at least partially.

For example, the first sub-optic 2961 may emit a collimation beam in a first direction and output a divergence beam in a second direction and a third direction. Also, the second sub-optic 2962 may emit a collimation beam in a fourth direction and emit a divergence beam in the third direction and a fifth direction. Also, the third sub-optic 2963 may emit a collimation beam in a sixth direction and emit a divergence beam in the second direction and a seventh direction.

Also, for example, the divergence beam of the first sub-optic 2961 and the divergence beam of the third sub-optic 2963 may be emitted in the same direction. In this case, the divergence beam of the first sub-optic 2961 and the divergence beam of the third sub-optic 2963 may be emitted in a direction perpendicular to a face on which the laser emitting unit is disposed.

Figure 43:
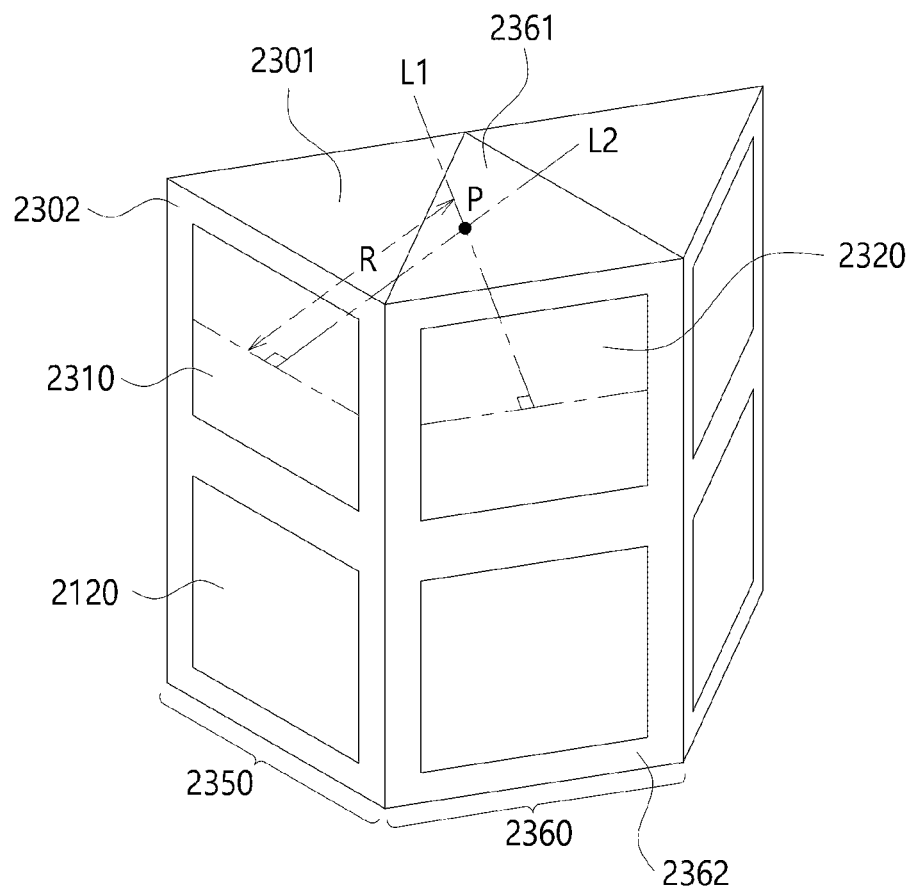
FIG. 43 is a diagram showing a reference point for measuring a distance between VCSEL modules according to an embodiment.

FIG. 43 is a diagram showing a reference point for measuring a distance between VCSEL modules according to an embodiment.

FIG. 43 shows a VCSEL module having VCSEL arrays disposed vertically, but the present disclosure is not limited thereto.

Referring to FIG. 43, a LiDAR device 2003 according to an embodiment may include a plurality of VCSEL modules 2350 and 2360. The LiDAR device 2003 may include a first VCSEL module 2350 and a second VCSEL module 2360.

The first VCSEL module 2350 may include a body 2301, a first face 2302, and a first VCSEL array 2310. The first VCSEL array 2310 may be disposed on the first face 2302 of the body 2301.

The second VCSEL module 2360 may include a body 2361, a second face 2362, and a second VCSEL array 2320. The second VCSEL array 2320 may be disposed on the second face 2362 of the body 2361.

According to an embodiment, there may be a first virtual line L1 that is perpendicular to the first face 2302 on which the first VCSEL array 2310 of the first VCSEL module 2350 is disposed and that extends in the opposite direction to a direction in which the first VCSEL array 2310 emits a laser beam.

According to an embodiment, the first virtual line L1 may be a virtual line extending from a first point of the first VCSEL array 2310. For example, the first point may be a central point of the first VCSEL array 2310, but the present disclosure is not limited thereto. Also, for example, the first point may be one point of the first VCSEL array 2310, for example, a point with certain coordinates on the x-axis and y-axis with respect to the central point. For example, the first point may be a point with coordinates (a, b) on the x-axis and y-axis with respect to the central point of the first VCSEL array 2310.

Also, according to an embodiment, there may be a second virtual line L2 that is perpendicular to the second face 2362 on which the second VCSEL array 2320 of the second VCSEL module 2360 is disposed and that extends in the opposite direction to a direction in which the second VCSEL array 2320 emits a laser beam.

The second virtual line L2 may be a virtual line extending from a second point of the second VCSEL array 2320. For example, the second point may be a central point of the second VCSEL array 2320. Also, for example, the second point may be one point of the second VCSEL array 2320, for example, a point with certain coordinates on the x-axis and y-axis with respect to the central point. For example, the second point may be a point having coordinates (c, d) on the x-axis and y-axis with respect to the central point of the second VCSEL array 2320.

When the first point and the second point have coordinates with respect to the central points of corresponding VCSEL arrays, the coordinates of the first point and the coordinates of the second point may be the same. For example, in the case of the coordinates (a, b) of the first point and the coordinates (c, d) of the second point, a and c may be the same, and b and d may be the same.

The first virtual line L1 and the second virtual line L2 may intersect. For example, the first virtual line L1 and the second virtual line L2 may form an intersection point. In this case, the intersection point of the first virtual line L1 and the second virtual line L2 may be a reference point P.

The reference point P may be included in a face that the first VCSEL module 2350 and the second VCSEL module 2360 share. Also, the reference point P may be included in an edge that the first VCSEL module 2350 and the second VCSEL module 2360 share. Also, the reference point P may be an intersection point at which the first VCSEL module 2350 and the second VCSEL module 2360 meet.

The reference point P may be prestored in a processor of the LiDAR device.

Also, for example, a minimum distance R between the reference point P and the first VCSEL array 2310 may be determined. Also, for example, a minimum distance between the reference point P and the second VCSEL array 2320 may be determined.

In this case, the minimum distance R between the reference point P and the first VCSEL array 2310 may be the same as the minimum distance between the reference point P and the second VCSEL array 2320.

In this case, the minimum distance R between the reference point P and the first VCSEL array 2310 may be a minimum distance between the reference point P and the first face 2302.

In this case, the minimum distance R between the reference point P and the second VCSEL array 2320 may be a minimum distance between the reference point P and the second face 2362.

Also, for example, the minimum distance R between the reference point P and the first VCSEL array 2310 may be different from the minimum distance between the reference point P and the second VCSEL array 2320.

Figure 44:
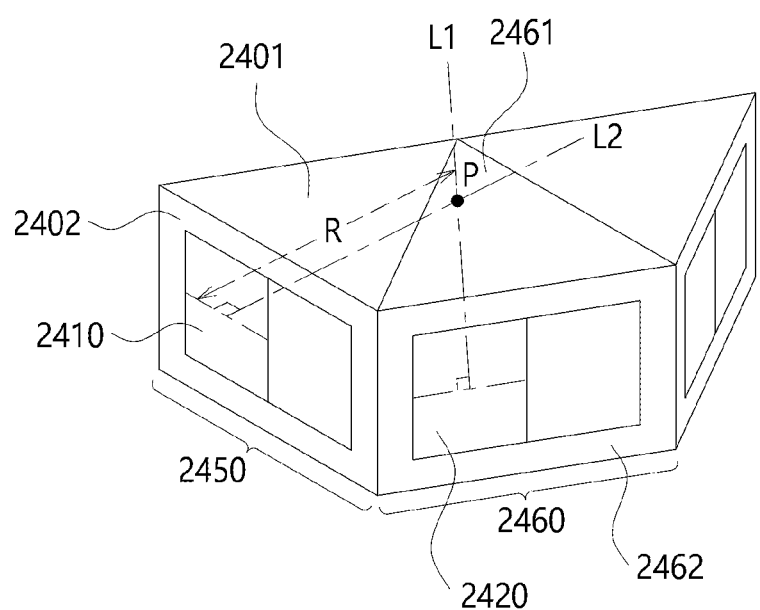
FIG. 44 is a diagram showing a reference point for measuring a distance between VCSEL modules according to another embodiment.

FIG. 44 is a diagram showing a reference point for measuring a distance between VCSEL modules according to another embodiment.

FIG. 44 shows a VCSEL module having VCSEL arrays disposed horizontally, but the present disclosure is not limited thereto.

Referring to FIG. 44, a LiDAR device 2004 according to an embodiment may include a plurality of VCSEL modules 2450 and 2460. The LiDAR device 2004 may include a first VCSEL module 2450 and a second VCSEL module 2460.

The first VCSEL module 2450 may include a body 2401, a first face 2402, and a first VCSEL array 2410. The first VCSEL array 2410 may be disposed on the first face 2402 of the body 2401.

The second VCSEL module 2460 may include a body 2461, a second face 2462, and a second VCSEL array 2420. The second VCSEL array 2420 may be disposed on the second face 2462 of the body 2461.

According to an embodiment, there may be a first virtual line L1 that is perpendicular to the first face 2402 on which the first VCSEL array 2410 of the first VCSEL module 2450 is disposed and that extends in the opposite direction to a direction in which the first VCSEL array 2410 emits a laser beam.

According to an embodiment, the first virtual line L1 may be a virtual line extending from a first point of the first VCSEL array 2310. For example, the first point may be a central point of the first VCSEL array 2310, but the present disclosure is not limited thereto. Also, for example, the first point may be one point of the first VCSEL array 2310, for example, a point with certain coordinates on the x-axis and y-axis with respect to the central point. For example, the first point may be a point with coordinates (a, b) on the x-axis and y-axis with respect to the central point of the first VCSEL array 2310.

Also, according to an embodiment, there may be a second virtual line L2 that is perpendicular to the second face 2462 on which the second VCSEL array 2420 of the second VCSEL module 2460 is disposed and that extends in the opposite direction to a direction in which the second VCSEL array 2420 emits a laser beam.

The second virtual line L2 may be a virtual line extending from a second point of the second VCSEL array 2320. For example, the second point may be a central point of the second VCSEL array 2320. Also, for example, the second point may be one point of the second VCSEL array 2320, for example, a point with certain coordinates on the x-axis and y-axis with respect to the central point. For example, the second point may be a point with coordinates (c, d) on the x-axis and y-axis with respect to the central point of the second VCSEL array 2320.

When the first point and the second point have coordinates with respect to the central points of corresponding VCSEL arrays, the coordinates of the first point and the coordinates of the second point may be the same. For example, in the case of the coordinates (a, b) of the first point and the coordinates (c, d) of the second point, a and c may be the same, and b and d may be the same.

The first virtual line L1 and the second virtual line L2 may intersect. For example, the first virtual line L1 and the second virtual line L2 may form an intersection point. In this case, the intersection point of the first virtual line L1 and the second virtual line L2 may be a reference point P.

The reference point P may be included in a face that the first VCSEL module 2450 and the second VCSEL module 2460 share. Also, the reference point P may be included in an edge that the first VCSEL module 2450 and the second VCSEL module 2460 share. Also, the reference point P may be an intersection point at which the first VCSEL module 2450 and the second VCSEL module 2460 meet.

Also, for example, a minimum distance R between the reference point P and the first VCSEL array 2410 may be determined. Also, for example, a minimum distance between the reference point P and the first VCSEL array 2410 may be determined.

In this case, the minimum distance R between the reference point P and the first VCSEL array 2410 may be the same as the minimum distance between the reference point P and the first VCSEL array 2410.

In this case, the minimum distance R between the reference point P and the first VCSEL array 2410 may be a minimum distance between the reference point P and the first face 2402.

In this case, the minimum distance R between the reference point P and the second VCSEL array 2420 may be a minimum distance between the reference point P and the second face 2462.

Figure 45:
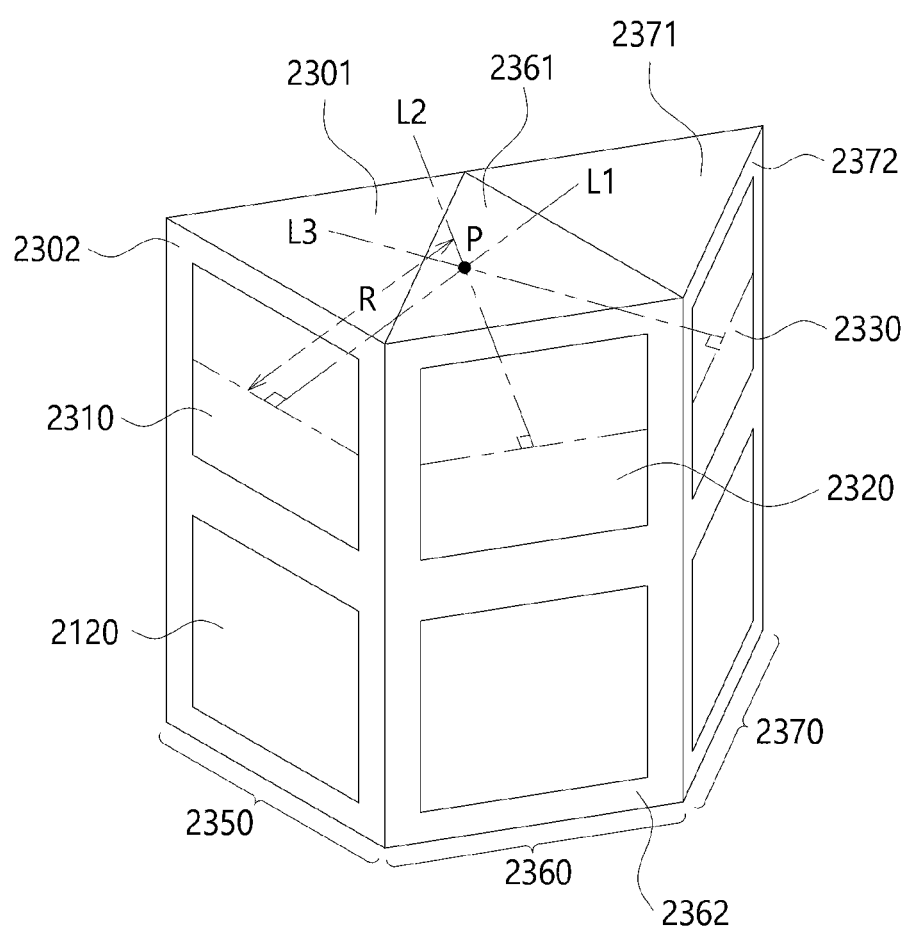
FIGS. 45 to 47 are diagrams showing a reference point for measuring a distance between VCSEL modules according to still another embodiment.
Figure 46:
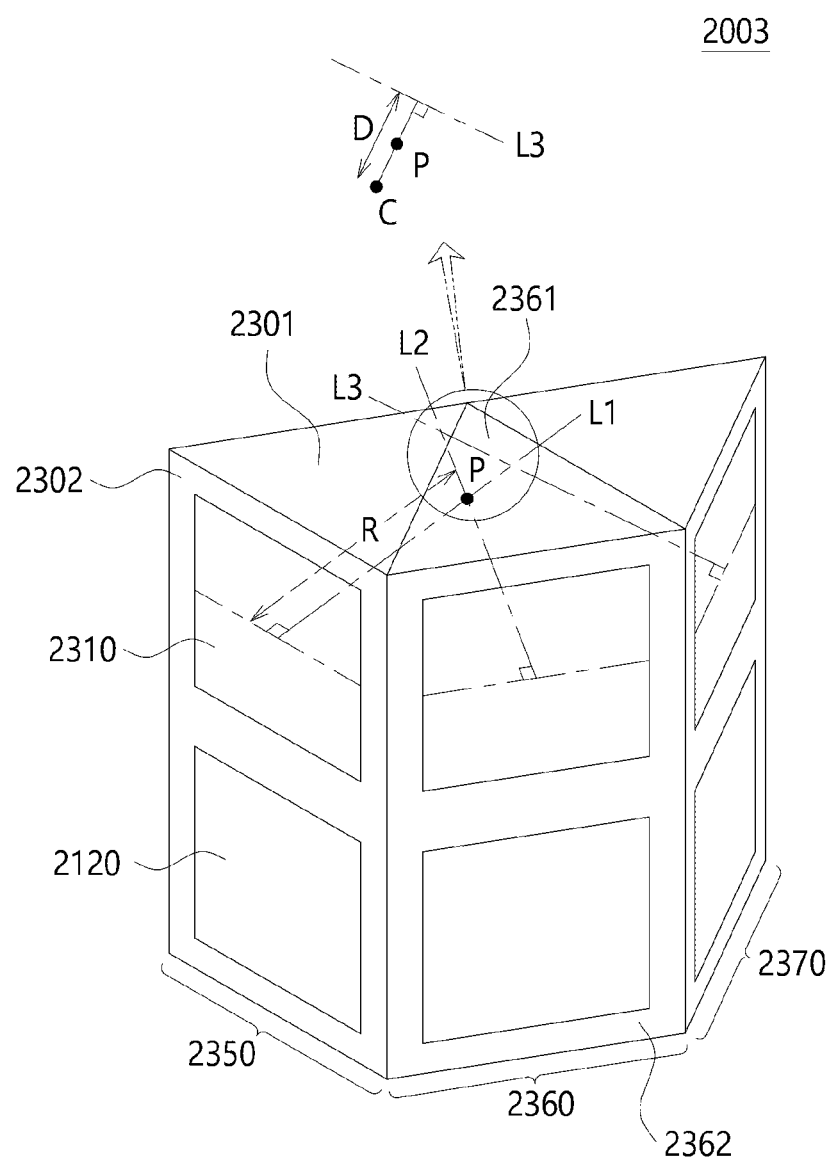
Figure 47:
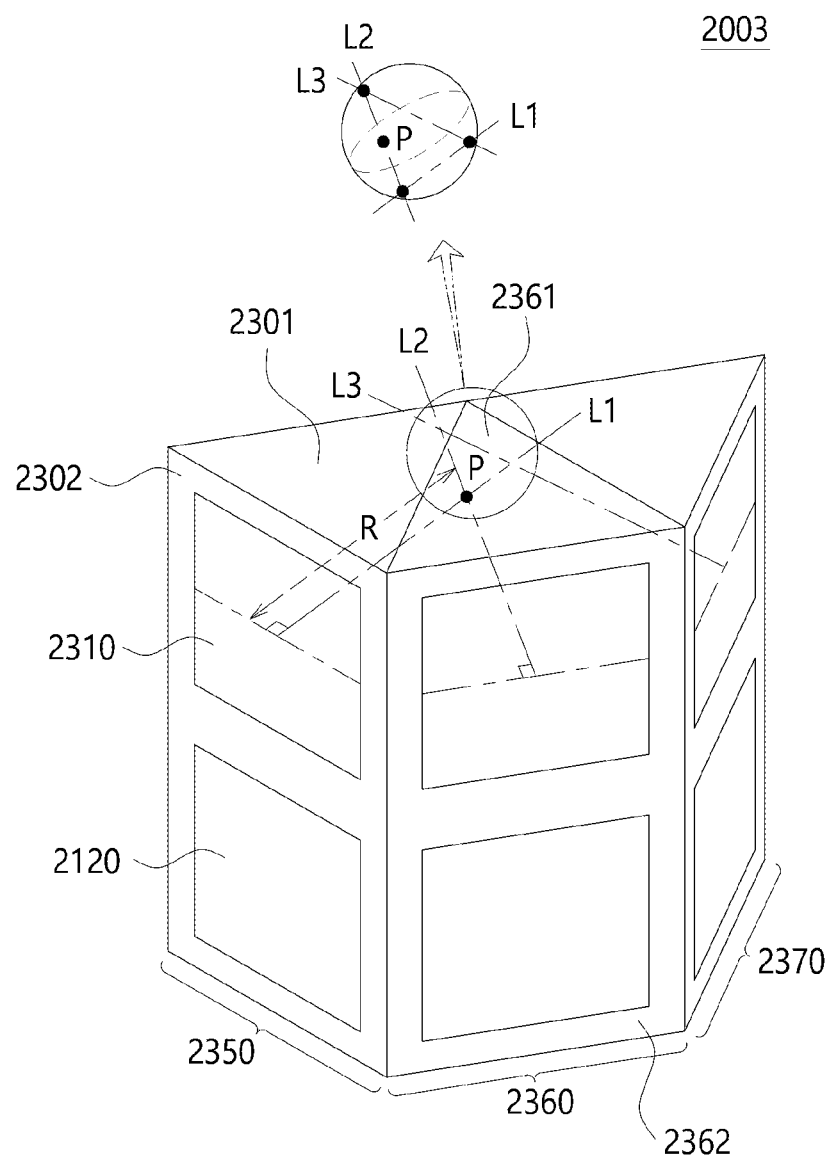

FIGS. 45 to 47 are diagrams showing a reference point for measuring a distance between VCSEL modules according to still another embodiment.

FIGS. 45 to 47 show a VCSEL module having VCSEL arrays disposed vertically, but the present disclosure is not limited thereto.

Referring to FIGS. 45 to 47, a LiDAR device 2003 according to an embodiment may include a plurality of VCSEL modules 2350, 2360, and 2370. The LiDAR device 2003 may include a first VCSEL module 2350, a second VCSEL module 2360, and a third VCSEL module 2370.

The first VCSEL module 2350 may include a body 2301, a first face 2302, and a first VCSEL array 2310. The first VCSEL array 2310 may be disposed on the first face 2302 of the body 2301.

The second VCSEL module 2360 may include a body 2361, a second face 2362, and a second VCSEL array 2320. The second VCSEL array 2320 may be disposed on the second face 2362 of the body 2361.

The third VCSEL module 2370 may include a body 2371, a third face 2372, and a third VCSEL array 2330. The third VCSEL array 2330 may be disposed on the third face 2372 of the body 2371.

According to an embodiment, there may be a first virtual line L1 that is perpendicular to the first face 2302 on which the first VCSEL array 2310 of the first VCSEL module 2350 is disposed and that extends in the opposite direction to a direction in which the first VCSEL array 2310 emits a laser beam.

The first virtual line L1 may be a virtual line extending from a first point of the first VCSEL array 2310. For example, the first point may be a central point of the first VCSEL array 2310, but the present disclosure is not limited thereto. Also, for example, the first point may be one point of the first VCSEL array 2310, for example, a point with certain coordinates on the x-axis and y-axis with respect to the central point. For example, the first point may be a point with coordinates (a, b) on the x-axis and y-axis with respect to the central point of the first VCSEL array 2310.

Also, according to an embodiment, there may be a second virtual line L2 that is perpendicular to the second face 2362 on which the second VCSEL array 2320 of the second VCSEL module 2360 is disposed and that extends in the opposite direction to a direction in which the second VCSEL array 2320 emits a laser beam.

The second virtual line L2 may be a virtual line extending from a second point of the second VCSEL array 2320. For example, the second point may be a central point of the second VCSEL array 2320. Also, for example, the second point may be one point of the second VCSEL array 2320, for example, a point with certain coordinates on the x-axis and y-axis with respect to the central point. For example, the second point may be a point with coordinates (c, d) on the x-axis and y-axis with respect to the central point of the second VCSEL array 2320.

Also, according to an embodiment, there may be a third virtual line L3 that is perpendicular to the third face 2372 on which the third VCSEL array 2330 of the third VCSEL module 2370 is disposed and that extends in the opposite direction to a direction in which the third VCSEL array 2330 outputs a laser beam.

The third virtual line L3 may be a virtual line extending from a third point of the third VCSEL array 2330. For example, the third point may be a central point of the third VCSEL array 2330. Also, for example, the second point may be one point of the third VCSEL array 2330, for example, a point with certain coordinates on the x-axis and y-axis with respect to the central point. For example, the third point may be a point with coordinates (e, f) on the x-axis and y-axis with respect to the central point of the third VCSEL array 2330.

When the first point, the second point, and the third point have coordinates with respect to the central points of corresponding VCSEL arrays, the coordinates of the first point, the coordinates of the second point, and the coordinates of the third point may be the same. For example, in the case of the coordinates (a, b) of the first point, the coordinates (c, d) of the second point, and the coordinates (e, f) of the third point, a, c, and e may be the same, and b, d, and f may be the same.

Referring to FIG. 45, the first virtual line L1, the second virtual line L2, and the third virtual line L3 may intersect. For example, the first virtual line L1, the second virtual line L2, and the third virtual line L3 may form an intersection point. In this case, the intersection point of the first virtual line L1, the second virtual line L2, and the third virtual line L3 may be a reference point P.

The reference point P may be included in a face that the first VCSEL module 2350 and the second VCSEL module 2360 share. Also, the reference point P may be included in a face that the second VCSEL module 2360 and the third VCSEL module 2370 share.

Also, the reference point P may be included in an edge that the first VCSEL module 2350 and the second VCSEL module 2360 share. Also, the reference point P may be included in an edge that the second VCSEL module 2360 and the third VCSEL module 2370 share. Also, the reference point P may be included in an edge that the first VCSEL module 2350 and the third VCSEL module 2370 share.

Also, the reference point P may be an intersection point at which the first VCSEL module 2350 and the second VCSEL module 2360 meet. Also, the reference point P may be an intersection point at which the second VCSEL module 2360 and the third VCSEL module 2370 meet. Also, the reference point P may be an intersection point at which the first VCSEL module 2350 and the third VCSEL module 2370 meet. Also, the reference point P may be an intersection point at which the first VCSEL module 2350, the second VCSEL module 2360, and the third VCSEL module 2370 meet.

Also, for example, a minimum distance R between the reference point P and the first VCSEL array 2310 may be determined. Also, for example, a minimum distance between the reference point P and the second VCSEL array 2320 may be determined. Also, for example, a minimum distance between the reference point P and the third VCSEL array 2330 may be determined.

In this case, the minimum distance R between the reference point P and the first VCSEL array 2310 may be the same as the minimum distance between the reference point P and the second VCSEL array 2320. Also, the minimum distance R between the reference point P and the first VCSEL array 2310 may be the same as the minimum distance between the reference point P and the third VCSEL array 2330. Also, the minimum distance R between the reference point P and the second VCSEL array 2320 may be the same as the minimum distance between the reference point P and the third VCSEL array 2330.

In this case, the minimum distance R between the reference point P and the first VCSEL array 2310 may be a minimum distance between the reference point P and the first face 2302.

In this case, the minimum distance R between the reference point P and the second VCSEL array 2320 may be a minimum distance between the reference point P and the second face 2362.

In this case, the minimum distance R between the reference point P and the third VCSEL array 2330 may be a minimum distance between the reference point P and the third face 2372.

According to another embodiment, the minimum distance R between the reference point P and the first VCSEL array 2310 may not be the same as the minimum distance between the reference point P and the second VCSEL array 2320. Also, the minimum distance R between the reference point P and the first VCSEL array 2310 may not be the same as the minimum distance between the reference point P and the third VCSEL array 2330. Also, the minimum distance R between the reference point P and the second VCSEL array 2320 may not be the same as the minimum distance between the reference point P and the third VCSEL array 2330.

The first virtual line L1, the second virtual line L2, and the third virtual line L3 may intersect. For example, the first virtual line L1 and the second virtual line L2 may form an intersection point. Also, for example, the second virtual line L2 and the third virtual line L3 may form an intersection point. Also, for example, the first virtual line L1 and the third virtual line L3 may form an intersection point. In this case, the intersection point C of the first virtual line L1 and the second virtual line L2 may be formed.

According to an embodiment, the first virtual line L1, the second virtual line L2, and the third virtual line L3 may form one intersection point or may form several intersection points.

When the first virtual line L1, the second virtual line L2, and the third virtual line L3 form several intersection points, there may be a problem as to which of the intersection points should be set as a reference point.

When a plurality of virtual lines form several intersection points, an intersection region sufficient to include all the intersection points may be formed. The intersection region may be formed in a spherical shape, but the present disclosure is not limited thereto. The center of the intersection region may be set as a reference point. Accordingly, when the virtual lines form several intersection points but the intersection points are included in the intersection region, a distance to an object may be calculated using the center of the intersection region as a reference point.

Referring to FIG. 46, the intersection point of the first virtual line L1 and the second virtual line L2 is C. The third virtual line L3 may be separated from the intersection point C. In this case, a minimum distance between the third virtual line L3 and the intersection point C may be D. In this case, a sphere including both of the third virtual line L3 and the intersection point C may be formed. The diameter of the sphere may be D. In this case, the center of the sphere may be determined as the reference point P.

Referring to FIG. 47, the intersection point of the first virtual line L1 and the second virtual line L2 may be a first intersection point C1. The intersection point of the second virtual line L2 and the third virtual line L3 may be a second intersection point C2. The intersection point of the first virtual line L1 and the third virtual line L3 may be a third intersection point C3.

According to an embodiment, the reference point P may be determined based on the first intersection point C1, the second intersection point C2, and the third intersection point C3. Also, a sphere including all of the first intersection point C1, the second intersection point C2, and the third intersection point C3 may be formed. The diameter of the sphere may be D. In this case, D may be the maximum distance among the distances between the first intersection point C1, the second intersection point C2, and the third intersection point C3. In this case, the center of the sphere may be determined as the reference point P.

For example, a distance between the first intersection point C1 and the second intersection point C2 may be found. Also, for example, a distance between the second intersection point C2 and the third intersection point C3 may be found. Also, for example, a distance between the first intersection point C1 and the third intersection point C3 may be found.

In this case, the largest one among the distance between the first intersection point C1 and the second intersection point C2, the distance between the second intersection point C2 and the third intersection point C3, and the distance between the first intersection point C1 and the third intersection point C3 may be determined as the diameter D of the sphere.

In this case, the reference point P may be located in the middle of two intersection points between which the distance is largest. For example, when the distance between the first intersection point C1 and the second intersection point C2 is largest, the reference point P may be the midpoint between the first intersection point C1 and the second intersection point C2.

According to an embodiment, the LiDAR device 2003 may calculate a distance from the LiDAR device 2003 to an object based on the reference point P, which is the center of the sphere.

For example, the LiDAR device 2003 may calculate a distance from the first VCSEL array 2310 to an object. Also, the LiDAR device 2003 may calculate a distance from the reference point P to the first VCSEL array 2310. In this case, the LiDAR device 2003 may determine the distance from the LiDAR device 2003 to the object as a distance from the reference point P to the object. The distance from the reference point P to the object may be equal to the sum of the distance from the first VCSEL array 2310 to the object and the distance from the reference point P to the first VCSEL array 2310.

Also, for example, the LiDAR device 2003 may calculate a distance from the second VCSEL array 2320 to the object. Also, the LiDAR device 2003 may calculate a distance from the reference point P to the second VCSEL array 2320. In this case, the LiDAR device 2003 may determine the distance from the LiDAR device 2003 to the object as a distance from the reference point P to the object. The distance from the reference point P to the object may be equal to the sum of the distance from the second VCSEL array 2320 to the object and the distance from the reference point P to the second VCSEL array 2320.

Also, for example, the LiDAR device 2003 may calculate a distance from the third VCSEL array 2330 to the object. Also, the LiDAR device 2003 may calculate a distance from the reference point P to the third VCSEL array 2330. In this case, the LiDAR device 2003 may determine the distance from the LiDAR device 2003 to the object as a distance from the reference point P to the object. The distance from the reference point P to the object may be equal to the sum of the distance from the third VCSEL array 2330 to the object and the distance from the reference point P to the third VCSEL array 2330.

The above embodiment has been described based on the case of three VCSEL modules. However, the same is applicable even to the case of four VCSEL modules, the case of five VCSEL modules, and the like.

Figure 48:
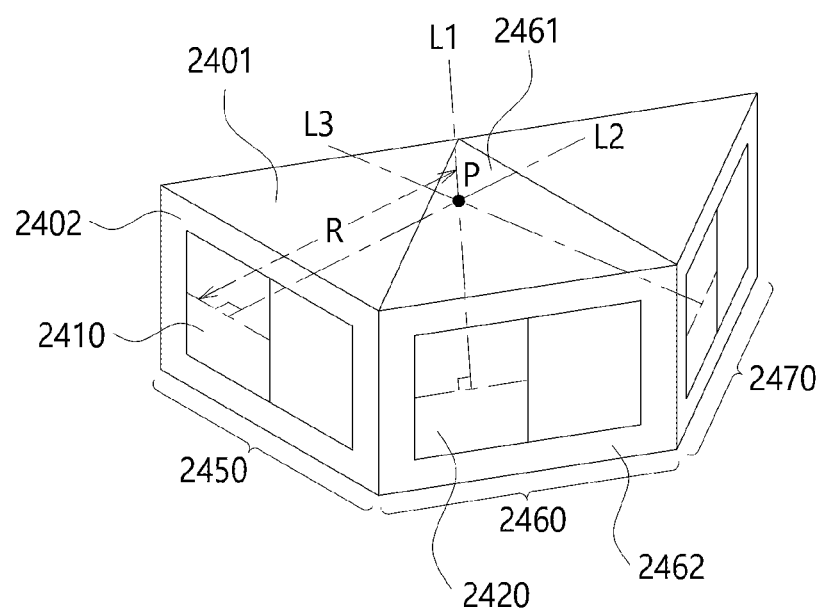
FIGS. 48 to 50 are diagrams showing a reference point for measuring a distance in a VCSEL module according to an embodiment.
Figure 49:
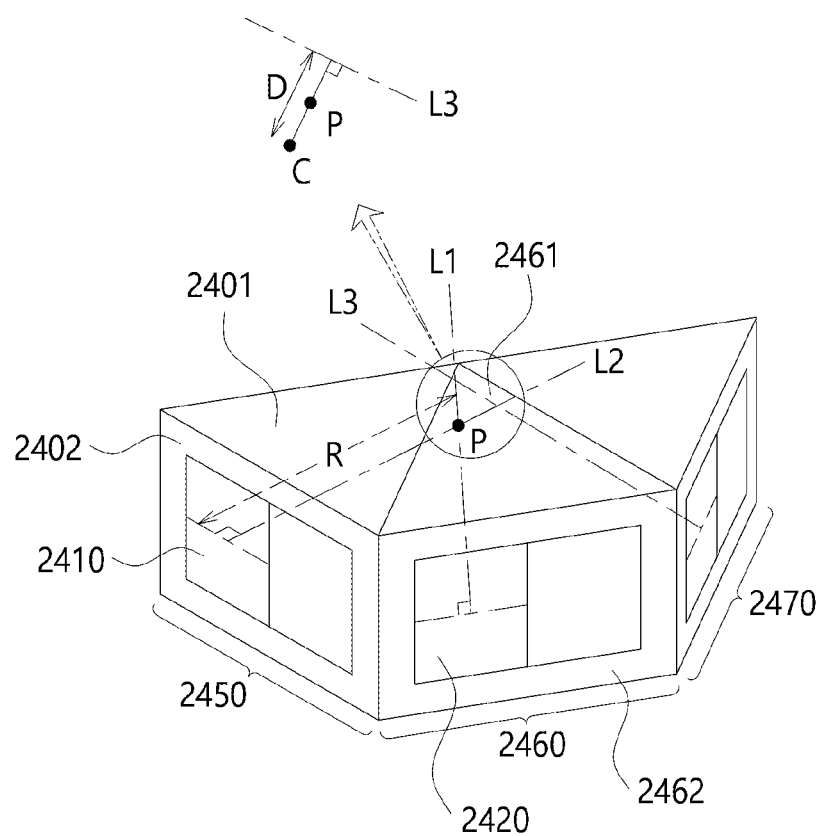
Figure 50:
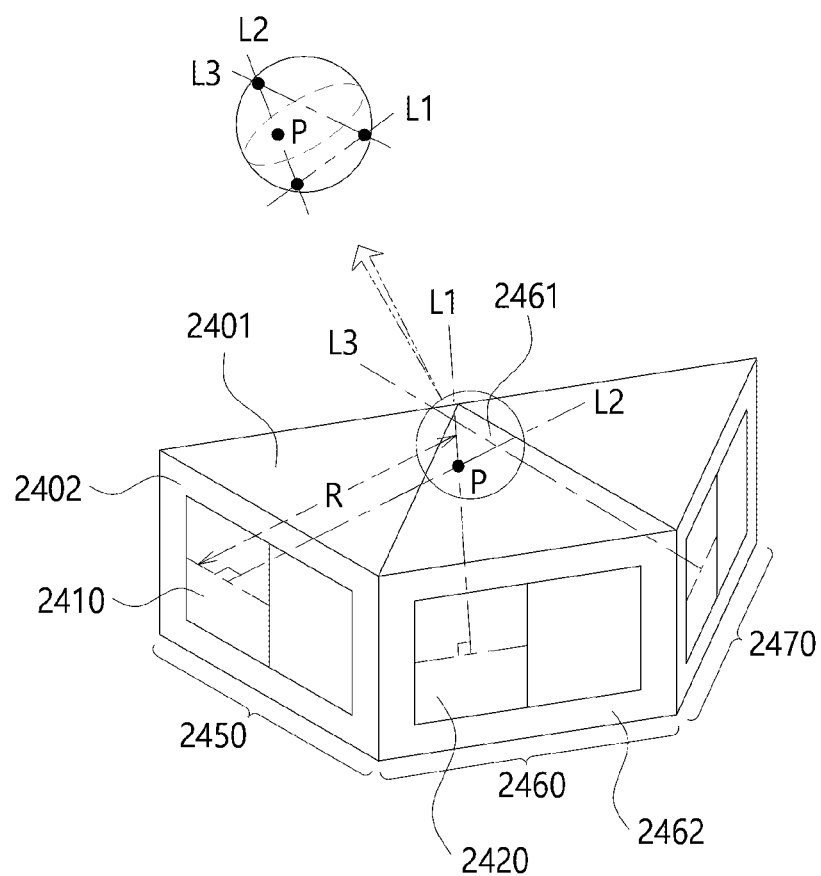

FIGS. 48 to 50 are diagrams showing a reference point for measuring a distance between VCSEL modules according to still another embodiment.

FIGS. 48 to 50 show a VCSEL module having VCSEL arrays disposed vertically, but the present disclosure is not limited thereto.

Referring to FIGS. 48 to 50, a LiDAR device 2004 according to an embodiment may include a plurality of VCSEL modules 2450, 2460, and 2470. The LiDAR device 2004 may include a first VCSEL module 2450, a second VCSEL module 2460, and a third VCSEL module 2470.

The first VCSEL module 2450 may include a body 2401, a first face 2402, and a first VCSEL array 2410. The first VCSEL array 2410 may be disposed on the first face 2402 of the body 2401.

The second VCSEL module 2460 may include a body 2461, a second face 2462, and a second VCSEL array 2420. The second VCSEL array 2420 may be disposed on the second face 2462 of the body 2461.

The third VCSEL module 2470 may include a body 2471, a third face 2472, and a third VCSEL array 2430. The third VCSEL array 2430 may be disposed on the third face 2472 of the body 2471.

According to an embodiment, there may be a first virtual line L1 that is perpendicular to the first face 2402 on which the first VCSEL array 2410 of the first VCSEL module 2450 is disposed and that extends in the opposite direction to a direction in which the first VCSEL array 2410 emits a laser beam.

Also, according to an embodiment, there may be a second virtual line L2 that is perpendicular to the second face 2462 on which the second VCSEL array 2420 of the second VCSEL module 2460 is disposed and that extends in the opposite direction to a direction in which the second VCSEL array 2420 emits a laser beam.

Also, according to an embodiment, there may be a third virtual line L3 that is perpendicular to the third face 2472 on which the third VCSEL array 2430 of the third VCSEL module 2470 is disposed and that extends in the opposite direction to a direction in which the third VCSEL array 2430 emits a laser beam.

Referring to FIG. 48, the first virtual line L1, the second virtual line L2, and the third virtual line L3 may intersect. For example, the first virtual line L1, the second virtual line L2, and the third virtual line L3 may form an intersection point. In this case, the intersection point of the first virtual line L1, the second virtual line L2, and the third virtual line L3 may be a reference point P.

The reference point P may be included in a face that the first VCSEL module 2450 and the second VCSEL module 2460 share. Also, the reference point P may be included in a face that the second VCSEL module 2460 and the third VCSEL module 2470 share.

Also, the reference point P may be included in an edge that the first VCSEL module 2450 and the second VCSEL module 2460 share. Also, the reference point P may be included in an edge that the second VCSEL module 2460 and the third VCSEL module 2470 share. Also, the reference point P may be included in an edge that the first VCSEL module 2450 and the third VCSEL module 2470 share.

Also, the reference point P may be an intersection point at which the first VCSEL module 2450 and the second VCSEL module 2460 meet. Also, the reference point P may be an intersection point at which the second VCSEL module 2460 and the third VCSEL module 2470 meet. Also, the reference point P may be an intersection point at which the first VCSEL module 2450 and the third VCSEL module 2470 meet. Also, the reference point P may be an intersection point at which the first VCSEL module 2450, the second VCSEL module 2460, and the third VCSEL module 2470 meet.

Also, for example, a minimum distance R between the reference point P and the first VCSEL array 2410 may be determined. Also, for example, a minimum distance between the reference point P and the second VCSEL array 2420 may be determined. Also, for example, a minimum distance between the reference point P and the third VCSEL array 2430 may be determined.

In this case, the minimum distance R between the reference point P and the first VCSEL array 2410 may be the same as the minimum distance between the reference point P and the second VCSEL array 2420. Also, the minimum distance R between the reference point P and the first VCSEL array 2410 may be the same as the minimum distance between the reference point P and the third VCSEL array 2430. Also, the minimum distance R between the reference point P and the second VCSEL array 2420 may be the same as the minimum distance between the reference point P and the third VCSEL array 2430.

In this case, the minimum distance R between the reference point P and the first VCSEL array 2410 may be a minimum distance between the reference point P and the first face 2402.

In this case, the minimum distance R between the reference point P and the second VCSEL array 2420 may be a minimum distance between the reference point P and the second face 2462.

In this case, the minimum distance R between the reference point P and the third VCSEL array 2430 may be a minimum distance between the reference point P and the third face 2472.

The first virtual line L1, the second virtual line L2, and the third virtual line L3 may intersect. For example, the first virtual line L1 and the second virtual line L2 may form an intersection point. Also, for example, the second virtual line L2 and the third virtual line L3 may form an intersection point. Also, for example, the first virtual line L1 and the third virtual line L3 may form an intersection point. In this case, the intersection point C of the first virtual line L1 and the second virtual line L2 may be formed.

According to an embodiment, the first virtual line L1, the second virtual line L2, and the third virtual line L3 may form one intersection point or may form several intersection points.

When the first virtual line L1, the second virtual line L2, and the third virtual line L3 form several intersection points, there may be a problem as to which of the intersection points should be set as a reference point.

When a plurality of virtual lines form several intersection points, an intersection region sufficient to include all the intersection points may be formed. The intersection region may be formed in a spherical shape, but the present disclosure is not limited thereto. The center of the intersection region may be set as a reference point. Accordingly, when the virtual lines form several intersection points but the intersection points are included in the intersection region, a distance to an object may be calculated using the center of the intersection region as a reference point.

Referring to FIG. 49, the intersection point of the first virtual line L1 and the second virtual line L2 is C. The third virtual line L3 may be separated from the intersection point C. In this case, a minimum distance between the third virtual line L3 and the intersection point C may be D. In this case, a sphere including both of the third virtual line L3 and the intersection point C may be formed. The diameter of the sphere may be D. In this case, the center of the sphere may be determined as the reference point P.

Referring to FIG. 50, the intersection point of the first virtual line L1 and the second virtual line L2 may be a first intersection point C1. The intersection point of the second virtual line L2 and the third virtual line L3 may be a second intersection point C2. The intersection point of the first virtual line L1 and the third virtual line L3 may be a third intersection point C3.

According to an embodiment, the reference point P may be determined based on the first intersection point C1, the second intersection point C2, and the third intersection point C3. Also, a sphere including all of the first intersection point C1, the second intersection point C2, and the third intersection point C3 may be formed. The diameter of the sphere may be D. In this case, D may be the maximum distance among the distances between the first intersection point C1, the second intersection point C2, and the third intersection point C3. In this case, the center of the sphere may be determined as the reference point P.

For example, a distance between the first intersection point C1 and the second intersection point C2 may be found. Also, for example, a distance between the second intersection point C2 and the third intersection point C3 may be found. Also, for example, a distance between the first intersection point C1 and the third intersection point C3 may be found.

In this case, the largest one among the distance between the first intersection point C1 and the second intersection point C2, the distance between the second intersection point C2 and the third intersection point C3, and the distance between the first intersection point C1 and the third intersection point C3 may be determined as the diameter D of the sphere.

In this case, the reference point P may be located in the middle of two intersection points between which the distance is largest. For example, when the distance between the first intersection point C1 and the second intersection point C2 is largest, the reference point P may be the midpoint between the first intersection point C1 and the second intersection point C2.

According to an embodiment, the LiDAR device 2004 may calculate a distance from the LiDAR device to an object based on the reference point P, which is the center of the sphere.

For example, the LiDAR device 2004 may calculate a distance from the first VCSEL array 2410 to an object. Also, the LiDAR device 2004 may calculate a distance from the reference point P to the first VCSEL array 2410. In this case, the LiDAR device 2004 may determine the distance from the LiDAR device 2004 to the object as a distance from the reference point P to the object. The distance from the reference point P to the object may be equal to the sum of the distance from the first VCSEL array 2410 to the object and the distance from the reference point P to the first VCSEL array 2410.

Also, for example, the LiDAR device 2004 may calculate a distance from the second VCSEL array 2420 to the object. Also, the LiDAR device 2004 may calculate a distance from the reference point P to the second VCSEL array 2420. In this case, the LiDAR device 2004 may determine the distance from the LiDAR device 2004 to the object as a distance from the reference point P to the object. The distance from the reference point P to the object may be equal to the sum of the distance from the second VCSEL array 2420 to the object and the distance from the reference point P to the second VCSEL array 2420.

Also, for example, the LiDAR device 2004 may calculate a distance from the third VCSEL array 2430 to the object. Also, the LiDAR device 2004 may calculate a distance from the reference point P to the third VCSEL array 2430. In this case, the LiDAR device 2004 may determine the distance from the LiDAR device 2004 to the object as a distance from the reference point P to the object. The distance from the reference point P to the object may be equal to the sum of the distance from the third VCSEL array 2430 to the object and the distance from the reference point P to the third VCSEL array 2430.

The above embodiment has been described based on the case of three VCSEL modules. However, the same is applicable even to the case of four VCSEL modules, the case of five VCSEL modules, and the like.

A reference point for distance measurement based on a plurality of VCSEL arrays in a VCSEL module will be described in detail below.

Figure 51:
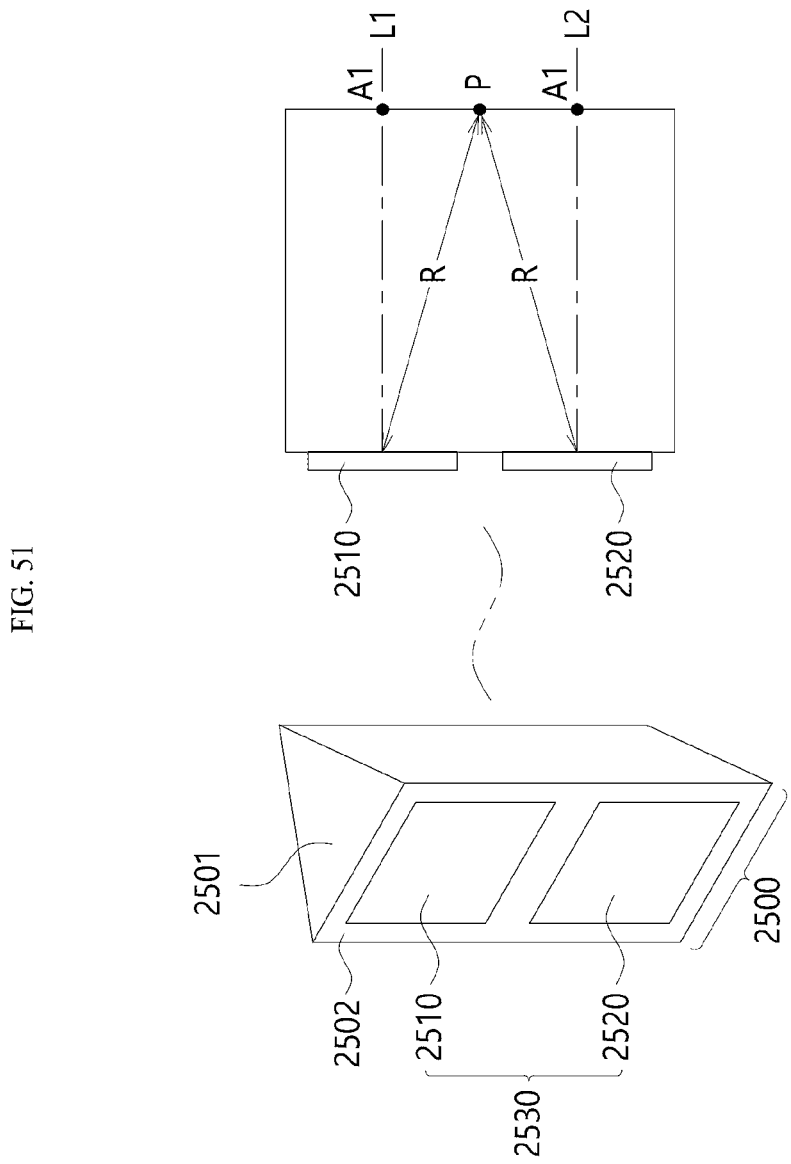
FIGS. 51 and 52 are diagrams showing a reference point for measuring a distance in a VCSEL module according to another embodiment.
Figure 52:
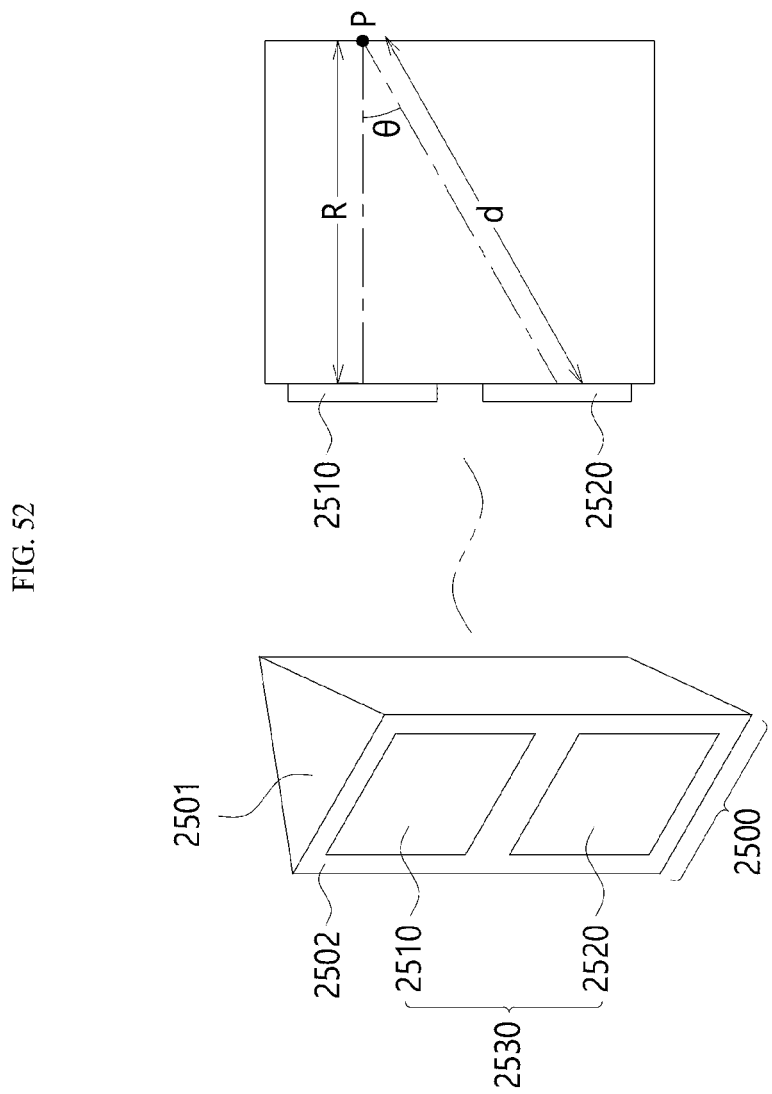

FIGS. 51 and 52 are diagrams showing a reference point for measuring a distance in a VCSEL module according to another embodiment.

Referring to FIGS. 51 and 52, a VCSEL module 2500 according to an embodiment may include a body 2501, a first face 2502, and a laser emitting unit 2530. Also, the laser emitting unit 2530 may include a first VCSEL array 2510 and a second VCSEL array 2520.

FIGS. 51 and 52 show the VCSEL module 2500 having the first VCSEL array 2510 and the second VCSEL array 2520 disposed vertically, but the present disclosure is not limited thereto.

FIG. 51 is a diagram showing the VCSEL module 2500 when viewed from the side.

Referring to FIG. 51, the VCSEL module 2500 may include the first VCSEL array 2510 and the second VCSEL array 2520.

According to an embodiment, there may be a first virtual line L1 that is perpendicular to the first face 2502 on which the first VCSEL array 2510 of the VCSEL module 2500 is disposed and that extends in the opposite direction to a direction in which the first VCSEL array 2510 emits a laser beam.

The first virtual line L1 may be a virtual line extending from a first point of the first VCSEL array 2510. For example, the first point may be a central point of the first VCSEL array 2510, but the present disclosure is not limited thereto. Also, for example, the first point may be one point of the first VCSEL array 2510, for example, a point with certain coordinates on the x-axis and y-axis with respect to the central point. For example, the first point may be a point with coordinates (a, b) on the x-axis and y-axis with respect to the central point of the first VCSEL array 2510.

Also, according to an embodiment, there may be a second virtual line L2 that is perpendicular to the first face 2502 on which the second VCSEL array 2520 of the VCSEL module 2500 is disposed and that extends in the opposite direction to a direction in which the second VCSEL array 2520 emits a laser beam.

The second virtual line L2 may be a virtual line extending from a second point of the second VCSEL array 2520. For example, the second point may be a central point of the second VCSEL array 2520. Also, for example, the second point may be one point of the second VCSEL array 2520, for example, a point with certain coordinates on the x-axis and y-axis with respect to the central point. For example, the second point may be a point with coordinates (c, d) on the x-axis and y-axis with respect to the central point of the second VCSEL array 2520.

When the first point and the second point have coordinates with respect to the central points of corresponding VCSEL arrays, the coordinates of the first point and the coordinates of the second point may be the same. For example, in the case of the coordinates (a, b) of the first point and the coordinates (c, d) of the second point, a and c may be the same, and b and d may be the same.

According to an embodiment, there may be a first point A1 spaced at a first interval, which is a predetermined value, from the first VCSEL array 2510 along the first virtual line L1.

Also, according to an embodiment, there may be a second point A2 spaced at a first interval, which is a predetermined value, from the second VCSEL array 2520 along the second virtual line L2.

The LiDAR device may determine the midpoint between the first point A1 and the second point A2 as a reference point P. In this case, each of the first point A1 and the second point A2 may be located on one axis with respect to the vertical axis of the VCSEL module 2500. Also, the first point A1 and the second point A2 may have the same position value with respect to the horizontal axis of the VCSEL module 2500.

In this case, a distance from the reference point P to one point of the first VCSEL array 2510 and a distance from the reference point P to one point of the second VCSEL array 2520 may be the same. For example, the one point may be a central point, i.e., the center, of the first VCSEL array 2510. Alternatively, for example, the one point may be a central point, i.e., the center, of the second VCSEL array 2520.

According to an embodiment, the LiDAR device may calculate a distance from the LiDAR device to an object based on the reference point P.

For example, the LiDAR device may calculate a distance from the first VCSEL array 2510 to an object. Also, the LiDAR device may calculate a distance from the reference point P to the first VCSEL array 2510. In this case, the LiDAR device may determine the distance from the LiDAR device to the object as a distance from the reference point P to the object. The distance from the reference point P to the object may be equal to the sum of the distance from the first VCSEL array 2510 to the object and the distance from the reference point P to the first VCSEL array 2510.

Also, for example, the LiDAR device may calculate a distance from the second VCSEL array 2520 to the object. Also, the LiDAR device may calculate a distance from the reference point P to the second VCSEL array 2520. In this case, the LiDAR device may determine the distance from the LiDAR device to the object as a distance from the reference point P to the object. The distance from the reference point P to the object may be equal to the sum of the distance from the second VCSEL array 2520 to the object and the distance from the reference point P to the second VCSEL array 2520.

The above embodiment has been described based on the case of two VCSEL arrays being in the VCSEL module. However, the same is applicable even to the case of three VCSEL arrays, four VCSEL arrays, five VCSEL arrays, and the like.

FIG. 52 is a diagram showing the VCSEL module 2500 when viewed from the side.

According to an embodiment, there may be a first virtual line L1 that is perpendicular to the first face 2502 on which the first VCSEL array 2510 of the VCSEL module 2500 is disposed and that extends in the opposite direction to a direction in which the first VCSEL array 2510 emits a laser beam.

The LiDAR device may determine a point spaced at a first interval R, which is a predetermined value, from the first VCSEL array 2510 along the first virtual line L1 as a reference point P. The present disclosure is not limited thereto, and the reference point P may be a point spaced at a first interval R, which is a predetermined value, from the second VCSEL array 2520.

According to an embodiment, the LiDAR device may calculate a distance from the LiDAR device to an object based on the reference point P.

For example, the LiDAR device may calculate a distance from the first VCSEL array 2510 to an object. Also, the LiDAR device may calculate a distance from the reference point P to the first VCSEL array 2510. In this case, the LiDAR device may determine the distance from the LiDAR device to the object as a distance from the reference point P to the object. The distance from the reference point P to the object may be equal to the sum of the distance from the first VCSEL array 2510 to the object and the distance from the reference point P to the first VCSEL array 2510.

Also, for example, the LiDAR device may calculate a distance from the second VCSEL array 2520 to the object. Also, the LiDAR device may calculate a distance from the reference point P to the second VCSEL array 2520. In this case, the LiDAR device may determine the distance from the LiDAR device to the object as a distance from the reference point P to the object. The distance from the reference point P to the object may be equal to the sum of the distance from the second VCSEL array 2520 to the object and the distance from the reference point P to the second VCSEL array 2520.

In this case, the distance from the reference point P to the first VCSEL array 2510 may be a first interval R, which is a predetermined value.

Also, the distance from the reference point P to the second VCSEL array 2520 may be calculated based on the first interval and an angle θ formed by the first VCSEL array 2510, the second VCSEL array 2520, and the reference point P.

For example, a distance d from the reference point P to the second VCSEL array 2520 may be R/cos θ.

$$d = \frac{R}{\cos\theta}$$

The above embodiment has been described based on the case of two VCSEL arrays being in the VCSEL module. However, the same is applicable even to the case of three VCSEL arrays, four VCSEL arrays, five VCSEL arrays, and the like.

Figure 53:
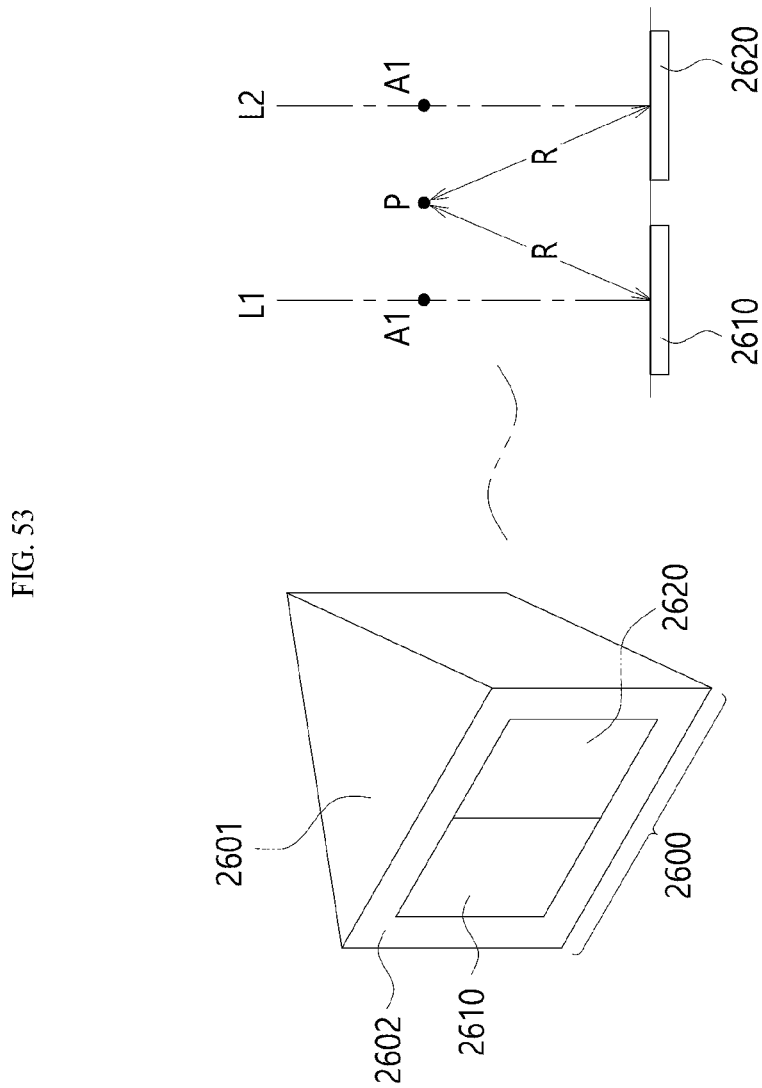
FIGS. 53 and 54 are diagrams showing a reference point for measuring a distance in a VCSEL module according to still another embodiment.
Figure 54:
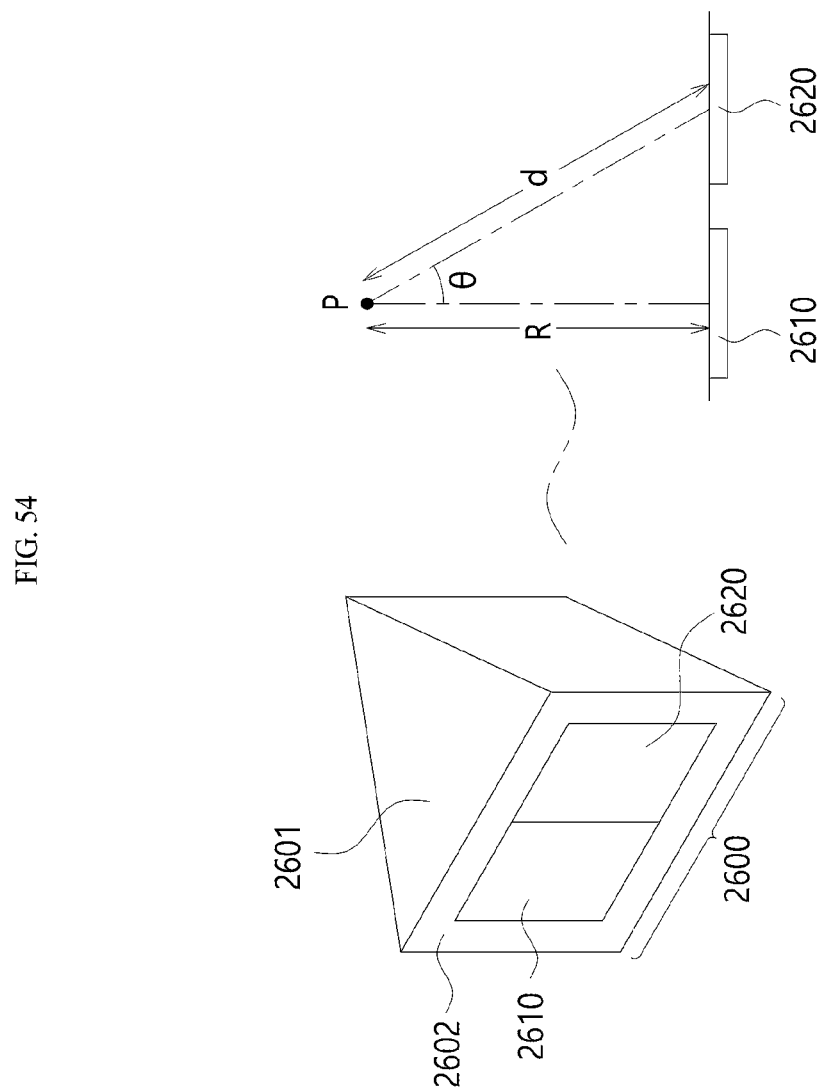

FIGS. 53 and 54 are diagrams showing a reference point for measuring a distance in a VCSEL module according to still another embodiment.

Referring to FIGS. 53 and 54, a VCSEL module 2600 according to an embodiment may include a body 2601, a first face 2602, and a laser emitting unit 2630. Also, the laser emitting unit 2630 may include a first VCSEL array 2610 and a second VCSEL array 2620.

FIGS. 53 and 54 show the VCSEL module 2600 having the first VCSEL array 2610 and the second VCSEL array 2620 disposed horizontally, but the present disclosure is not limited thereto.

FIG. 53 is a diagram showing the VCSEL module 2600 when viewed from the top.

Referring to FIG. 53, the VCSEL module 2600 may include the first VCSEL array 2610 and the second VCSEL array 2620.

According to an embodiment, there may be a first virtual line L1 that is perpendicular to the first face 2602 on which the first VCSEL array 2610 of the VCSEL module 2600 is disposed and that extends in the opposite direction to a direction in which the first VCSEL array 2610 emits a laser beam.

Also, according to an embodiment, there may be a second virtual line L2 that is perpendicular to the first face 2602 on which the second VCSEL array 2620 of the VCSEL module 2600 is disposed and that extends in the opposite direction to a direction in which the second VCSEL array 2620 emits a laser beam.

According to an embodiment, there may be a first point A1 spaced at a first interval, which is a predetermined value, from the first VCSEL array 2610 along the first virtual line L1.

Also, according to an embodiment, there may be a second point A2 spaced at a first interval, which is a predetermined value, from the second VCSEL array 2620 along the second virtual line L2.

The LiDAR device may determine the midpoint between the first point A1 and the second point A2 as a reference point P. In this case, the first point A1 and the second point A2 may be located on one axis with respect to the horizontal axis of the VCSEL module 2600. Also, the first point A1 and the second point A2 may have the same position value with respect to the vertical axis of the VCSEL module 2600.

In this case, a distance from the reference point P to one point of the first VCSEL array 2610 and a distance from the reference point P to one point of the second VCSEL array 2620 may be the same. For example, the one point may be a central point, i.e., the center, of the first VCSEL array 2610. Alternatively, for example, the one point may be a central point, i.e., the center, of the second VCSEL array 2620.

According to an embodiment, the LiDAR device may calculate a distance from the LiDAR device to an object on the basis of the reference point P.

For example, the LiDAR device may calculate a distance from the first VCSEL array 2610 to an object. Also, the LiDAR device may calculate a distance from the reference point P to the first VCSEL array 2610. In this case, the LiDAR device may determine the distance from the LiDAR device to the object as a distance from the reference point P to the object. The distance from the reference point P to the object may be equal to the sum of the distance from the first VCSEL array 2610 to the object and the distance from the reference point P to the first VCSEL array 2610.

Also, for example, the LiDAR device may calculate a distance from the second VCSEL array 2620 to the object. Also, the LiDAR device may calculate a distance from the reference point P to the second VCSEL array 2620. In this case, the LiDAR device may determine the distance from the LiDAR device to the object as a distance from the reference point P to the object. The distance from the reference point P to the object may be equal to the sum of the distance from the second VCSEL array 2620 to the object and the distance from the reference point P to the second VCSEL array 2620.

The above embodiment has been described based on the case of two VCSEL arrays being in the VCSEL module. However, the same is applicable even to the case of three VCSEL arrays, four VCSEL arrays, five VCSEL arrays, and the like.

FIG. 54 is a diagram showing the VCSEL module 2500 when viewed from the top.

According to an embodiment, there may be a first virtual line L1 that is perpendicular to the first face 2602 on which the first VCSEL array 2610 of the VCSEL module 2600 is disposed and that extends in the opposite direction to a direction in which the first VCSEL array 2610 emits a laser beam.

The LiDAR device may determine a point spaced at a first interval R, which is a predetermined value, from the first VCSEL array 2610 along the first virtual line L1 as a reference point P. The present disclosure is not limited thereto, and the reference point P may be a point spaced at a first interval R, which is a predetermined value, from the second VCSEL array 2620.

According to an embodiment, the LiDAR device may calculate a distance from the LiDAR device to an object based on the reference point P.

For example, the LiDAR device may calculate a distance from the first VCSEL array 2610 to an object. Also, the LiDAR device may calculate a distance from the reference point P to the first VCSEL array 2610. In this case, the LiDAR device may determine the distance from the LiDAR device to the object as a distance from the reference point P to the object. The distance from the reference point P to the object may be equal to the sum of the distance from the first VCSEL array 2610 to the object and the distance from the reference point P to the first VCSEL array 2610.

Also, for example, the LiDAR device may calculate a distance from the second VCSEL array 2620 to the object. Also, the LiDAR device may calculate a distance from the reference point P to the second VCSEL array 2620. In this case, the LiDAR device may determine the distance from the LiDAR device to the object as a distance from the reference point P to the object. The distance from the reference point P to the object may be equal to the sum of the distance from the second VCSEL array 2620 to the object and the distance from the reference point P to the second VCSEL array 2620.

In this case, the distance from the reference point P to the first VCSEL array 2610 may be a first interval R, which is a predetermined value.

Also, the distance from the reference point P to the second VCSEL array 2620 may be calculated based on the first interval and an angle θ formed by the first VCSEL array 2610, the second VCSEL array 2620, and the reference point P.

For example, a distance d from the reference point P to the second VCSEL array 2620 may be R/cos θ.

$$d = \frac{R}{\cos\theta}$$

The above embodiment has been described based on the case of two VCSEL arrays being in the VCSEL module. However, the same is applicable even to the case of three VCSEL arrays, four VCSEL arrays, five VCSEL arrays, and the like.

Figure 55:
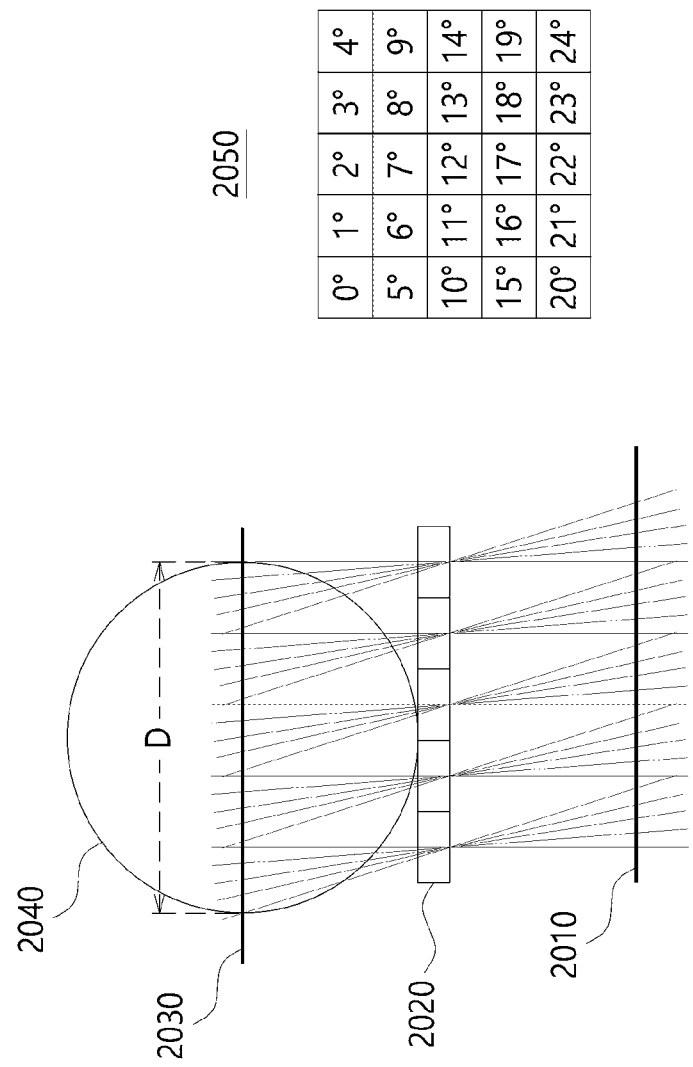
FIG. 55 is a diagram showing a VCSEL array according to an embodiment when viewed from the top.

FIG. 55 is a diagram showing a VCSEL array according to an embodiment when viewed from the top.

Referring to FIG. 55, the VCSEL array may include a plurality of VCSEL units 2020. The plurality of VCSEL units 2020 may emit laser beams to an object 2010.

As shown in a table 2050, each of the plurality of VCSEL units 2020 may have a predetermined steering angle, but the present disclosure is not limited thereto. For example, the plurality of VCSEL units 2020 may be in the form of a 5×5 matrix, but the present disclosure is not limited thereto. Also, for example, the steering angle of the plurality of VCSEL units 2020 may gradually increase in a row direction.

For example, a VCSEL unit at (1, 1) may have a steering angle of 0 degrees. Also, for example, a VCSEL unit at (1, 2) may have a steering angle of 1 degree. Also, for example, a VCSEL unit at (1, 3) may have a steering angle of 2 degrees. Also, for example, a VCSEL unit at (1, 4) may have a steering angle of 3 degrees. Also, for example, a VCSEL unit at (1, 5) may have a steering angle of 4 degrees. Also, for example, a VCSEL unit at (2, 1) may have a steering angle of 5 degrees. The steering angle increases in the row direction as described above, and as a result, a VCSEL unit at (5, 5) may have a steering angle of 24 degrees.

FIG. 55 shows the laser beams that are emitted by the plurality of VCSEL units 2020 with steering angles conforming to the table 2050. When the VCSEL array has a plurality of VCSEL units, various reference points for distance measurement may be present for each VCSEL unit. The reference points may be included in a virtual plane 2030. When there are various reference points, a calculated distance between the LiDAR device and the object may vary depending on the position of the VCSEL unit even at the same distance.

In order to solve such a problem, when the VCSEL array includes a plurality of VCSEL units, a fixed reference point may be determined as a distance calculation reference, and a distance may be calculated based on the reference point.

Alternatively, in order to solve such a problem, when the VCSEL array includes a plurality of VCSEL units, a reference range sufficient to include all of the reference points of the VCSEL units may be set. Thus, the center of the reference range may be set as the reference point, which is the distance calculation reference, and a distance may be calculated based on the reference point.

Referring to FIG. 55, when it is assumed that laser beams emitted from the plurality of VCSEL units 2020 extend in the opposite direction to a direction in which the laser beams travel, there may be virtual lines reaching the virtual plane 2030 spaced a predetermined distance apart from the VCSEL unit 2020. The reference range 2040 may be in a spherical shape with a minimum diameter D sufficient to include all of the plurality of virtual lines. The center of the reference range 2040 may be determined as the reference point for distance measurement.

A distance from the LiDAR device to the object may be measured based on the reference point. The distance from the LiDAR device to the object may be equal to the sum of a distance from the reference point to the VCSEL unit 2020 and a distance from the VCSEL unit 2020 to the object. The distance from the reference point to the VCSEL unit 2020 may be predetermined, and the distance from the VCSEL unit 2020 to the object may be calculated by a processor along a traveling path of a laser beam output from the VCSEL unit 2020.

However, since the diameter D of the reference range 2040 of FIG. 55 may be somewhat large, there may be a difference between when the center of the reference range 2040 is used as a reference point and when the reference point of each of the plurality of VCSEL units is used. A method of reducing the difference between the center of the reference range and the reference point of each VCSEL unit will be described in detail below.

Figure 56:
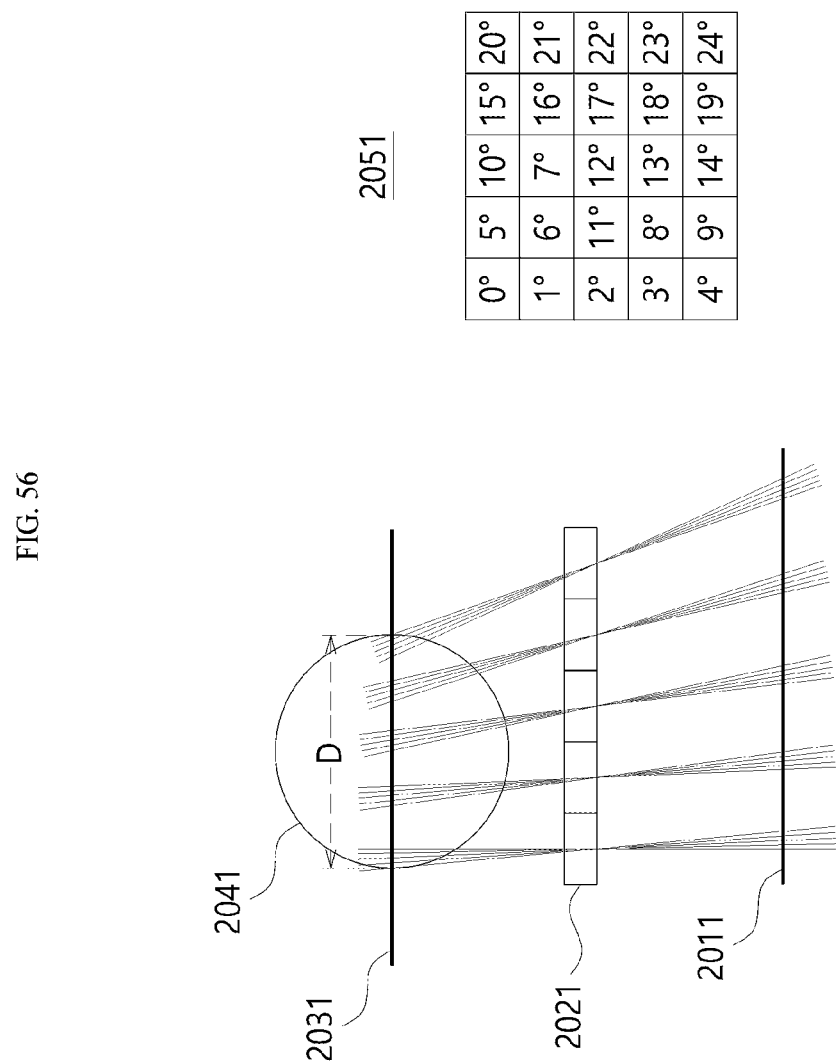
FIG. 56 is a diagram showing a VCSEL array when viewed from the top according to another embodiment.

FIG. 56 is a diagram showing a VCSEL array according to another embodiment when viewed from the top.

Referring to FIG. 56, the VCSEL array may include a plurality of VCSEL units 2021. The plurality of VCSEL units 2021 may emit laser beams to an object 2011.

As shown in a table 2051, each of the plurality of VCSEL units 2021 may have a predetermined steering angle, but the present disclosure is not limited thereto. For example, the plurality of VCSEL units 2021 may be in the form of a 5×5 matrix, but the present disclosure is not limited thereto. Also, for example, the steering angle of the plurality of VCSEL units 2021 may gradually increase in a column direction.

For example, a VCSEL unit at (1, 1) may have a steering angle of 0 degrees. Also, for example, a VCSEL unit at (2, 1) may have a steering angle of 1 degree. Also, for example, a VCSEL unit at (3, 1) may have a steering angle of 2 degrees. Also, for example, a VCSEL unit at (4, 1) may have a steering angle of 3 degrees. Also, for example, a VCSEL unit at (5, 1) may have a steering angle of 4 degrees. Also, for example, a VCSEL unit at (1, 2) may have a steering angle of 5 degrees. The steering angle increases in the column direction as described above, and as a result, a VCSEL unit at (5, 5) may have a steering angle of 24 degrees.

FIG. 56 shows the laser beams that are emitted by the plurality of VCSEL units 2021 with steering angles conforming to the table 2051. When the VCSEL array has a plurality of VCSEL units, various reference points for distance measurement may be present for each VCSEL unit. The reference points may be included in a virtual plane 2031. When there are various reference points, a calculated distance between the LiDAR device and the object may vary depending on the position of the VCSEL unit even at the same distance.

In order to solve such a problem, when the VCSEL array includes a plurality of VCSEL units, a fixed reference point may be determined as a distance calculation reference, and a distance may be calculated based on the reference point.

Alternatively, in order to solve such a problem, when the VCSEL array includes a plurality of VCSEL units, a reference range sufficient to include all of the reference points of the VCSEL units may be set. Thus, the center of the reference range may be set as the reference point, which is the distance calculation reference, and a distance may be calculated based on the reference point.

Referring to FIG. 56, when it is assumed that laser beams emitted from the plurality of VCSEL units 2021 extend in the opposite direction to a direction in which the laser beams travel, there may be virtual lines reaching a virtual plane 2031 spaced a predetermined distance apart from the VCSEL units 2021. The reference range 2041 may be in a spherical shape with a minimum diameter D sufficient to include all of the plurality of virtual lines. The center of the reference range 2041 may be determined as the reference point for distance measurement.

A distance from the LiDAR device to the object may be measured based on the reference point. The distance from the LiDAR device to the object may be equal to the sum of a distance from the reference point to the VCSEL unit 2021 and a distance from the VCSEL unit 2021 to the object. The distance from the reference point to the VCSEL unit 2021 may be predetermined, and the distance from the VCSEL unit 2021 to the object may be calculated by a processor along a traveling path of a laser beam emitted from the VCSEL unit 2021.

The diameter D of the reference range 2041 of FIG. 56 may be smaller than the diameter D of the reference range 2040 of FIG. 55. Therefore, the difference between the center of the reference range 2041 of FIG. 56 and the reference point of each VCSEL unit 2021 may be smaller than the difference between the center of the reference range 2040 of FIG. 55 and the reference point of each VCSEL unit 2020. Accordingly, in consideration of the range of the reference points of the plurality of VCSEL units, it may be more advantageous when the steering angle of the plurality of VCSEL units increases in the column direction than when the steering angle increases in the row direction.

Figure 57:
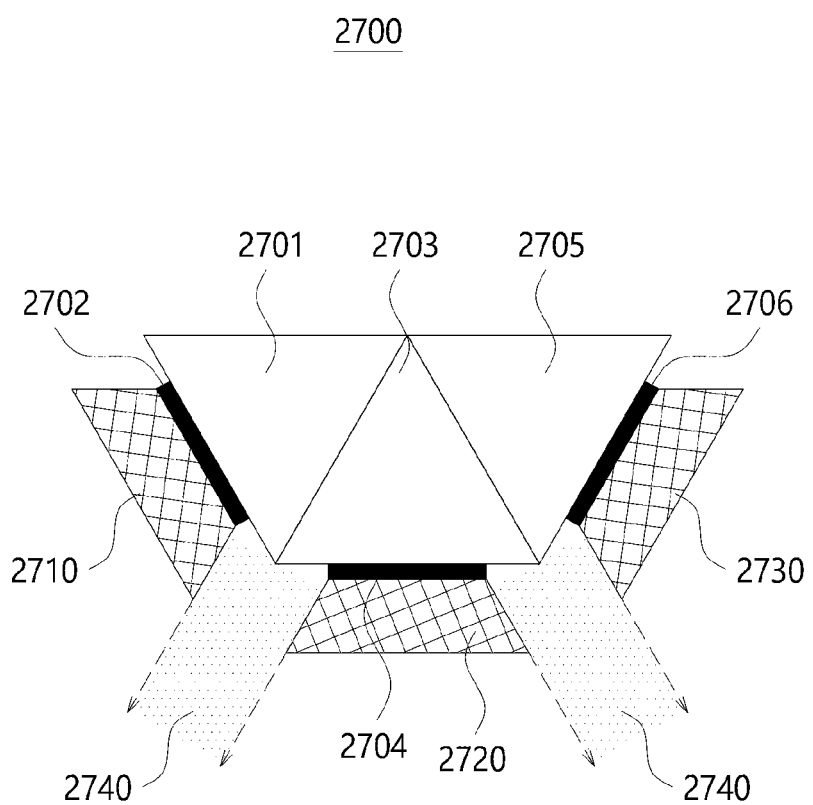
FIGS. 57 and 58 are diagrams showing a LiDAR device according to an embodiment.
Figure 58:
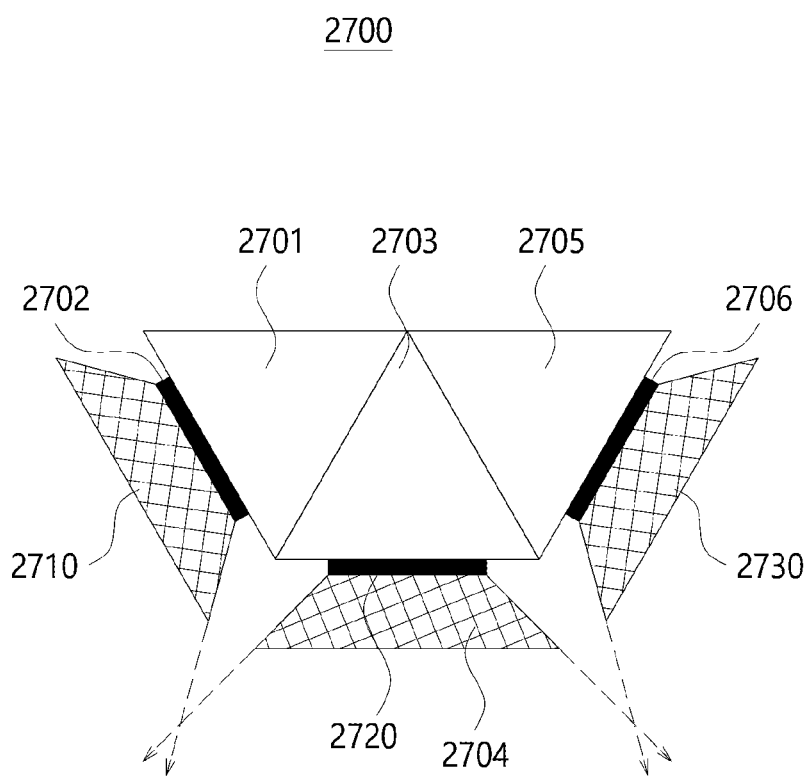

FIGS. 57 and 58 are diagrams showing a LiDAR device according to an embodiment.

Referring to FIGS. 57 and 58, a LiDAR device 2700 according to an embodiment may include a plurality of VCSEL modules 2701, 2703, and 2705. The VCSEL modules may include VCSEL arrays 2702, 2704, and 2706. The VCSEL arrays may emit laser beam bundles 2710, 2720, and 2730.

The VCSEL arrays 2702, 2704, and 2706 according to an embodiment may be disposed outside the VCSEL modules 2701, 2703, and 2705, respectively. The VCSEL arrays 2702, 2704, and 2706 disposed outside the VCSEL modules 2701, 2703, and 2705 may emit laser beam bundles 2710, 2720, and 2730 toward the outsides of the VCSEL modules 2701, 2703, and 2705, respectively.

The LiDAR device 2700 according to an embodiment may include a first VCSEL module 2701, a second VCSEL module 2703, and a third VCSEL module 2705. The LiDAR device 2700 may include three VCSEL modules, but the number of VCSEL modules may be one, two, four, five, or six.

The first VCSEL module 2701 according to an embodiment may include a first VCSEL array 2702. The first VCSEL array 2702 may emit a first laser beam bundle 2710. The first VCSEL array 2702 may emit the first laser beam bundle 2710 toward an object. The first laser beam bundle 2710 may form a vertical FOV and a horizontal FOV. The first laser beam bundle 2710 may be reflected by the object and detected by a detecting unit of the first VCSEL module 2701.

The second VCSEL module 2703 according to an embodiment may include a second VCSEL array 2704. The second VCSEL array 2704 may emit a second laser beam bundle 2720. The second VCSEL array 2704 may emit the second laser beam bundle 2720 toward an object. The second laser beam bundle 2720 may form a vertical FOV and a horizontal FOV. The second laser beam bundle 2720 may be reflected by the object and detected by a detecting unit of the second VCSEL module 2703.

The third VCSEL module 2705 according to an embodiment may include a third VCSEL array 2706. The third VCSEL array 2706 may emit a third laser beam bundle 2730. The third VCSEL array 2706 may emit the third laser beam bundle 2730 toward an object. The third laser beam bundle 2730 may form a vertical FOV and a horizontal FOV. The third laser beam bundle 2730 may be reflected by the object and detected by a detecting unit of the third VCSEL module 2705.

The LiDAR device 2700 according to an embodiment may form a dead zone 2740. The dead zone 2740 may occur due to parallel laser beams between VCSEL modules. The dead zone 2740 may refer to a region to which no laser beam is irradiated.

For example, the first VCSEL module 2701 may use the first VCSEL array 2702 to emit the first laser beam bundle 2710. Also, for example, the second VCSEL module 2703 may use the second VCSEL array 2704 to emit the second laser beam bundle 2720. The outermost laser beam of the first laser beam bundle 2710 may be parallel to the outermost laser beam of the second laser beam bundle 2720. Since the outermost laser beam of the first laser beam bundle 2710 is parallel to the outermost laser beam of the second laser beam bundle 2720, the dead zone 2740 to which no laser beam is irradiated may be formed between the first VCSEL module 2701 and the second VCSEL module 2703.

Also, for example, the second VCSEL module 2703 may use the second VCSEL array 2704 to emit the second laser beam bundle 2720. Also, for example, the third VCSEL module 2705 may use the third VCSEL array 2706 to emit the third laser beam bundle 2730. The outermost laser beam of the second laser beam bundle 2720 may be parallel to the outermost laser beam of the third laser beam bundle 2730.

Since the outermost laser beam of the second laser beam bundle 2720 is parallel to the outermost laser beam of the third laser beam bundle 2730, the dead zone 2740 to which no laser beam is irradiated may be formed between the second VCSEL module 2703 and the third VCSEL module 2705.

When the dead zone 2740 is formed, no laser beam is irradiated to the dead zone 2740. Accordingly, the LiDAR device 2700 cannot detect an object located in the dead zone 2740.

In order to solve such a problem, the following structure may be employed.

Referring to FIG. 58, a LiDAR device 2700 according to an embodiment may include a plurality of VCSEL modules 2701, 2703, and 2705. The VCSEL modules may include VCSEL arrays 2702, 2704, and 2706. The VCSEL arrays may emit laser beam bundles 2710, 2720, and 2730.

The VCSEL arrays 2702, 2704, and 2706 according to an embodiment may be disposed outside the VCSEL modules 2701, 2703, and 2705, respectively. The VCSEL arrays 2702, 2704, and 2706 disposed outside the VCSEL modules 2701, 2703, and 2705 may emit laser beam bundles 2710, 2720, and 2730 toward the outsides of the VCSEL modules 2701, 2703, and 2705, respectively.

The LiDAR device 2700 according to an embodiment may include a first VCSEL module 2701, a second VCSEL module 2703, and a third VCSEL module 2705. The LiDAR device 2700 may include three VCSEL modules, but the number of VCSEL modules may be one, two, four, five, or six.

The first VCSEL module 2701 according to an embodiment may include a first VCSEL array 2702. The first VCSEL array 2702 may emit a first laser beam bundle 2710. The first VCSEL array 2702 may emit the first laser beam bundle 2710 toward an object. The first laser beam bundle 2710 may form a vertical FOV and a horizontal FOV. The first laser beam bundle 2710 may be reflected by the object and detected by a detecting unit of the first VCSEL module 2701.

The second VCSEL module 2703 according to an embodiment may include a second VCSEL array 2704. The second VCSEL array 2704 may emit a second laser beam bundle 2720. The second VCSEL array 2704 may emit the second laser beam bundle 2720 toward an object. The second laser beam bundle 2720 may form a vertical FOV and a horizontal FOV. The second laser beam bundle 2720 may be reflected by the object and detected by a detecting unit of the second VCSEL module 2703.

The third VCSEL module 2705 according to an embodiment may include a third VCSEL array 2706. The third VCSEL array 2706 may emit a third laser beam bundle 2730. The third VCSEL array 2706 may emit the third laser beam bundle 2730 toward an object. The third laser beam bundle 2730 may form a vertical FOV and a horizontal FOV. The third laser beam bundle 2730 may be reflected by the object and detected by a detecting unit of the third VCSEL module 2705.

The outermost laser beams emitted from the VCSEL modules of the LiDAR device according to an embodiment may not be parallel.

For example, the outermost laser beam of the first laser beam bundle 2710 may not be parallel to the outermost laser beam of the second laser beam bundle 2720. Since the outermost laser beam of the first laser beam bundle 2710 is not parallel to the outermost laser beam of the second laser beam bundle 2720, the first laser beam bundle 2710 and the second laser beam bundle 2720 may overlap. Since the first laser beam bundle 2710 and the second laser beam bundle 2720 overlap, a dead zone, to which no laser beam is irradiated, may not be formed between the first VCSEL module 2701 and the second VCSEL module 2703.

Also, for example, the outermost laser beam of the second laser beam bundle 2720 may not be parallel to the outermost laser beam of the third laser beam bundle 2730. Since the outermost laser beam of the second laser beam bundle 2720 is not parallel to the outermost laser beam of the third laser beam bundle 2730, the second laser beam bundle 2720 and the third laser beam bundle 2730 may overlap. Since the second laser beam bundle 2720 and the third laser beam bundle 2730 overlap, a dead zone, to which no laser beam is irradiated, may not be formed between the second VCSEL module 2703 and the third VCSEL module 2705.

Figure 59:
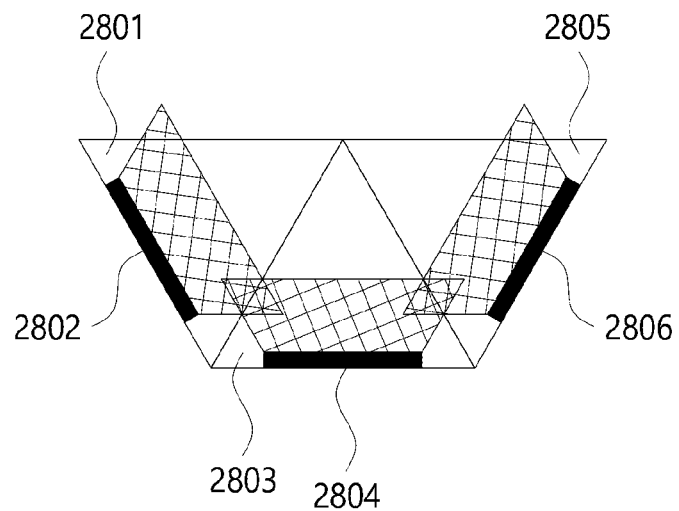
FIGS. 59 and 60 are diagrams showing a LiDAR device according to another embodiment.
Figure 60:
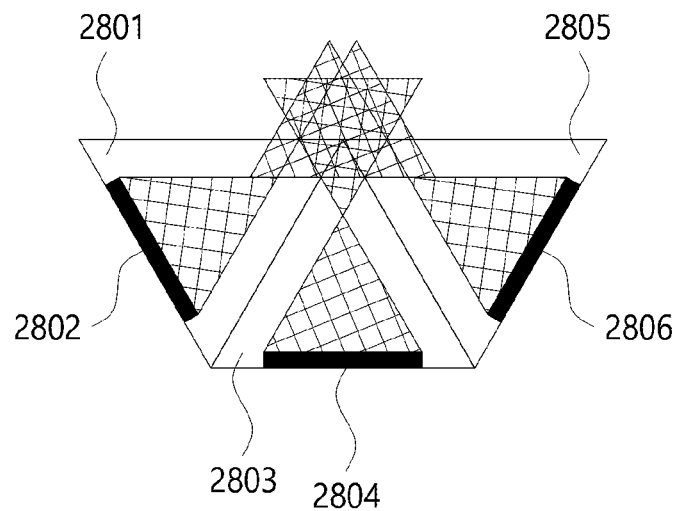

FIGS. 59 and 60 are diagrams showing a LiDAR device according to another embodiment.

Referring to FIGS. 59 and 60, a LiDAR device 2800 according to an embodiment may include a plurality of VCSEL modules 2801, 2803, and 2805. The VCSEL modules may include VCSEL arrays 2802, 2804, and 2806. The VCSEL arrays may emit laser beam bundles 2810, 2820, and 2830.

Referring to FIG. 59, the VCSEL arrays 2802, 2804, and 2806 according to an embodiment may be disposed inside the VCSEL modules 2801, 2803, and 2805, respectively. The VCSEL arrays 2802, 2804, and 2806 disposed inside the VCSEL modules 2801, 2803, and 2805 may emit laser beam bundles 2810, 2820, and 2830 toward the insides of the VCSEL modules 2801, 2803, and 2805, respectively.

Also, the VCSEL arrays 2802, 2804, and 2806 according to an embodiment may be disposed inside the VCSEL modules 2801, 2803, and 2805 to emit laser beams in directions in which the laser beam bundles 2810, 2820, and 2830 spread out, respectively.

The LiDAR device 2800 according to an embodiment may include a first VCSEL module 2801, a second VCSEL module 2803, and a third VCSEL module 2805. The LiDAR device 2800 may include three VCSEL modules, but the number of VCSEL modules may be one, two, four, five, or six.

The first VCSEL module 2801 according to an embodiment may include a first VCSEL array 2802. The first VCSEL array 2802 may output a first laser beam bundle 2810. The first VCSEL array 2802 may emit the first laser beam bundle 2810 toward an object. The first laser beam bundle 2810 may form a vertical FOV and a horizontal FOV. The first laser beam bundle 2810 may be reflected by the object and detected by a detecting unit of the first VCSEL module 2801.

The second VCSEL module 2803 according to an embodiment may include a second VCSEL array 2804. The second VCSEL array 2804 may emit a second laser beam bundle 2820. The second VCSEL array 2804 may emit the second laser beam bundle 2820 toward an object. The second laser beam bundle 2820 may form a vertical FOV and a horizontal FOV. The second laser beam bundle 2820 may be reflected by the object and detected by a deteting unit of the second VCSEL module 2803.

The third VCSEL module 2805 according to an embodiment may include a third VCSEL array 2806. The third VCSEL array 2806 may emit a third laser beam bundle 2830. The third VCSEL array 2806 may emit the third laser beam bundle 2830 toward an object. The third laser beam bundle 2830 may form a vertical FOV and a horizontal FOV.

The third laser beam bundle 2830 may be reflected by the object and detected by a detecting unit of the third VCSEL module 2805.

The LiDAR device 2800 according to an embodiment may not form a dead zone.

For example, the first laser beam bundle 2710 and the second laser beam bundle 2720 may overlap. Also, for example, the second laser beam bundle 2720 and the third laser beam bundle 2730 may overlap.

In this case, since the first laser beam bundle 2710 and the second laser beam bundle 2720 overlap and the second laser beam bundle 2720 and the third laser beam bundle 2730 overlap, the LiDAR device 2800 may not form a dead zone to which no laser beam is irradiated.

Referring to FIG. 60, the VCSEL arrays 2802, 2804, and 2806 according to an embodiment may be disposed inside the VCSEL modules 2801, 2803, and 2805, respectively. The VCSEL arrays 2802, 2804, and 2806 disposed inside the VCSEL modules 2801, 2803, and 2805 may emit laser beam bundles 2810, 2820, and 2830 toward the insides of the VCSEL modules 2801, 2803, and 2805, respectively.

Also, the VCSEL arrays 2802, 2804, and 2806 according to an embodiment may be disposed inside the VCSEL modules 2801, 2803, and 2805 to emit laser beams in directions in which the laser beam bundles 2810, 2820, and 2830 meet, respectively.

The first VCSEL module 2801 according to an embodiment may include a first VCSEL array 2802. The first VCSEL array 2802 may emit a first laser beam bundle 2810. The first VCSEL array 2802 may emit the first laser beam bundle 2810 toward an object. The first laser beam bundle 2810 may form a vertical FOV and a horizontal FOV. The first laser beam bundle 2810 may be reflected by the object and detected by a detecting unit of the first VCSEL module 2801.

The second VCSEL module 2803 according to an embodiment may include a second VCSEL array 2804. The second VCSEL array 2804 may emit a second laser beam bundle 2820. The second VCSEL array 2804 may emit the second laser beam bundle 2820 toward an object. The second laser beam bundle 2820 may form a vertical FOV and a horizontal FOV. The second laser beam bundle 2820 may be reflected by the object and detected by a detecting unit of the second VCSEL module 2803.

The third VCSEL module 2805 according to an embodiment may include a third VCSEL array 2806. The third VCSEL array 2806 may emit a third laser beam bundle 2830. The third VCSEL array 2806 may emit the third laser beam bundle 2830 toward an object. The third laser beam bundle 2830 may form a vertical FOV and a horizontal FOV. The third laser beam bundle 2830 may be reflected by the object and detected by a detecting unit of the third VCSEL module 2805.

The LiDAR device 2800 according to an embodiment may not form a dead zone.

For example, the first laser beam bundle 2710 and the second laser beam bundle 2720 may overlap. Also, for example, the second laser beam bundle 2720 and the third laser beam bundle 2730 may overlap.

In this case, since the first laser beam bundle 2710 and the second laser beam bundle 2720 overlap and the second laser beam bundle 2720 and the third laser beam bundle 2730 overlap, the LiDAR device 2800 may not form a dead zone to which no laser beam is irradiated.

A VCSEL emitter according to an embodiment of the present disclosure will be described below.

Figure 61:
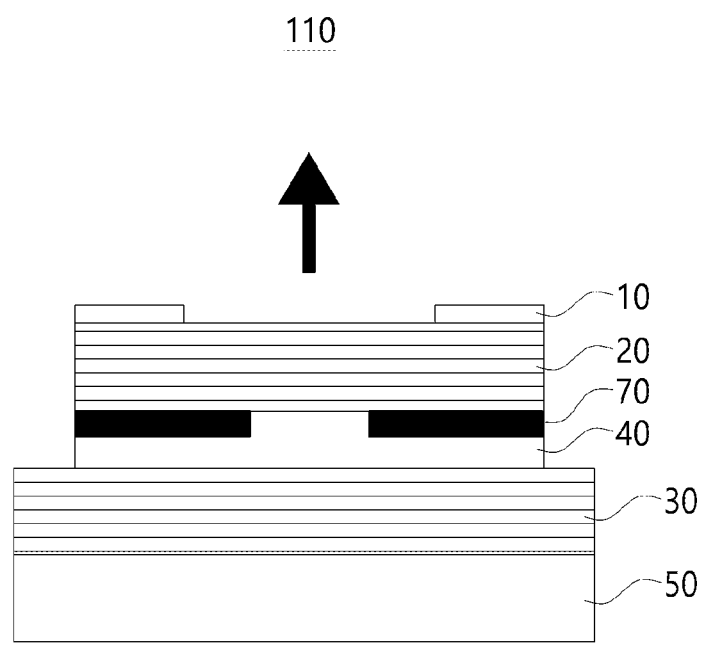
FIG. 61 is a diagram showing a cross-section of a VCSEL emitter according to an embodiment.

FIG. 61 is a diagram showing a cross-section of a VCSEL emitter according to an embodiment. The VCSEL emitter of FIG. 61 may be the same as the VCSEL emitter of FIG. 3. FIG. 61 may show a cross-section of the VCSEL emitter of FIG. 3.

Referring to FIG. 61, the VCSEL emitter 110 according to an embodiment may include an upper metal contact 10, an upper DBR layer 20, an active layer 40 (quantum well), a lower DBR layer 30, a substrate 50, and an oxidation region 70.

Also, the VCSEL emitter 110 according to an embodiment may emit a laser beam perpendicularly to an upper surface. For example, the VCSEL emitter 110 may emit a laser beam perpendicularly to the surface of the upper metal contact 10. Also, for example, the VCSEL emitter 110 may emit a laser beam perpendicularly to the active layer 40.

A description of the VCSEL emitter 110 may overlap with the description of the VCSEL emitter with reference to FIG. 3, and thus a detailed description thereof will be omitted.

Figure 62:
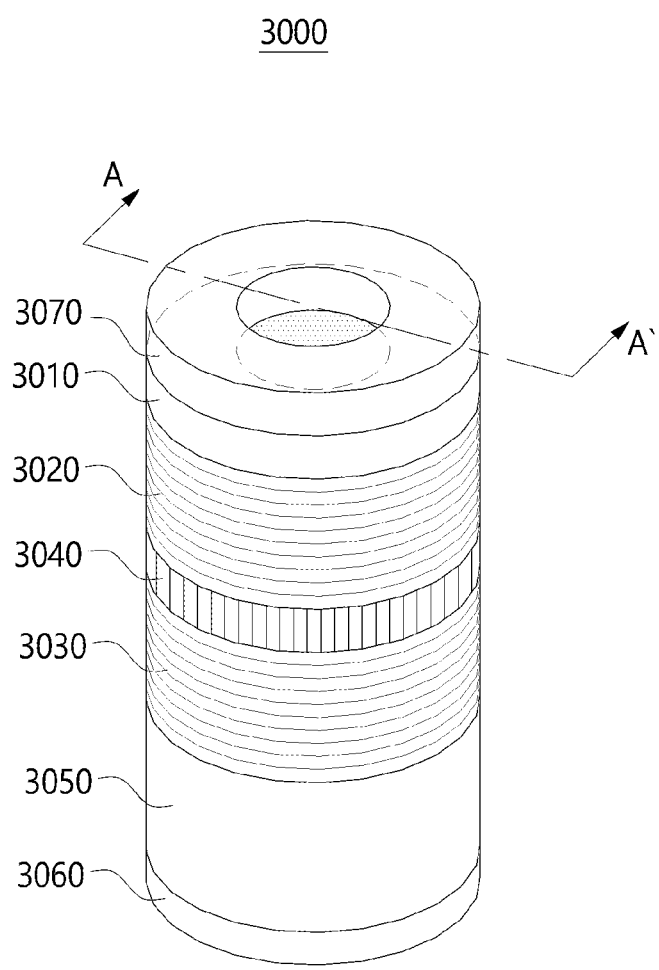
FIG. 62 is a diagram showing a VCSEL emitter according to another embodiment.

FIG. 62 is a diagram showing a VCSEL emitter according to another embodiment.

Referring to FIG. 62, a VCSEL emitter 3000 according to an embodiment may include an upper metal contact 3010, an upper DBR layer 3020, a lower DBR layer 3030, an active layer 3040 (quantum well), a substrate 50, a lower metal contact 3060, and a reflector 3070.

The VCSEL emitter 3000 according to an embodiment may emit a laser beam perpendicularly to an upper surface thereof. For example, the VCSEL emitter 3000 may emit a laser beam perpendicularly to the surface of the upper metal contact 3010. Also, for example, the VCSEL emitter 3000 may emit a laser beam perpendicularly to the active layer 3040.

The VCSEL emitter 3000 according to an embodiment may emit laser beams of various wavelengths. For example, the VCSEL emitter 3000 may emit a laser beam with a wavelength of 905 nm. Also, for example, the VCSEL emitter 3000 may emit a laser beam with a wavelength of 1550 nm.

Also, the wavelength of the laser beam emitted from the VCSEL emitter 3000 according to an embodiment may vary depending on the surrounding environment. For example, as the temperature of the surrounding environment increases, the wavelength of the laser beam emitted from the VCSEL emitter 3000 may increase. Alternatively, for example, as the temperature of the surrounding environment decreases, the wavelength of the laser beam emitted from the VCSEL emitter 3000 may decrease. The surrounding environment may include temperature, humidity, pressure, dust concentration, ambient light amount, altitude, gravity, acceleration, and the like, but the present disclosure is not limited thereto. Here, the VCSEL emitter 3000 may be represented as VCSEL.

The VCSEL unit may include a plurality of VCSEL emitters 3000. Also, the VCSEL array may include a plurality of VCSEL units.

According to an embodiment, the VCSEL emitter 3000 may include the upper DBR layer 3020 and the lower DBR layer 3030.

Here, the upper DBR layer 3020 may be expressed as an upper DBR layer, an upper reflective layer, a reflective layer, or a first reflective layer, but the present disclosure is not limited thereto.

According to an embodiment, the upper DBR layer 3020 may include a plurality of reflective layers. For example, the plurality of reflective layers may be arranged such that a reflective layer with high reflectance alternates with a reflective layer with low reflectance. In this case, the thickness of the plurality of reflective layers may be a quarter of the wavelength of the laser beam emitted from the VCSEL emitter 3000.

Also, according to an embodiment, the upper DBR layer 3020 may be doped in p-type or n-type. For example, when the upper DBR layer 3020 is doped in p-type, the lower DBR layer 3030 is doped in n-type. Also, for example, when the upper DBR layer 3020 is doped in n-type, the lower DBR layer 3030 is doped in p-type.

Here, the lower DBR layer 3030 may be represented as a lower DBR layer, a lower reflective layer, a reflective layer, or a second reflective layer, but the present disclosure is not limited thereto.

According to an embodiment, the lower DBR layer 3030 may include a plurality of reflective layers. For example, the plurality of reflective layers may be arranged such that a reflective layer with high reflectance alternates with a reflective layer with low reflectance. In this case, the thickness of the plurality of reflective layers may be a quarter of the wavelength of the laser beam emitted from the VCSEL emitter 3000.

Also, according to an embodiment, the lower DBR layer 3030 may be doped in p-type or n-type. For example, when the lower DBR layer 3030 is doped in p-type, the upper DBR layer 3020 is doped in n-type. Also, for example, when the lower DBR layer 3030 is doped in n-type, the upper DBR layer 3020 is doped in p-type.

According to an embodiment, the VCSEL emitter 3000 may include an active layer 3040.

Here, the active layer 3040 is expressed as an active layer, but the present disclosure is not limited thereto.

According to an embodiment, the active layer 3040 may be disposed between the upper DBR layer 3020 and the lower DBR layer 3030.

According to an embodiment, the active layer 3040 may include a plurality of quantum wells that generate laser beams. Also, the active layer 3040 may emit laser beams.

Also, according to an embodiment, the active layer 3040 may include an oxidation region. Alternatively, the oxidation region may be placed above the active layer 3040.

In this case, the oxidation region may have electrical insulation. In the oxidation region, no electric current may flow, or the flow of electricity may be restricted.

Also, the oxidation region may be present on the edge of the active layer 3040. For example, the oxidation region may not be disposed on a central part of the active layer 3040. In this case, the oxidation region may be disposed not on the central part of the active layer 3040 but on the edge, and thus a laser beam emitted from the active layer 3040 may be emitted to the central part. Also, the oxidation region may enable photons in the active layer 3040 to meet in the central part, and thus a laser beam may be emitted to the central part of the active layer 3040.

In this case, the oxidation region may serve as an aperture of the VCSEL emitter 3000. In detail, since the oxidation region has electrical insulation, a laser beam generated from the active layer 3040 may be emitted to only a part other than the oxidation region.

According to an embodiment, the VCSEL emitter 3000 may include a metal contact for an electrical connection to an external power source or the like. For example, the VCSEL emitter 3000 may include the upper metal contact 3010 and the lower metal contact 3060.

Also, according to an embodiment, the VCSEL emitter 3000 may be electrically connected to the upper DBR layer 3020 and the lower DBR layer 3030 through a metal contact.

For example, when the upper DBR layer 3020 is doped in p-type and the lower DBR layer 3030 is doped in n-type, p-type power may be supplied to the upper metal contact 3010 to electrically connect the VCSEL emitter 3000 to the upper DBR layer 3020, and n-type power may be supplied to the lower metal contact 3060 to electrically connect the VCSEL emitter 3000 to the lower DBR layer 3030.

Also, for example, when the upper DBR layer 3020 is doped in n-type and the lower DBR layer 3030 is doped in p-type, n-type power may be supplied to the upper metal contact 3010 to electrically connect the VCSEL emitter 3000 to the upper DBR layer 3020, and p-type power may be supplied to the lower metal contact 3060 to electrically connect the VCSEL emitter 3000 to the lower DBR layer 3030.

The upper metal contact 3010 and the lower metal contact 3060 may be made of titanium (Ti), chromium (Cr), nickel (Ni), or a combination thereof, but the present disclosure is not limited thereto.

For example, when the upper metal contact 3010 or the lower metal contact 3060 is made of titanium, the upper metal contact 3010 or the lower metal contact 3060 may have a reflectance of 54.6%, but the present disclosure is not limited thereto.

Also, for example, when the upper metal contact 3010 or the lower metal contact 3060 is made of chromium, the upper metal contact 3010 or the lower metal contact 3060 may have a reflectance of 57.5%, but the present disclosure is not limited thereto.

Also, for example, when the upper metal contact 3010 or the lower metal contact 3060 is made of nickel, the upper metal contact 3010 or the lower metal contact 3060 may have a reflectance of 70.5%, but the present disclosure is not limited thereto.

According to an embodiment, the upper metal contact 3010 may have a thickness of 2 nm or less, but the present disclosure is not limited thereto.

Also, the VCSEL emitter 3000 may include a reflector 3070. For example, the VCSEL emitter 3000 may include a reflector 3070 disposed above the upper metal contact 3010.

According to an embodiment, the reflector 3070 may reflect a laser beam emitted from the upper metal contact 3010. For example, the reflector 3070 may reflect a laser beam emitted from the upper metal contact 3010 back to the upper metal contact 3010. Also, for example, the reflector 3070 may reflect a laser beam that is emitted from the active layer 3040 and absorbed by the upper metal contact 3010 through the upper DBR layer 3020. Therefore, the reflector 3070 can improve the laser beam emission efficiency of the VCSEL emitter 3000 by reflecting the laser beam absorbed by the upper metal contact 3010 of the VCSEL emitter 3000.

Also, according to an embodiment, the reflector 3070 may have a first face facing the upper metal contact 3010. The first face may be adjacent to or separated from the upper metal contact 3010.

The first face of the reflector 3070 may be a flat face, a curved face, or an inclined face with a slope.

For example, when the first face of the reflector 3070 is a flat face, the reflector 3070 and the upper metal contact 3010 may be formed adjacent to each other to share the first face, but the present disclosure is not limited thereto.

Also, for example, when the first face of the reflector 3070 is a curved face, the first face may be bent toward the central part of the VCSEL emitter 3000, but the present disclosure is not limited thereto.

Also, for example, when the first face of the reflector 3070 is an inclined face, the first face may be inclined toward the central part of the VCSEL emitter 3000, but the present disclosure is not limited thereto.

According to an embodiment, the reflector 3070 may be made of silver (Ag), aluminum (Al), or a combination thereof, but the present disclosure is not limited thereto.

For example, when the reflector 3070 is made of silver, the reflector 3070 may have a reflectance of 99%, but the present disclosure is not limited thereto.

Also, for example, when the reflector 3070 is made of aluminum, the reflector 3070 may have a reflectance of 90.7%, but the present disclosure is not limited thereto.

According to an embodiment, the reflectance of the reflector 3070 may be greater than the reflectance of the upper metal contact 3010. For example, the reflectance of the first face of the reflector 3070 may be greater than the reflectance of the upper metal contact 3010.

For example, the reflectance of the upper metal contact 3010 is 54.6% (Ti), 57.5% (Cr), or 70.5% (Ni), and the reflectance of the reflector 3070 is 99% (Ag) or 90.7% (Al). In this case, the reflectance of the reflector 3070 may be greater than the reflectance of the upper metal contact 3010, but the present disclosure is not limited thereto.

Also, for example, when the upper metal contact 3010 is made of titanium and has a thickness of 2 nm or less and the reflector 3070 is made of silver, the reflectance of the reflector 3070 may be greater than or equal to 90% with respect to light with a wavelength of 940 nm.

Figure 63:
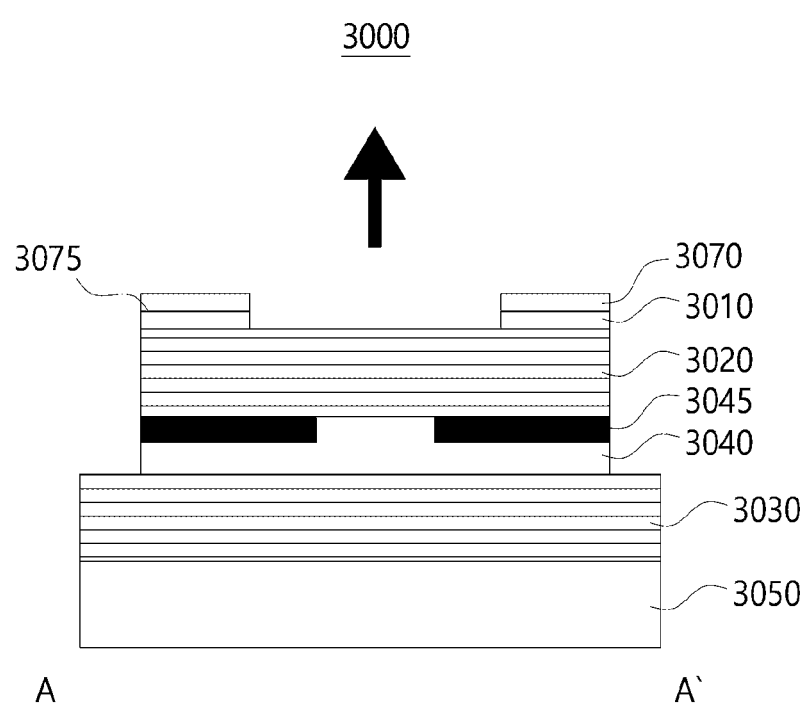
FIG. 63 is a diagram showing a cross-section of a VCSEL emitter according to still another embodiment.

FIG. 63 is a diagram showing a cross-section of a VCSEL emitter according to another embodiment.

Referring to FIG. 63, a VCSEL emitter 3000 according to an embodiment may include an upper metal contact 3010, an upper DBR layer 3020, a lower DBR layer 3030, an active layer 3040 (quantum well), an oxidation region 3045, a substrate 3050, a lower metal contact 3060, and a reflector 3070.

According to an embodiment, the reflector 3070 of the VCSEL emitter 3000 may include a first face 3075 facing the upper metal contact 3010. In this case, the first face 3075 may have a flat shape or may include a curved face.

According to an embodiment, the reflector 3070 of the VCSEL emitter 3000 may reflect light emitted from the upper metal contact 3010. For example, the reflector 3070 may reflect light, which travels from the active layer 3040 toward the upper metal contact 3010, back to the active layer 3040. The light reflected by the reflector 3070 may be reflected by the upper DBR layer or the lower DBR layer and then emitted outward through an opening present in the upper metal contact 3010.

The reflector 3070 can increase the laser beam emission efficiency of the VCSEL emitter 3000 by reflecting the light emitted from the upper metal contact 3010. The reflector 3070 can increase the amount of light output through the opening of the VCSEL emitter 3000 by reflecting the light emitted from the upper metal contact 3010.

According to an embodiment, the reflector 3070 of the VCSEL emitter 3000 may include a first face 3075 in contact with the upper metal contact 3010. In this case, when the first face 3075 is longer than the upper metal contact 3010, the first face 3075 may decrease the area and the emission efficiency of a laser beam output from the active layer 3040. Thus, the length of the first face 3075 may be less than or equal to the length of the upper metal contact 3010.

Also, according to an embodiment, the first face 3075 of the reflector 3070 of the VCSEL emitter 3000 may not directly reflect a laser beam output from the active layer 3040. When directly reflecting the laser beam output from the active layer 3040, the first face 3075 may decrease the area and the emission efficiency of the laser beam output from the active layer 3040. Thus, the laser beam output from the active layer 3040 may not be directly incident on the first face 3075.

Figure 64:
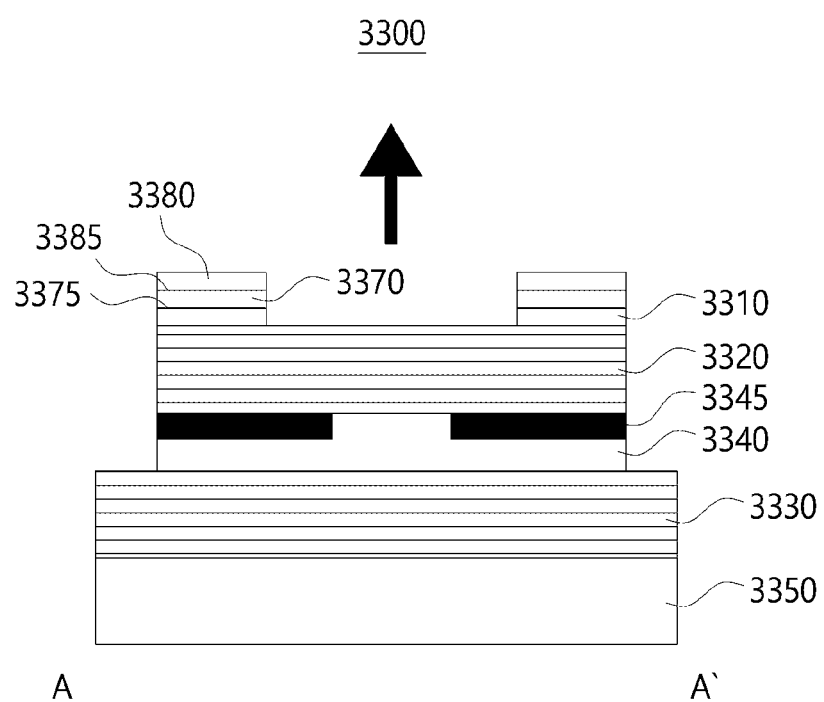
FIG. 64 is a diagram showing a cross-section of a VCSEL emitter according to still another embodiment.

FIG. 64 is a diagram showing a cross-section of a VCSEL emitter according to still another embodiment.

Referring to FIG. 64, a VCSEL emitter 3300 according to an embodiment may include an upper metal contact 3310, an upper DBR layer 3320, a lower DBR layer 3330, an active layer 3340 (quantum well), an oxidation region 3345, a substrate 3350, a lower metal contact 3360, and reflectors 3370 and 3380.

A description of the upper metal contact 3310, the upper DBR layer 3320, the lower DBR layer 3330, the active layer 3340 (quantum well), the oxidation region 3345, the substrate 3350, the lower metal contact 3360, and the reflector 3370 may overlap with the description of the upper metal contact 3010, the upper DBR layer 3020, the lower DBR layer 3030, the active layer 3040 (quantum well), the oxidation region 3045, the substrate 3050, the lower metal contact 3060, and the reflector 3370 with reference to FIG. 63, and thus a detailed description thereof will be omitted.

The VCSEL emitter 3300 may include a plurality of reflectors. For example, the VCSEL emitter 3300 may include a first reflector 3370 and a second reflector 3380.

The first reflector 3370 may have a first face 3375 facing the upper metal contact 3310. The first face 3375 may be adjacent to or separated from the upper metal contact 3310.

The second reflector 3380 may have a second face 3385 facing the first reflector 3370. The second face 3385 may be adjacent to or separated from the first reflector 3370.

Each of the first face 3375 of the first reflector 3370 and the second face 3385 of the second reflector 3380 may be a flat face, a curved face, or an inclined face with a slope.

A description of the first face 3375 and the second face 3385 may overlap with the first face 3075 of the VCSEL emitter 3000, and thus a detailed description thereof will be omitted.

Figure 65:
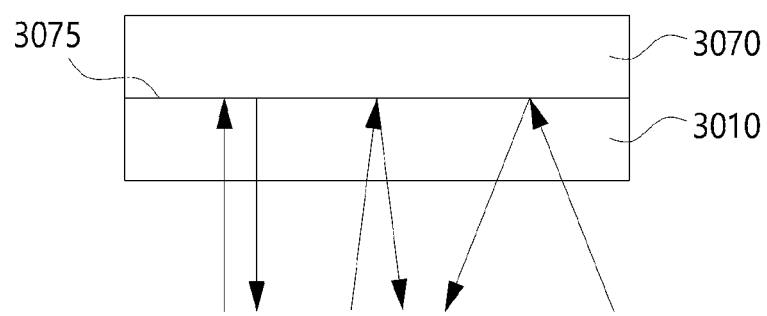
FIG. 65 is a diagram showing an upper metal contact and a reflector according to an embodiment.

FIG. 65 is a diagram showing an upper metal contact and a reflector according to an embodiment.

Referring to FIG. 65, the reflector 3070 may include the first face 3075 facing the upper metal contact 3010. The number of times photons are reflected in a DBR layer and the degree of reflection may vary depending on the shape of the first face.

According to an embodiment, the first face 3075 may reflect a laser beam absorbed by the upper metal contact 3010. Also, the first face 3075 may reflect a laser beam output through the upper metal contact 3010.

For example, the first face 3075 may reflect a laser beam perpendicularly incident on the first face 3075 through the upper metal contact 3010, perpendicularly to the first face 3075.

Also, for example, the first face 3075 may reflect a laser beam incident on the first face 3075 at an angle of incidence of θ through the upper metal contact 3010, at an angle of reflection of θ.

Figure 66:
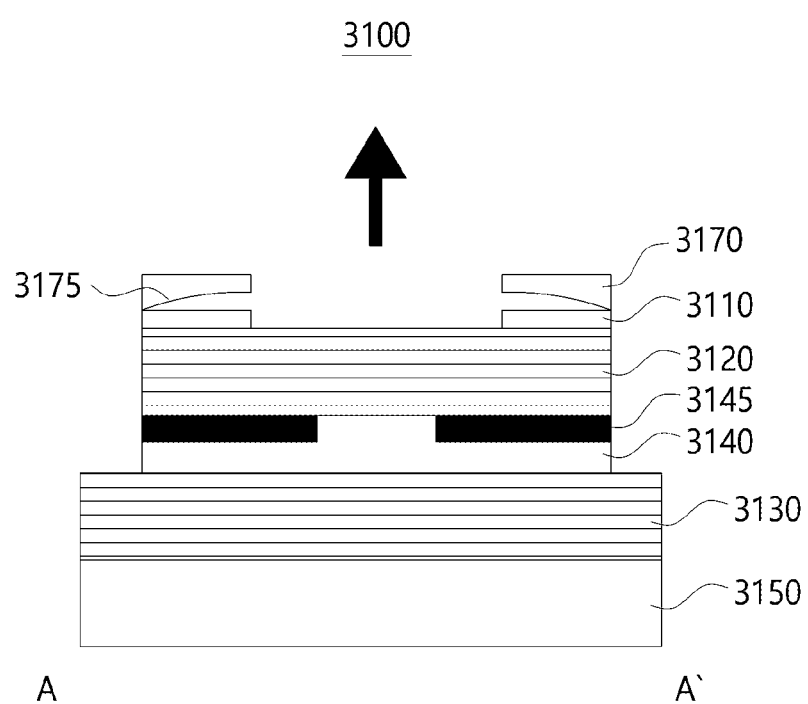
FIG. 66 is a diagram showing a cross-section of a VCSEL emitter according to another embodiment.

FIG. 66 is a diagram showing a cross-section of a VCSEL emitter according to another embodiment.

Referring to FIG. 66, a VCSEL emitter 3100 according to another embodiment may include an upper metal contact 3110, an upper DBR layer 3120, a lower DBR layer 3130, an active layer 3140 (quantum well), an oxidation region 3145, a substrate 3150, a lower metal contact 3160, and a reflector 3170.

The upper metal contact 3110 of the VCSEL emitter 3100 may be the same as the upper metal contact 3010 of the VCSEL emitter 3000 of FIG. 62, and thus a detailed description thereof will be omitted.

The upper DBR layer 3120 of the VCSEL emitter 3100 may be the same as the upper DBR layer 3020 of the VCSEL emitter 3000 of FIG. 62, and thus a detailed description thereof will be omitted.

The lower DBR layer 3130 of the VCSEL emitter 3100 may be the same as the lower DBR layer 3030 of the VCSEL emitter 3000 of FIG. 62, and thus a detailed description thereof will be omitted.

The active layer 3140 of the VCSEL emitter 3100 may be the same as the active layer 3040 of the VCSEL emitter 3000 of FIG. 62, and thus a detailed description thereof will be omitted.

The oxidation region 3145 of the VCSEL emitter 3100 may be the same as the oxidation region 3045 of the VCSEL emitter 3000 of FIG. 62, and thus a detailed description thereof will be omitted.

The substrate 3150 of the VCSEL emitter 3100 may be the same as the substrate 3050 of the VCSEL emitter 3000 of FIG. 62, and thus a detailed description thereof will be omitted.

The lower metal contact 3160 of the VCSEL emitter 3100 may be the same as the lower metal contact 3060 of the VCSEL emitter 3000 of FIG. 62, and thus a detailed description thereof will be omitted.

The reflector 3170 of the VCSEL emitter 3100 may be the same as the reflector 3070 of the VCSEL emitter 3000 of FIG. 62, and thus a detailed description thereof will be omitted.

According to an embodiment, the reflector 3170 of the VCSEL emitter 3100 may include a first face 3175 facing the upper metal contact 3110. In this case, the first face 3175 may be a curved face.

According to an embodiment, when the reflector 3170 of the VCSEL emitter 3100 is longer than the upper metal contact 3110, the reflector 3170 may decrease the area and the emission efficiency of a laser beam output from the active layer 3140. Thus, the length of the reflector 3170 may be less than or equal to the length of the upper metal contact 3110.

Also, according to an embodiment, the first face 3175 of the reflector 3170 of the VCSEL emitter 3100 may not directly reflect a laser beam output from the active layer 3140. When directly reflecting the laser beam output from the active layer 3140, the first face 3175 may decrease the area and the emission efficiency of the laser beam output from the active layer 3140. Thus, the laser beam output from the active layer 3140 may not be directly incident on the first face 3175.

Figure 67:
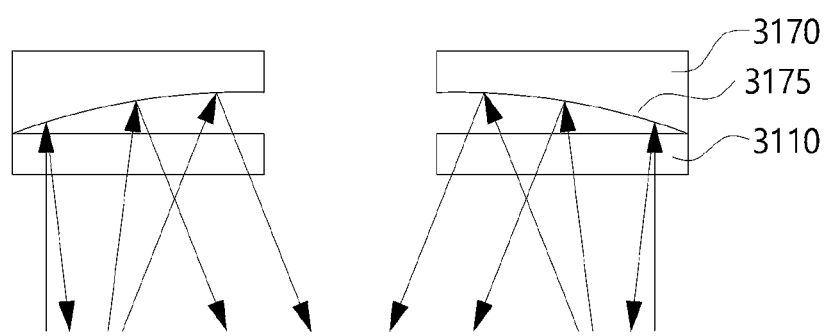
FIG. 67 is a diagram showing an upper metal contact and a reflector according to another embodiment.

FIG. 67 is a diagram showing an upper metal contact and a reflector according to another embodiment.

Referring to FIG. 67, the reflector 3170 may include the first face 3175 facing the upper metal contact 3110.

According to an embodiment, the first face 3175 may reflect a laser beam absorbed by the upper metal contact 3110. Also, the first face 3175 may reflect a laser beam output through the upper metal contact 3110.

In this case, since the first face 3175 is a curved face, a laser beam incident on the first face 3175 through the upper metal contact 3110 may be reflected by the first face 3175 toward the central part of the VCSEL emitter 3100. Since the laser beam reflected by the first face 3175 is directed to the central part of the VCSEL emitter 3100, it is possible to reduce the light loss of the VCSEL emitter 3100 and improve the laser beam emission efficiency.

Figure 68:
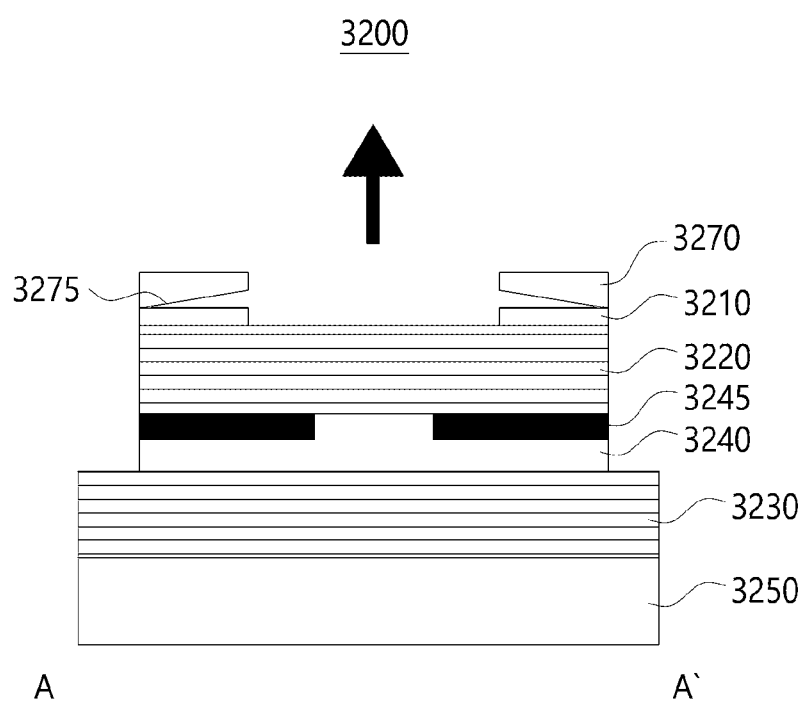
FIG. 68 is a diagram showing a cross-section of a VCSEL emitter according to still another embodiment.

FIG. 68 is a diagram showing a cross-section of a VCSEL emitter according to still another embodiment.

Referring to FIG. 68, a VCSEL emitter 3200 according to still another embodiment may include an upper metal contact 3210, an upper DBR layer 3220, a lower DBR layer 3230, an active layer 3240 (quantum well), an oxidation region 3245, a substrate 3250, a lower metal contact 3260, and a reflector 3270.

The upper metal contact 3210 of the VCSEL emitter 3200 may be the same as the upper metal contact 3010 of the VCSEL emitter 3000 of FIG. 62, and thus a detailed description thereof will be omitted.

The upper DBR layer 3220 of the VCSEL emitter 3200 may be the same as the upper DBR layer 3020 of the VCSEL emitter 3000 of FIG. 62, and thus a detailed description thereof will be omitted.

The lower DBR layer 3230 of the VCSEL emitter 3200 may be the same as the lower DBR layer 3030 of the VCSEL emitter 3000 of FIG. 62, and thus a detailed description thereof will be omitted.

The active layer 3240 of the VCSEL emitter 3200 may be the same as the active layer 3040 of the VCSEL emitter 3000 of FIG. 62, and thus a detailed description thereof will be omitted.

The oxidation region 3245 of the VCSEL emitter 3200 may be the same as the oxidation region 3045 of the VCSEL emitter 3000 of FIG. 62, and thus a detailed description thereof will be omitted.

The substrate 3250 of the VCSEL emitter 3200 may be the same as the substrate 3050 of the VCSEL emitter 3000 of FIG. 62, and thus a detailed description thereof will be omitted.

The lower metal contact 3260 of the VCSEL emitter 3200 may be the same as the lower metal contact 3060 of the VCSEL emitter 3000 of FIG. 62, and thus a detailed description thereof will be omitted.

The reflector 3270 of the VCSEL emitter 3200 may be the same as the reflector 3070 of the VCSEL emitter 3000 of FIG. 62, and thus a detailed description thereof will be omitted.

According to an embodiment, the reflector 3270 of the VCSEL emitter 3200 may include a first face 3275 facing the upper metal contact 3210. In this case, the first face 3275 may be an inclined face with a slope.

According to an embodiment, when the reflector 3270 of the VCSEL emitter 3200 is longer than the upper metal contact 3210, the reflector 3270 may decrease the area and the emission efficiency of a laser beam output from the active layer 3240. Thus, the length of the reflector 3270 may be less than or equal to the length of the upper metal contact 3210.

Also, according to an embodiment, the first face 3175 of the reflector 3270 of the VCSEL emitter 3200 may not directly reflect a laser beam output from the active layer 3240. When directly reflecting the laser beam output from the active layer 3240, the first face 3275 may decrease the area and the emission efficiency of the laser beam output from the active layer 3240. Thus, the laser beam output from the active layer 3240 may not be directly incident on the first face 3275.

Figure 69:
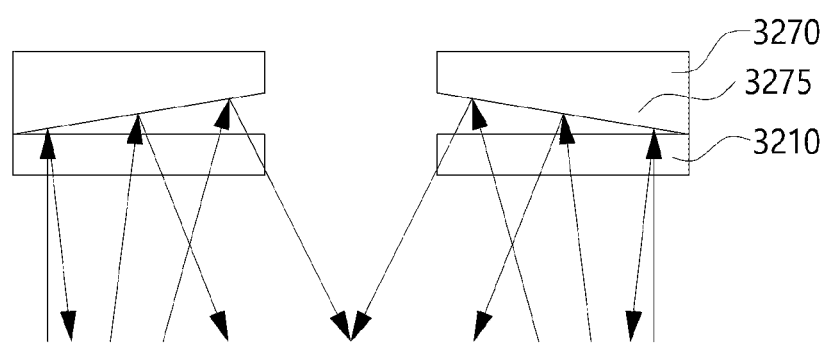
FIG. 69 is a diagram showing an upper metal contact and a reflector according to still another embodiment.

FIG. 69 is a diagram showing an upper metal contact and a reflector according to still another embodiment.

Referring to FIG. 69, the reflector 3270 may include the first face 3275 facing the upper metal contact 3210.

According to an embodiment, the first face 3275 may reflect a laser beam absorbed by the upper metal contact 3210. Also, the first face 3275 may reflect a laser beam output through the upper metal contact 3210.

In this case, since the first face 3275 is an inclined face with a slope, a laser beam incident on the first face 3275 through the upper metal contact 3210 may be reflected by the first face 3275 toward the central part of the VCSEL emitter 3200. Since the laser beam reflected by the first face 3275 is directed to the central part of the VCSEL emitter 3200, it is possible to reduce the light loss of the VCSEL emitter 3200 and improve light output efficiency.

Figure 70:
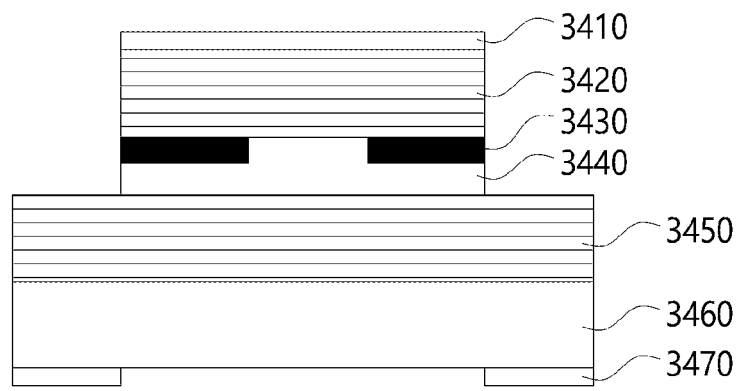
FIG. 70 is a diagram showing a cross-section of a bottom-emitting VCSEL emitter according to an embodiment.

FIG. 70 is a diagram showing a cross-section of a bottom-emitting VCSEL emitter according to an embodiment.

Referring to FIG. 70, a bottom-emitting VCSEL emitter 3400 according to an embodiment may include a first metal contact 3410, a first DBR layer 3420, an oxidation region 3430, an active layer 3440, a second DBR layer 3450, a substrate 3460, and a second metal contact 3470.

Also, the VCSEL emitter 3400 according to an embodiment may emit a laser beam perpendicularly to a lower surface. For example, the VCSEL emitter 3400 may emit a laser beam perpendicularly to the surface of the second metal contact 3470. Also, for example, the VCSEL emitter 3400 may emit a laser beam perpendicularly to the active layer 3440.

The VCSEL emitter 3400 according to an embodiment may include a first DBR layer 3420 and a second DBR layer 3430.

A description of the first DBR layer 3420 and the second DBR layer 3430 may overlap with the description of the upper DBR layer 20 and the lower DBR layer 30 of the VCSEL emitter 110 with reference to FIG. 3, and thus a detailed description thereof will be omitted.

According to an embodiment, the first DBR layer 3420 may be doped in p-type, and the second DBR layer 3450 may be doped in n-type. Alternatively, the first DBR layer 3420 may be doped in n-type, and the second DBR layer 3450 may be doped in p-type.

In this case, the first metal contact 3410 may be a p-type metal, and the second metal contact 3470 may be an n-type metal. Alternatively, the first metal contact 3410 may be an n-type metal, and the second metal contact 3470 may be a p-type metal.

A description of the oxidation region 3430, the active layer 3440, and the substrate 3460 may overlap with the description of the oxidation region, the active layer 40, and the substrate 50 of the VCSEL emitter 110 with reference to FIG. 3, and thus a detailed description thereof will be omitted.

Figure 71:
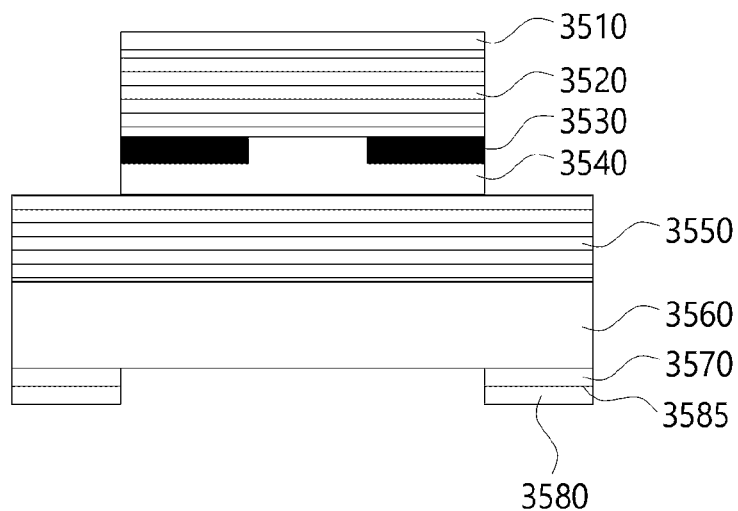
FIG. 71 is a diagram showing a cross-section of a bottom-emitting VCSEL emitter according to another embodiment.

FIG. 71 is a diagram showing a cross-section of a bottom-emitting VCSEL emitter according to another embodiment.

Referring to FIG. 71, a bottom-emitting VCSEL emitter 3500 according to another embodiment may include a first metal contact 3510, a first DBR layer 3520, an oxidation region 3530, an active layer 3540, a second DBR layer 3550, a substrate 3560, a second metal contact 3570, and a reflector 3580.

Also, the VCSEL emitter 3500 according to an embodiment may emit a laser beam perpendicularly to a lower surface. For example, the VCSEL emitter 3500 may emit a laser beam perpendicularly to the surface of the second metal contact 3570. Also, for example, the VCSEL emitter 3500 may emit a laser beam perpendicularly to the active layer 3540.

A description of the first metal contact 3510, the first DBR layer 3520, the oxidation region 3530, the active layer 3540, the second DBR layer 3550, the substrate 3560, and the second metal contact 3570 may overlap with the description of the first metal contact 3410, the first DBR layer 3420, the oxidation region 3430, the active layer 3440, the second DBR layer 3450, the substrate 3460, and the second metal contact 3470 with reference to FIG. 70, and thus a detailed description thereof will be omitted.

According to an embodiment, the reflector 3580 of the VCSEL emitter 3500 may include a first face 3085 facing the second metal contact 3570. In this case, the first face 3585 may have a flat shape or may include a curved face.

According to an embodiment, the reflector 3580 of the VCSEL emitter 3500 may reflect light emitted from the second metal contact 3570. For example, the reflector 3580 may reflect light traveling from the active layer 3540 toward the second metal contact 3570, back to the active layer 3540. The light reflected by the reflector 3580 may be reflected by the first DBR layer or the second DBR layer again and then emitted outward through an opening present in the second metal contact 3570.

The reflector 3580 can increase the laser beam emission efficiency of the VCSEL emitter 3500 by reflecting the light emitted from the second metal contact 3570. The reflector 3580 can increase the amount of light output through the opening of the VCSEL emitter 3500 by reflecting the light emitted from the second metal contact 3570.

According to an embodiment, the reflector 3580 of the VCSEL emitter 3500 may include a first face 3585 in contact with the second metal contact 3570. In this case, when the first face 3585 is longer than the second metal contact 3570, the first face 3585 may decrease the area and the emission efficiency of a laser beam output from the active layer 3540. Thus, the length of the first face 3585 may be less than or equal to the length of the second metal contact 3570.

Also, according to an embodiment, the first face 3585 of the reflector 3580 of the VCSEL emitter 3500 may not directly reflect a laser beam output from the active layer 3540. When directly reflecting the laser beam output from the active layer 3540, the first face 3585 may decrease the area and the output efficiency of the laser beam output from the active layer 3540. Thus, the laser beam output from the active layer 3540 may not be directly incident on the first face 3585.

A VCSEL array according to an embodiment of the present disclosure will be described below.

Figure 72:
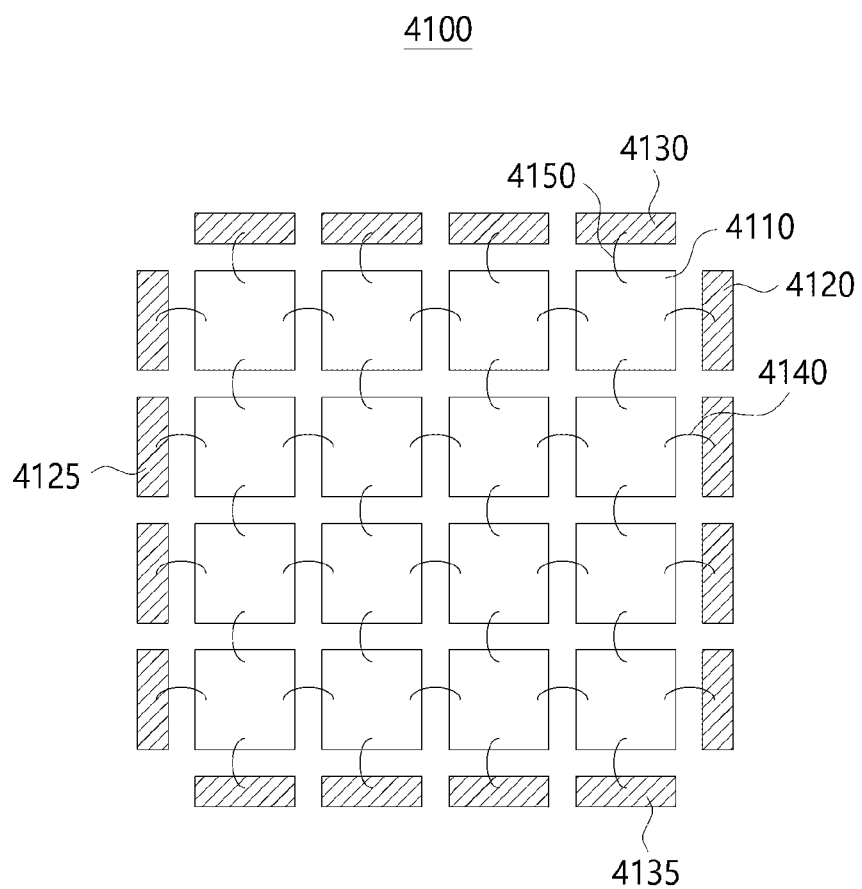
FIG. 72 is a diagram illustrating a VCSEL array according to an embodiment.

FIG. 72 is a diagram illustrating a VCSEL array according to an embodiment.

Referring to FIG. 72, a VCSEL array 4100 according to an embodiment may include a plurality of VCSEL units 4110.

The VCSEL array 4100 may be a two-dimensional (2D) array. The plurality of VCSEL units 4110 may be arranged in two dimensions. For example, the plurality of VCSEL units 4110 may be arranged along a first axis and along a second axis different from the first axis. For example, the plurality of VCSEL units 4110 may be arranged along the x-axis and the y-axis to form a matrix.

FIG. 72 shows only a VCSEL array in the form of a 4×4 matrix. However, the form of the VCSEL array is not limited thereto. For example, the VCSEL array may be in the form of a 5×5, 6×6, 7×7, 8×8, 9×9, 10×10, 11×11, 12×12, 13×13, 14×14, 15×15, or 16×16 matrix. Alternatively, for example, the VCSEL array may be in the form of an N×M matrix. The form of the VCSEL array is not limited to the aforementioned numbers and may be a matrix in other numbers of dimensions.

Also, for example, the plurality of VCSEL units 4110 may be arranged along the x-axis and a second axis inclined at an angle of 90 degrees or less with respect to the x-axis. In this case, the plurality of VCSEL arrays 4100 may be in the form of a rhombus or a trapezoid. Also, the plurality of VCSEL arrays 4100 may be in the form of a honeycomb.

The VCSEL unit 4110 may include a plurality of VCSEL emitters. For example, the VCSEL unit 4110 may include 300 to 400 VCSEL emitters. For example, the VCSEL unit 4110 may include a plurality of VCSEL emitters arranged in a circular structure, a matrix structure, a rhombus structure, a trapezoid structure, or a honeycomb structure.

The VCSEL array 4100 according to an embodiment may include a plurality of contacts 4120, 4125, 4130, and 4135. For example, the VCSEL array 4100 may include first contacts 4120 and 4125 adjacent to both ends of the VCSEL array arranged along the first axis. Also, for example, the VCSEL array 4100 may include second contacts 4130 and 4135 adjacent to both ends of the VCSEL array arranged along the second axis.

As another example, the VCSEL array 4100 may include first contacts 4120 adjacent to one end of the VCSEL array arranged along the first axis and second contacts 4124 neighboring the other end. Also, for example, the VCSEL array 4100 may include third contacts 4130 adjacent to one end of the VCSEL array arranged along the second axis and fourth contacts 4135 adjacent to the other end.

The plurality of contacts 4120, 4125, 4130, and 4135 according to an embodiment may contain a conductive material. For example, the plurality of contacts 4120, 4125, 4130, and 4135 contain metal.

The plurality of contacts 4120, 4125, 4130, and 4135 according to an embodiment may be electrically connected to the plurality of VCSEL units 4110. In this case, the plurality of contacts 4120, 4125, 4130, and 4135 may supply power to the plurality of VCSEL units 4110.

According to an embodiment, the plurality of contacts 4120, 4125, 4130, and 4135 may supply a p-type or n-type voltage to the plurality of VCSEL units 4110. For example, the p-type voltage may be a voltage supplied from a terminal (+) of a voltage source, and the n-type voltage may be a voltage supplied from a terminal (−) of a voltage source. Also, for example, the p-type voltage may generally be a voltage applied to a p-type doped body, and the n-type voltage may generally be a voltage applied to an n-type doped body.

For example, the first contacts 4120 and 4125 arranged on both ends of the VCSEL array arranged along the first axis may be connected to a lower metal contact 60 of the plurality of VCSEL units 4110. In this case, an n-type voltage may be applied to the lower metal contact 60 of the VCSEL unit 4110 through the first contacts 4120 and 4125.

Also, for example, the second contacts 4130 and 4135 arranged on both ends of the VCSEL array arranged along the second axis may be connected to an upper metal contact 10 of the plurality of VCSEL units 4110. In this case, a p-type voltage may be applied to the upper metal contact 10 of the VCSEL unit 4110 through the second contacts 4130 and 4135. In this case, a voltage higher than or equal to a reference voltage may be applied to the upper metal contact 10 of the VCSEL unit 4110 through the second contacts 4130 and 4135.

As another example, the first contacts 4120 and 4125 arranged on both ends of the VCSEL array arranged along the first axis may be connected to the upper metal contact 10 of the plurality of VCSEL units 4110. In this case, a p-type voltage may be applied to the upper metal contact 10 of the VCSEL unit 4110 through the first contacts 4120 and 4125. In this case, a voltage higher than or equal to a reference voltage may be applied to the upper metal contact 10 of the VCSEL unit 4110 through the first contacts 4120 and 4125.

Also, as another example, the second contacts 4130 and 4135 arranged on both ends of the VCSEL array arranged along the second axis may be connected to the lower metal contact 60 of the plurality of VCSEL unit 4110. In this case, an n-type voltage may be applied to the lower metal contact 60 of the VCSEL unit 4110 through the second contacts 4130 and 4135. In this case, a voltage lower than or equal to a reference voltage may be applied to the lower metal contact 60 of the VCSEL unit 4110 through the second contacts 4130 and 4135.

The VCSEL array 4100 according to an embodiment may include a plurality of wires 4140 and 4150. The plurality of wires 4140 and 4150 may contain a conductive material. For example, the plurality of wires 4140 and 4150 may contain metal.

The plurality of wires 4140 according to an embodiment may connect the plurality of VCSEL units 4110 arranged along the first axis to one another or may electrically connect the VCSEL units 4110 to the first contacts 4120 and 4125. Also, the plurality of wires 4150 may connect the plurality of VCSEL units 4110 arranged along the second axis to one another or may electrically connect the VCSEL units 4110 to the second contacts 4130 and 4135.

Referring to FIG. 72, the plurality of VCSEL units 4110 included in the VCSEL array 4100 may operate individually. Each of the plurality of VCSEL units 4110 included in the VCSEL array 4100 may operate independently regardless of whether the other VCSEL units operate.

For example, in order to operate the VCSEL unit in the first row and first column, an n-type voltage may be applied to a contact disposed in the first row among the first contacts 4120 and 4125, and a p-type voltage may be applied to a contact disposed in the first column among the second contacts 4130 and 4135.

For example, in order to operate the VCSEL unit in the first row and first column, a voltage lower than or equal to a reference voltage may be applied to a contact disposed in the first row among the first contacts 4120 and 4125, and a voltage higher than or equal to a reference voltage may be applied to a contact disposed in the first column among the second contacts 4130 and 4135.

For example, in order to operate the VCSEL unit in the first row and second column, an n-type voltage may be applied to a contact disposed in the first row among the first contacts 4120 and 4125, and a p-type voltage may be applied to a contact disposed in the second column among the second contacts 4130 and 4135.

Also, for example, in order to operate the VCSEL unit in the first row and second column, a voltage lower than or equal to a reference voltage may be applied to a contact disposed in the first row among the first contacts 4120 and 4125, and a voltage higher than or equal to a reference voltage may be applied to a contact disposed in the second column among the second contacts 4130 and 4135.

Also, for example, in order to operate all of the four VCSEL units disposed in the first row, an n-type voltage may be applied to a contact disposed in the first row among the first contacts 4120 and 4125, and a p-type voltage may be applied to all of the second contacts 4130 and 4135.

Also, for example, in order to operate all of the four VCSEL units disposed in the first row, a voltage lower than or equal to a reference voltage may be applied to a contact disposed in the first row among the first contacts 4120 and

4125, and a voltage higher than or equal to a reference voltage may be applied to all of the second contacts 4130 and 4135.

Also, for example, in order to operate the VCSEL unit in the second row and second column and the VCSEL unit in the third row and fourth column, an n-type voltage may be applied to the contacts arranged in the second and third rows among the first contacts 4120 and 4125, and a p-type voltage may be applied to the contacts arranged in the second and fourth columns among the second contacts 4130 and 4135.

Also, for example, in order to operate the VCSEL unit in the second row and second column and the VCSEL unit in the third row and fourth column, a voltage lower than or equal to a reference voltage may be applied to the contacts arranged in the second and third rows among the first contacts 4120 and 4125, and a voltage higher than or equal to a reference voltage may be applied to the contacts arranged in the second and fourth columns among the second contacts 4130 and 4135.

Also, for example, in order to operate all of the VCSEL units 4110 included in the VCSEL array 4100, an n-type voltage may be applied to all of the first contacts 4120 and 4125, and a p-type voltage may be applied to all of the second contacts 4130 and 4135.

Also, for example, in order to operate all of the VCSEL units 4110 included in the VCSEL array 4100, a voltage lower than or equal to a reference voltage may be applied to all of the first contacts 4120 and 4125, and a voltage higher than or equal to a reference voltage may be applied to all of the second contacts 4130 and 4135.

Figure 73:
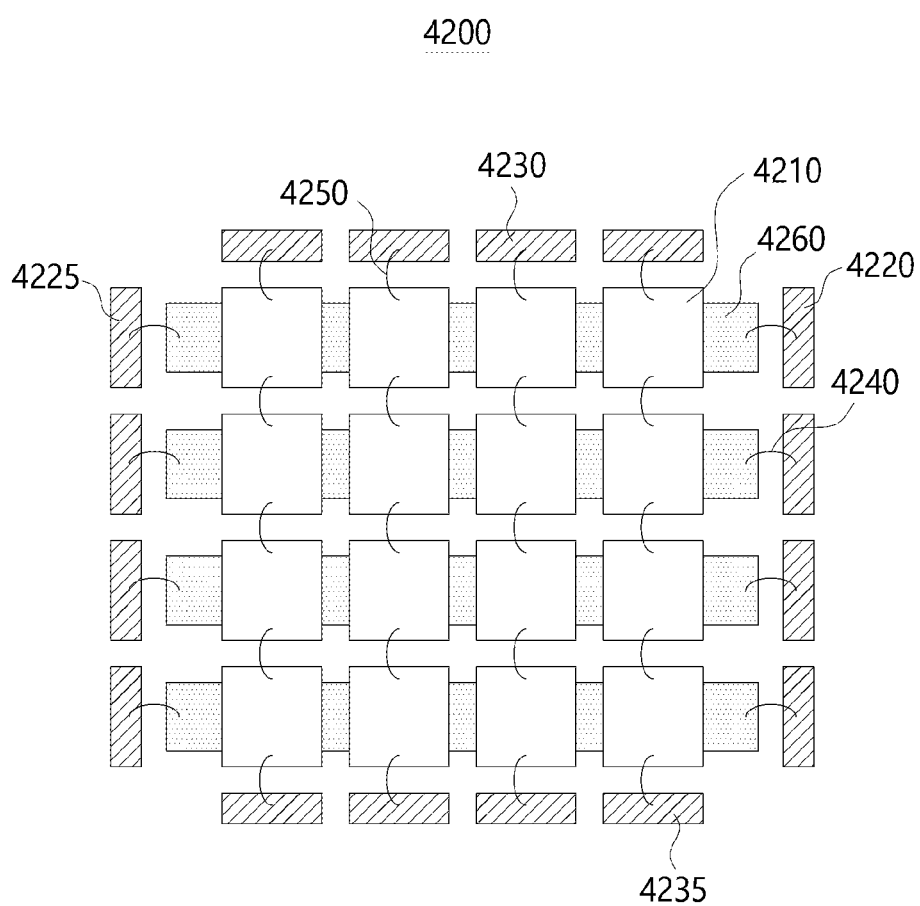
FIG. 73 is a diagram illustrating a VCSEL array according to another embodiment.

FIG. 73 is a diagram illustrating a VCSEL array according to another embodiment.

Referring to FIG. 73, a VCSEL array (or a laser emitting array) 4200 according to another embodiment may include a plurality of VCSEL units (or a plurality of sub-arrays) 4210.

A description of the plurality of VCSEL units 4210 may overlap with the description of the plurality of VCSEL units 4110 with reference to FIG. 72, and thus a detailed description thereof will be omitted.

A description of a plurality of contacts 4220, 4225, 4230, and 4235 may overlap with the description of the plurality of contacts 4120, 4125, 4130, and 4135 with reference to FIG. 72, and thus a detailed description thereof will be omitted.

A description of a plurality of wires 4240 and 4250 may overlap with the description of the plurality of wires 4140 and 4150 with reference to FIG. 72, and thus a detailed description thereof will be omitted.

The VCSEL array 4200 according to an embodiment may include a common contact 4260. The common contact 4260 may contain a conductive material. For example, the common contact 4260 may contain metal.

The common contact 4260 according to an embodiment may be electrically connected to the plurality of VCSEL units 4210 arranged along the first axis. For example, the common contact 4260 may be electrically connected to the plurality of VCSEL units 4210 arranged along the first axis through a lower metal contact 60. Also, for example, the common contact 4260 may be electrically connected to the plurality of VCSEL units 4210 arranged along the first axis through an upper metal contact 10.

The common contact 4260 according to an embodiment may have resistance. In this case, the resistance may increase as a length from one reference point to one end of the common contact 4260 increases.

For example, the resistance from a first reference point, which is the center of the VCSEL unit in the first row and first column, to the left end of the common contact 4260 in the first row may be smaller than the resistance from a second reference point, which is the center of the VCSEL unit in the first row and second column, to the left end of the common contact 4260 in the first row.

Also, for example, the resistance from the first reference point, which is the center of the VCSEL unit in the first row and first column, to the left end of the common contact 4260 in the first row may be smaller than the resistance from a third reference point, which is the center of the VCSEL unit in the first row and third column, to the left end of the common contact 4260 in the first row.

Also, for example, the resistance from the first reference point, which is the center of the VCSEL unit in the first row and first column, to the left end of the common contact 4260 in the first row may be smaller than the resistance from a fourth reference point, which is the center of the VCSEL unit in the first row and fourth column, to the left end of the common contact 4260 in the first row.

In this case, when the common contact (or an upper connection line) 4260 allows power to be supplied from only a first contact (or a first side contact) 4225 neighboring the left end of the common contact 4260 through the wire 4240, the differences in resistance between the plurality of VCSEL units in the first row may not be uniform. As shown in FIG. 73, each of the plurality of sub-arrays 4210 includes a common contact (or an upper connection line) 4260 extending along the first axis and electrically connected to the respective sub-array 4210. In each row, the upper connection line 4260 is connected to a first (or left) side contact 4225 via a first (or left) wire in contact with a first (or left) end of each upper connection line 4260. The upper connection line 4260 is also connected to a second (or right) side contact 4220 via a second (or right) wire 4240 in contact with a second (or right) end of each upper connection line 4260.

When the resistances of the VCSEL units are different from each other or the differences therebetween are not uniform, the intensities of the laser beam outputs of the VCSEL units may be different from each other. When the intensities of the laser beam outputs of the VCSEL units are different from each other, a non-uniform beam profile may be formed in the VCSEL array.

Also, when the intensities of the laser beam outputs of the VCSEL units are different from each other, the maximum measurable distances of the VCSEL units may be different, and thus the performance of the LiDAR device using the VCSEL array may be degraded.

In order to solve the above problem, the first contacts 4220 and 4225 may be disposed on both ends of the plurality of VCSEL units 4210 arranged along the first axis, instead of being disposed on one end thereof. It is possible to decrease the difference in resistance between the VCSEL units by placing the first contacts 4220 and 4225 on both ends of the plurality of VCSEL units 4210.

The difference in resistance between the VCSEL units will be described below.

FIGS. 74 to 77 are diagrams illustrating the resistance of a VCSEL unit according to an embodiment. In detail, FIGS. 74 to 77 show that a contact is neighboring one end of a VCSEL array.

Figure 74:
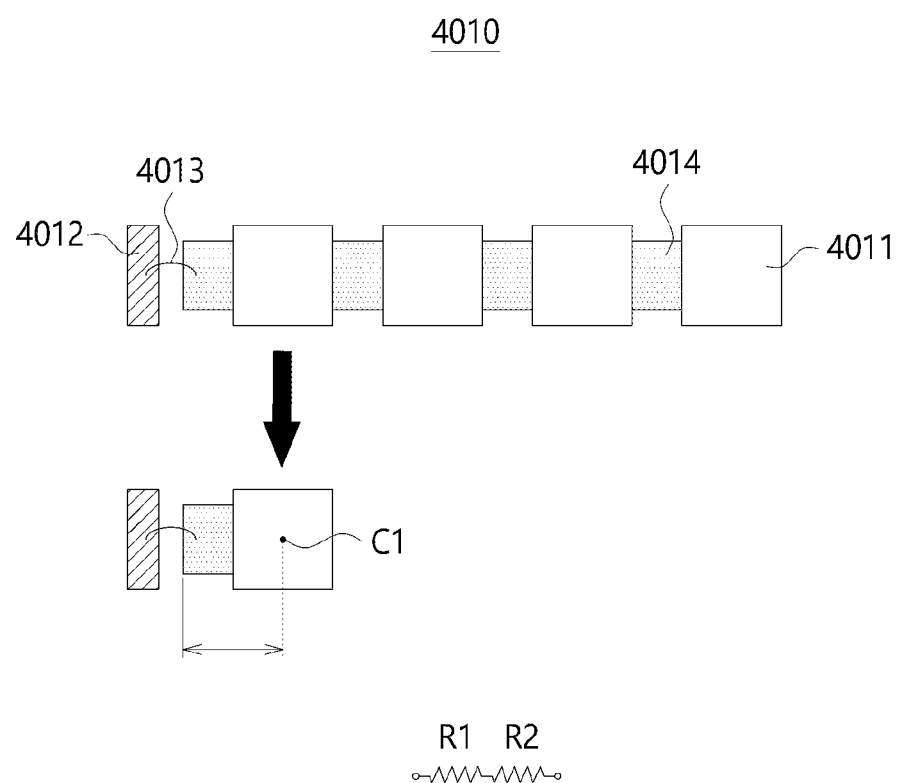
FIGS. 74 to 77 are diagrams illustrating the resistance of a VCSEL unit according to an embodiment.

FIG. 74 is a diagram showing a VCSEL array 4010 according to an embodiment. The VCSEL array 4010 according to an embodiment includes a plurality of VCSEL units 4011, a contact 4012, a wire 4013, and a common contact 4014. In this case, the VCSEL array 4010 includes a contact 4012 neighboring one end of the VCSEL array.

The VCSEL array 4010 according to an embodiment may supply power to a plurality of VCSEL units 4011 through the contact 4012 to operate the VCSEL units 4011. In this case, a resistance occurring due to the common contact 4014 electrically connected to the contact 4012 included in each of the VCSEL unit 4011 may be different for each VCSEL unit.

Referring to FIG. 74, the VCSEL unit in the first column may have a first central point C1. A resistance at the first central point C1 may be equal to a resistance obtained by combining a resistance from one end of the common contact 4014 to an edge of the VCSEL unit in the first column and a resistance from the edge of the VCSEL unit in the first column to the first central point C1.

According to an embodiment, the resistance from one end of the common contact 4014 to the edge of the VCSEL unit in the first column may be R1. Also, the resistance from the edge of the VCSEL unit in the first column to the first central point C1 may be R2. Accordingly, the resistance at the first central point C1 may be the combined resistance of R1 and R2. For example, the resistance at the first central point C1 may be R1+R2.

For example, when the length from one end of the common contact 4014 to an edge of the VCSEL unit in the first column and the length from the edge of the VCSEL unit in the first column to the first central point C1 are the same, R1 may be equal to R2. Accordingly, the resistance at the first central point C1 may be 2*R1 or 2*R2.

Figure 75:
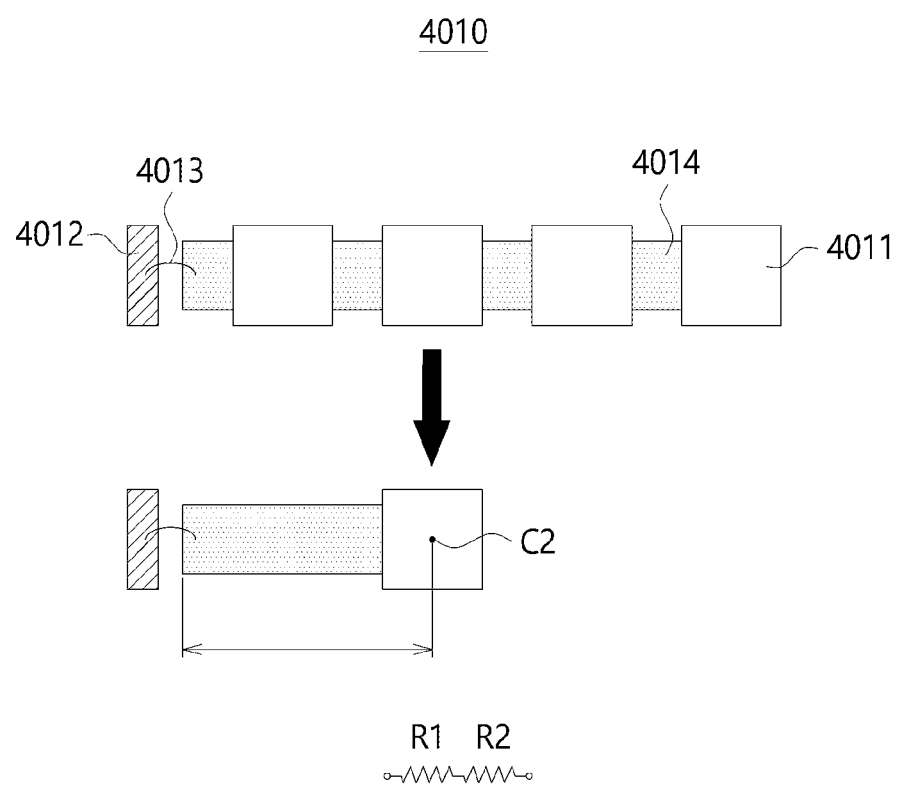

FIG. 75 is a diagram showing a VCSEL array 4010 according to an embodiment.

Referring to FIG. 75, the VCSEL unit in the second column may have a second central point C2. A resistance at the second central point C2 may be equal to a resistance obtained by combining a resistance from one end of the common contact 4014 to an edge of the VCSEL unit in the second column and a resistance from the edge of the VCSEL unit in the second column to the second central point C2.

According to an embodiment, the resistance from one end of the common contact 4014 to the edge of the VCSEL unit in the second column may be R1. Also, the resistance from the edge of the VCSEL unit in the second column to the second central point C2 may be R2. Accordingly, the resistance at the second central point C2 may be the combined resistance of R1 and R2. For example, the resistance at the second central point C2 may be R1+R2.

For example, when the length from one end of the common contact 4014 to an edge of the VCSEL unit in the first column, the length from the edge of the VCSEL unit in the first column to the first central point C1, the length between the VCSEL units, and the length from an edge of the VCSEL unit in the second column to the second central point C2 are the same, R1 may be four times R2. Accordingly, the resistance at the second central point C2 may be (5/4)*R1 or 5*R2.

Figure 76:
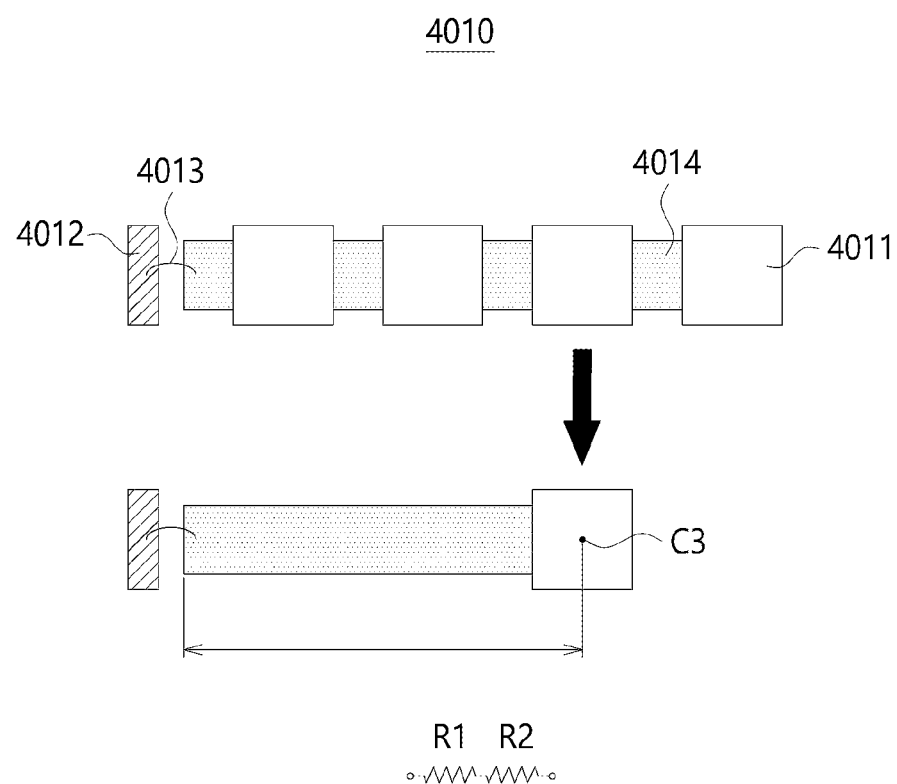

FIG. 76 is a diagram showing a VCSEL array 4010 according to an embodiment.

Referring to FIG. 76, the VCSEL unit in the third column may have a third central point C3. The resistance at the third central point C3 may be equal to a resistance obtained by combining a resistance from one end of the common contact 4014 to an edge of the VCSEL unit in the third column and a resistance from the edge of the VCSEL unit in the third column to the third central point C3.

According to an embodiment, the resistance from one end of the common contact 4014 to the edge of the VCSEL unit in the third column may be R1. Also, the resistance from the edge of the VCSEL unit in the third column to the third central point C3 may be R2. Accordingly, the resistance at the third central point C3 may be the combined resistance of R1 and R2. For example, the resistance at the third central point C3 may be R1+R2.

For example, when the length from one end of the common contact 4014 to an edge of the VCSEL unit in the first column, the length from the edge of the VCSEL unit in the first column to the first central point C1, the length between the VCSEL units, and the length from an edge of the VCSEL unit in the third column to the third central point C3 are the same, R1 may be seven times R2. Accordingly, the resistance at the third central point C3 may be (8/7)*R1 or 8*R2.

Figure 77:
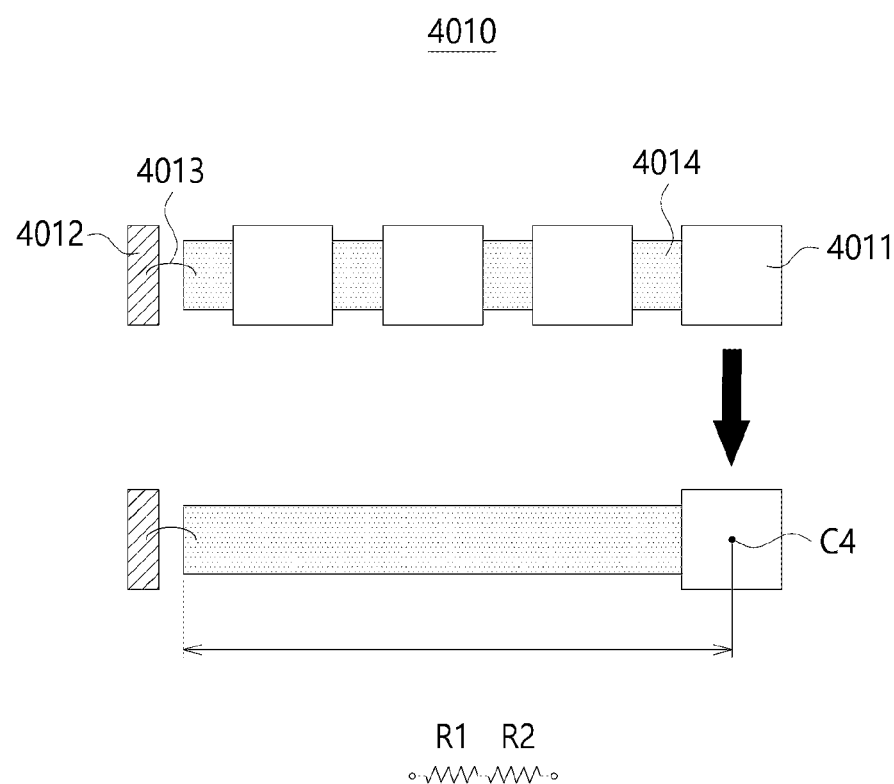

FIG. 77 is a diagram showing a VCSEL array 4010 according to an embodiment.

Referring to FIG. 77, the VCSEL unit in the fourth column may have a fourth central point C4. The resistance at the fourth central point C4 may be equal to a resistance obtained by combining a resistance from one end of the common contact 4014 to an edge of the VCSEL unit in the fourth column and a resistance from the edge of the VCSEL unit in the fourth column to the fourth central point C4.

According to an embodiment, the resistance from one end of the common contact 4014 to the edge of the VCSEL unit in the fourth column may be R1. Also, the resistance from the edge of the VCSEL unit in the fourth column to the fourth central point C4 may be R2. Accordingly, the resistance at the fourth central point C4 may be the combined resistance of R1 and R2. For example, the resistance at the fourth central point C4 may be R1+R2.

For example, when the length from one end of the common contact 4014 to an edge of the VCSEL unit in the first column, the length from the edge of the VCSEL unit in the first column to the first central point C1, the length between the VCSEL units, and the length from an edge of the VCSEL unit in the fourth column to the fourth central point C4 are the same, R1 may be ten times R2. Accordingly, the resistance at the fourth central point C4 may be (11/10)*R1 or 11*R2.

As described with reference to FIGS. 74 to 77, the resistance of the VCSEL unit may increase in a direction away from the contact 4012.

Since the VCSEL unit in the first column is positioned closer to the contact 4012 than the other VCSEL units in the same row, the VCSEL unit in the first column may have a lower resistance than the VCSEL units in the same row. For example, the resistance of the VCSEL unit in the first column may be 2*R2.

Since the VCSEL unit in the second column is positioned farther from the contact 4012 than the VCSEL unit in the first column, the VCSEL unit in the second column may have a higher resistance than the VCSEL unit in the first column. For example, the resistance of the VCSEL unit in the second column may be 5*R2.

Since the VCSEL unit in the third column is positioned farther from the contact 4012 than the VCSEL unit in the first column and the VCSEL unit in the second column, the VCSEL unit in the third column may have a higher resistance than the VCSEL unit in the first column and the VCSEL unit in the second column. For example, the resistance of the VCSEL unit in the third column may be 8*R2.

Since the VCSEL unit in the fourth column is positioned farther from the contact 4012 than the VCSEL unit in the first column, the VCSEL unit in the second column, and the VCSEL unit in the third column, the VCSEL unit in the fourth column may have a higher resistance than the VCSEL unit in the first column, the VCSEL unit in the second column, and the VCSEL unit in the third column. For example, the resistance of the VCSEL unit in the fourth column may be 11*R2.

Since the resistances of the VCSEL units caused by one end of the common contact 4014 are different, the VCSEL units may output laser beams of different intensities. The difference between the intensities of the laser beams may increase as the difference in resistance between the VCSEL units increases. When the difference between the intensities of the laser beams is increased, the beam profile of the VCSEL array may become unbalanced, and the LiDAR device using the VCSEL array may have a measurable distance that changes depending on the VCSEL unit.

According to an embodiment, the difference between the resistance of the VCSEL unit in the first column and the resistance of the VCSEL unit in the second column may be 3*R2. Also, the difference between the resistance of the VCSEL unit in the first column and the VCSEL unit in the third column may be 6*R2, and the difference between the resistance of the VCSEL unit in the first column and the VCSEL unit in the fourth column may be 9*R2.

In this case, the difference between the resistance of the VCSEL unit in the first column and the VCSEL unit in the fourth column (9*R2) may be greater than the difference between the VCSEL unit in the first column and the VCSEL unit in the second column (3*R2).

In this case, the difference between the intensity of a laser beam emitted from the VCSEL unit in the first column and the intensity of a laser beam emitted from the VCSEL unit in the fourth column may be greater than the difference between the intensity of a laser beam output from the VCSEL unit in the first column and the intensity of a laser beam output from the VCSEL unit in the second column.

When the difference in intensity between the laser beams of the VCSEL units is outside a certain range, the beam profile of the VCSEL array may become non-uniform, and the measurable distance of the LiDAR device using the VCSEL array may be limited. In order to solve the above problem, by placing the contact 4012 on both ends of the common contact 4014, the common contact 4014 may be electrically connected to a plurality of VCSEL units 4011. A method of applying a voltage to both ends of the common contact 4014 will be described below.

FIGS. 78 to 81 are diagrams illustrating the resistance of a VCSEL unit according to another embodiment. In detail, FIGS. 78 to 81 show contacts neighboring both ends of a VCSEL array.

Figure 78:
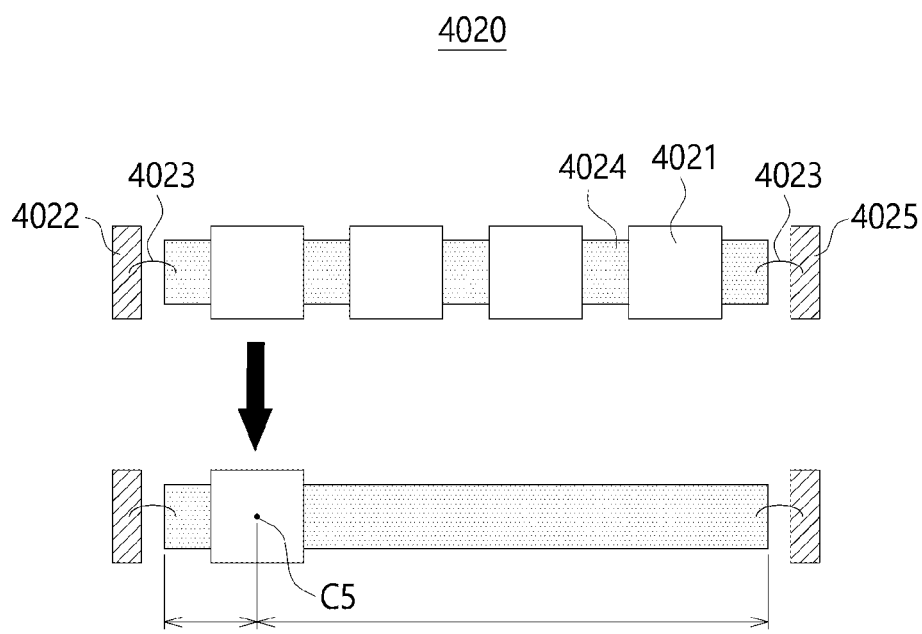
FIGS. 78 to 81 are diagrams illustrating the resistance of a VCSEL unit according to another embodiment.

FIG. 78 is a diagram showing a VCSEL array 4020 according to another embodiment. The VCSEL array 4020 according to an embodiment may include a plurality of VCSEL units 4021, a contact 4022, a wire 4023, and a common contact 4024. In this case, the VCSEL array 4020 may include a contact 4022 neighboring one end of the VCSEL array.

The VCSEL array 4020 according to an embodiment may supply power to the plurality of VCSEL units 4021 through contacts 4022 and 4025 disposed on the both ends to operate the VCSEL units 4021. In this case, the resistance of each VCSEL unit 4021 occurring due to the common contact 4024 electrically connected to the contacts 4022 and 4025 may be different from those of the other VCSEL units.

Referring to FIG. 78, the VCSEL unit in the first column may have a fifth central point C5. The resistance at the fifth central point C5 may be equal to a resistance obtained by combining a resistance caused by a first sub-contact 4022 and a resistance caused by a second sub-contact 4025. For example, the resistance at the fifth central point C5 may be equal to a resistance obtained by connecting the resistance caused by the first sub-contact 4022 in parallel to the resistance caused by the second sub-contact 4025.

According to an embodiment, the resistance from one end of the common contact 4024 to an edge of the VCSEL unit in the first column may be R1. Also, the resistance from the edge of the VCSEL unit in the first column to the fifth central point C5 may be R2. Also, the resistance from the edge of the VCSEL unit in the first column to the other end of the common contact 4024 may be R3.

Accordingly, the resistance at the fifth central point C5 may be the combined resistance of R1, R2, and R3. For example, the resistance at the fifth central point C5 may be (R1+R2)*(R2+R3)/(R1+2*R2+R3).

For example, when the length from one end of the common contact 4024 to an edge of the VCSEL unit in the first column and the length from the edge of the VCSEL unit in the first column to the fifth central point C5 are the same, R1 may be equal to R2. Also, when the length to the fifth central point C5, the length between the VCSEL units, and the length from an edge of the VCSEL unit to one end or the other end of the common contact 4024 are the same, R3 may be ten times R1 or R2. Accordingly, the resistance at the fifth central point C5 may be (22/13)*R2.

Figure 79:
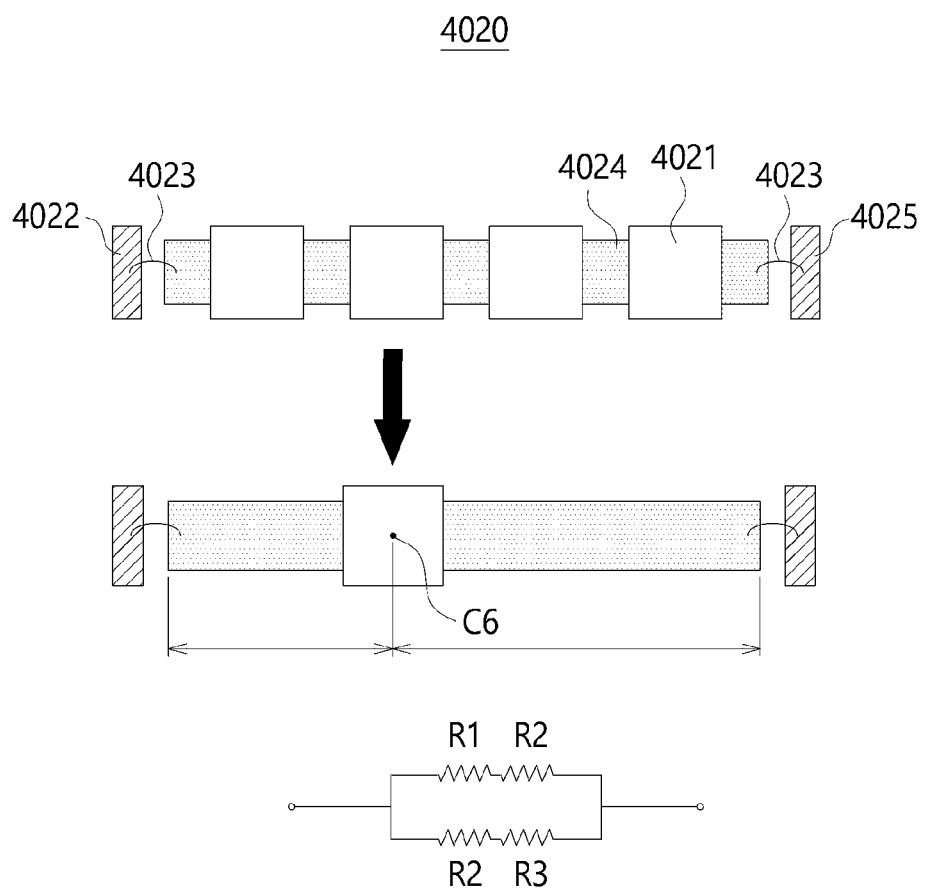

FIG. 79 is a diagram showing a VCSEL array 4020 according to another embodiment.

Referring to FIG. 79, the VCSEL unit in the second column may have a sixth central point C6. The resistance at the sixth central point C6 may be equal to a resistance obtained by combining a resistance caused by the first sub-contact 4022 and a resistance caused by the second sub-contact 4025. For example, the resistance at the sixth central point C6 may be equal to a resistance obtained by connecting the resistance caused by the first sub-contact 4022 in parallel to the resistance caused by the second sub-contact 4025.

According to an embodiment, the resistance from one end of the common contact 4024 to an edge of the VCSEL unit in the second column may be R1. Also, the resistance from the edge of the VCSEL unit in the second column to the sixth central point C6 may be R2. Also, the resistance from the edge of the VCSEL unit in the second column to the other end of the common contact 4024 may be R3.

Accordingly, the resistance at the sixth central point C6 may be the combined resistance of R1, R2, and R3. For example, the resistance at the sixth central point C6 may be (R1+R2)*(R2+R3)/(R1+2*R2+R3).

For example, when the length from one end of the common contact 4024 to an edge of the VCSEL unit in the first column and the length from the edge of the VCSEL unit in the first column to the sixth central point C6 are the same, R1 may be four times R2. Also, when the length to the sixth central point C6, the length between the VCSEL units, and the length from an edge of the VCSEL unit to one end or the other end of the common contact 4024 are all the same, R3 may be seven times R2. Accordingly, the resistance at the sixth central point C6 may be (40/13)*R2.

Figure 80:
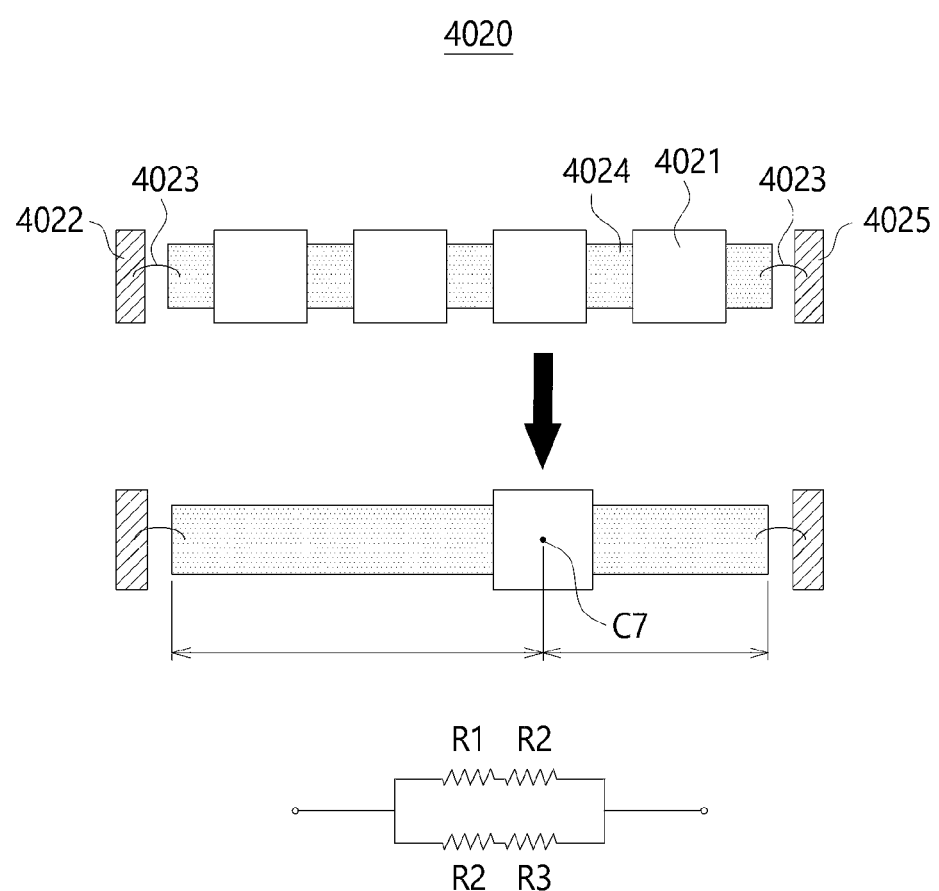

FIG. 80 is a diagram showing a VCSEL array 4020 according to another embodiment.

Referring to FIG. 80, the VCSEL unit in the third column may have a seventh central point C7. The resistance at the seventh central point C7 may be equal to a resistance obtained by combining a resistance caused by the first sub-contact 4022 and a resistance caused by the second sub-contact 4025. For example, the resistance at the seventh central point C7 may be equal to a resistance obtained by connecting the resistance caused by the first sub-contact 4022 in parallel to the resistance caused by the second sub-contact 4025.

According to an embodiment, the resistance from one end of the common contact 4024 to the edge of the VCSEL unit in the third column may be R1. Also, the resistance from the edge of the VCSEL unit in the third column to the seventh central point C7 may be R2. Also, the resistance from the edge of the VCSEL unit in the third column to the other end of the common contact 4024 may be R3.

Accordingly, the resistance at the seventh central point C7 may be the combined resistance of R1, R2, and R3. For example, the resistance at the seventh central point C7 may be $(R1+R2)*(R2+R3)/(R1+2*R2+R3)$.

For example, when the length from one end of the common contact 4024 to an edge of the VCSEL unit in the third column and the length from the edge of the VCSEL unit in the third column to the seventh central point C7 are the same, R1 may be seven times R2. Also, when the length to the seventh central point C7, the length between the VCSEL units, and the length from an edge of the VCSEL unit to one end or the other end of the common contact 4024 are the same, R3 may be four times R2. Accordingly, the resistance at the seventh central point C7 may be $(40/13)*R2$.

Figure 81:
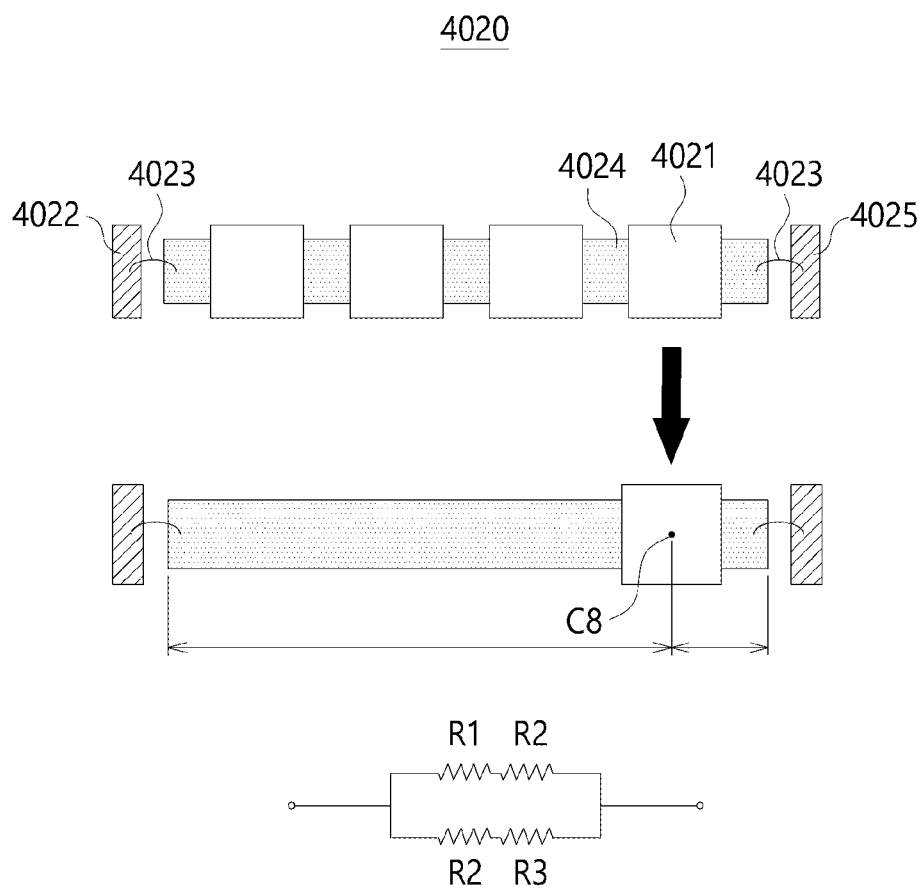

FIG. 81 is a diagram showing a VCSEL array 4020 according to another embodiment.

Referring to FIG. 81, the VCSEL unit in the fourth column may have an eighth central point C8. A resistance at the eighth central point C8 may be equal to a resistance obtained by combining a resistance caused by the first sub-contact 4022 and a resistance caused by the second sub-contact 4025. For example, the resistance at the eighth central point C8 may be equal to a resistance obtained by connecting the resistance caused by the first sub-contact 4022 in parallel to the resistance caused by the second sub-contact 4025.

According to an embodiment, the resistance from one end of the common contact 4024 to an edge of the VCSEL unit in the fourth column may be R1. Also, the resistance from the edge of the VCSEL unit in the fourth column to the eighth central point C8 may be R2. Also, the resistance from the edge of the VCSEL unit in the fourth column to the other end of the common contact 4024 may be R3.

Accordingly, the resistance at the eighth central point C8 may be the combined resistance of R1, R2, and R3. For example, the resistance at the eighth central point C8 may be $(R1+R2)*(R2+R3)/(R1+2*R2+R3)$.

For example, when the length from one end of the common contact 4024 to an edge of the VCSEL unit in the fourth column and the length from the edge of the VCSEL unit in the fourth column to the eighth central point C8 are the same, R1 may be ten times R2. Also, when the length to the eighth central point C8, the length between the VCSEL units, and the length from an edge of the VCSEL unit to one end or the other end of the common contact 4024 are the same, R3 may be equal to R2. Accordingly, the resistance at the eighth central point C8 may be $(22/13)*R2$.

The difference in resistance between the VCSEL units of FIGS. 78 to 81 may be less than the difference in resistance between the VCSEL units of FIGS. 74 to 77.

According to an embodiment, the resistance at the first central point C1 of the VCSEL unit in the first column of FIGS. 74 to 77 may be $2*R2$, the resistance at the second central point C2 of the VCSEL unit in the second column may be $5*R2$, the resistance at the third central point C3 of the VCSEL unit in the third column may be $8*R2$, and the resistance at the fourth central point C4 of the VCSEL unit in the fourth column may be $11*R2$.

In this case, the greatest difference in resistance between the VCSEL units may be $9*R2$, which is the difference in resistance between the VCSEL unit in the first column and the VCSEL unit in the fourth column.

According to another embodiment, the resistance at the fifth central point C5 of the VCSEL unit in the first column of FIGS. 78 to 81 may be $(22/13)*R2$, the resistance at the sixth central point C6 of the VCSEL unit in the second column may be $(40/13)*R2$, the resistance at the seventh central point C7 of the VCSEL unit in the third column may be $(40/13)*R2$, and the resistance at the eighth central point C8 of the VCSEL unit in the fourth column may be $(22/13)*R2$.

In this case, the greatest difference in resistance between the VCSEL units may be $(18/13)*R2$, which is the difference in resistance between the VCSEL unit in the first column and the VCSEL unit in the second column, the difference in resistance between the VCSEL unit in the first column and the VCSEL unit in the third column, the difference in resistance between the VCSEL unit in the second column and the fourth column, or the difference in resistance between the VCSEL unit in the third column and the VCSEL unit in the fourth column.

Accordingly, the VCSEL array of FIGS. 78 to 81 may have a smaller difference in resistance between VCSEL units than the VCSEL array of FIGS. 74 to 77. For example, the greatest difference in resistance between the VCSEL units 4011 included in the VCSEL array 4010 of FIGS. 74 to 77 may be $9*R2$ while the greatest difference in resistance between the VCSEL units 4021 included in the VCSEL array 4020 of FIGS. 78 to 81 may be $(18/13)*R2$, which is smaller than $9*R2$.

Also, for example, the smallest difference in resistance between the VCSEL units 4011 included in the VCSEL array 4010 of FIGS. 74 to 77 may be $3*R2$ while the greatest difference in resistance between the VCSEL units 4021 included in the VCSEL array 4020 of FIGS. 78 to 81 may be $(18/13)*R2$, which is smaller than $3*R2$.

When contacts are disposed on both ends of a common contact connected to a lower metal contact of VCSEL units included in a VCSEL array to supply a voltage to the VCSEL units, the difference in resistance between the VCSEL units may be reduced.

When contacts are disposed on both ends of a common contact connected to a lower metal contact of VCSEL units included in a VCSEL array to supply a voltage to the VCSEL units, the difference in intensity between laser beams output by the VCSEL units may be reduced.

When a contact is disposed on only one end of a common contact connected to a lower metal of the VCSEL units to supply a voltage to the VCSEL units, a VCSEL unit disposed close to the contact may have a relatively small resistance and thus output a laser beam of a relatively large intensity. On the other hand, a VCSEL unit disposed far from the contact may have a relatively large resistance and thus output a laser beam of a relatively small intensity. The method of placing a contact on only one end of the common contact to supply a voltage to VCSEL units may cause severe non-uniformity in the laser beam output by the VCSEL units included in the VCSEL array.

However, the difference in resistance between the VCSEL units can be further reduced when contacts are disposed on both ends of a common contact connected to a lower metal of the VCSEL units to supply a voltage to the VCSEL units than when a contact is disposed on only one end of the common contact to supply a voltage to the VCSEL units.

By reducing the difference in resistance between the VCSEL units, it is possible to reduce the difference in intensity between laser beams emitted from the VCSEL units. By reducing the difference in intensity between laser beams emitted from the VCSEL units, the maximum measurable distance of the LiDAR device using the VCSEL array may not be relatively limited.

Figure 82:
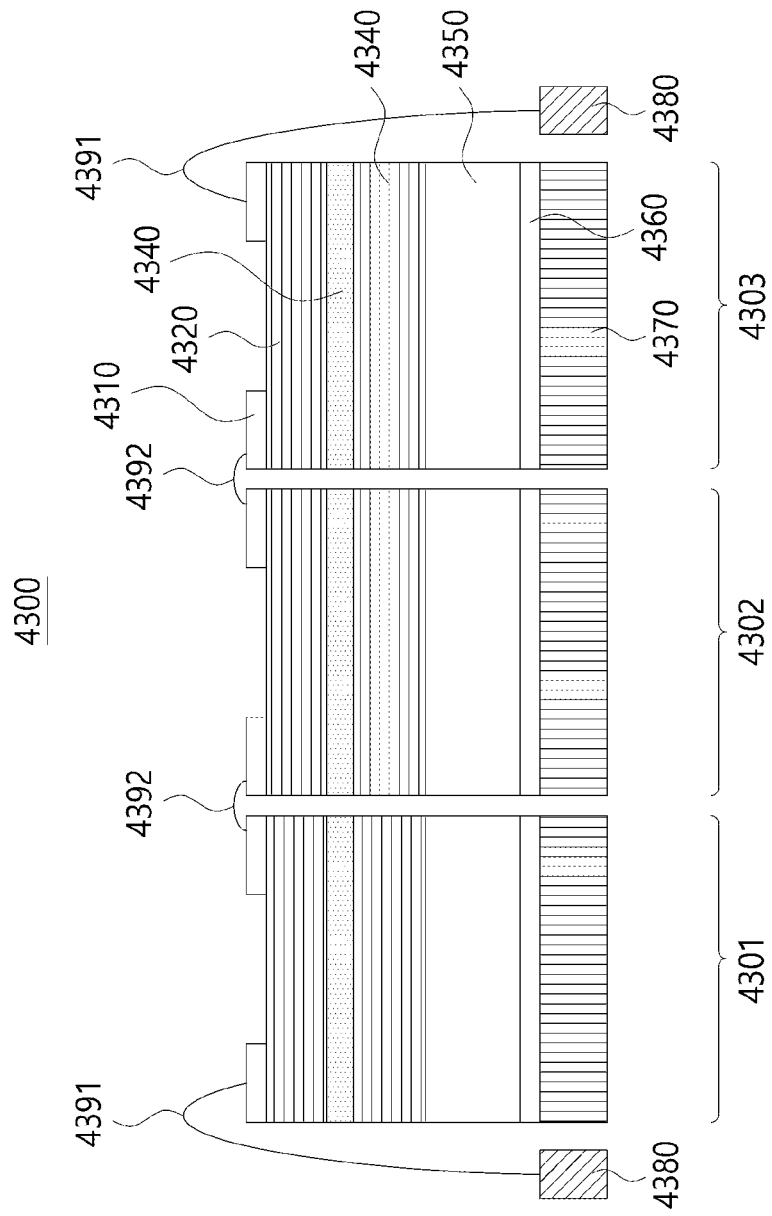
FIG. 82 is a diagram showing a VCSEL array when viewed in one direction.

FIG. 82 is a diagram showing a VCSEL array when viewed in one direction. The direction may be an x-axis direction or a y-axis direction.

Referring to FIG. 82, a VCSEL array 4300 may include a plurality of VCSEL units 4301, 4302, and 4303, contacts 4370 and 4380, and wires 4391 and 4392.

The VCSEL array 4300 may include the plurality of VCSEL units 4301, 4302 and 4303. FIG. 82 shows the VCSEL array 4300 including three VCSEL units 4301, 4302, and 4303. However, the present disclosure is not limited thereto, and the VCSEL array 4300 may include one VCSEL unit or a plurality of VCSEL units, i.e., one, two, four, five, six, seven, eight, nine, ten, eleven, or twelve VCSEL units. The VCSEL array 4300 is not limited to the numbers aforementioned as an example and may include other numbers of VCSEL units.

The plurality of VCSEL units 4301, 4302, and 4303 may include a plurality of VCSEL emitters. For convenience of description, FIG. 82 shows a VCSEL unit including one VCSEL emitter. However, the present disclosure is not limited thereto, and the VCSEL units 4301, 4302, and 4303 may include one VCSEL emitter or a plurality of VCSEL emitters, i.e., one, two, three, four, five, six, seven, eight, nine, ten, 20, 30, 40, 50, 60, 70, 80, 90, 100, 200, 300, 400, and 500 VCSEL emitters. The VCSEL units 4301, 4302, and 4303 are not limited to the numbers aforementioned as an example and may include other numbers of VCSEL emitters.

Each of the VCSEL units 4301, 4302, and 4303 may include an upper metal contact 4310, an upper DBR layer 4320, a lower DBR layer 4330, an active layer 4340, a substrate 4350, and a lower metal contact 4360.

A description of the upper metal contact 4310, the upper DBR layer 4320, the lower DBR layer 4330, the active layer 4340, the substrate 4350, and the lower metal contact 4360 is included in FIG. 3 and the detailed description thereof, and thus a detailed description thereof will be omitted.

The VCSEL array 4300 may include a plurality of contacts 4370 and 4380. The first contact 4370 may have at least a portion thereof brought into contact with the lower metal contacts 4360 of the VCSEL units 4301, 4302, and 4303. The first contact 4370 may be at least partially brought into contact with the lower metal contact 4360 to supply power to the VCSEL units 4301, 4302, and 4303 through the lower metal contacts 4360.

For example, the first contact 4370 may supply an n-type voltage to the VCSEL units 4301, 4302, and 4303 through the lower metal contacts 4360. For example, the first contact 4370 may supply a voltage lower than or equal to a reference voltage to the VCSEL units 4301, 4302, and 4303 through the lower metal contacts 4360.

Also, for example, the first contact 4370 may supply a p-type voltage to the VCSEL units 4301, 4302, and 4303 through the lower metal contacts 4360. Also, for example, the first contact 4370 may supply a voltage higher than or equal to a reference voltage to the VCSEL units 4301, 4302, and 4303 through the lower metal contacts 4360.

The second contact 4380 may be electrically connected to the upper metal contacts 4310 of the VCSEL units 4301, 4302, and 4303. For example, the second contact 4380 may be electrically connected to the upper metal contacts 4310 of the VCSEL units 4301, 4302, and 4303 through wires 4391 and 4392.

For example, the second contact 4380 may supply a p-type voltage to the VCSEL units 4301, 4302, and 4303 through the wires 4391 and 4392 and the upper metal contacts 4310. For example, the second contact 4380 may supply a voltage higher than or equal to a reference voltage to the VCSEL units 4301, 4302, and 4303 through the wires 4391 and 4392 and the upper metal contacts 4310.

Also, for example, the second contact 4380 may supply an n-type voltage to the VCSEL units 4301, 4302, and 4303 through the wires 4391 and 4392 and the upper metal contacts 4310.

Also, for example, the second contact 4380 may supply a voltage lower than or equal to a reference voltage to the VCSEL units 4301, 4302, and 4303 through the wires 4391 and 4392 and the upper metal contacts 4310.

Figure 83:
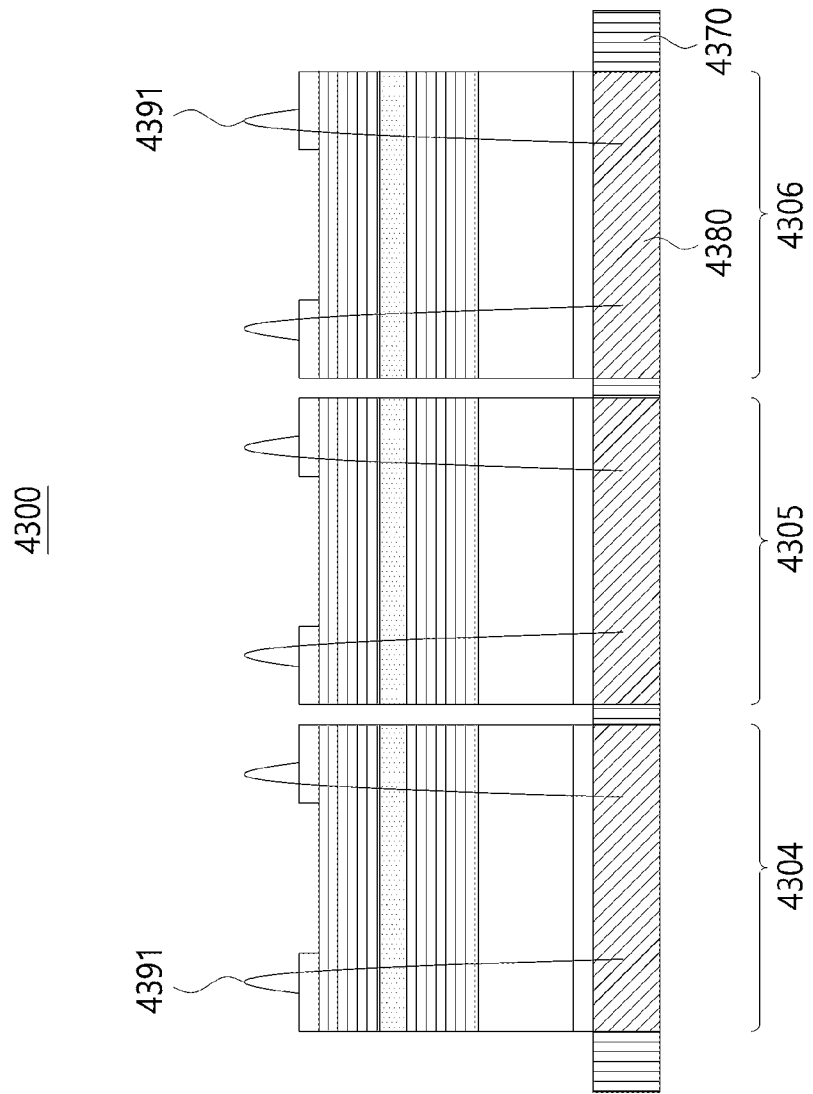
FIG. 83 is a diagram showing a VCSEL array when viewed in another direction.

FIG. 83 is a diagram showing a VCSEL array when viewed in another direction. The direction may be an x-axis direction or a y-axis direction. Also, the direction may be different from the direction of FIG. 82. For example, the direction may be a 90-degree rotation of the direction of FIG. 82.

According to an embodiment, the VCSEL units 4301, 4302, and 4303 may be electrically connected to each other. For example, the upper metal contacts 4310 of the VCSEL units 4301, 4302, and 4303 may be electrically connected to each other. Also, for example, the lower metal contacts 4360 of the VCSEL units 4301, 4302, and 4303 may be electrically connected to each other.

In this case, the upper metal contacts 4310 of the VCSEL units 4301, 4302, and 4303 may be electrically connected to each other through the wires 4391 and 4392. Also, in this case, the lower metal contacts 4360 of the VCSEL units 4301, 4302, and 4303 may be electrically connected to each other through the first contact 4370.

The VCSEL array 4300 of FIG. 82 may be obtained when the VCSEL array 4200 of FIG. 73 is viewed in a direction toward the side surface of the contact 4225. When the VCSEL array 4300 is viewed in one direction, the VCSEL units 4301 in the first row, the VCSEL units 4302 in the second row, and the VCSEL units 4303 in the third row may appear as shown in FIG. 82.

The VCSEL units 4301 in the first row have the lower metal contacts 4360 electrically connected to each other through the first contact 4370. The VCSEL units 4302 in the second row may also have the lower metal contacts 4360 electrically connected to each other through the first contact 4370, and the VCSEL units 4303 in the third row may also have the lower metal contacts 4360 electrically connected to each other through the first contact 4370.

According to an embodiment, the first contact 4370 may supply an n-type voltage to the VCSEL units 4301, 4302, and 4303 through the lower metal contacts 4360. For example, the first contact 4370 may supply a voltage lower than or equal to a reference voltage to the VCSEL units 4301, 4302, and 4303 through the lower metal contacts 4360.

According to another embodiment, the first contact 4370 may supply a p-type voltage to the VCSEL units 4301, 4302, and 4303 through the lower metal contacts 4360. For example, the first contact 4370 may supply a voltage higher than or equal to a reference voltage to the VCSEL units 4301, 4302, and 4303 through the lower metal contacts 4360.

Also, when the VCSEL array 4300 is viewed in one direction, the plurality of VCSEL units may form the first column. For example, the VCSEL unit 4301 in the first row, the VCSEL unit 4302 in the second row, and the VCSEL unit 4303 in the third row may be arranged along one axis to form the first column.

The plurality of VCSEL units 4301, 4302, and 4303 forming the first column may have upper metal contacts 4310 electrically connected to each other through wires 4391 and 4392.

For example, among the plurality of VCSEL units in the first column, the VCSEL unit 4301 in the first row and the VCSEL unit 4302 in the second row may be electrically connected to each other through the wire 4392. Also, for example, among the plurality of VCSEL units in the first column, the VCSEL unit 4302 in the second row and the VCSEL unit 4303 in the third row may be electrically connected to each other through the wire 4392.

For example, among the plurality of VCSEL units in the first column, the VCSEL unit 4301 in the first row and the VCSEL unit 4303 in the third row may be connected to the second contact 4380 through the wire 4391.

According to an embodiment, the second contact 4380 may supply a p-type voltage to the VCSEL units 4301, 4302, and 4303 through the upper metal contacts 4310. For example, the second contact 4380 may supply a voltage higher than or equal to a reference voltage to the VCSEL units 4301, 4302, and 4303 through the upper metal contacts 4310.

According to another embodiment, the second contact 4380 may supply an n-type voltage to the VCSEL units 4301, 4302, and 4303 through the upper metal contacts 4310. For example, the second contact 4380 may supply a voltage lower than or equal to a reference voltage to the VCSEL units 4301, 4302, and 4303 through the upper metal contacts 4310.

The VCSEL array 4300 of FIG. 83 may be obtained when the VCSEL array 4200 of FIG. 73 is viewed in a direction toward the side surface of the contact 4235. When the VCSEL array 4300 is viewed in another direction, the VCSEL units 4304 in the first column, the VCSEL units 4305 in the second column, and the VCSEL units 4306 in the third column may appear as shown in FIG. 83.

The VCSEL units 4304 in the first column may have upper metal contacts 4310 electrically connected to each other through the second contact 4380. The VCSEL units 4305 in the second column may also have upper metal contacts 4310 electrically connected to each other through the second contact 4380, and the VCSEL units 4306 in the third column may also have upper metal contacts 4310 electrically connected to each other through the second contact 4380.

For example, among the plurality of VCSEL units in the first column, the VCSEL units arranged in different rows may be electrically connected to each other through the wire 4392. Also, for example, among the plurality of VCSEL units in the first column, VCSEL units neighboring the second contact 4380 may be connected to the second contact 4380 through the wire 4391.

According to an embodiment, the second contact 4380 may supply a p-type voltage to the VCSEL units 4301, 4302, and 4303 through the upper metal contacts 4310. For example, according to an embodiment, the second contact 4380 may supply a voltage higher than or equal to a reference voltage to the VCSEL units 4301, 4302, and 4303 through the upper metal contacts 4310.

According to another embodiment, the second contact 4380 may supply an n-type voltage to the VCSEL units 4301, 4302, and 4303 through the upper metal contacts 4310. For example, the second contact 4380 may supply a voltage lower than or equal to a reference voltage to the VCSEL units 4301, 4302, and 4303 through the upper metal contacts 4310.

Also, when the VCSEL array 4300 is viewed in another direction, the plurality of VCSEL units may form the first row. For example, the VCSEL unit 4304 in the first column, the VCSEL unit 4305 in the second column, and the VCSEL unit 4303 in the third column may be arranged along one axis to form the first row.

The plurality of VCSEL units 4304, 4305, and 4306 forming the first row may have lower metal contacts 4360 electrically connected to each other through the first contact 4370. For example, among the plurality of VCSEL units in the first row, the VCSEL unit 4304 in the first column, the VCSEL unit 4305 in the second column, and the VCSEL unit 4306 in the third column may be electrically connected to each other through the first contact 4370.

According to an embodiment, the first contact 4370 may supply an n-type voltage to the VCSEL units 4301, 4302, and 4303 through the lower metal contacts 4360. For example, the first contact 4370 may supply a voltage lower than or equal to a reference voltage to the VCSEL units 4301, 4302, and 4303 through the lower metal contacts 4360.

According to another embodiment, the first contact 4370 may supply a p-type voltage to the VCSEL units 4301, 4302, and 4303 through the lower metal contacts 4360. For example, the first contact 4370 may supply a voltage higher than or equal to a reference voltage to the VCSEL units 4301, 4302, and 4303 through the lower metal contacts 4360.

Figure 84:
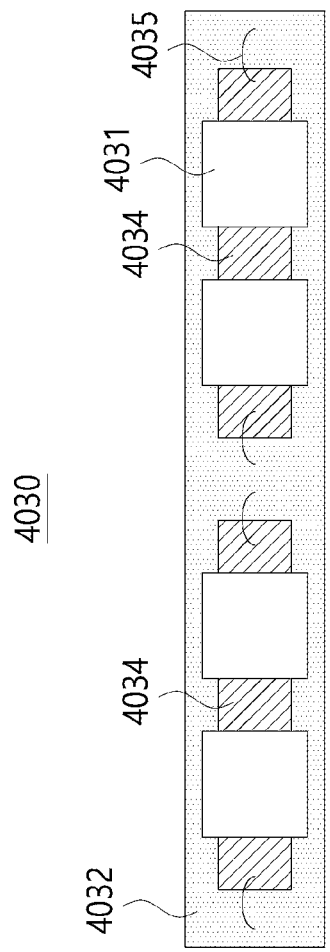
FIG. 84 is a diagram illustrating a VCSEL array according to still another embodiment.

FIG. 84 is a diagram illustrating a VCSEL array according to still another embodiment. FIG. 84 may be a plan view of a portion of a VCSEL array when viewed from the top.

Referring to FIG. 84, a VCSEL array 4030 according to an embodiment may include a plurality of VCSEL units 4031, a contact 4032, a common contact 4034, and a wire 4035.

Unlike the VCSEL array 4020 of FIGS. 78 to 81, the VCSEL array 4030 may have a wire additionally connected to a central portion of each of the VCSEL units 4031. For example, a wire may be additionally connected to the common contact 4034 in the central portion.

By adding a wire connection to the central portions of the VCSEL units 4031, resistances of the VCSEL units caused by the common contact 4034 may be the same, or the difference therebetween may be reduced.

For example, in the case of the VCSEL unit in the first column, a resistance applied by one end of the common contact 4034 is R, and a resistance applied by the other end is 2R. Thus, the total resistance applied to the VCSEL unit in the first column by the common contact may be ($2/3$)R.

Also, for example, in the case of the VCSEL unit in the second column, a resistance applied by one end of the common contact 4034 is 2R, and a resistance applied by the other end is R. Thus, the total resistance applied to the VCSEL unit in the second column by the common contact may be ($2/3$)R.

Accordingly, the total resistance applied to the VCSEL unit in the first column by the common contact and the total resistance applied to the VCSEL unit in the second column by the common contact may be equal to (⅔)R.

Also, for example, in the case of the VCSEL unit in the third column, a resistance applied by one end of the common contact 4034 is R, and a resistance applied by the other end is 2R. Thus, the total resistance applied to the VCSEL unit in the third column by the common contact may be (⅔)R.

Also, for example, in the case of the VCSEL unit in the fourth column, a resistance applied by one end of the common contact 4034 is 2R, and a resistance applied by the other end is R. Thus, the total resistance applied to the VCSEL unit in the fourth column by the common contact may be (⅔)R.

Accordingly, the total resistance applied to the VCSEL unit in the third column by the common contact and the total resistance applied to the VCSEL unit in the fourth column by the common contact may be equal to (⅔)R. Also, the total resistance applied to the VCSEL unit in the first column by the common contact, the total resistance applied to the VCSEL unit in the second column by the common contact, the total resistance applied to the VCSEL unit in the third column by the common contact, and the total resistance applied to the VCSEL unit in the fourth column by the common contact may be equal to (⅔)R.

Figure 85:
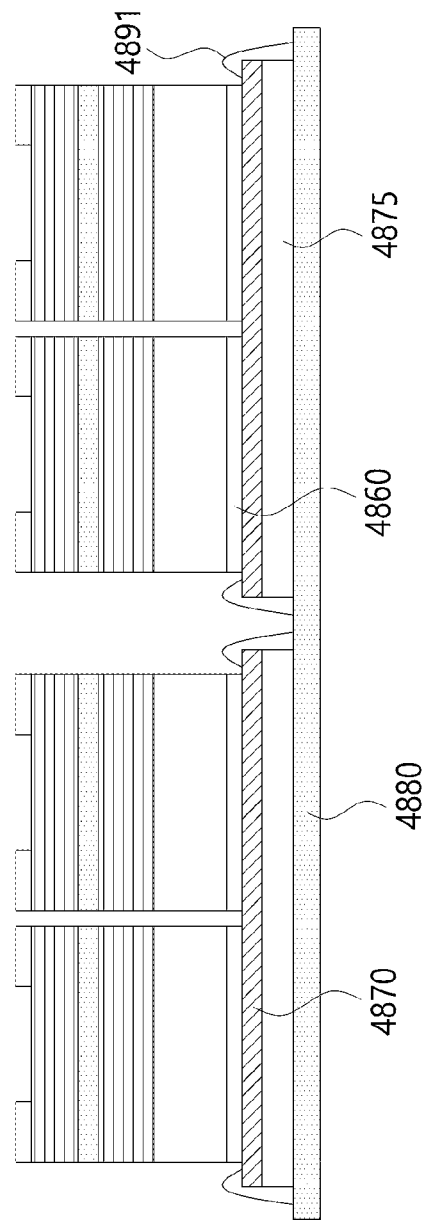
FIG. 85 is a diagram showing a VCSEL array according to still another embodiment when viewed in one direction.

FIG. 85 is a diagram showing a VCSEL array according to still another embodiment when viewed in one direction. FIG. 85 may be a front view of the VCSEL array of FIG. 84 when viewed from the front.

Referring to FIG. 85, a VCSEL array 4800 may include a plurality of VCSEL units, a common contact 4870, a substrate 4875, a contact 7880, and a wire 4891.

According to an embodiment, some VCSEL units included in the VCSEL array 4800 may share the common contact 4870 and the substrate 4875. Also, some or all of the VCSEL units included in the VCSEL array may share the contact 4880. The VCSEL units may be electrically connected to the common contact 4870 through lower metal contacts.

According to an embodiment, unlike the VCSEL array 4300 of FIG. 82, the VCSEL array 4800 may additionally include a wire connection to the central portions of the VCSEL units. For example, an additional wire connection may be applied to the common contact 4870 in the central portions of the VCSEL units.

By adding a wire connection to the common contact 4870 in the central portions of the VCSEL units, resistances of the VCSEL units caused by the common contact 4034 may be the same, or the difference therebetween may be reduced.

Figure 86:
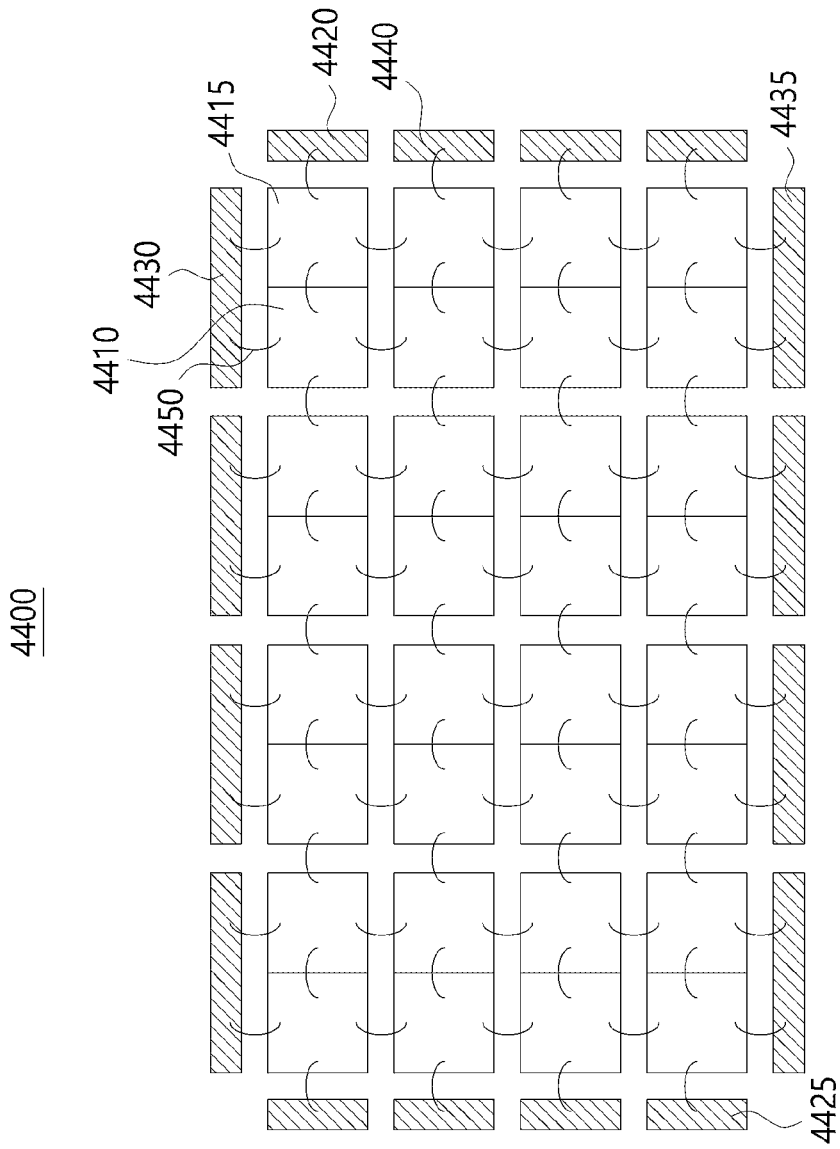
FIG. 86 is a diagram illustrating a VCSEL array according to an embodiment.

FIG. 86 is a diagram illustrating a VCSEL array according to an embodiment.

Referring to FIG. 86, a VCSEL array 4400 may include a plurality of VCSEL units 4410 and 4415, a plurality of contacts 4420 and 4430, and a plurality of wires 4440 and 4450.

A description of the plurality of VCSEL units 4410 and 4415, the plurality of contacts 4420, 4425, 4430, 4435, and the plurality of wires 4440 and 4450 is included in FIG. 72 and the detailed description thereof, and thus a detailed description thereof will be omitted.

The VCSEL array 4400 according to an embodiment may include a plurality of VCSEL unit pairs, a plurality of couples of VCSEL units, or a plurality of pairs of VCSEL units 4410 and 4415.

The pairs of VCSEL units 4410 and 4415 according to an embodiment may be arranged in two dimensions. For example, the plurality of pairs of VCSEL units 4410 and 4415 may be arranged along a first axis and may be arranged along a second axis different from the first axis. For example, the plurality of pairs of VCSEL units 4410 and 4415 may be arranged along an x-axis and a y-axis to form a matrix.

FIG. 86 shows only a VCSEL array in the form of a 4×4 matrix. However, the form of the VCSEL array is not limited thereto. For example, the VCSEL array may be in the form of a 5×5, 6×6, 7×7, 8×8, 9×9, 10×10, 11×11, 12×12, 13×13, 14×14, 15×15, or 16×16 matrix. The form of the VCSEL array is not limited to the aforementioned numbers and may be a matrix in other numbers of dimensions.

Also, for example, the plurality of pairs of VCSEL units 4410 and 4415 may be arranged along the x-axis and a second axis inclined at an angle of 90 degrees or less with respect to the x-axis. In this case, the plurality of VCSEL arrays 4100 may be in the form of a rhombus or a trapezoid. Also, the plurality of VCSEL arrays 4100 may be in the form of a honeycomb.

The VCSEL array 4400 according to an embodiment may include a plurality of contacts 4420, 4425, 4430, and 4435. For example, the VCSEL array 4400 may include first contacts 4420 and 4425 neighboring both ends of the VCSEL arrays arranged along the first axis. Also, for example, the VCSEL array 4400 may include second contacts 4430 and 4435 neighboring both ends of the VCSEL array arranged along the second axis.

The VCSEL units 4410 and 4415 included in the pair of VCSEL units according to an embodiment may share the second contacts 4430 and 4435. For example, the VCSEL units 4410 and 4415 included in the pair of VCSEL units may be electrically connected to the second contacts 4430 and 4435.

The VCSEL array 4400 according to an embodiment may receive power through the plurality of contacts 4420, 4425, 4430, and 4435.

For example, the first contacts 4420 and 4425 arranged on both ends of the VCSEL array arranged along the first axis may be connected to a lower metal contact 60 of the plurality of pairs of VCSEL units 4410 and 4415. In this case, an n-type voltage may be applied to the lower metal contact 60 of the pair of VCSEL units 4410 and 4415 through the first contacts 4420 and 4425.

Also, for example, the second contacts 4430 and 4435 arranged on both ends of the VCSEL array arranged along the second axis may be connected to an upper metal contact 10 of the plurality of pairs of VCSEL units 4410 and 4415. In this case, a p-type voltage may be applied to the upper metal contact 10 of the pair of VCSEL units 4410 and 4415 through the second contacts 4430 and 4435. For example, a voltage higher than or equal to a reference voltage may be applied to the upper metal contact 10 of the pair of VCSEL units 4410 and 4415 through the second contacts 4430 and 4435.

As another example, the first contacts 4420 and 4425 arranged on both ends of the VCSEL array arranged along the first axis may be connected to the upper metal contact 10 of the plurality of pairs of VCSEL units 4410 and 4415. In this case, a p-type voltage may be applied to the upper metal contacts 10 of the pair of VCSEL units 4410 and 4415 through the first contacts 4420 and 4425. For example, a voltage higher than or equal to a reference voltage may be applied to the upper metal contact 10 of the pair of VCSEL units 4410 and 4415 through the first contacts 4420 and 4425.

Also, as another example, the second contacts 4430 and 4435 arranged on both ends of the VCSEL array arranged along the second axis may be connected to a lower metal contact 60 of the plurality of pairs of VCSEL units 4410 and 4415. In this case, an n-type voltage may be applied to the lower metal contact 60 of the pair of VCSEL units 4410 and 4415 through the second contacts 4430 and 4435. For example, a voltage lower than or equal to a reference voltage may be applied to the lower metal contact 60 of the pair of VCSEL units 4410 and 4415 through the second contacts 4430 and 4435.

The plurality of wires 4440 and 4450 according to an embodiment may connect the plurality of pairs of VCSEL units 4410 and 4415 arranged along the first axis to one another or may electrically connect the pairs of VCSEL units 4410 and 4415 to the first contacts 4420 and 4430. Also, the plurality of wires 4440 and 4450 may connect the plurality of pairs of VCSEL units 4410 and 4415 arranged along the second axis to one another or may electrically connect the pairs of VCSEL units 4410 and 4415 to the second contacts 4430 and 4435.

Referring to FIG. 86, the plurality of pairs of VCSEL units 4410 and 4415 included in the VCSEL array 4400 may operate individually. Each of the plurality of pairs of VCSEL units 4410 and 4415 included in the VCSEL array 4400 may operate independently regardless of whether the other pairs of VCSEL units operate.

For example, in order to operate the pair of VCSEL units in the first row and first column, an n-type voltage may be applied to a contact disposed in the first row among the first contacts 4420 and 4425, and a p-type voltage may be applied to a contact disposed in the first column among the second contacts 4430 and 4435.

For example, in order to operate the pair of VCSEL units in the first row and first column, a voltage lower than or equal to a reference voltage may be applied to a contact disposed in the first row among the first contacts 4420 and 4425, and a voltage higher than or equal to a reference voltage may be applied to a contact disposed in the first column among the second contacts 4430 and 4435.

Also, for example, in order to operate the pair of VCSEL units in the first row and second column, an n-type voltage may be applied to a contact disposed in the first row among the first contacts 4420 and 4425, and a p-type voltage may be applied to a contact disposed in the second column among the second contacts 4430 and 4435.

Also, for example, in order to operate the pair of VCSEL units in the first row and second column, a voltage lower than or equal to a reference voltage may be applied to a contact disposed in the first row among the first contacts 4420 and 4425, and a voltage higher than or equal to a reference voltage may be applied to a contact disposed in the second column among the second contacts 4430 and 4435.

Also, for example, in order to operate all of the four pairs of VCSEL units disposed in the first row, an n-type voltage may be applied to a contact disposed in the first row among the first contacts 4420 and 4425, and a p-type voltage may be applied to all of the second contacts 4430 and 4435.

Also, for example, in order to operate all of the four pairs of VCSEL units in the first row, a voltage lower than or equal to a reference voltage may be applied to a contact disposed in the first row among the first contacts 4420 and 4425, and a voltage higher than or equal to a reference voltage may be applied to all of the second contacts 4430 and 4435.

Also, for example, in order to operate the pair of VCSEL units in the second row and second column and the pair of VCSEL units in the third row and fourth column, an n-type voltage may be applied to contacts disposed in the second and third rows among the first contacts 4420 and 4425, and a p-type voltage may be applied to contacts disposed in the second and fourth columns among the second contacts 4430 and 4435.

Also, for example, in order to operate the pair of VCSEL units in the second row and second column and the pair of VCSEL units in the third row and fourth column, a voltage lower than or equal to a reference voltage may be applied to contacts arranged in the second and third rows among the first contacts 4420 and 4425, and a voltage higher than or equal to a reference voltage may be applied to contacts arranged in the second and fourth columns among the second contacts 4430 and 4435.

Also, for example, in order to operate all of the pairs of VCSEL units 4410 and 4415 included in the VCSEL array 4400, an n-type voltage may be applied to all of the first contacts 4420 and 4425, and a p-type voltage may be applied to all of the second contacts 4430 and 4435.

Also, for example, in order to operate all of the pairs of VCSEL units 4410 and 4415 included in the VCSEL array 4400, a voltage lower than or equal to a reference voltage may be applied to all of the first contacts 4420 and 4425, and a voltage higher than or equal to a reference voltage may be applied to all of the second contacts 4430 and 4435.

The plurality of VCSEL units 4410 and 4415 included in the pair of VCSEL units may operate individually. Each of the plurality of VCSEL units 4410 and 4415 included in the pair of VCSEL units may operate independently regardless of whether the other VCSEL units operate.

For example, one VCSEL unit 4410 may operate, and the other VCSEL unit 4415 may not operate. Also, for example, one VCSEL unit 4410 may not operate, and the other VCSEL unit 4415 may operate.

According to an embodiment, the directions of diodes of the VCSEL units included in the pair of VCSEL units may be opposite to each other.

For example, one VCSEL unit 4410 included in the pair of VCSEL units may include a forward diode, and the other VCSEL unit 4415 may include a reverse diode.

Also, for example, one VCSEL unit 4410 included in the pair of VCSEL units may include a reverse diode, and the other VCSEL unit 4415 may include a forward diode.

According to an embodiment, a VCSEL unit 4410, which is one of the plurality of VCSEL units included in the pair of VCSEL units, may include a forward diode.

For example, the VCSEL unit 4410 may include a VCSEL emitter consisting of a plurality of forward diodes.

Also, for example, the VCSEL unit 4410 may include a VCSEL emitter consisting of 300 to 400 forward diodes. In this case, the VCSEL unit 4410 may include only forward diodes, but the present disclosure is not limited thereto.

According to an embodiment, a VCSEL unit 4415, which is another one of the plurality of VCSEL units included in the pair of VCSEL units, may include a reverse diode.

For example, the VCSEL unit 4415 may include a VCSEL emitter consisting of a plurality of reverse diodes.

Also, for example, the VCSEL unit 4415 may include a VCSEL emitter consisting of 300 to 400 reverse diodes. In this case, the VCSEL unit 4415 may include only reverse diodes, but the present disclosure is not limited thereto.

According to an embodiment, a VCSEL unit, which is one of the plurality of VCSEL units included in the pair of VCSEL units, may include a first upper DBR layer and a first lower DBR layer. According to an embodiment, a VCSEL unit, which is another one of the plurality of VCSEL units included in the pair of VCSEL units, may include a second upper DBR layer and a second lower DBR layer.

In this case, the first upper DBR layer and the second upper DBR layer may have different properties, and the first lower DBR layer and the second lower DBR layer may have different properties. For example, the first upper DBR layer and the second lower DBR layer may be p-type doped, and the second upper DBR layer and the first lower DBR layer may be n-type doped.

However, the first upper DBR layer and the second upper DBR layer may have the same properties. For example, the first VCSEL unit and the second VCSEL unit may include the same VCSEL emitter.

Figure 87:
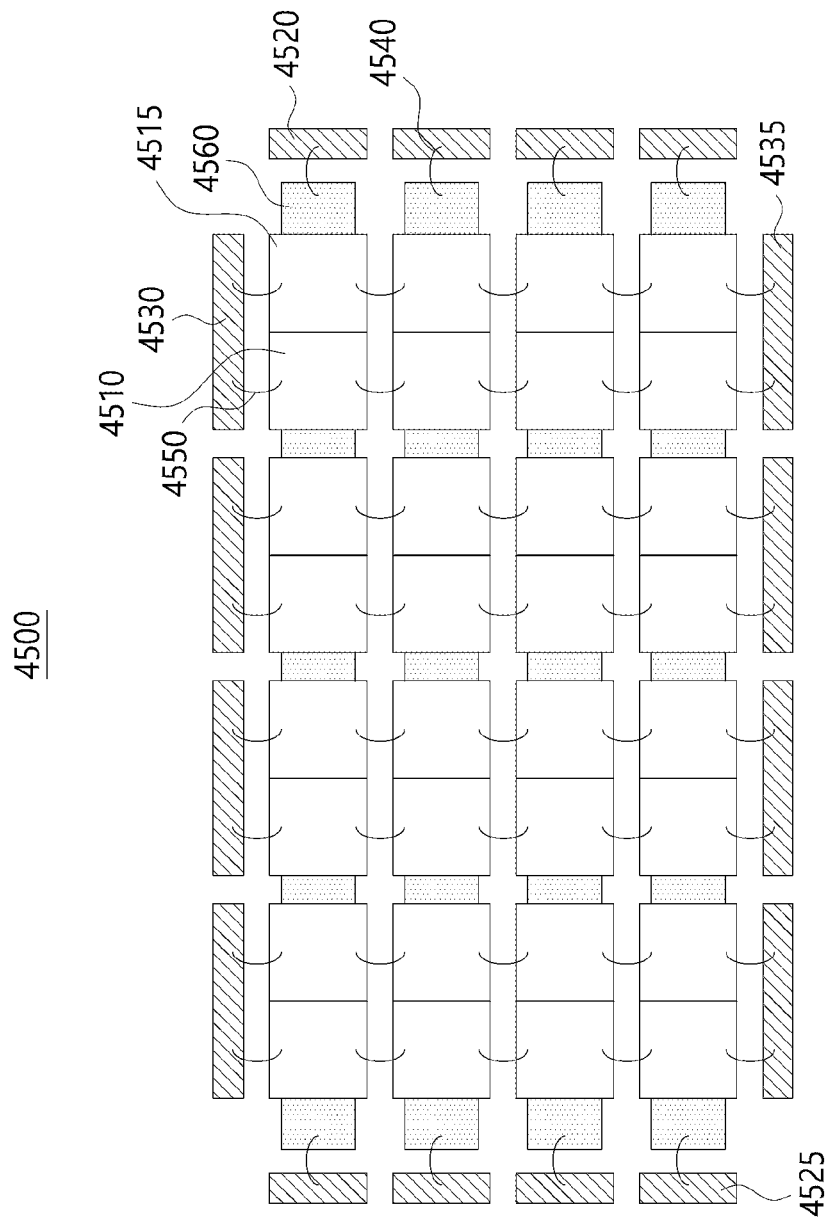
FIG. 87 is a diagram illustrating a VCSEL array according to another embodiment.

FIG. 87 is a diagram illustrating a VCSEL array according to another embodiment.

Referring to FIG. 87, a VCSEL array 4500 according to another embodiment may include a plurality of pairs of VCSEL units 4510 and 4515.

A description of the plurality of pairs of VCSEL units 4510 and 4515 may overlap with the description of the plurality of pairs of VCSEL units 4410 and 4415 with reference to FIG. 86, and thus a detailed description thereof will be omitted.

A description of a plurality of contacts 4520, 4525, 4530, and 4535 may overlap with the description of the plurality of contacts 4420, 4425, 4430, and 4435 with reference to FIG. 86, and thus a detailed description thereof will be omitted.

A description of a plurality of wires 4540 and 4550 may overlap with the description of the plurality of wires 4440 and 4450 with reference to FIG. 86, and thus a detailed description thereof will be omitted.

The VCSEL array 4500 according to an embodiment may include a common contact 4560. The common contact 4560 may contain a conductive material. For example, the common contact 4560 may contain metal.

The VCSEL units 4510 and 4515 included in the pair of VCSEL units according to an embodiment may share the second contacts 4530 and 4535. For example, both of the VCSEL units 4510 and 4515 included in the pair of VCSEL units may be electrically connected to the second contacts 4530 and 4535.

The common contact 4560 according to an embodiment may be electrically connected to a plurality of pairs of VCSEL units 4510 and 4515 arranged along the first axis.

For example, the common contact 4560 may be electrically connected to the plurality of pairs of VCSEL units 4510 and 4515 arranged along the first axis through the lower metal contact 60.

Also, for example, the common contact 4560 may be electrically connected to the plurality of pairs of VCSEL units 4510 and 4515 arranged along the first axis through the upper metal contact 10.

The VCSEL array 4500 according to an embodiment may receive power through the plurality of contacts 4520, 4525, 4530, and 4535.

For example, the first contacts 4520 and 4525 arranged on both ends of the VCSEL array arranged along the first axis may be connected to the lower metal contact 60 of the plurality of pairs of VCSEL units. In this case, an n-type voltage may be applied to the lower metal contact 60 of the pair of VCSEL units through the first contacts 4520 and 4525.

Also, for example, the second contacts 4530 and 4535 arranged on both ends of the VCSEL array arranged along the second axis may be connected to an upper metal contact 10 of the plurality of pair of VCSEL units.

In this case, a p-type voltage may be applied to the upper metal contact 10 of the pair of VCSEL units through the second contacts 4530 and 4535. For example, a voltage higher than or equal to a reference voltage may be applied to the upper metal contact 10 of the pair of VCSEL units through the second contacts 4530 and 4535.

As another example, the first contacts 4520 and 4525 arranged on both ends of the VCSEL array arranged along the first axis may be connected to the upper metal contact 10 of the plurality of pairs of VCSEL units.

In this case, a p-type voltage may be applied to the upper metal contact 10 of the pair of VCSEL units through the first contacts 4520 and 4525. For example, a voltage higher than or equal to a reference voltage may be applied to the upper metal contact 10 of the pair of VCSEL units through the first contacts 4520 and 4525.

Also, as another example, the second contacts 4530 and 4535 arranged on both ends of the VCSEL array arranged along the second axis may be connected to a lower metal contact 60 of the plurality of pair of VCSEL units.

In this case, an n-type voltage may be applied to the lower metal contact 60 of the pair of VCSEL units through the second contacts 4530 and 4535. For example, a voltage lower than or equal to a reference voltage may be applied to the lower metal contact 60 of the pair of VCSEL units through the second contacts 4530 and 4535.

Referring to FIG. 87, a plurality of pairs of VCSEL units included in the VCSEL array 4500 may operate individually. Each of the plurality of pairs of VCSEL units included in the VCSEL array 4500 may operate independently regardless of whether the other pairs of VCSEL units operate.

The individual operations of the plurality of pairs of VCSEL units may overlap with the description of FIG. 86, and thus a detailed description thereof will be omitted.

The plurality of VCSEL units included in the pair of VCSEL units may operate individually. Each of the plurality of VCSEL units included in the pair of VCSEL units may operate independently regardless of whether the other VCSEL units operate.

For example, one VCSEL unit 4510 may operate, and the other VCSEL unit 4515 may not operate. Also, for example, one VCSEL unit 4510 may not operate, and the other VCSEL unit 4515 may operate.

According to an embodiment, the directions of diodes of the VCSEL units included in the pair of VCSEL units may be opposite to each other.

For example, one VCSEL unit 4510 included in the pair of VCSEL units may include a forward diode, and the other VCSEL unit 4515 may include a reverse diode.

Also, in other words, one VCSEL unit 4410 included in the pair of VCSEL units may have a circuit configured to serve as a forward diode, and the other VCSEL unit 4415 may have a circuit configured to serve as a reverse diode.

Also, here, the forward diode may refer to a VCSEL unit in which an electric current flows in one direction, and the reverse diode may refer to a VCSEL unit in which an electric current flows in the reverse direction.

Also, for example, one VCSEL unit 4510 included in the pair of VCSEL units may include a reverse diode, and the other VCSEL unit 4515 may include a forward diode.

According to an embodiment, a VCSEL unit 4510, which is one of a plurality of VCSEL units included in the pair of VCSEL units, may include a forward diode.

For example, the VCSEL unit 4510 may include a VCSEL emitter consisting of a plurality of forward diodes.

Also, for example, the VCSEL unit 4510 may include a VCSEL emitter consisting of 300 to 400 forward diodes. In this case, the VCSEL unit 4510 may include only forward diodes, but the present disclosure is not limited thereto.

According to an embodiment, a DBR layer of one VCSEL unit 4510 included in the pair of VCSEL units may be different from a DBR layer of the other VCSEL unit 4515.

For example, an upper DBR layer of one VCSEL unit 4510 included in the pair of VCSEL units may be a P-DBR layer, and a lower DBR layer of the VCSEL unit 4510 may be an N-DBR layer. In this case, an upper DBR layer of the other VCSEL unit 4515 included in the pair of VCSEL units may be an N-DBR layer, and a lower DBR layer of the VCSEL unit 4515 may be a P-DBR layer. That is, the positions of the N-DBR and P-DBR of each of the VCSEL units included in the pair of VCSEL units may be opposite to each other.

According to an embodiment, a VCSEL unit 4515, which is another one of the plurality of VCSEL units included in the pair of VCSEL units, may include a reverse diode.

For example, the VCSEL unit 4515 may include a VCSEL emitter consisting of a plurality of reverse diodes.

Also, for example, the VCSEL unit 4515 may include a VCSEL emitter consisting of 300 to 400 reverse diodes. In this case, the VCSEL unit 4515 may include only reverse diodes, but the present disclosure is not limited thereto.

Figure 88:
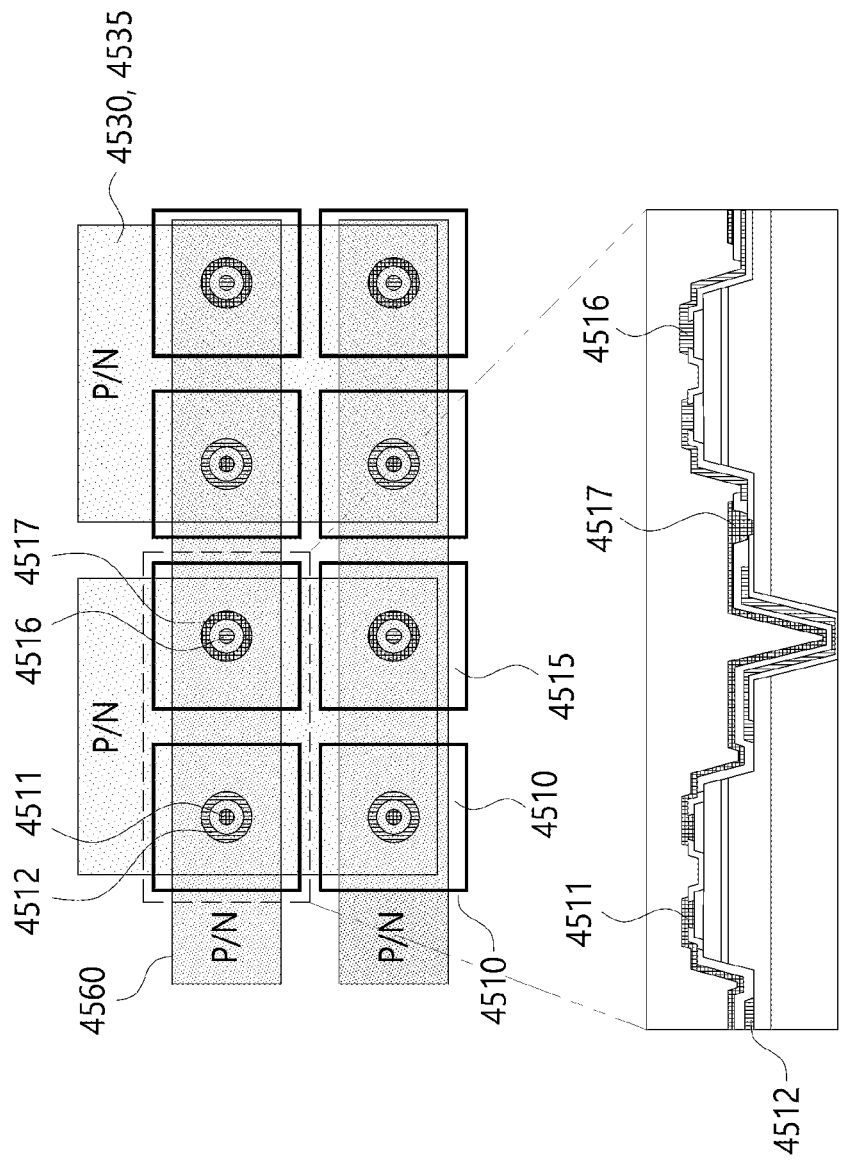
FIG. 88 is a diagram showing a connection state and a cross-section of a VCSEL array according to an embodiment.

FIG. 88 is a diagram showing a connection state and a cross-section of a VCSEL array according to an embodiment.

According to an embodiment, VCSEL units 4510 and 4515 included in a VCSEL array may share a substrate. For example, the VCSEL units 4510 and 4515 may share GaAs.

Referring to FIG. 88, the VCSEL array may include a plurality of pairs of VCSEL units. A pair of VCSEL units may include a plurality of VCSEL units. For example, the pair of VCSEL units may include one VCSEL unit 4510 and the other VCSEL unit 4515.

According to an embodiment, the plurality of pairs of VCSEL units may be electrically connected to one another through the common contact 4560 arranged along the first axis. Also, the VCSEL units 4510 and 4515 included in the pair of VCSEL units may be electrically connected to one another through the common contact 4560 arranged along the first axis.

According to an embodiment, the plurality of pairs of VCSEL units may be electrically connected to one another through wires (not shown) and second contacts 4530 and 4535 arranged along the second axis. Also, the VCSEL units 4510 and 4515 included in the pair of VCSEL units may be electrically connected to one another through the second contacts 4530 and 4535 arranged along the second axis.

A p-type voltage or an n-type voltage may be applied to the common contact 4560 and the second contacts 4530 and 4535. For example, an n-type voltage may be applied to the common contact 4560, and a p-type voltage may be applied to the second contacts 4530 and 4535.

Also, for example, a p-type voltage may be applied to the common contact 4560, and an n-type voltage may be applied to the second contacts 4530 and 4535. However, the present disclosure is not limited thereto, and a p-type voltage or an n-type voltage may be applied to all of the common contact 4560 and the second contacts 4530 and 4535.

A voltage higher than or equal to a reference voltage or a voltage lower than or equal to a reference voltage may be applied to the common contact 4560 and the second contacts 4530 and 4535. For example, a voltage lower than or equal to a reference voltage may be applied to the common contact 4560, and a voltage higher than or equal to a reference voltage may be applied to the second contacts 4530 and 4535.

Also, for example, a voltage higher than or equal to a reference voltage may be applied to the common contact 4560, and a voltage lower than or equal to a reference voltage may be applied to the second contacts 4530 and 4535. However, the present disclosure is not limited thereto, and either of a voltage higher than or equal to a reference voltage or a voltage lower than or equal to a reference voltage may be applied to all of the common contact 4560 and the second contacts 4530 and 4535.

According to an embodiment, the direction of diodes of one VCSEL unit 4510 and the other VCSEL unit 4515 included in the pair of VCSEL units may be opposite to each other. For example, one VCSEL unit 4510 may include a forward diode, and the other VCSEL unit 4515 may include a reverse diode.

According to an embodiment, connections between upper metal contacts and lower metal contacts of one VCSEL unit 4510 and the other VCSEL unit 4515 included in the pair of VCSEL units may be opposite to each other.

For example, an upper metal contact 4511 electrically connected to an upper DBR layer of one VCSEL unit 4510 may be electrically connected to a lower metal contact 4517 electrically connected to a lower DBR layer of the other VCSEL unit 4515.

Also, a lower metal contact 4512 electrically connected to a lower DBR layer of one VCSEL unit 4510 may be electrically connected to an upper metal contact 4516 electrically connected to an upper DBR layer of the other VCSEL unit 4515.

In this case, the lower metal contact 4512 of the VCSEL unit 4510 and the upper metal contact 4516 of the VCSEL unit 4515 may be electrically connected to the common contact 4560.

Also, in this case, the upper metal contact 4511 of the VCSEL unit 4510 and the lower metal contact 4517 of the VCSEL unit 4515 may be electrically connected to the second contacts 4530 and 4535.

However, the present disclosure is not limited thereto, the lower metal contact 4512 of the VCSEL unit 4510 and the upper metal contact 4516 of the VCSEL unit 4515 may be electrically connected to the second contacts 4530 and 4535, and the upper metal contact 4511 of the VCSEL unit 4510 and the lower metal contact 4517 of the VCSEL unit 4515 may be electrically connected to the common contact 4560.

Also, according to an embodiment, an upper metal contact 4511 of a first VCSEL unit and a lower metal contact 4517 of a second VCSEL unit may be produced as the same metal layer. Also, a lower metal contact 4512 of the first VCSEL unit and an upper metal contact 4516 of the second VCSEL unit may be produced as the same metal layer.

In this case, when a current or voltage is applied to the upper metal contact 4511 of the first VCSEL unit, a current or voltage may be applied to the lower metal contact 4517 of the second VCSEL unit because the upper metal contact 4511 of the first VCSEL unit is the same metal layer as the lower metal contact 4517 of the second VCSEL unit.

Also, in this case, when a current or voltage is applied to the lower metal contact 4512 of the first VCSEL unit, a current or voltage may be applied to the upper metal contact 4516 of the second VCSEL unit because the lower metal contact 4512 of the first VCSEL unit is the same metal layer as the upper metal contact 4516 of the second VCSEL unit.

In this case, when a first voltage is applied to the upper metal contact 4511 of the first VCSEL unit and a second voltage lower than the first voltage is applied to the lower metal contact 4512 of the first VCSEL unit, an electric current that flows through the first VCSEL unit may flow from the upper metal contact 4511 to the lower metal contact 4512, and thus the first VCSEL unit may operate.

However, when a first voltage is applied to the upper metal contact 4511 of the first VCSEL unit and a second voltage lower than the first voltage is applied to the lower metal contact 4512 of the first VCSEL unit, an electric current that flows through the second VCSEL unit may flow from the lower metal contact 4517 to the upper metal contact 4516, and thus the second VCSEL unit may not operate.

Also, in this case, when a third voltage is applied to the upper metal contact 4511 of the first VCSEL unit and a fourth voltage higher than the third voltage is applied to the lower metal contact 4512 of the first VCSEL unit, an electric current that flows through the first VCSEL unit may flow from the upper metal contact 4511 to the lower metal contact 4512, and thus the first VCSEL unit may not operate.

However, when a third voltage is applied to the upper metal contact 4511 of the first VCSEL unit and a fourth voltage higher than the third voltage is applied to the lower metal contact 4512 of the first VCSEL unit, an electric current that flows through the second VCSEL unit may flow from the upper metal contact 4516 to the lower metal contact 4517, and thus the second VCSEL unit may operate.

Figure 89:
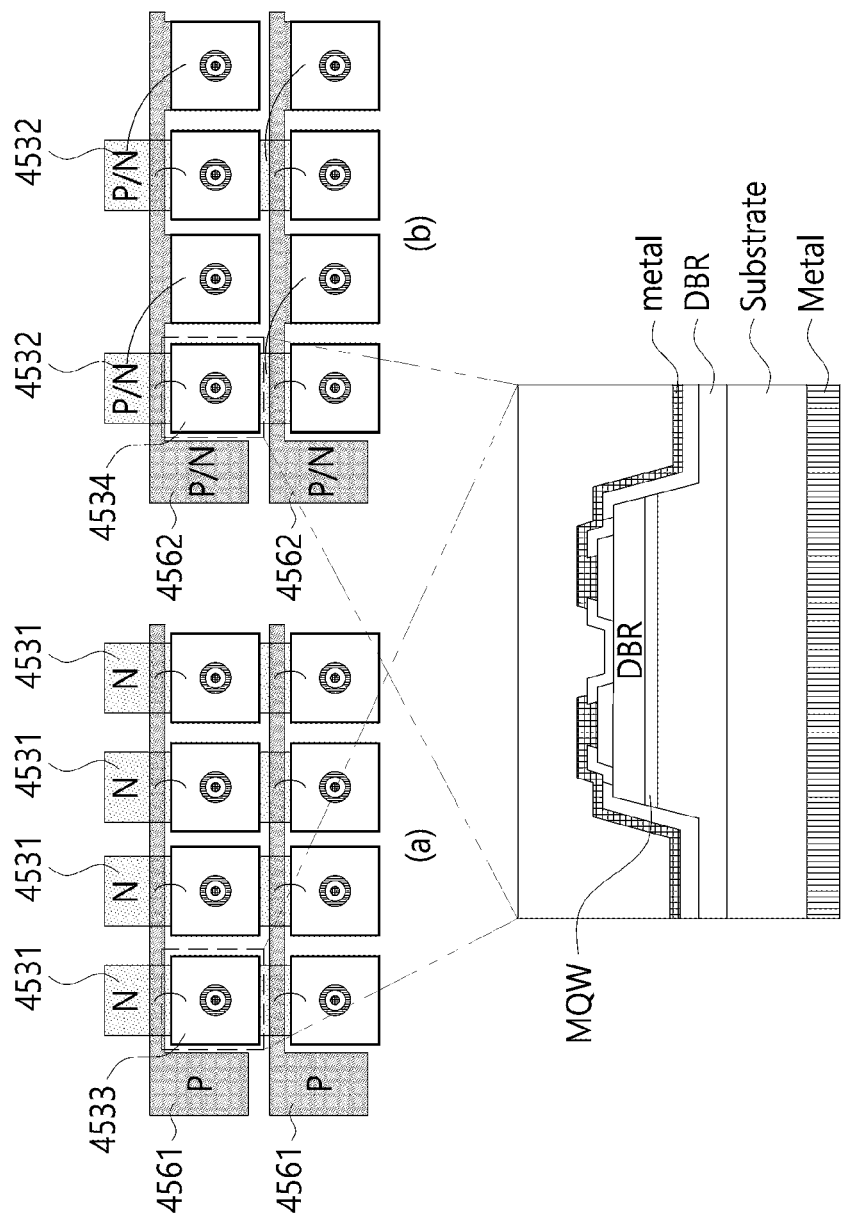
FIG. 89 is a diagram showing a connection state and a cross-section of a VCSEL array according to another embodiment.

FIG. 89 is a diagram showing a connection state and a cross-section of a VCSEL array according to another embodiment.

According to an embodiment, each of the VCSEL units 4533 and 4534 may include an upper DBR layer, a lower DBR layer, multi-quantum wells, metal, and a substrate.

For example, in the VCSEL units 4533 and 4534, the upper DBR layer may be p-type doped, and the lower DBR layer may be n-type doped. Alternatively, for example, in the VCSEL units 4533 and 4534, the upper DBR layer may be n-type doped, and the lower DBR layer may be p-type doped.

According to an embodiment, the VCSEL units 4533 and 4534 included in the VCSEL array may share the substrate. For example, the VCSEL units 4533 and 4534 may share GaAs.

According to another embodiment, the VCSEL units 4533 and 4534 included in the VCSEL array may partially share the substrate. For example, N VCSEL units included in the VCSEL array may share the substrate.

According to an embodiment, a VCSEL emitter included in the VCSEL units 4533 and 4534 may include an upper DBR layer and a lower DBR layer.

For example, the VCSEL emitter may include a P-DBR layer in an upper portion and an N-DBR layer in a lower portion. Alternatively, for example, the VCSEL emitter may include an N-DBR layer in an upper portion and a P-DBR layer in a lower portion.

Referring to FIG. 89A, a VCSEL array according to another embodiment may include a plurality of VCSEL units 4533, a first contact 4531, a second contact 4561, and a wire.

According to another embodiment, the first contact 4531 may be electrically connected to a lower contact of the plurality of VCSEL units 4533. For example, the first contact 4531 may be electrically connected to N-Metal of the plurality of VCSEL units 4533.

For example, the first contact 4531 may be an n-type doped metal or a typical metal. An n-type voltage may be applied to the first contact 4531.

According to another embodiment, the second contact 4561 may be electrically connected to an upper contact of the plurality of VCSEL units 4533. For example, the second contact 4561 and the plurality of VCSEL units 4533 may be electrically connected to each other through the wire. Also, for example, the second contact 4561 may be electrically connected to P-Metal of the plurality of VCSEL units 4533.

For example, the second contact 4561 may be a p-type doped metal or a typical metal. A p-type voltage or a voltage higher than or equal to a reference voltage may be applied to the second contact 4561.

Referring to FIG. 89B, a VCSEL array according to still another embodiment may include a plurality of VCSEL units 4534, a first contact 4532, a second contact 4562, and a wire.

According to still another embodiment, the first contact 4532 may be electrically connected to a lower contact of VCSEL units disposed in odd columns among the VCSEL units included in the VCSEL array. For example, the first contact 4532 may be electrically connected to N-Metal of the VCSEL units disposed in odd columns. In this case, a lower contact of VCSEL units disposed in even columns may not be electrically connected to the first contact 4532.

Also, the first contact 4532 may be electrically connected to an upper contact of the VCSEL units disposed in even columns among the VCSEL units included in the VCSEL array. For example, the first contact 4532 may be electrically connected to P-Metal of the VCSEL units disposed in even columns. In this case, the first contact 4532 may be electrically connected to the upper contact of the VCSEL units disposed in even columns through the wire.

According to still another embodiment, the second contact 4562 may be electrically connected to the lower contact of the VCSEL units disposed in even columns among the VCSEL units included in the VCSEL array. For example, the second contact 4562 may be electrically connected to N-Metal of the VCSEL units disposed in even columns. In this case, the lower contact of VCSEL units disposed in odd columns may not be electrically connected to the second contact 4562.

Also, the second contact 4562 may be electrically connected to the upper contact of the VCSEL units disposed in odd columns among the VCSEL units included in the VCSEL array. For example, the second contact 4562 may be electrically connected to P-Metal of the VCSEL units disposed in odd columns. In this case, the second contact 4562 may be electrically connected to the upper contact of the VCSEL units disposed in odd columns through the wire.

According to still another embodiment, a p-type voltage or an n-type voltage may be applied to the first contact 4532 and the second contact 4562. For example, a voltage higher than or equal to a reference voltage or a voltage lower than or equal to a reference voltage may be applied to the first contact 4532 and the second contact 4562.

For example, when an n-type voltage is applied to the first contact 4532 and a p-type voltage is applied to the second contact 4562, VCSEL units disposed in odd columns among the VCSEL units included in the VCSEL array may operate, and VCSEL units disposed in even columns may not operate.

For example, when a voltage lower than or equal to a reference voltage is applied to the first contact 4532 and a voltage higher than or equal to a reference voltage is applied to the second contact 4562, VCSEL units disposed in odd columns among the VCSEL units included in the VCSEL array may operate, and VCSEL units disposed in even columns may not operate.

Also, for example, when a p-type voltage is applied to the first contact 4532 and an n-type voltage is applied to the second contact 4562, VCSEL units disposed in even columns among the VCSEL units included in the VCSEL array may operate, and VCSEL units disposed in odd columns may not operate.

Also, for example, when a voltage higher than or equal to a reference voltage is applied to the first contact 4532 and a voltage lower than or equal to a reference voltage is applied to the second contact 4562, VCSEL units disposed in even columns among the VCSEL units included in the VCSEL array may operate, and VCSEL units disposed in odd columns may not operate.

As described above, in the VCSEL array shown in FIG. 89B, a different VCSEL unit may operate depending on a current or voltage applied to the first contact 4532 and the second contact 4562.

Also, the VCSEL array shown in FIG. 89B can reduce the number of contacts more than the VCSEL array shown in FIG. 89A.

For example, the contacts of the VCSEL array shown in FIG. 89A may include four first contacts 4531 and two second contacts 4561, and the contacts of the VCSEL array shown in FIG. 89B may include two first contacts 4532 and two second contacts 4562. By reducing the number of contacts, it is possible to reduce the processing cost of the VCSEL array.

However, the connection state of the VCSEL array of FIG. 88 can reduce the number of contacts more than those of FIGS. 89A and 89B.

For example, the VCSEL array of FIG. 88 may include four wires when wire connections are applied to two first contacts 4560 and two second contacts 4530 and 4535.

Also, for example, the VCSEL array of FIG. 89 may require a total of eight wires because four wire connections are applied to the first contacts 4531 and 4532 and four wire connections are applied to the second contacts 4561 and 4562.

Accordingly, the number of wires required for the VCSEL array of FIG. 88 may be smaller than the number of wires required for the VCSEL array of FIG. 89. In terms of processing simplification and cost, it may be important to reduce the number of wires. Like the VCSEL array of FIG. 88, by producing upper metal contacts and lower metal contacts of VCSEL units as the same metal layer, it is possible to reduce the number of wires.

Figure 90:
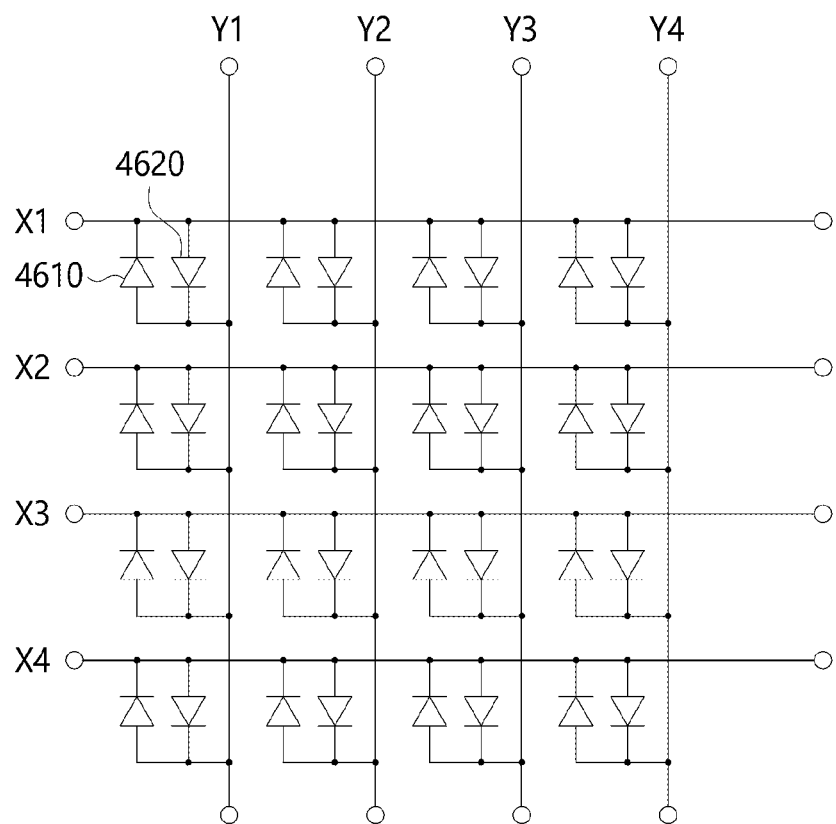
FIG. 90 is a circuit diagram showing a VCSEL array according to an embodiment.

FIG. 90 is a circuit diagram showing a VCSEL array according to an embodiment.

Referring to FIG. 90, a VCSEL array 4600 may include a plurality of pairs of VCSEL units 4610 and 4620. The pair of VCSEL units may include a plurality of VCSEL units 4610 and 4620. For example, the pair of VCSEL units may include a VCSEL unit including a forward diode and a VCSEL unit including a reverse diode.

FIG. 90 shows that the number of diodes included in the VCSEL unit is one. However, the present disclosure is not limited thereto, and the VCSEL unit may include a plurality of diodes. For example, the VCSEL unit may include 300 to 400 diodes.

According to an embodiment, a VCSEL unit 4610, which is one of the pair of VCSEL units, may include a forward diode, and the other VCSEL unit 4620 may include a reverse diode. For example, the directions of the diodes of the VCSEL units included in the pair of VCSEL units may be opposite to each other.

According to an embodiment, the negative electrode (cathode) of the VCSEL unit 4610 including the forward diode may be electrically connected to the positive electrode (anode) of the VCSEL unit 4610 including the reverse diode. Also, the positive electrode of the VCSEL unit 4610 including the forward diode may be electrically connected to the negative electrode of the VCSEL unit 4620 including the reverse diode.

In this case, the negative electrode (cathode) of the VCSEL unit 4610 including the forward diode and the positive electrode (anode) of the VCSEL unit 4620 including the reverse diode may be connected to the first contacts 4520 and 4525 arranged in the x-axis direction. Also, the positive electrode of the VCSEL unit 4610 including the forward diode and the negative electrode of the VCSEL unit 4620 including the reverse diode may be connected to the second contacts 4530 and 4535 arranged in the y-axis direction.

Alternatively, the negative electrode (cathode) of the VCSEL unit 4610 including the forward diode and the positive electrode (anode) of the VCSEL unit 4620 including the reverse diode may be connected to the second contacts 4530 and 4535 arranged in the y-axis direction. Also, the positive electrode of the VCSEL unit 4610 including the forward diode and the negative electrode of the VCSEL unit 4620 including the reverse diode may be connected to the first contacts 4520 and 4525 arranged in the x-axis direction.

According to an embodiment, an n-type voltage may be applied to first contacts X1, X2, X3, and X4, and a p-type voltage may be applied to the second contacts Y1, Y2, Y3, and Y4. For example, a voltage lower than or equal to a reference voltage may be applied to the first contacts X1, X2, X3, and X4, and a voltage higher than or equal to a reference voltage may be applied to the second contacts Y1, Y2, Y3, and Y4. In this case, only a VCSEL unit 4610, which is one of the pair of VCSEL units, may operate, and the other VCSEL unit 4620 may not operate.

Also, according to an embodiment, a p-type voltage may be applied to first contacts X1, X2, X3, and X4, and an n-type voltage may be applied to the second contacts Y1, Y2, Y3, and Y4. For example, a voltage higher than or equal to a reference voltage may be applied to the first contacts X1, X2, X3, and X4, and a voltage lower than or equal to a reference voltage may be applied to the second contacts Y1, Y2, Y3, and Y4. In this case, only a VCSEL unit 4620, which is one of the pair of VCSEL units, may operate, and the other VCSEL unit 4610 may not operate.

The directions of diodes of the VCSEL units 4610 and 4620 included in the pair of VCSEL units are opposite to each other. When one of the VCSEL units operates, the other VCSEL unit may not operate.

The number and size of contacts and the number and size of wires may be reduced when a plurality of VCSEL units are grouped as a pair of VCSEL units and connected to a first contact and a second contact as described above rather than when the VCSEL units are connected to the contacts.

Also, each VCSEL unit may operate according to the voltage applied to the first contact and the second contact, and thus convenience of operation can be derived.

Also, the VCSEL units 4610 and 4620 included in the pair of VCSEL units cannot operate at the same time, and thus it is possible to compensate for the vulnerability caused by an increase in temperature of the VCSEL array due to the heat generation of the VCSEL units. For example, a temperature increase rate may be smaller when only one VCSEL unit 4610 or 4620 operates than when all of the VCSEL units 4610 and 4620 included in the pair of VCSEL units operate.

The increase in temperature of the VCSEL array leads to a change in wavelength output from the VCSEL, and the change in wavelength may be associated with a measurable distance. Thus, the method of operating the pair of VCSEL units capable of reducing an increase in temperature according to the present disclosure may be a great advantage in the field of LiDAR.

FIGS. 91 to 97 are diagrams showing various examples of a VCSEL array.

Figure 91:
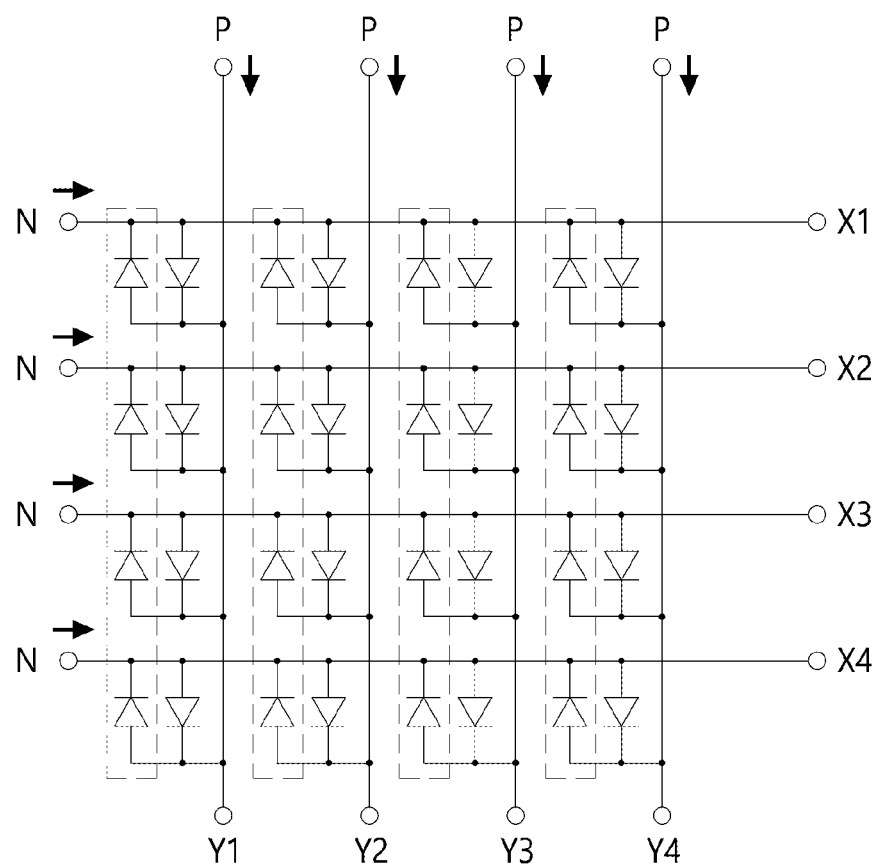
FIGS. 91 to 97 are diagrams showing various examples of a VCSEL array.

As shown in FIG. 91, an n-type voltage may be applied to first contacts X1, X2, X3, and X4 of the VCSEL array according to an embodiment. Also, a p-type voltage may be applied to second contacts Y1, Y2, Y3, and Y4 of the VCSEL array.

For example, a voltage lower than or equal to a reference voltage may be applied to the first contacts X1, X2, X3, and X4 of the VCSEL array, and a voltage higher than or equal to a reference voltage may be applied to the second contacts Y1, Y2, Y3, and Y4 of the VCSEL array.

In this case, only one of the pair of VCSEL units may operate. For example, only VCSEL units to which a correct voltage is applied may operate, and VCSEL units to which a correct voltage is not applied cannot operate.

Referring to FIG. 91, only VCSEL units indicated by dotted lines may operate. The VCSEL units included in the VCSEL array may operate in a column unit.

Figure 92:
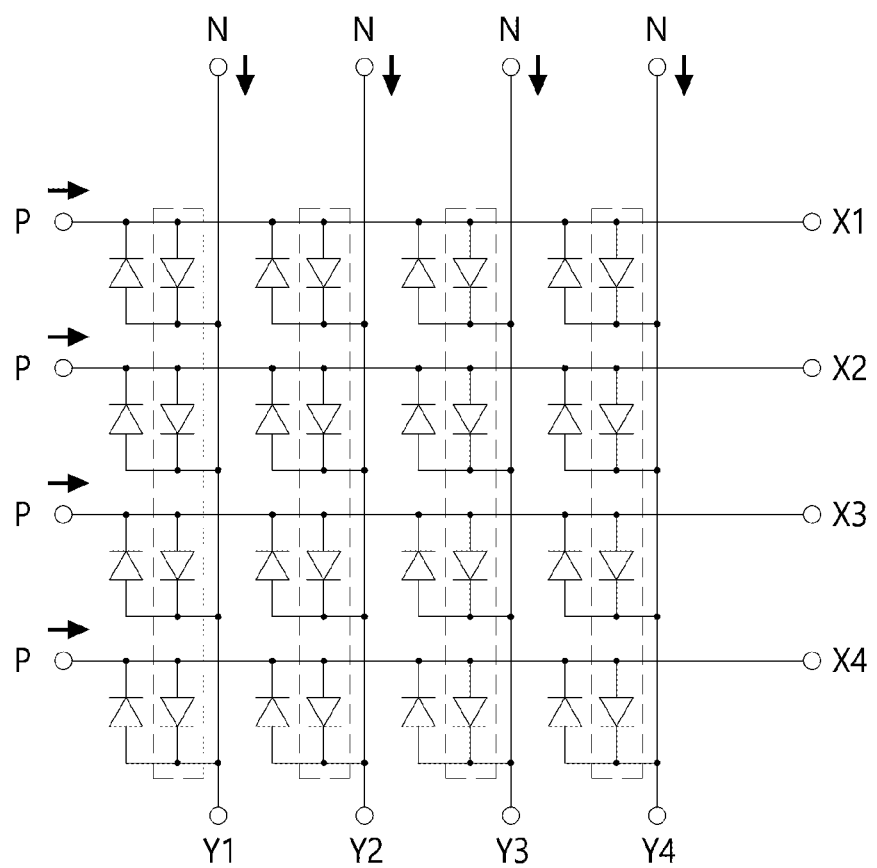

As shown in FIG. 92, a p-type voltage may be applied to the first contacts X1, X2, X3, and X4 of the VCSEL array according to an embodiment. Also, an n-type voltage may be applied to the second contacts Y1, Y2, Y3, and Y4 of the VCSEL array.

For example, a voltage higher than or equal to a reference voltage may be applied to the first contacts X1, X2, X3, and X4 of the VCSEL array, and a voltage lower than or equal to a reference voltage may be applied to the second contacts Y1, Y2, Y3, and Y4 of the VCSEL array.

Referring to FIG. 92, only VCSEL units indicated by dotted lines may operate. The VCSEL units included in the VCSEL array may operate in a column unit different from the column unit of FIG. 90.

Figure 93:
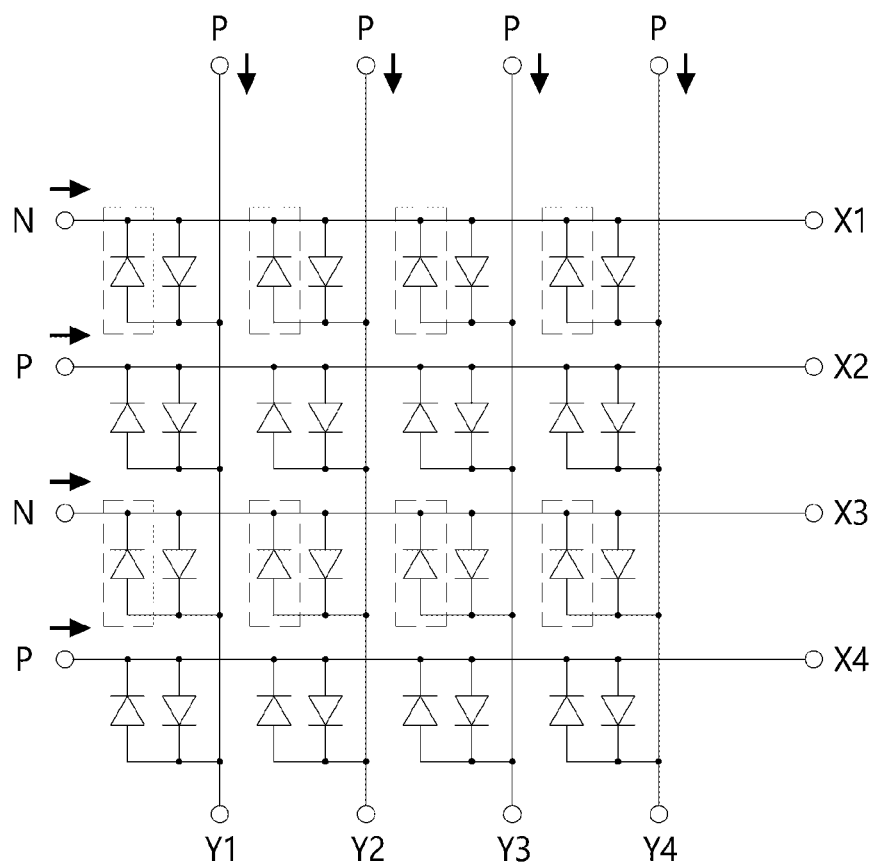

As shown in FIG. 93, according to an embodiment, an n-type voltage may be applied to first contacts X1 and X3 of the VCSEL array, and a p-type voltage may be applied to first contacts X2 and X4. Also, a p-type voltage may be applied to second contacts Y1, Y2, Y3, and Y4 of the VCSEL array.

For example, a voltage lower than or equal to a reference voltage may be applied to the first contacts X1 and X3 of the VCSEL array, a voltage higher than or equal to a reference voltage may be applied to the first contacts X2 and X4, and a voltage higher than or equal to a reference voltage may be applied to the second contacts Y1, Y2, Y3, and Y4 of the VCSEL array.

In this case, only one of the pair of VCSEL units may operate. For example, only a VCSEL unit to which a correct voltage is applied may operate, and a VCSEL unit to which a correct voltage is not applied cannot operate.

Alternatively, all of the VCSEL units included in the pair of VCSEL units may not operate. For example, when an incorrect voltage is applied to all of the VCSEL units included in the pair of VCSEL units, all of the VCSEL units cannot operate.

Referring to FIG. 93, only VCSEL units indicated by dotted lines may operate. The VCSEL units included in the VCSEL array may operate in a row unit.

Figure 94:
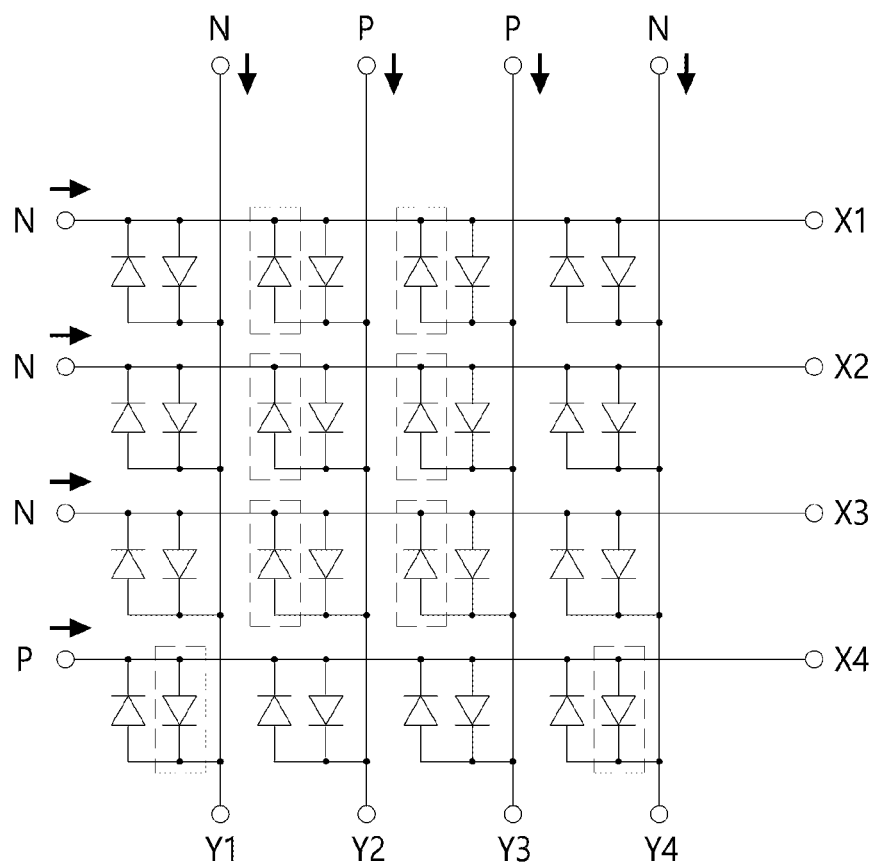

As shown in FIG. 94, an n-type voltage may be applied to first contacts X1, X2, and X3 of the VCSEL array, and a p-type voltage may be applied to a first contact X4. Also, an n-type voltage may be applied to second contacts Y1 and Y4 of the VCSEL array, and a p-type voltage may be applied to second contacts Y2 and Y3.

For example, a voltage lower than or equal to a reference voltage may be applied to the first contacts X1, X2, and X3 of the VCSEL array, a voltage higher than or equal to a reference voltage may be applied to the first contact X4, a voltage lower than or equal to a reference voltage may be applied to the second contacts Y1 and Y4 of the VCSEL array, and a voltage higher than or equal to a reference voltage may be applied to the second contacts Y2 and Y3.

Referring to FIG. 94, only VCSEL units indicated by dotted lines may operate. The VCSEL units included in the VCSEL array may operate individually rather than in a row unit or in a column unit.

Figure 95:
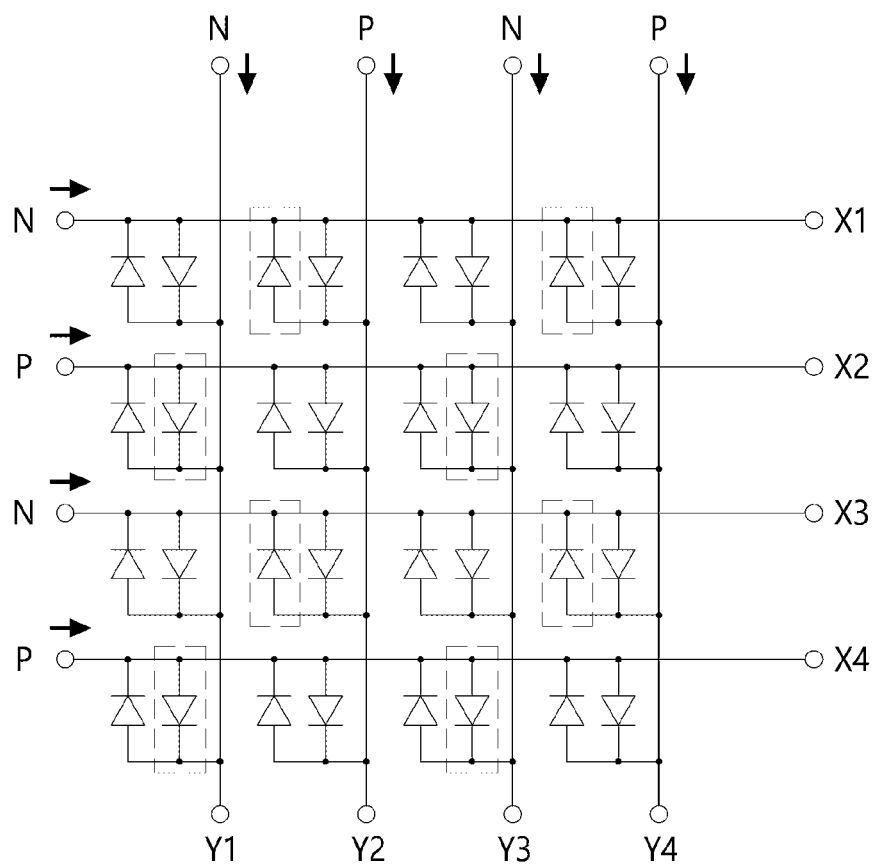

As shown in FIG. 95, according to an embodiment, an n-type voltage may be applied to first contacts X1 and X3 of the VCSEL array, and a p-type voltage may be applied to first contacts X2 and X4. Also, an n-type voltage may be applied to second contacts Y1 and Y3 of the VCSEL array, and a p-type voltage may be applied to second contacts Y2 and Y4.

For example, a voltage lower than or equal to a reference voltage may be applied to the first contacts X1 and X3 of the VCSEL array, a voltage higher than or equal to a reference voltage may be applied to the first contacts X2 and X4, a voltage lower than or equal to a reference voltage may be applied to the second contacts Y1 and Y3 of the VCSEL array, and a voltage higher than or equal to a reference voltage may be applied to the second contacts Y2 and Y4.

Referring to FIG. 95, only VCSEL units indicated by dotted lines may operate. The VCSEL units included in the VCSEL array may operate individually rather than in a row unit or in a column unit.

Figure 96:
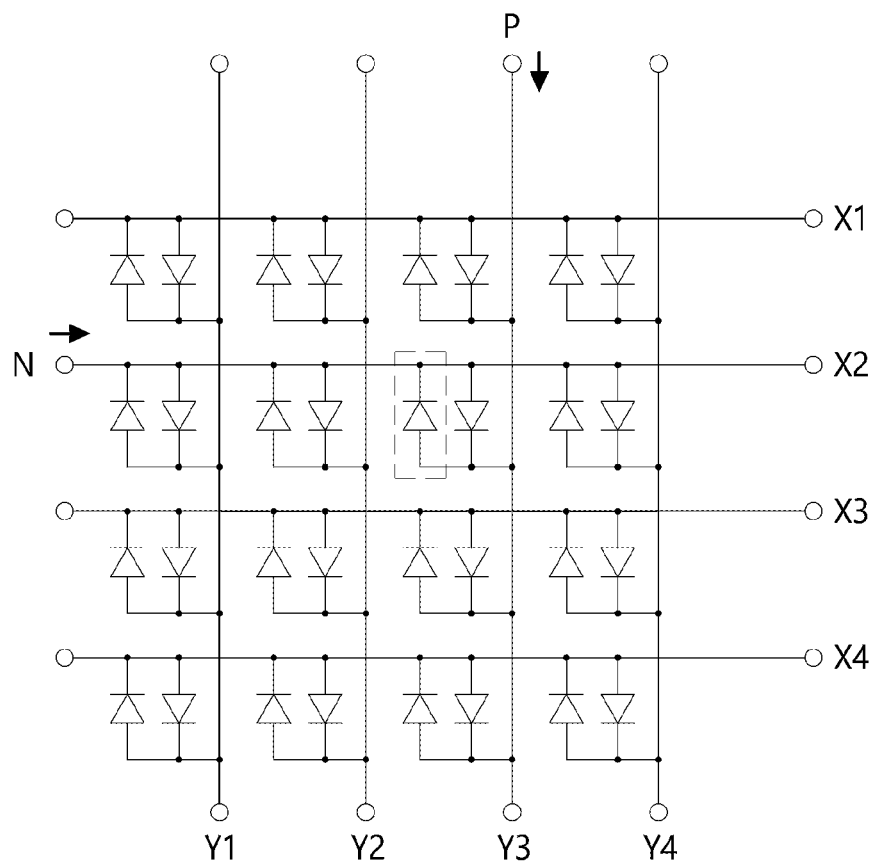

As shown in FIG. 96, according to an embodiment, an n-type voltage may be applied to only a first contact X2 of the VCSEL array according to an embodiment. Also, a p-type voltage may be applied to only a second contact Y3 of the VCSEL array.

For example, a voltage lower than or equal to a reference voltage may be applied to only the first contact X2 of the VCSEL array, and a voltage higher than or equal to a reference voltage may be applied to only the second contact Y3 of the VCSEL array.

Referring to FIG. 96, only VCSEL units indicated by dotted lines may operate. Only one of the VCSEL units included in the VCSEL array may operate individually.

Figure 97:
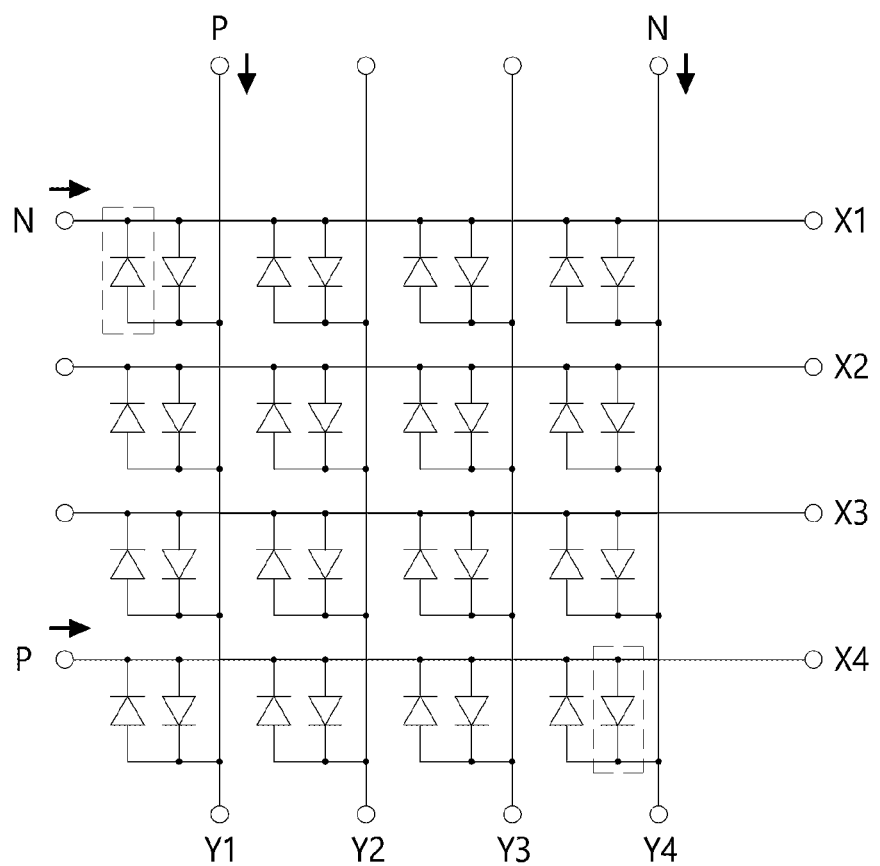

As shown in FIG. 97, an n-type voltage may be applied to a first contact X1 of the VCSEL array according to an embodiment, and a p-type voltage may be applied to a first contact X4. Also, a p-type voltage may be applied to a second contact Y1 of the VCSEL array, and an n-type voltage may be applied to a second contact Y4.

For example, a voltage lower than or equal to a reference voltage may be applied to the first contact X1 of the VCSEL array, a voltage higher than or equal to a reference voltage may be applied to the first contact X4, a voltage higher than or equal to a reference voltage may be applied to the second contact Y1 of the VCSEL array, and a voltage lower than or equal to a reference voltage may be applied to the second contact Y4.

Referring to FIG. 97, VCSEL units indicated by dotted lines may operate. The VCSEL units included in the VCSEL array may operate individually rather than in a row unit or in a column unit.

Figure 98:
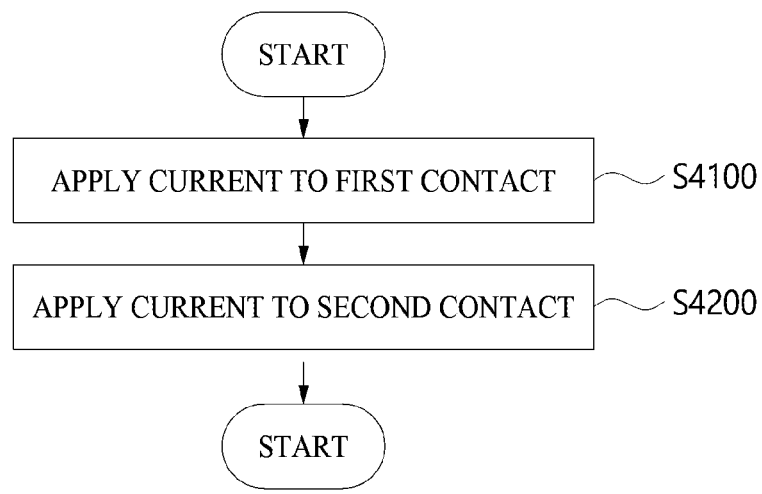
FIG. 98 is a diagram showing an operation flowchart of a VCSEL array according to an embodiment.

FIG. 98 is a diagram showing an operation flowchart of a VCSEL array according to an embodiment.

Referring to FIG. 98, the operation of the VCSEL array may include applying a current to a first contact (S4100) and applying a current to a second contact (S4200).

According to an embodiment, the operation of applying a current to a first contact of the VCSEL array (S4100) may be performed. Then, the operation of applying a current to a second contact of the VCSEL array (S4200) may be performed. By applying the current to the first contact and the second contact, VCSEL units included in the VCSEL array may operate.

According to another embodiment, the operation of applying a current to a second contact of the VCSEL array (S4200) may be performed first. Then, the operation of applying a current to a first contact of the VCSEL array (S4100) may be performed.

FIG. 99 is a diagram showing an operation sequence of a VCSEL array according to an embodiment.

Referring to FIG. 99, a VCSEL array 4580 according to an embodiment may include 4×4 VCSEL units 4570. However, the present disclosure is not limited thereto, and the VCSEL array 4580 may include 5×5, 6×6, 7×7, 8×8, 12×12, 24×24, or 64×64 VCSEL units 4570.

Referring to FIG. 99(a), a VCSEL array 4580 according to an embodiment may operate according to operation sequences corresponding to numbers marked on VCSEL units 4570.

For example, a VCSEL unit in the first row and first column may operate in the first place. Subsequently, a VCSEL unit in the third row and third column may operate in the second place. Subsequently, a VCSEL unit in the first row and third column may operate in the third place. Subsequently, a VCSEL unit in the third row and first column may operate in the fourth place. Subsequently, a VCSEL unit in the first row and fourth column may operate in the fifth place. Subsequently, a VCSEL unit in the third row and second column may operate in the sixth place. Subsequently, a VCSEL unit in the first row and second column may operate in the seventh place. Subsequently, a VCSEL unit in the third row and fourth column may operate in the eighth place. Subsequently, a VCSEL unit in the second row and first column may operate in the ninth place. Subsequently, a VCSEL unit in the fourth row and third column may operate in the tenth place. Subsequently, a VCSEL unit in the second row and third column may operate in the eleventh place. Subsequently, a VCSEL unit in the fourth row and first column may operate in the twelfth place. Subsequently, a VCSEL unit in the second row and fourth column may operate in the thirteenth place. Subsequently, a VCSEL unit in the fourth row and second column may operate in the fourteenth place. Subsequently, a VCSEL unit in the second row and second column may operate in the fifteenth place. Subsequently, a VCSEL unit in the fourth row and fourth column may operate in the sixteenth place.

Referring to FIG. 99(b), a VCSEL array 4580 according to another embodiment may operate according to operation sequences corresponding to numbers marked on VCSEL units 4570.

For example, a VCSEL unit in the first row and first column may operate in the first place. Subsequently, a VCSEL unit in the first row and second column may operate in the second place. Subsequently, a VCSEL unit in the third row and first column may operate in the third place. Subsequently, a VCSEL unit in the third row and third column may operate in the fourth place. Subsequently, a VCSEL unit in the second row and second column may operate in the fifth place. Subsequently, a VCSEL unit in the second row and fourth column may operate in the sixth place. Subsequently, a VCSEL unit in the fourth row and second column may operate in the seventh place. Subsequently, a VCSEL unit in the fourth row and fourth column may operate in the eighth place. Subsequently, a VCSEL unit in the first row and second column may operate in the ninth place. Subsequently, a VCSEL unit in the first row and fourth column may operate in the tenth place.

Subsequently, a VCSEL unit in the third row and second column may operate in the eleventh place. Subsequently, a VCSEL unit in the third row and fourth column may operate in the twelfth place. Subsequently, a VCSEL unit in the second row and first column may operate in the thirteenth place. Subsequently, a VCSEL unit in the second row and third column may operate in the fourteenth place. Subsequently, a VCSEL unit in the fourth row and first column may operate in the fifteenth place. Subsequently, a VCSEL unit in the fourth row and third column may operate in the sixteenth place.

When the VCSEL units 4570 included in the VCSEL array 4580 follow the sequence shown in FIG. 98, it is possible to minimize an increase in temperature of the VCSEL array 4580. When a second VCSEL unit adjacent to a first VCSEL unit operates after the first VCSEL unit operates, the temperature of the VCSEL array 4580 may increase by an increase in temperature due to the operation of the second VCSEL unit influencing an increase in temperature due to the operation of the first VCSEL unit.

However, when a third VCSEL unit not adjacent to a first VCSEL unit operates after the first VCSEL unit operates, the increase in temperature due to the operation of the third VCSEL unit may have less effect on the influence of an increase in temperature due to the operation of the first VCSEL unit than the increase in temperature due to the operation of the second VCSEL unit.

Accordingly, the increase in temperature of the VCSEL array 4580 may be less reduced when the third VCSEL unit not adjacent to the first VCSEL unit operates than when the second VCSEL unit adjacent to the first VCSEL unit operates.

The operation of the VCSEL array 4580 is not limited to the operation sequence shown in FIG. 99 and may follow another sequence for operating a VCSEL unit not adjacent to a VCSEL unit having previously operated.

Figure 100:
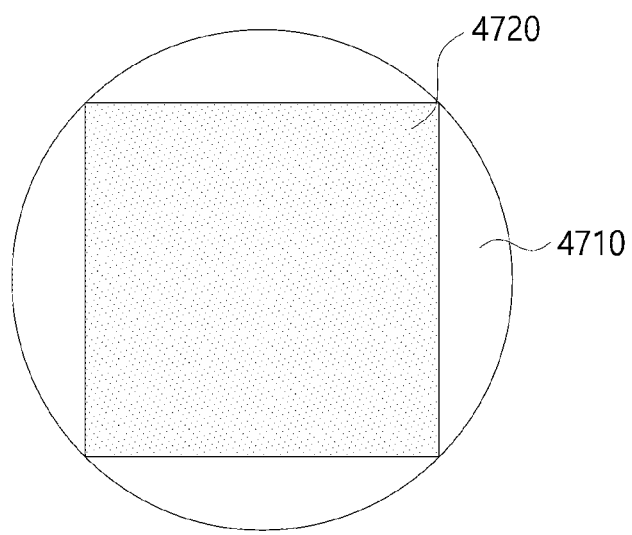
FIG. 100 is a diagram showing a wafer including a VCSEL array according to an embodiment.

FIG. 100 is a diagram showing a wafer including a VCSEL array according to an embodiment.

Referring to FIG. 100, a wafer 4700 may include a VCSEL array 4720. FIG. 100 shows that the wafer 4700 is in a circular shape. However, the present disclosure is not limited thereto, and the wafer 4700 may be in a polygonal shape or other shapes. FIG. 100 shows that the VCSEL array 4720 is in a polygonal shape. However, the present disclosure is not limited thereto, and the wafer 4700 may be in a circular shape or other shapes.

According to an embodiment, the wafer 4700 may be divided into a first region 4710, which does not include the VCSEL array 4720, and a second region 4720, which includes the VCSEL array 4720.

Since the first region 4710 does not include the VCSEL array 4720, the first region 4710 may be cut by a sawing process to reduce the size. However, the first region 4710 may be utilized as a contact region for the VCSEL array 4720 rather than being cut.

For example, a contact for supplying power to the VCSEL array 4720 may be disposed in the first region 4710. Also, for example, a VCSEL array of a shape different from the polygonal shape of the VCSEL array 4720 may be additionally disposed in the first region 4710.

For example, another VCSEL array that emits a laser beam of a wavelength different from the wavelength of a laser beam emitted by the VCSEL array 4720 may be additionally disposed in the first region 4710.

Also, for example, another VCSEL array that emits a laser beam with a divergence angle different from the divergence angle of a laser beam emitted by the VCSEL array 4720 may be additionally disposed in the first region 4710.

Figure 101:
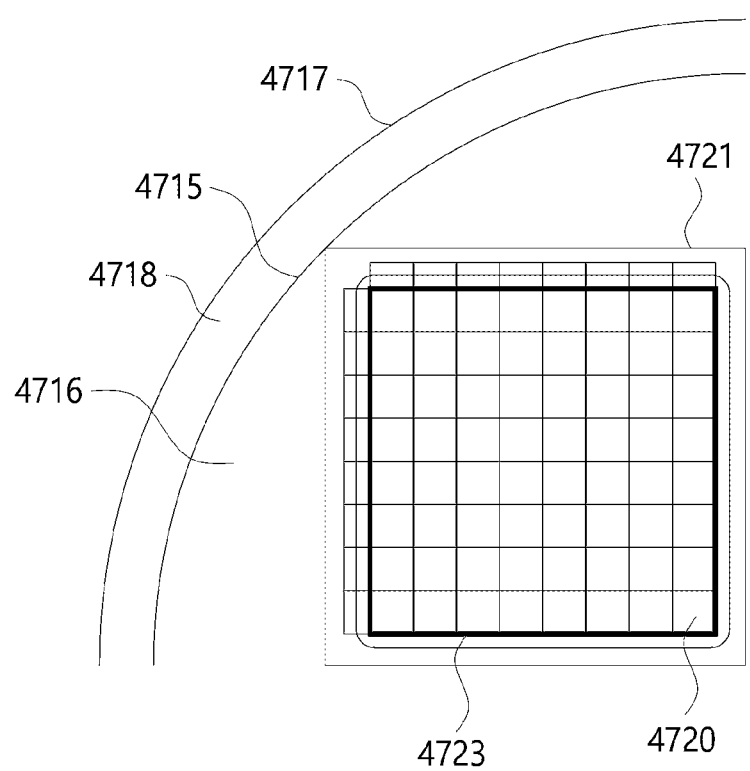
FIG. 101 is a diagram showing a layout of a VCSEL array and a wafer according to an embodiment.

FIG. 101 is a diagram showing a layout of a VCSEL array and a wafer according to an embodiment.

Referring to FIG. 101, a VCSEL array 4720 may be disposed in a wafer 4700. The wafer 4700 may include an available region 4716 and an unavailable region 4718.

According to an embodiment, the available region 4716 may be inside an available boundary 4715. The available region 4716 may be a region where a semiconductor disposed inside the wafer 4700 can operate.

According to an embodiment, the unavailable region 4718 may be a region between the available boundary 4715 and an edge of the wafer 4700. The unavailable region 4718 may be a region where the probability that the semiconductor disposed therein will operate is low. Alternatively, the unavailable region 4718 may be a region having a non-uniform doping concentration.

When the VCSEL array 4720 is disposed in the unavailable region 4718, the VCSEL array 4720 may not operate. In particular, when an active region 4723, which is a region where the VCSEL emitters in the VCSEL array 4720 are disposed, is included in the unavailable region 4718, the VCSEL emitters may not output laser beams.

However, when the VCSEL array 4720 is disposed only in the available region 4716, the area utilization of the wafer 4700 may be low.

For example, a region where no VCSEL emitters of the VCSEL array 4720 are disposed may be included in the unavailable region 4718.

That is, the VCSEL array 4720 may be disposed on both of the available region 4716 and the unavailable region 4718 rather than only on the available region 4716.

Figure 102:
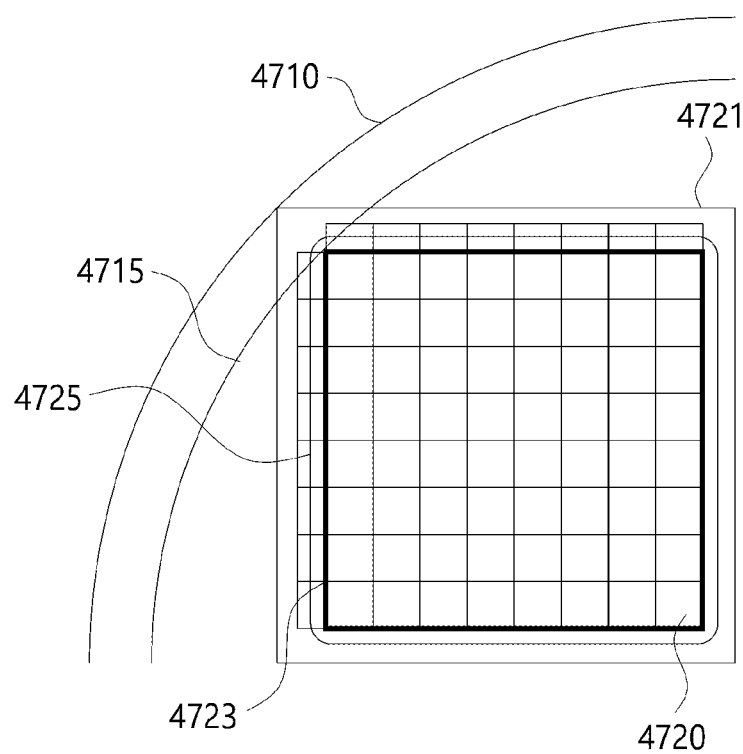
FIG. 102 is a diagram showing a layout of a VCSEL array and a wafer according to another embodiment.

FIG. 102 is a diagram showing a layout of a VCSEL array and a wafer according to another embodiment.

Referring to FIG. 102, the VCSEL array 4720 may be disposed on both of the available region 4716 and the unavailable region 4718 rather than only on the available region 4716.

According to an embodiment, the VCSEL array 4720 may include an edge 4721, an active region 4723 including a VCSEL emitter and a non-active region 4725 including no VCSEL emitter. In this case, a metal contact or passivation may be included in the non-active region 4725.

According to an embodiment, in order to improve the region utilization of the wafer, the VCSEL array 4720 may also be disposed in the unavailable region 4718.

For example, a portion of the edge 4721 and the non-active region 4725 of the VCSEL array 4720 may be included in the unavailable region 4718. In this case, the active region 4723 of the VCSEL array 4720 may not be included in the unavailable region 4718. In this case, the boundary of the active region 4723 of the VCSEL array 4720 may be in contact with the boundary between the available region 4716 and the unavailable region 4718.

By a portion of the edge 4721 and the non-active region 4725 of the VCSEL array 4720 being included in the unavailable region 4718, the ratio of the active region 4723 of the VCSEL array 4720 to the available region 4716 may increase. Alternatively, the number of VCSEL emitters to be disposed in the available region 4716 may increase.

Figure 103:
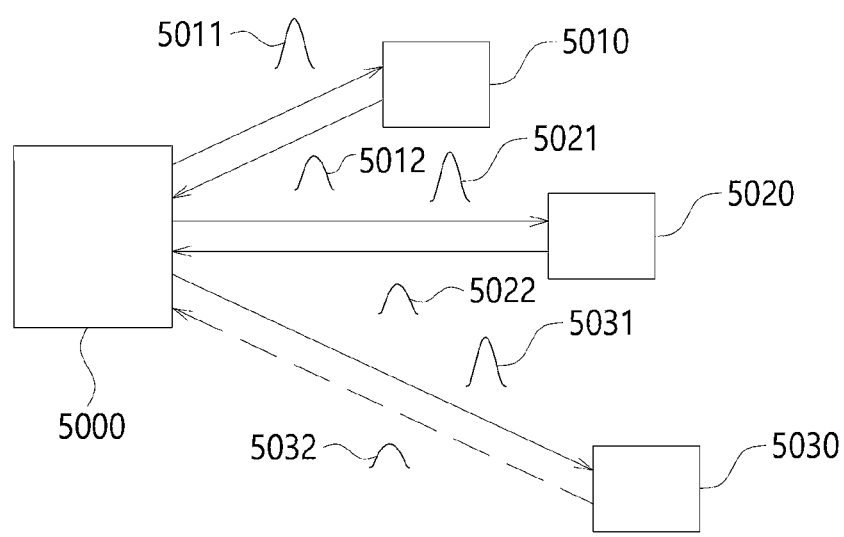
FIGS. 103 to 105 are diagrams illustrating a measurable distance of a LIDAR device according to an embodiment.
Figure 104:
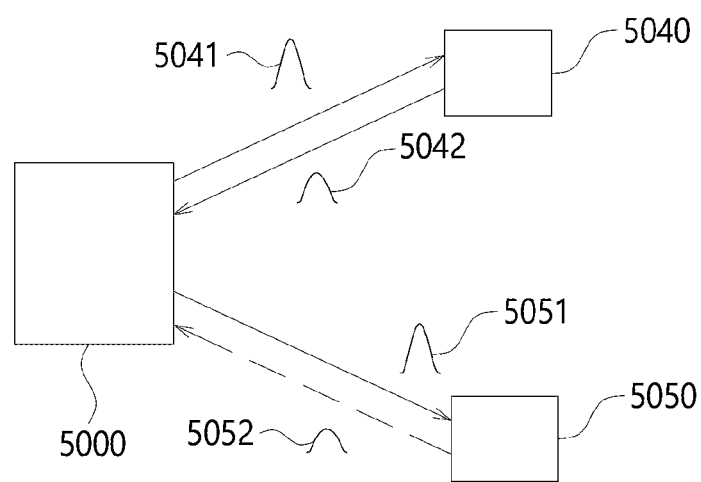
Figure 105:
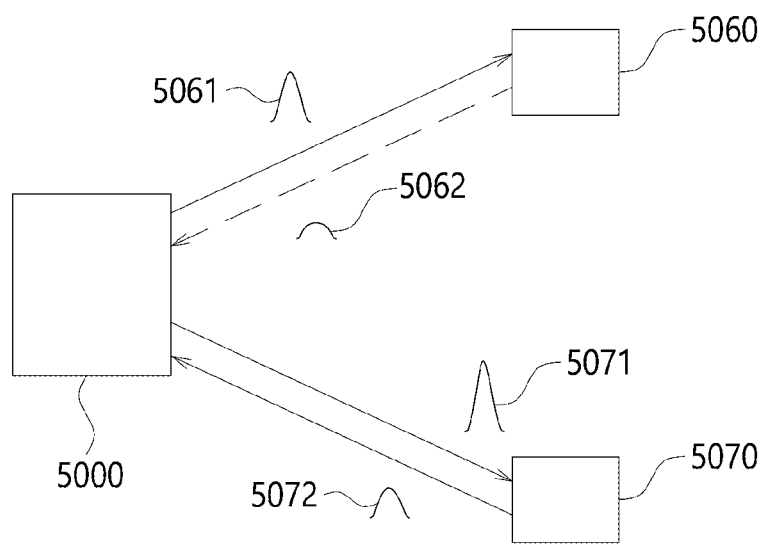

FIGS. 103 to 105 are diagrams illustrating a measurable distance of a LiDAR device according to an embodiment.

Referring to FIG. 103, the LiDAR device according to an embodiment may emit laser beams to a first object 5010, a second object 5020, and a third object 5030. In this case, the LiDAR device 5000 may emit a first laser beam 5011, a second laser beam 5021, and a third laser beam 5031 to the first object 5010, the second object 5020, and the third object 5030, respectively. For example, the LiDAR device 5000 may emit the first, second, and third laser beams 5011, 5021, and 5031 at the same time or may emit at least one of the laser beams independently.

Also, the LiDAR device 5000 may acquire a first reflected laser beam 5012 when the first laser beam 5011 emitted to the first object 5010 is reflected by the first object 5010. In this case, the LiDAR device 5000 may measure a distance from the LiDAR device 5000 to the first object 5010 based on a time at which the first reflected laser beam 5012 is received. For example, the LiDAR device 5000 may measure the distance from the LiDAR device 5000 to the first object 5010 based on a time at which the first laser beam 5011 is emitted and a time at which the first reflected laser beam 5012 is acquired, but the present disclosure is not limited thereto.

Also, the LiDAR device 5000 may acquire a second reflected laser beam 5022 when the second laser beam 5021 emitted to the second object 5020 is reflected by the second object 5020. In this case, the LiDAR device 5000 may measure a distance from the LiDAR device 5000 to the second object 5020 based on a time at which the second reflected laser beam 5022 is received. For example, the LiDAR device 5000 may measure the distance from the LiDAR device 5000 to the second object 5020 based on a time at which the second laser beam 5021 is emitted and a time at which the second reflected laser beam 5022 is acquired, but the present disclosure is not limited thereto.

Also, the LiDAR device 5000 may acquire a third reflected laser beam 5032 when the third laser beam 5031 emitted to the third object 5030 is reflected by the third object 5030. In this case, the LiDAR device 5000 may measure the distance from the LiDAR device 5000 to the third object 5030 based on a time at which the third reflected laser beam 5032 is received. For example, the LiDAR device 5000 may measure the distance from the LiDAR device 5000 to the third object 5030 based on a time at which the third laser beam 5031 is emitted and a time at which the third reflected laser beam 5032 is acquired, but the present disclosure is not limited thereto.

Also, the distance from the LiDAR device 5000 to the second object 5020 may be greater than the distance from the LiDAR device 5000 to the first object 5010. In this case, when the first laser beam 5011 has the same intensity as the second laser beam 5021, the intensity of the first reflected laser beam 5012 reflected by the first object 5010 may be greater than the intensity of the second reflected laser beam 5022 reflected by the second object 5020. Accordingly, the magnitude of a signal related to the first object 5010 and acquired by the LiDAR device 5000 may be greater than the magnitude of a signal related to the second object 5020 and acquired by the LiDAR device 5000.

Also, the distance from the LiDAR device 5000 to the third object 5030 may be greater than the distance from the LiDAR device 5000 to the second object 5020. In this case, when the second laser beam 5021 has the same intensity as the third laser beam 5031, the intensity of the second reflected laser beam 5022 reflected by the second object 5020 may be greater than the intensity of the third reflected laser beam 5032 reflected by the third object 5030. Accordingly, the magnitude of a signal related to the second object 5020 and acquired by the LiDAR device 5000 may be larger than the magnitude of a signal related to the third object 5030 and acquired by the LiDAR device 5000.

Accordingly, the intensity of a signal acquired by the LiDAR device 5000 may be associated with a distance to an object reflecting the laser beam. For example, the magnitude of the signal acquired by the LiDAR device 5000 may decrease as the distance from the LiDAR device 5000 to the object increases, and the magnitude of the signal acquired by the LiDAR device 5000 may increase as the distance to the object decreases, but the present disclosure is not limited thereto.

Also, the magnitude of a signal related to the third object 5030 and acquired by the LiDAR device 5000 may be smaller than the magnitude of a signal needed to measure a distance to the third object 5030. In this case, the magnitude of the related signal being smaller than the magnitude of the signal needed to measure the distance may mean that the absolute magnitude of the signal is small, that the magnitude of the signal is smaller than the magnitude of a reference signal for distance measurement, or that the magnitude of the signal is so small that the magnitude of the signal cannot be distinguished from that of noise. However, the present disclosure is not limited thereto.

As a result, when the magnitude of the signal related to the third object 5030 and acquired by the LiDAR device 5000 is smaller than the magnitude of the signal needed to measure the distance, the LiDAR device 5000 may not measure the distance to the third object.

Referring to FIG. 104, the LiDAR device according to an embodiment may emit laser beams to a fourth object 5040 and a fifth object 5050. In this case, the LiDAR device 5000 may emit a fourth laser beam 5041 and a fifth laser beam 5051 to the fourth object 5040 and the fifth object 5050, respectively. For example, the LiDAR device 5000 may emit the fourth and fifth laser beams 5041 and 5051 at the same time or may emit at least one of the laser beams independently.

Also, the LiDAR device 5000 may measure a distance to the fourth object 5040 and a distance to the fifth object 5050 using the fourth laser beam 5041 and the fifth laser beam 5051 as described above, and thus a detailed description thereof will be omitted.

Also, the fourth object 5040 and the fifth object 5050 may be objects which are located at the same distance from the LiDAR device 5000 and which have different reflectances. For example, the reflectance of the fourth object 5040 may be higher than the reflectance of the fifth object 5050, but the present disclosure is not limited thereto. Also, the reflectances of the fourth object 5040 and the fifth object 5050 may be determined based on color, material, or incidence angle, but the present disclosure is not limited thereto.

When the reflectance of the fourth object 5040 is higher than the reflectance of the fifth object 5050, the magnitude of a fourth reflected laser beam 5042 obtained by the fourth object 5040 reflecting the fourth laser beam 5041 may be larger than the magnitude of a fifth reflected laser beam 5052 obtained by the fifth object 5050 reflecting the fifth laser beam 5051. Accordingly, the magnitude of a signal related to the fourth object 5040 and acquired by the LiDAR device 5000 may be greater than the magnitude of a signal related to the fifth object 5050 and acquired by the LiDAR device 5000.

Accordingly, the intensity of a signal acquired by the LiDAR device 5000 may be associated with the reflectance of an object reflecting the laser beam. For example, the magnitude of the signal acquired by the LiDAR device 5000 may decrease as the reflectance of the object decreases, and the magnitude of the signal acquired by the LiDAR device 5000 may increase as the reflectance of the object increases, but the present disclosure is not limited thereto.

Also, the magnitude of a signal related to the fifth object 5050 and acquired by the LiDAR device 5000 may be smaller than the magnitude of a signal needed to measure a distance to the fifth object 5050. In this case, the magnitude of the related signal being smaller than the magnitude of the signal needed to measure the distance may mean that the absolute magnitude of the signal is small, that the magnitude of the signal is smaller than the magnitude of a reference signal for distance measurement, or that the magnitude of the signal is so small that the magnitude of the signal cannot distinguish from that of noise. However, the present disclosure is not limited thereto.

As a result, when the magnitude of the signal related to the fifth object 5050 and acquired by the LiDAR device 5000 is smaller than the magnitude of the signal needed to measure the distance, the LiDAR device 5000 may not measure the distance to the fifth object 5050.

Referring to FIG. 105, the LiDAR device according to an embodiment may emit laser beams to a sixth object 5060 and a seventh object 5070. In this case, the LiDAR device 5000 may emit a sixth laser beam 5061 and a seventh laser beam 5071 to the sixth object 5060 and the seventh object 5070, respectively. For example, the LiDAR device 5000 may emit the sixth laser beam 5061 and the seventh laser beam 5071 at the same time or may emit at least one of the laser beams independently.

Also, the sixth laser beam 5061 and the seventh laser beam 5071 may be emitted with different intensities. For example, the intensity of the seventh laser beam 5071 may be greater than the intensity of the sixth laser beam 5061, but the present disclosure is not limited thereto.

Also, the sixth laser beam 5061 and the seventh laser beam 5071 may be emitted in one frame or in different frames. For example, the sixth laser beam 5061 may be emitted in a first frame, and the seventh laser beam 5071 may be emitted in a second frame different from the first frame. Alternatively, the sixth laser beam 5061 may be emitted at a first time point of the first frame, and the seventh laser beam 5071 may be emitted at a second time point of the first frame.

Also, as shown in FIG. 105, the magnitude of a signal related to the sixth object 5060 and acquired by the LiDAR device 5000 may be smaller than the magnitude of a signal needed to measure a distance to the sixth object 5060. As a result, the cause of the magnitude of the signal related to the sixth object 5060 and acquired by the LiDAR device 5000 being smaller than the magnitude of the signal needed to measure the distance is that the distance from the LiDAR device 5000 to the sixth object 5060 is far or that the reflectance of the sixth object 5060 is low, but the present disclosure is not limited thereto.

Also, the conditions of the seventh object 5070, such as a distance, reflectance, or the like, may be substantially the same as those of the sixth object 5060. For example, the seventh object 5070 may be separated from the LiDAR device 5000 by the same distance as the distance from the LiDAR device 5000 to the sixth object 5060, and the reflectance of the seventh object 5070 may be substantially the same as the reflectance of the sixth object 5060.

However, the intensity of the seventh laser beam 5071 emitted to the seventh object 5070 may be greater than the intensity of the sixth laser beam 5061 emitted to the sixth object 5060. In this case, the magnitude of a signal related to the seventh object 5070 and acquired by the LiDAR device 5000 may be greater than the magnitude of a signal needed to measure a distance to the seventh object 5070.

Therefore, the intensity of a signal acquired by the LiDAR device 5000 may be associated with the intensity of an emitted laser beam. For example, the intensity of a signal acquired under the same conditions (reflectance or the like) may increase as the intensity of a laser beam emitted from the LiDAR device 5000 increases. This may satisfy a condition for improving a measurable distance.

As a result, the magnitude of the signal related to the sixth object 5060 and acquired by the LiDAR device 5000 may be smaller than the magnitude of the signal needed to measure the distance, and the magnitude of the signal related to the seventh object 5070 may be greater than the magnitude of the signal needed to measure the distance.

Accordingly, the LiDAR device 5000 may not measure the distance to the sixth object 5060 but may measure the distance to the seventh object 5070.

As a result, the intensity of the laser beam emitted from the LiDAR device 5000 should be increased in order to increase a measurable distance and improve accuracy according to various surrounding situations of the LiDAR device 5000, but the present disclosure is not limited thereto.

Figure 106:
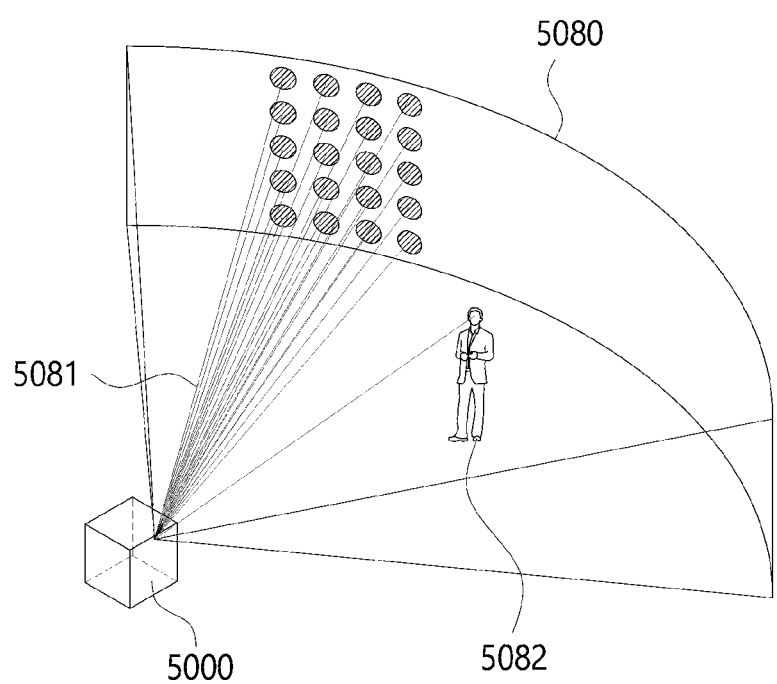
FIG. 106 is a diagram illustrating eye safety of a LiDAR device.

FIG. 106 is a diagram illustrating eye safety of a LiDAR device.

Referring to FIG. 106, the LiDAR device according to an embodiment may scan surrounding environments using laser beams.

In detail, the LiDAR device 5000 according to an embodiment may emit laser beams 5081 to surrounding environments. In this case, the irradiation direction of the laser beams 5081 may be continuously changed. For example, the LiDAR device 5000 may emit a first laser beam to a first point and emit a second laser beam to a second point. In this case, the first laser beam and the second laser beam may be emitted at the same time or may be emitted independently at different times.

Also, the LiDAR device 5000 according to an embodiment may generate a scan point using an emitted laser beam. In this case, the scan point may be generated in addition to the location at which the laser beam is emitted and the distance to the point at which the laser beam is reflected.

Also, the LiDAR device 5000 according to an embodiment may form a field of view (FOV) using the emitted laser beams. For example, when the LiDAR device 5000 according to an embodiment emits laser beams in the horizontal range between −60 degrees and +60 degrees and in the vertical range between −30 degrees and +30 degrees, a vertical FOV(FOV(V)) of 60 degrees and a horizontal FOV(FOV(H)) of 120 degrees may be formed. Accordingly, in this case, the LiDAR device 5000 may detect an object present in the horizontal range of 120 degrees and the vertical range of 60 degrees with respect to the LiDAR device 5000 or may measure a distance to the object.

In this case, a person 5082 may be present within the FOV of the LiDAR device 5000 in an environment in which the LiDAR device 5000 is installed. In this case, at least some laser beams emitted from the LiDAR device 5000 may be emitted to the eyes of the person 5082, and the intensity of the laser beams 5081 may affect the eyes of the person 5082.

Accordingly, it may be necessary for the laser beams 5081 emitted from the LiDAR device 5000 to satisfy the eye safety condition for preventing the laser beams 5081 from affecting the eye health of the person 5082.

As a result, it may be necessary for the LiDAR device 5000 to increase the intensity of the emitted laser beams 5081 in order to increase the measurable distance and improve the accuracy. However, it may be necessary for the LiDAR device 5000 to emit the laser beams 5081 with a certain intensity or less in order not to affect the eye health of the person 5082.

Accordingly, it may be necessary to design a laser emitting unit capable of satisfying the eye safety condition and increasing the measurable distance. The laser emitting unit for satisfying the eye safety condition and increasing the measurable distance will be described below.

Figure 107:
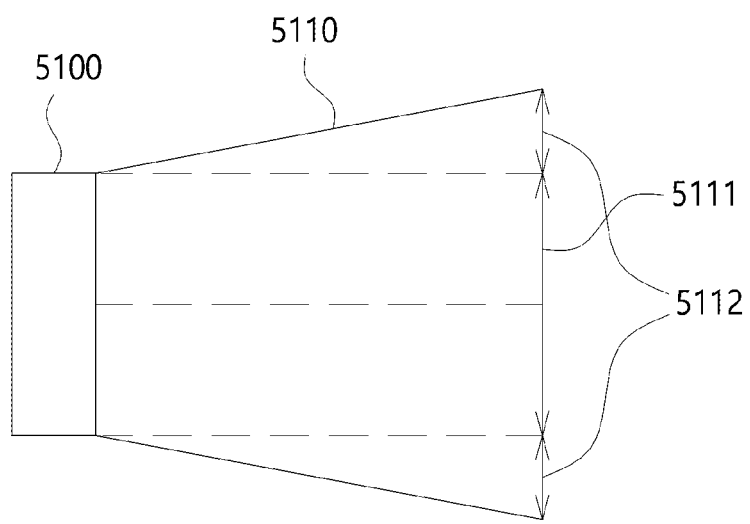
FIGS. 107 and 108 are diagrams illustrating laser beam divergence according to an embodiment.
Figure 108:
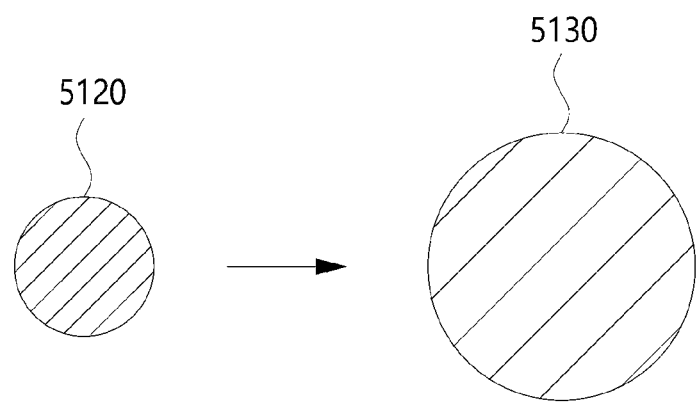

FIGS. 107 and 108 are diagrams illustrating laser beam divergence according to an embodiment.

Referring to FIGS. 107 and 108, a laser emitting unit 5100 according to an embodiment may emits a laser beam 5110. In this case, the laser beam 5110 emitted from the laser emitting unit 5100 may be diffused and emitted at a predetermined angle or more. For example, the laser beam 5110 may be emitted such that the irradiation area is larger than an area 5111 of a parallel laser beam that is initially emitted. In detail, since the laser beam 5110 is diffused and emitted at a certain angle or more, the spot size of the laser beam 5110 may be larger, by an area 5112 caused by the diffusion, than the area 5111 of the parallel laser beam that is initially emitted at a certain distance.

Also, the laser beam 5110 emitted from the laser emitting unit 5100 may vary in spot size depending on the distance. For example, the laser beam 5110 may have a spot size equal to the size of a first spot 5120 at a first distance, and the laser beam 5110 may have a spot size equal to the size of a second spot 5130 at a second distance greater than the first distance. In this case, as shown in FIG. 109, the size of the second spot 5130 may be greater than the size of the first spot 5120 due to the divergence angle of the laser beam 5110.

Also, the laser beam 5110 emitted from the laser emitting unit 5100 may vary in light density depending on the distance. For example, the laser beam 5110 may have a first light density corresponding to the first spot 5120 at the first distance and may have a second light density corresponding to the second spot 5130 at the second distance. In this case, the first light density may be greater than the second light density. This may be because the size of the second spot 5130 at the second distance is greater than the size of the first spot 5120 at the first distance by the divergence angle of the laser beam 5110 but the first spot 5120 and the second spot 5130 should have the same energy.

Accordingly, when the laser beam 5110 emitted from the laser emitting unit 5100 is diffused with a divergence angle, the laser beam 5110 may increase in spot size and decrease in light density as the distance increases.

Figure 109:
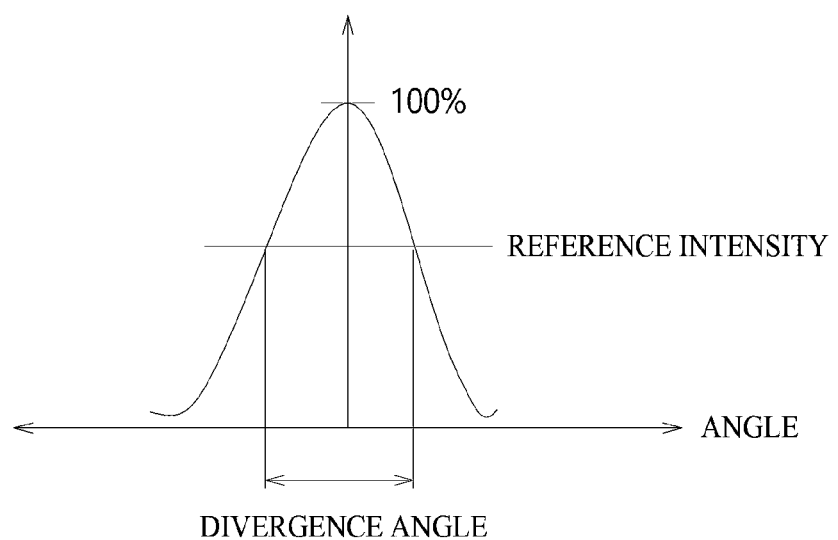
FIG. 109 is a diagram illustrating a divergence angle using a laser beam profile according to an embodiment.

FIG. 109 is a diagram illustrating a divergence angle using a laser beam profile according to an embodiment.

Referring to FIG. 109, a profile of a laser beam according to an embodiment may be in a Gaussian form. However, the present disclosure is not limited thereto, and the profile of the laser beam may be in various forms such as non-Gaussian, top-hat, and the like.

Also, a divergence angle of a laser beam according to an embodiment may be determined on the profile and intensity of the laser beam. For example, when the profile of the laser beam is in a Gaussian form, the divergence angle of the laser beam may be from a point corresponding to a laser beam mid-intensity to a point corresponding to a reference intensity.

In this case, the reference intensity may be 10%, 20%, 30%, 40%, 50%, 60%, 70%, 80%, 90%, or 100% of the laser beam mid-intensity, but the present disclosure is not limited thereto.

Also, the reference intensity may be 1/e2 of the laser beam mid-intensity, but the present disclosure is not limited thereto.

Therefore, hereinafter, only laser beams within a divergence angle may be referred to as laser beams for convenience of description. For example, referring to FIG. 109, a laser beam within a divergence angle and with an intensity ranging from the reference intensity to the laser beam mid-intensity may be referred to as a laser beam.

Figure 110:
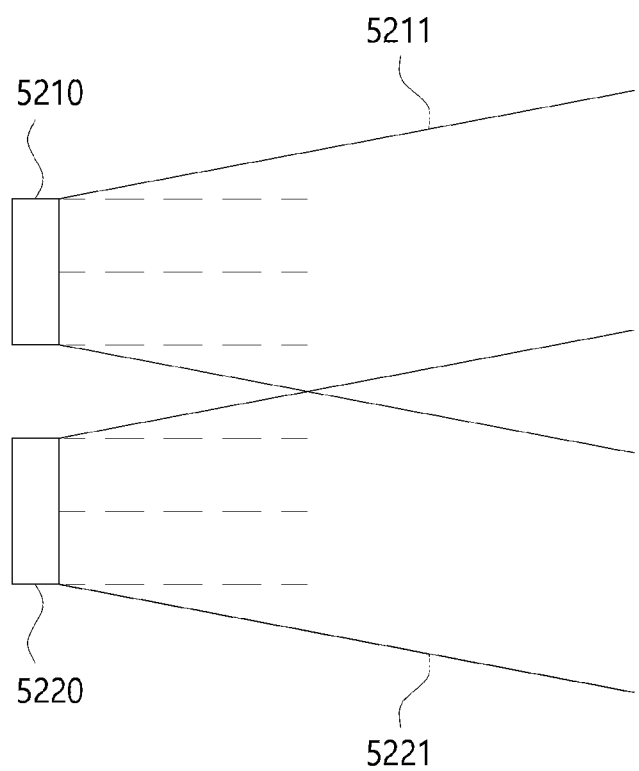
FIGS. 110 and 111 are diagrams illustrating a laser beam output unit including a plurality of laser emitting elements according to an embodiment.
Figure 111:
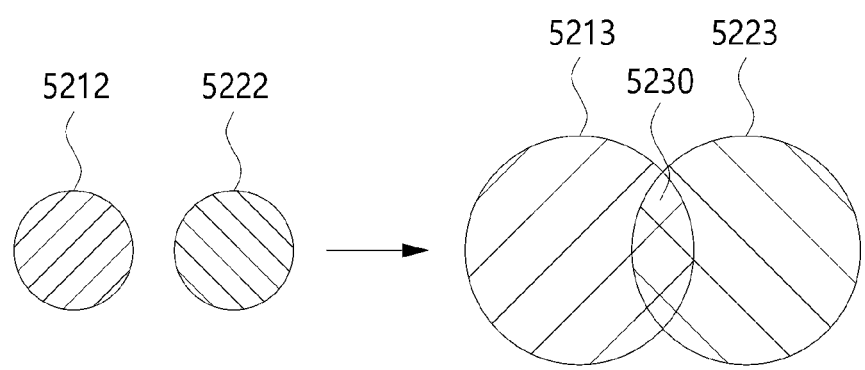

FIGS. 110 and 111 are diagrams illustrating a laser emitting unit including a plurality of laser emitting elements according to an embodiment.

Referring to FIG. 110, a laser emitting unit 5200 according to an embodiment may include a first laser emitting element 5210 and a second laser emitting element 5220. In this case, the first laser emitting element 5210 and the second laser emitting element 5220 may include a VCSEL and may also include a VCSEL unit including a plurality of VCSELs, but the present disclosure is not limited thereto. Also, each of the first laser emitting element 5210 and the second laser emitting element 5220 may also include a VCSEL array, which include a VCSEL unit including a plurality of VCSELs, but the present disclosure is not limited thereto.

Also, when each laser emitting element includes a VCSEL unit or a VCSEL array, parameters such as intensity and density of a laser beam emitted from the laser emitting element may refer to the average of laser beams emitted from VCSEL emitters included in the VCSEL unit or VCSEL array but the present disclosure is not limited thereto.

Also, the first laser emitting element 5210 may emits a first laser beam 5211, and the second laser emitting element 5220 may emits a second laser beam 5221. In this case, the first laser beam 5211 and the second laser beam 5221 may have respective divergence angles.

Also, the first laser beam 5211 and the second laser beam 5221 may increase in spot size as the distance from the laser emitting unit increases.

Also, the first laser beam 5211 and the second laser beam 5221 may overlap after traveling a certain distance from the laser emitting unit. In this case, the overlap may mean that a portion of the first and second laser beams 5211 and 5221 is emitted to the same region in space. For example, referring to FIG. 111, a spot 5212 of the first laser beam 5211 at a first distance may not overlap a spot 5222 of the second laser beam 5221 at the first distance, but a spot 5213 of the first laser beam 5211 at a second distance greater than the first distance may overlap a spot 5223 of the second laser beam 5221 at the second distance.

Also, the first laser beam 5211 and the second laser beam 5221 may decrease in light density as the distance from the laser emitting unit increases. For example, the light density of the spot 5212 of the first laser beam 5211 at the first distance may be greater than the light density of the spot 5213 of the first laser beam 5211 at the second distance.

Also, the first laser beam 5211 and the second laser beam 5221 may be emitted at the same time. In this case, when the first laser beam 5211 and the second laser beam 5221 are emitted at the same time, the first laser beam 5211 and the second laser beam 5221 may overlap after traveling a certain distance from the laser emitting unit.

Also, when the first laser beam 5211 and the second laser beam 5221 are emitted at the same time to overlap, the light density of a region where the first laser beam 5211 and the second laser beam 5221 overlap may increase. For example, the light density of a region 5230 where the spot 5213 of the first laser beam 5211 and the spot 5223 of the second laser beam 5221 overlap at the second distance may increase due to the overlap between the first laser beam 5211 and the second laser beam 5221.

Also, when the first and second laser beams 5211 and 5221 have the same light density in the spot, the region 5230 where the first and second laser beams 5211 and 5221 overlap at the second distance may have a light density twice that of a region where the first and second laser beams 5211 and 5221 do not overlap.

Accordingly, the intensity of laser beams in the region where the first and second laser beams 5211 and 5221 overlap may be greater than the intensity of laser beams in the region where the first and second laser beams 5211 and 5221 do not overlap. When the laser emitting unit 5200 is attached to a LiDAR device, the region where the first and second laser beams 5211 and 5221 overlap may have a greater measurable distance than the region where the first and second laser beams 5211 and 5221 do not overlap.

Figure 112:
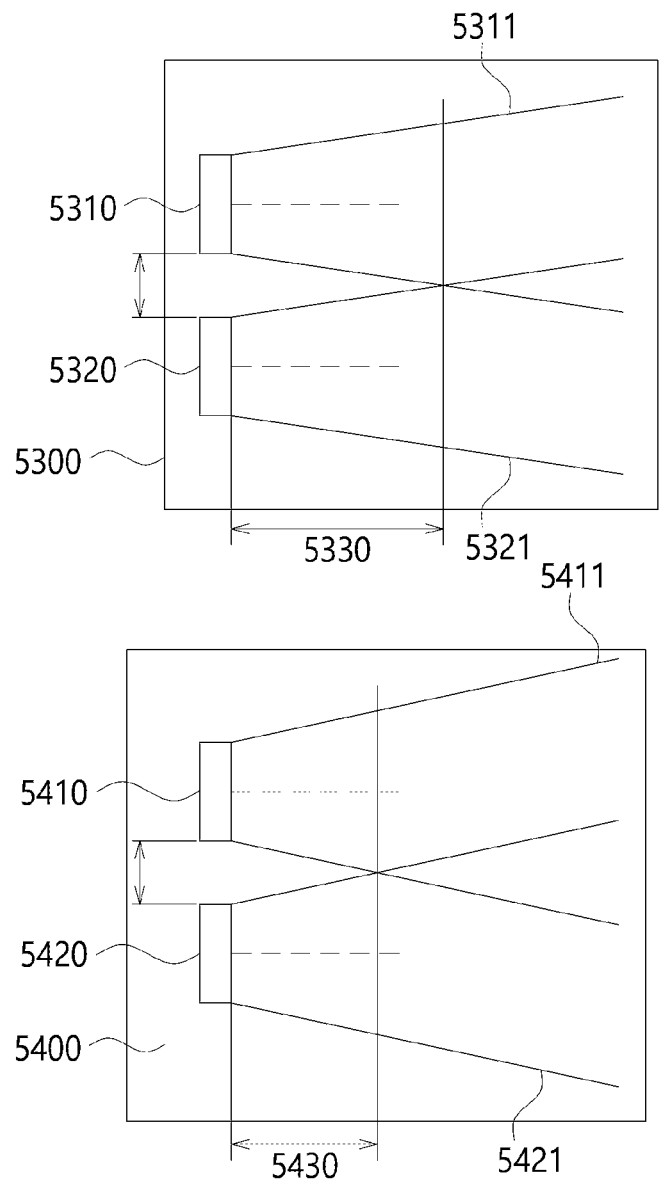
FIG. 112 is a diagram illustrating an overlap distance corresponding to laser beam divergence according to an embodiment.

FIG. 112 is a diagram illustrating an overlap distance corresponding to laser beam divergence according to an embodiment.

Referring to FIG. 112, a first laser emitting unit 5300 according to an embodiment may include a laser emitting element 5310 and a second laser emitting element 5320, and a second laser emitting unit 5400 may include a third laser emitting element 5410 and a fourth laser emitting element 5420. In this case, it has been described that each laser emitting element may become various laser emitting elements such as a VCSEL, and thus a detailed description thereof will be omitted.

Also, the first laser emitting element 5310 and the second laser emitting element 5320 included in the first laser emitting unit 5300 may emits a first laser beam 5311 and a second laser beam 5321 at a first divergence angle, respectively. For example, the first and second laser emitting elements 5310 and 5320 may emits the first and second laser beams 5311 and 5321 at a divergence angle of 1.2 degrees, respectively, but the present disclosure is not limited thereto.

Also, the third laser emitting element 5410 and the fourth laser emitting element 5420 included in the second laser emitting unit 5400 may emits a third laser beam 5411 and a fourth laser beam 5421 at a second divergence angle, respectively. For example, the third and fourth laser emitting elements 5410 and 5420 may emits the third and fourth laser beams 5411 and 5421 at a divergence angle of 1.8 degrees, respectively, but the present disclosure is not limited thereto.

Also, the second divergence angle of the third and fourth laser beams 5411 and 5421 may be set to be greater than the first divergence angle of the first and second laser beams 5311 and 5321, but the present disclosure is not limited thereto.

Also, the first and second laser emitting elements 5310 and 5320 may be spaced a first distance from each other, and the third and fourth laser emitting elements 5410 and 5420 may be spaced a second distance from each other. In this case, the first distance and the second distance may be the same. However, the present disclosure is not limited thereto, and the first distance and the second distance may be different.

Also, when the spacings between the laser emitting elements included in the laser emitting unit are the same, a laser beam overlap distance may be changed according to the divergence angle of laser beams emitted from the laser emitting elements. In detail, the laser beam overlap distance may decrease as the divergence angle of laser beams emitted from the laser emitting elements increases.

For example, as shown in FIG. 112, when the first distance and the second distance are the same and the first divergence angle is smaller than the second divergence angle, a distance 5330 by which the first and second laser beams 5311 and 5321 overlap may be greater than a distance 5430 by which the third and fourth laser beams 5411 and 5421 overlap.

In detail, the first and second laser emitting elements 5310 and 5320 may be spaced 1 cm apart from each other. When the first divergence angle of the first and second laser beams 5311 and 5321 is 1.2 degrees, the distance 5330 by which the first and second laser beams 5311 and 5321 overlap may be about 47 cm.

Also, the third and fourth laser emitting elements 5410 and 5420 may be spaced 1 cm apart from each other. When the second divergence angle of the third and fourth laser beams 5411 and 5421 is 1.8 degrees, the distance 5430 by which the third and fourth laser beams 5411 and 5421 overlap may be about 31 cm.

Figure 113:
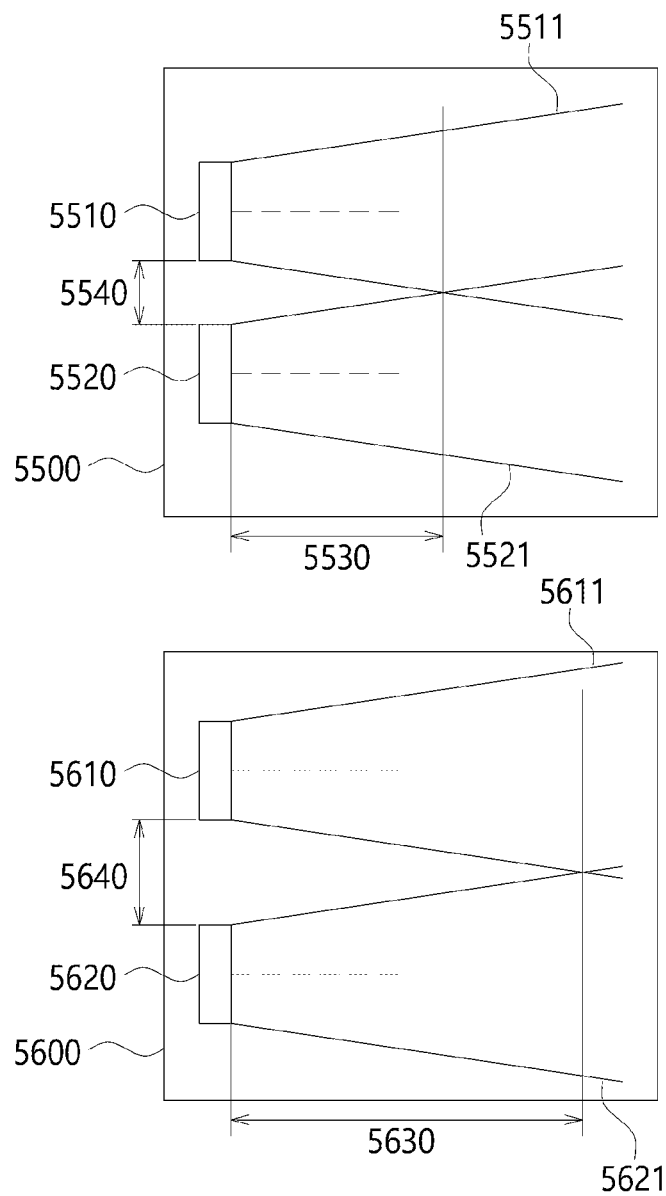
FIG. 113 is a diagram illustrating a laser beam overlap distance corresponding to a distance between laser emitting elements.

FIG. 113 is a diagram illustrating a laser beam overlap distance corresponding to a distance between laser emitting elements.

Referring to FIG. 113, according to an embodiment, a first laser emitting unit 5500 may include a first laser emitting element 5510 and a second laser emitting element 5520, and a second laser emitting unit 5600 may include a third laser emitting element 5610 and a fourth laser emitting element 5620. In this case, as described above, each laser emitting element may become various laser emitting elements such as a VCSEL, and thus a detailed description thereof will be omitted.

Also, the first laser emitting element 5510 and the second laser emitting element 5520 included in the first laser emitting unit 5500 may emits a first laser beam 5511 and a second laser beam 5521 at a first divergence angle, respectively. For example, the first and second laser emitting elements 5510 and 5520 may emits the first and second laser beams 5511 and 5521 at a divergence angle of 1.2 degrees, respectively, but the present disclosure is not limited thereto.

Also, the third laser emitting element 5610 and the fourth laser emitting element 5620 included in the second laser emitting unit 5600 may emits a third laser beam 5611 and a fourth laser beam 5621 at a second divergence angle, respectively. For example, the third and fourth laser emitting elements 5610 and 5620 may emits the third and fourth laser beams 5611 and 5621 at a divergence angle of 1.2 degrees, respectively, but the present disclosure is not limited thereto.

For example, the first divergence angle and the second divergence angle may be set to be the same, but the present disclosure is not limited thereto.

Also, the first and second laser emitting elements 5510 and 5520 may be spaced a first distance from each other, and the third and fourth laser emitting elements 5610 and 5620 may be spaced a second distance from each other. In this case, the first distance and the second distance may be different. However, the present disclosure is not limited thereto, and the first distance and the second distance may be the same.

Also, when the divergence angles of laser beams emitted from laser emitting elements included in a laser emitting unit are the same, a laser beam overlap distance may be changed according to the spacing between the laser emitting elements. In detail, the laser beam overlap distance may increase as the spacing between the laser emitting elements increases.

For example, as shown in FIG. 113, when the first divergence angle and the second divergence angle are the same and a distance 5460 between the third and fourth laser emitting elements 5610 and 5620 is greater than a distance 5540 between the first and second laser emitting elements 5510 and 5520, the distance 5430 by which the third and fourth laser beams 5611 and 5621 overlap may be greater than the distance 5530 by which the first and second laser beams 5511 and 5521 overlap.

In detail, the first and second laser emitting elements 5510 and 5520 may be spaced 1 cm apart from each other. When the first divergence angle of the first and second laser beams 5511 and 5521 is 1.2 degrees, the distance 5330 by which the first and second laser beams 5511 and 5521 overlap may be about 47 cm.

Also, the third and fourth laser emitting elements 5610 and 5620 may be spaced 2 cm apart from each other. When the second divergence angle of the third and fourth laser beams 5611 and 5621 is 1.2 degrees, the distance 5630 by which the third and fourth laser beams 5611 and 5621 overlap may be about 94 cm.

Therefore, considering those described above with reference to FIGS. 112 and 113, it can be seen that a distance by which laser beams emitted from a plurality of laser emitting elements overlap may be associated with the spacing between the plurality of laser emitting elements and the divergence angles of the laser beams emitted from the plurality of laser emitting elements.

That is, when it is assumed that a distance between two laser emitting elements is d, the divergence angle of laser beams emitted from two laser emitting elements is θ, and a distance at which laser beams emitted from two laser emitting elements overlap is D, the following Equation may be satisfied.

$$D = \frac{d}{2\tan\left(\frac{\theta}{2}\right)}$$

Figure 114:
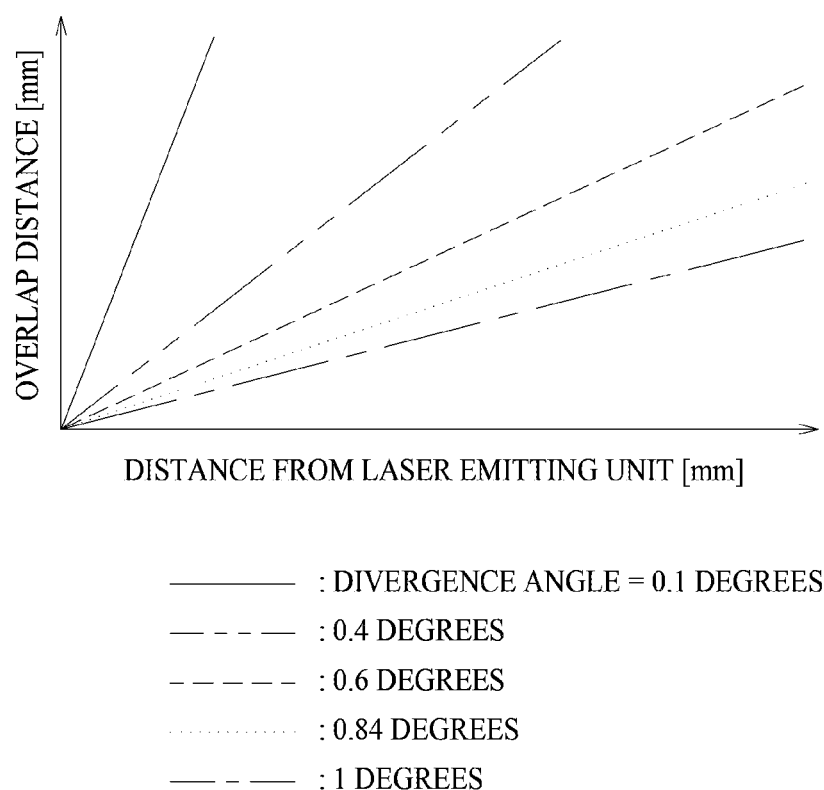
FIG. 114 is a graph in which a correlation between an overlap distance and a distance between laser emitting elements is expressed for each divergence angle.

As a result, the distance d between the laser emitting elements and the distance D by which the laser beams overlap may have a linear relationship with one divergence angle, and this will be expressed through the graph of FIG. 114.

FIG. 114 is a graph in which a correlation between an overlap distance and a distance between laser emitting elements is expressed for each divergence angle.

Accordingly, referring to FIG. 114 and the above-described equation, by adjusting the divergence angle and the distance between laser emitting elements, it is possible to design a desired overlap distance.

Figure 115:
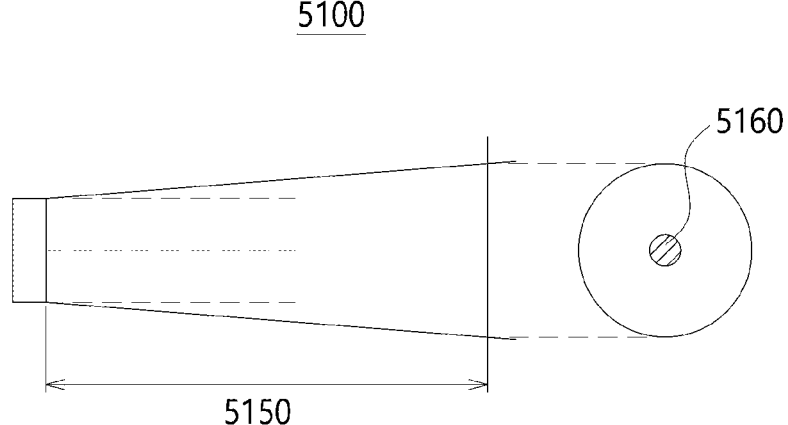
FIG. 115 is a diagram illustrating an eye safety criterion.

FIG. 115 is a diagram illustrating an eye safety criterion.

A criterion for preventing laser beams emitted from a LiDAR device from affecting human eye health as described above with reference to FIG. 106 may be provided.

In order to prevent laser beams emitted from the LiDAR device from affecting human eye health, there is a design need to avoid affecting human eye health even when human eyes are placed at the minimum distance accessible by people while the LiDAR device is used.

Also, there is a design need to prevent the optical energy of light received through human eyes from affecting human eye health.

Therefore, when the optical energy of light passing through a reference area at a reference distance does not affect human eye health, laser beams may not affect human eye health while the LiDAR device is used.

For example, when the optical energy of light received in a reference area 5160 that can correspond to the size of a human eye and that is spaced a reference distance 5150 from the laser emitting unit 5100 does not affect human eye health, laser beams may not affect human eye health while the LiDAR device is used.

In detail, when energy of a laser beam received in a circular area that has a diameter of 7 mm and that is spaced 10 cm from the laser emitting unit 5100 does not affect human eye health, the laser beam may not affect human eye health when the LiDAR device is used. However, the reference distance 5150 and the reference area 5160 may vary depending on the installation location, environments, and the like of the LiDAR device.

Figure 116:
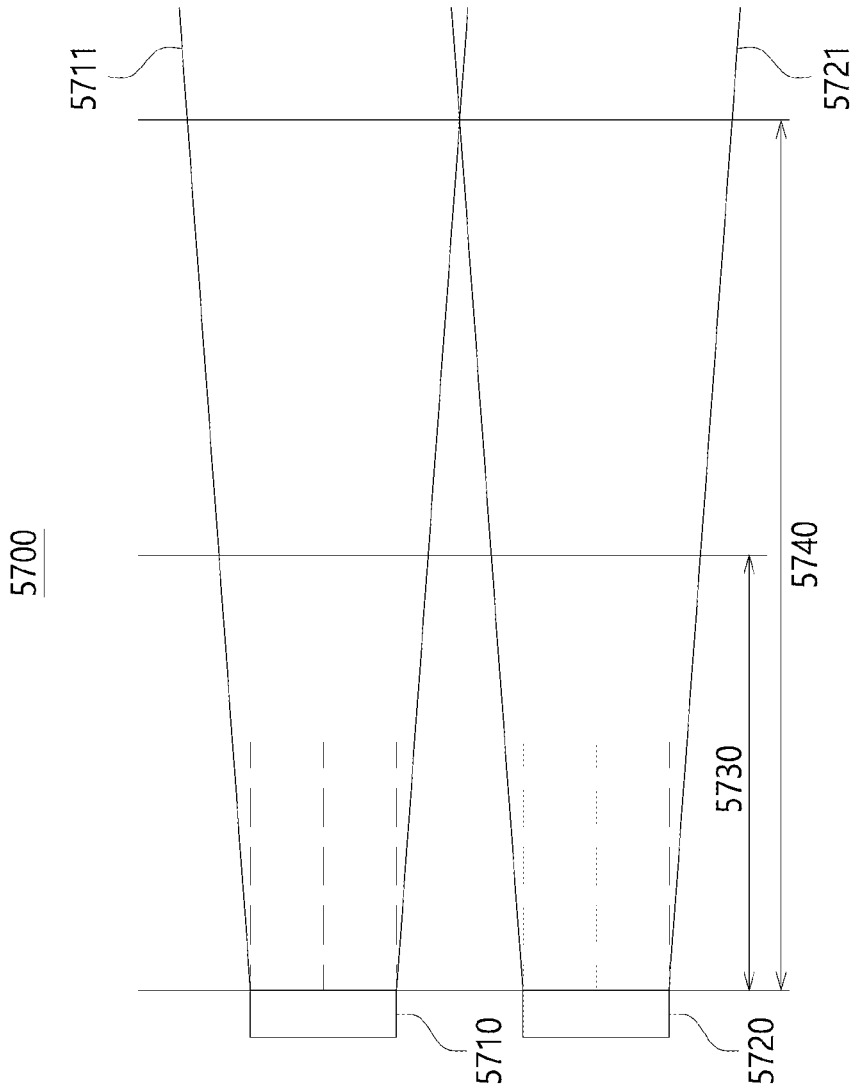
FIG. 116 is a diagram illustrating an overlap distance and a reference distance of a laser beam output unit according to an embodiment.

FIG. 116 is a diagram illustrating an overlap distance and a reference distance of a laser emitting unit according to an embodiment.

Referring to FIG. 116, a laser emitting unit 5700 according to an embodiment may include a first laser emitting element 5710 and a second laser emitting element 5720. In this case, it has been described that each laser emitting element may become various laser emitting elements such as a VCSEL, and thus a detailed description thereof will be omitted.

Also, the first laser emitting element 5710 may emits a first laser beam 5711, and the first laser beam 5711 may have a first divergence angle.

Also, the second laser emitting element 5720 may emits a second laser beam 5721, and the second laser beam 5721 may have a second divergence angle.

In this case, the first divergence angle and the second divergence angle may be the same. However, the present disclosure is not limited thereto, and the first divergence angle and the second divergence angle may be different.

Also, the first and second laser beams 5711 and 5721 may have first and second light densities at a first distance 5730. In this case, the first distance 5730 may be a reference distance for eye safety.

Also, the first and second laser emitting elements 5710 and 5720 may emits laser beams independently of each other. Also, the second laser emitting element 5720 may emits the second laser beam 5721 at a predetermined time after the first laser emitting element 5710 emitteds the first laser beam 5711.

Also, the first and second light densities of the first and second laser beams 5711 and 5721 at the first distance 5730 may be light densities that do not affect human eye health.

Accordingly, when the first laser beam 5711 has a first light density that does not affect human eye health at the first distance 5730, the light density of the first laser beam 5711 at a distance greater than the first distance 5730 is less than or equal to the first light density, and thus the first laser beam 5711 may not affect human eye health.

Also, when the second laser beam 5721 has a second light density that does not affect human eye health at the first distance 5730, the light density of the second laser beam 5721 at a distance greater than the first distance 5730 is less than or equal to the second light density, and thus the second laser beam 5721 may not affect human eye health.

Also, the first and second laser emitting elements 5710 and 5720 may emits laser beams at the same time. For example, the first and second laser emitting elements 5710 and 5720 may emits the first and second laser beams 5711 and 5721 simultaneously.

In this case, since some portions of the first and second laser beams 5711 and 5721 overlap, the light density increases in the overlap region, and thus it is possible to increase a distance measurable with a laser beam.

However, although the first and second laser beams 5711 and 5721 may not affect human eye health, when the first and second laser beams 5711 and 5721 overlap, the light density may increase in the overlap region and thus may affect human eye health.

For example, although the first and second laser beams 5711 and 5721 have light densities that do not affect human eye health at the first distance 5730, when a distance by which the first and second laser beams 5711 and 5721 overlap is less than or equal to the first distance 5730 unlike FIG. 38, the light density increases in the overlap region and thus may affect human eye health.

Accordingly, as shown in FIG. 116, it may be necessary for a distance 5740 by which the first and second laser beams 5711 and 5721 overlap to be greater than or equal to the first distance 5730.

Also, it has been described in detail with reference to FIGS. 110 to 113 that the distance 5740 by which the first and second laser beams 5711 and 5721 overlap may be designed using the spacing between the first and second laser emitting elements 5710 and 5720 and the divergence angle of the first and second laser beams 5711 and 5721, and thus a detailed description thereof will be omitted.

Figure 117:
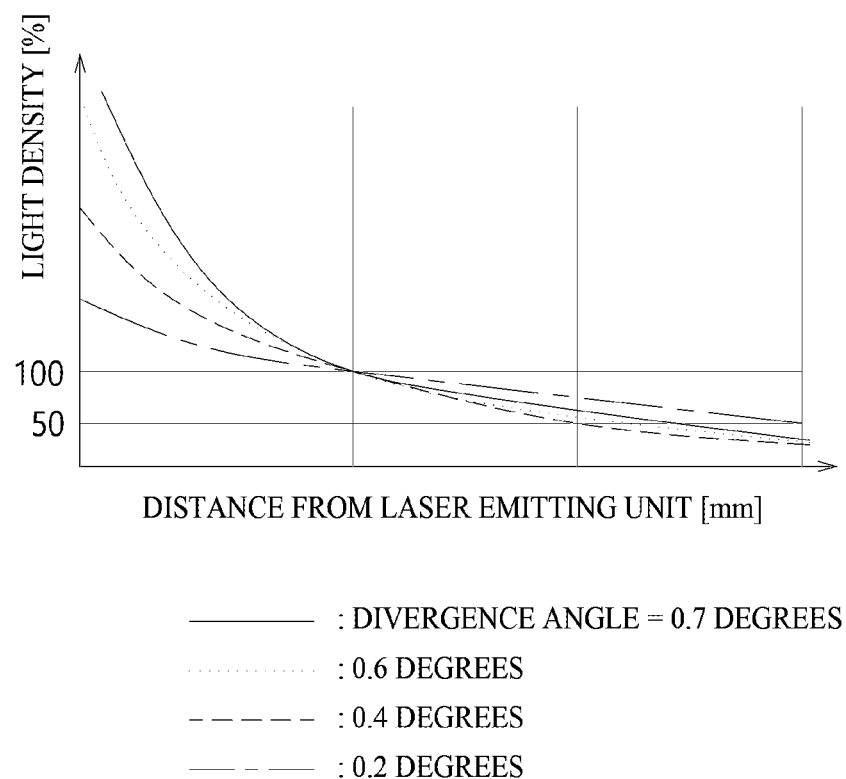
FIG. 117 is a graph in which a correlation between the light density of a laser beam output from a laser beam output element and a distance from the laser beam output element is expressed for each divergence angle.

FIG. 117 is a graph in which a correlation between the light density of a laser beam emitted from a laser emitting element and a distance from the laser emitting element is expressed for each divergence angle.

Referring to FIG. 117, the X-axis of the graph may refer to a distance from a laser emitting element, and the Y-axis may refer to a light density. In detail, the Y-axis of the graph may indicate light densities in units of percentage when a light density at a reference distance is set to 100%.

Also, referring to the graph, a correlation between the light density of a laser beam for each divergence angle and a distance from a laser emitting element can be seen.

In detail, as the divergence angle increases, the distance from the laser emitting element increases, and thus the degree to which the light density decreases may increase. For example, for a laser beam with a divergence angle of 0.7 degrees to have a light density of 100% at a reference distance, the laser beam has to be emitted with a light density of 400% or greater. However, for a laser beam with a divergence angle of 0.2 degrees to have a light density of 100% at a reference distance, it may be necessary for the laser beam to be emitted with a light density of 200% or less.

Also, a distance at which a laser beam has a light density of 50% may differ depending on the divergence angle of the laser beam. For example, a distance at which a laser beam with a divergence angle of 0.7 degrees has a light density of 50% may be shorter than a distance at which a laser beam with a divergence angle of 0.2 degrees has a light density of 50%.

Accordingly, a distance at which a laser beam has a light density equal to 50% of the light density at the reference distance may be determined according to the divergence angle.

Also, when a plurality of laser emitting elements are used, a distance at which a light density becomes 50% may be more important than a light density at a reference distance. For example, when laser beams emitted from the plurality of laser emitting elements overlap, a light density increases in the overlap region. However, when a distance at which the laser beams overlap is a distance at which the light densities of the laser beams are equal to 50% or less of the light density at the reference distance, the light density increased in the overlap region may not exceed the light density at the reference distance. Accordingly, in this case, the light density increased in the overlap region may not affect human eye health.

Using this, it is possible to design a laser emitting unit that does not affect human eye health but increases a measurable distance, and details thereof will be described below.

Figure 118:
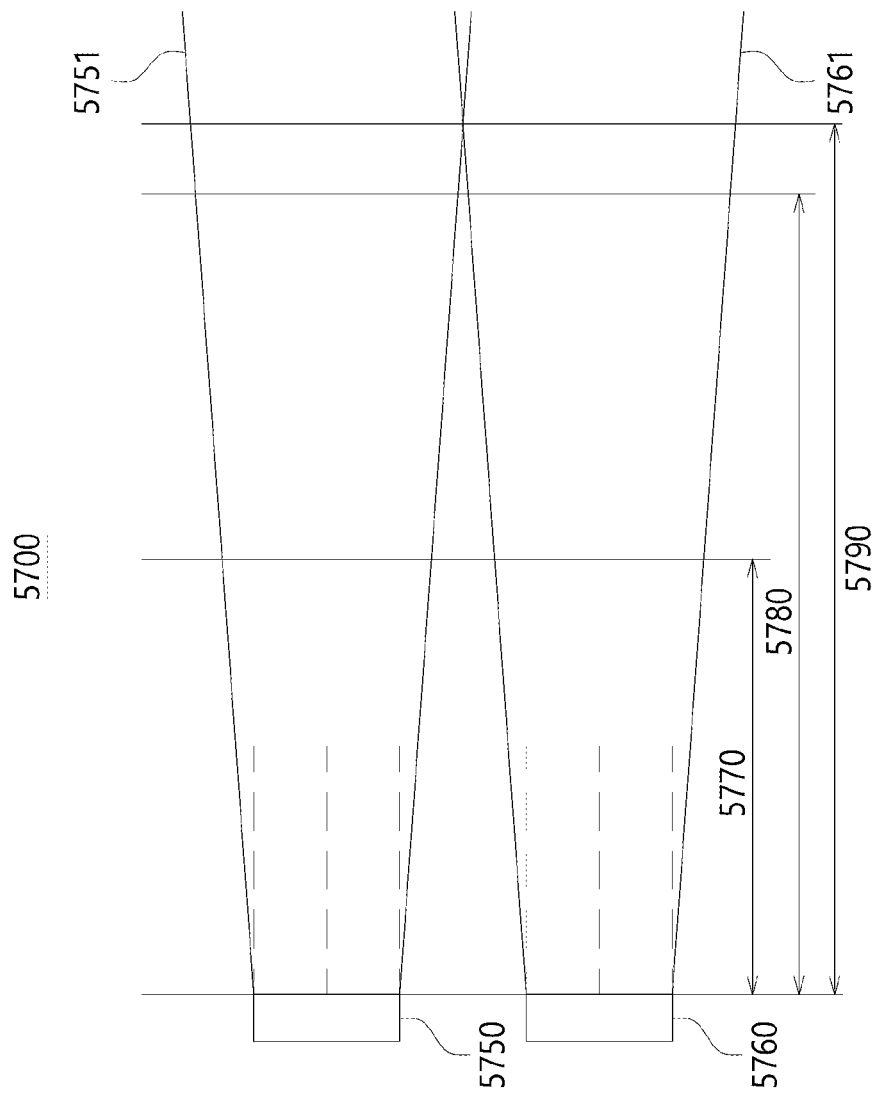
FIG. 118 is a diagram illustrating an overlap distance and a reference distance of a laser beam output unit according to an embodiment.

FIG. 118 is a diagram illustrating an overlap distance and a reference distance of a laser emitting unit according to an embodiment.

Referring to FIG. 118, a laser emitting unit 5700 according to an embodiment may include a first laser emitting element 5750 and a second laser emitting element 5760. In this case, it has been described that each laser emitting element may become various laser emitting elements such as a VCSEL, and thus a detailed description thereof will be omitted.

Also, the first laser emitting element 5750 may emits a first laser beam 5751, and the first laser beam 5751 may have a first divergence angle.

Also, the second laser emitting element 5760 may emits a second laser beam 5761, and the second laser beam 5761 may have a second divergence angle.

In this case, the first divergence angle and the second divergence angle may be the same. However, the present disclosure is not limited thereto, and the first divergence angle and the second divergence angle may be different.

Also, the first and second laser beams 5751 and 5761 may have first and second light densities at a first distance 5770. In this case, the first distance 5770 may be a reference distance for eye safety.

Also, the first and second light densities of the first and second laser beams 5751 and 5761 at the first distance 5770 may be light densities that do not affect human eye health.

Also, the first and second laser beams 5751 and 5761 may have third and fourth light densities at a second distance 5780. In this case, the third and fourth light densities may be 50% of the first and second light densities, respectively, but the present disclosure is not limited thereto.

Also, the first and second laser beams 5751 and 5761 may have light densities greater than the third and fourth light densities at a distance close to the second distance 5780 and may have light densities less than the third and fourth light densities at a distance greater than the second distance 5780.

Also, the first and second laser beams 5751 and 5761 may at least partially overlap at a third distance 5790.

Accordingly, when the light density at the first distance 5770 is the maximum light density that does not affect human eyes, the light density of the region where the first and second laser beams 5751 and 5761 overlap may exceed the maximum light density that does not affect human eyes when the third distance 5790 in which the first and second laser beams 5751 and 5761 overlap is less than or equal to the second distance 5780 unlike FIG. 118.

However, as shown in FIG. 118, when the third distance 5790 in which the first and second laser beams 5751 and 5761 overlap is greater than or equal to the second distance 5780, the light density of the region where the first and second laser beams 5751 and 5761 overlap may be less than or equal to the maximum light density that does not affect human eyes.

Accordingly, as described above, when the spacing between the first and second laser emitting elements 5750 and 5760 and the divergence angles of the first and second laser beams 5751 and 5761 are designed such that the distance 5790 by which the first and second laser beams 5751 and 5761 overlap is greater than or equal to the second distance 5780, it is possible to increase a distance measurable in the overlap region while satisfying the eye safety criterion.

Figure 119:
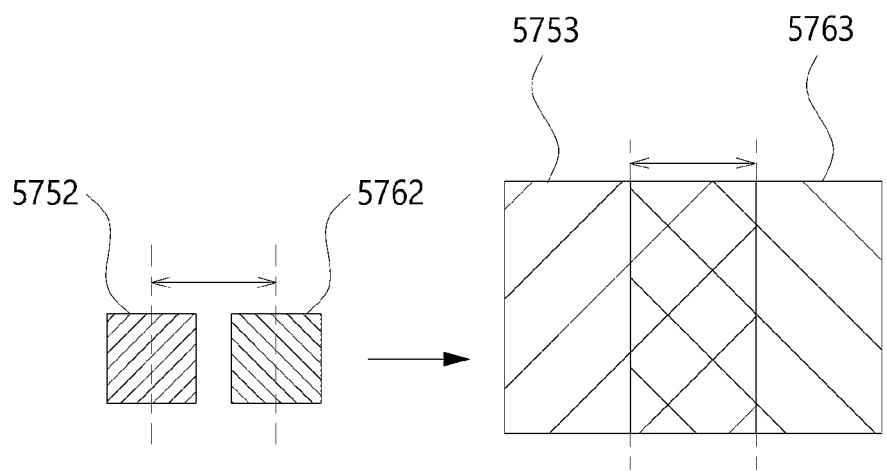
FIG. 119 is a diagram illustrating an increased measurable distance of a LiDAR device according to an embodiment.

FIG. 119 is a diagram illustrating an increased measurable distance of a LiDAR device according to an embodiment.

The LiDAR device according to an embodiment may include a laser emitting unit, and the laser emitting unit may include a first laser emitting element and a second laser emitting element. Also, the first and second laser emitting elements may emits laser beams.

In this case, each of the first laser beam and the second laser beam may form a laser spot corresponding to the distance, and the laser spot may form an irradiation region of the LiDAR device. For example, when the first laser beam is emitted, the LiDAR device may form an irradiation region corresponding to a spot region corresponding to a distance of the first laser beam.

Also, it has been described that the measurable distance of the LiDAR device may be proportional to the light densities of the laser beams, and a detailed description thereof will be omitted.

Also, referring to FIG. 119, the first laser beam and the second laser beam may form a first irradiation region 5752 and a second irradiation region 5762 at a first distance, respectively, and may form a third irradiation region 5753 and a fourth irradiation region 5763 at a second distance, respectively. In this case, for convenience of description, it is shown that the irradiation regions 5752 and 5762 have a rectangular shape. However, the present disclosure is not limited thereto, and the irradiation regions 5752 and 5762 may be formed in a shape corresponding to a spot shape, such as circular shape and an oval shape, of an emitted laser beam.

Also, the first distance may be a distance at which the first laser beam and the second laser beam do not overlap, and the second distance may be a distance at which the first laser beam and the second laser beam overlap. For example, the first distance may be 10 cm from the laser emitting unit, and the second distance may be 200 m from the laser emitting unit, but the present disclosure is not limited thereto.

Also, the first laser beam and the second laser beam may be emitted such that the beams do not affect human eye health. For example, when the first distance is a reference distance for determining eye safety, the light densities of the first and second laser beams at the first distance may be light densities that do not affect human eye health.

Also, the first and second laser beams may have first and second light densities at the second distance. In this case, the first and second light densities may change depending on the second distance and the emitted intensities and divergences of the first and second laser beams.

Also, when the first and second laser beams are emitted at the same time, the region where the first and second laser beams overlap at the second distance may have a third light density. In this case, the third light density may be greater than the first light density and the second light density. For example, when the first light density and the second light density are the same, the third light density may be two times the first light density and the second light density.

Accordingly, it is possible to increase the measurable distance of the LiDAR device in the region where the first and second laser beams overlap. For example, when the first light density of the first laser beam at the second distance is a light density that cannot generate a reference signal used for the LiDAR device to measure a distance, distance information of an object located at the second distance may not be acquired when the LiDAR device emits only the first laser beam. However, when the third light density at the second distance is a light density that can generate a reference signal used for the LiDAR device to measure a distance, the LiDAR device may acquire distance information of an object located at the second distance in the region where the first laser beam and the second laser beam overlap when the LiDAR device emits the first laser beam and the second laser beam at the same time.

Also, when a third laser beam is emitted from a third laser emitting element in order to have the third light density at the second distance, the emitted intensity of the third laser beam may be greater than the emitted intensities of the first laser beam and the second laser beam. Accordingly, the third laser beam may have a light density that affects human eye health at the first distance.

However, as described above, when the first and second laser beams are emitted from the first and second laser emitting elements at the same time to form an overlap region having the third light density at the second distance, the first and second laser beams may have light densities that do not affect human eye health at the first distance and may have the third light density in the overlap region at the second distance. Thus, the LiDAR device including the first and second laser emitting elements may increase a measurable distance in at least some regions while not affecting human eye health.

Also, the region where the first and second laser beams overlap may increase as the distance from the laser emitting unit increases. For example, when the distance between the centers of the laser beams is 1 cm and the divergence angles of the first and second laser beams are 1.2 degrees, the size of the irradiation regions of the first and second laser beams at 200 m may be 4 m×4 m, and the overlap region may be 99.5% of the entire irradiation region of the first and second laser beams.

Accordingly, as the proportion of the overlap region increases as described above, the first laser beam and the second laser beam may be regarded as one laser beam, and thus it is possible to increase the measurable distance of the LiDAR device.

Also, when it is assumed that the irradiation region of the laser beam has a rectangular shape, the ratio of the overlap region to the entire irradiation region according to the distance may be expressed as follows.

When a distance from a laser emitting unit is D, a distance between laser emitting elements is d, and the divergence angle of a laser beam is θ, the following equation may be satisfied.

$$\text{Proportion of Overlap Region} = \frac{2D\tan\left(\frac{\theta}{2}\right) - d}{2D\tan\left(\frac{\theta}{2}\right) + d}$$

However, the present disclosure is not limited thereto, and the irradiation region of the laser beam may have various shapes. Also, it has been described that the proportion of the overlap region may increase as the distance from the laser emitting unit increases, and thus it is possible to increase the measurable distance of the LiDAR device.

Figure 120:
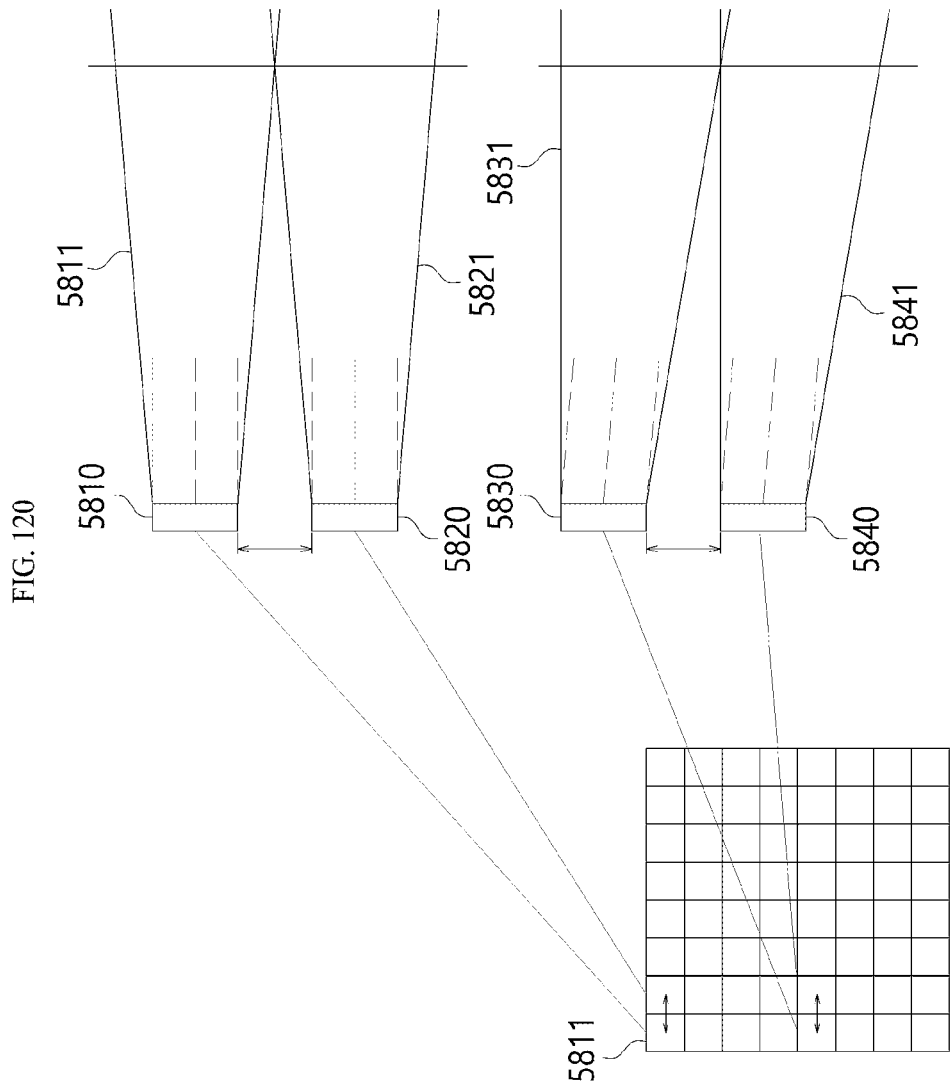
FIG. 120 is a diagram illustrating a laser beam output unit according to an embodiment.

FIG. 120 is a diagram illustrating a laser emitting unit according to an embodiment.

Referring to FIG. 120, a laser emitting unit 5800 according to an embodiment may include a first laser emitting element 5810, a second laser emitting element 5820, a third laser emitting element 5830, and a fourth laser emitting element 5840. The first, second, third, and fourth laser emitting elements 5810, 5820, 5830, and 5840 may emits first, second, third, and fourth laser beams 5811, 5821, 5831, and 5841, respectively. Also, each of the laser emitting elements may include a collimation component and a steering component. For example, the laser emitting unit may include a first layer including the laser emitting elements, a second layer including the collimation component, and a third layer including the steering component, but the present disclosure is not limited thereto.

Also, the first to fourth laser beams may have first to fourth divergence angles, and the first to fourth divergence angles may be the same. However, the present disclosure is not limited thereto, and some or all of the divergence angles may be different.

Also, the first to fourth laser beams may have first to fourth steering angles, and the first to fourth steering angles may be the same. However, the present disclosure is not limited thereto, and the first to fourth steering angles may be different, or at least some of the steering angles may be the same. For example, as shown in FIG. 120, the first and second steering angles may be the same and the third and fourth steering angles may be the same while the first steering angle and the third steering angle may be different from each other.

Also, a LiDAR device including the laser emitting unit 5800 may form an FOV using a plurality of steering angles. For example, 25 laser emitting elements in the laser emitting unit 5800 including the first and third laser emitting elements 5810 and 5830 are emitted with different steering angles, and when the steering angles of the laser beams differ by 1.2 degrees in the vertical direction, the LiDAR device may form an FOV(V) of 30 degrees in the vertical direction, but the present disclosure is not limited thereto.

Also, in order to increase the measurable distance of the LiDAR device including the laser emitting unit 5800, the laser emitting unit 5800 may include the second laser emitting element 5820 having the same steering angle as the first laser emitting element 5810. That is, when the first steering angle and the second steering angle are the same, the first laser beam 5811 and the second laser beam 5821 may be emitted in the same direction.

Also, when the first and second laser beams 5811 and 5821 are emitted in the same direction, the first and second laser beams 5811 and 5821 may overlap due to diffusion caused by the first and second divergence angles as described above with reference to FIGS. 110 and 119.

Also, the LiDAR device including the first and second laser emitting elements 5810 and 5820 may operate the first and second laser emitting elements 5810 and 5820 at the same time. In this case, it is possible to increase the measurable distance in the region where the first and second laser beams 5811 and 5821 overlap. For example, when the first and second laser emitting elements 5810 and 5820 are operated at the same time, the LiDAR device can measure a distance to an object located at a distance that cannot be measured by the first and second laser beams 5811 and 5821.

Also, as shown in FIG. 120, the first and second laser emitting elements 5810 and 5820 may be adjacent to each other in the laser emitting unit 5800. In this case, the distance between the first and second laser emitting elements 5810 and 5820 may be set such that the distance at which the first and second laser beams 5811 and 5821 overlap is farther than the reference distance for eye safety. For example, the distance between the first and second laser emitting elements 5810 and 5820 may be set such that the light density of the overlap region at the distance at which the first and second laser beams 5811 and 5821 overlap does not exceed the light density of each of the first and second laser beams 5811 and 5821 at the reference distance, but the present disclosure is not limited thereto.

Also, in order to increase the measurable distance of the LiDAR device including the laser emitting unit 5800, the laser emitting unit 5800 may include the fourth laser emitting element 5840 having the same steering angle as the third laser emitting element 5830. That is, when the third steering angle and the fourth steering angle are the same, the third laser beam 5831 and the fourth laser beam 5841 may be emitted in the same direction.

Also, when the third and fourth laser beams 5831 and 5841 are emitted in the same direction, the third and fourth laser beams 5831 and 5841 may overlap due to diffusion caused by the third and fourth divergence angles as described above with reference to FIGS. 110 and 119.

Also, the LiDAR device including the third and fourth laser emitting elements 5830 and 5840 may operate the third and fourth laser emitting elements 5830 and 5840 at the same time. In this case, it is possible to increase the measurable distance in the region where the first and second laser beams 5831 and 5841 overlap. For example, when the third and fourth laser emitting elements 5830 and 5840 are operated at the same time, the LiDAR device may measure a distance to an object located at a distance that cannot be measured by the third and fourth laser beams 5831 and 5841.

Also, as shown in FIG. 120, the third and fourth laser emitting elements 5830 and 5840 may be adjacent to each other in the laser emitting unit 5800. In this case, the distance between the third and fourth laser emitting elements 5830 and 5840 may be set such that the distance at which the third and fourth laser beams 5831 and 5841 overlap is farther than the reference distance for eye safety. For example, the distance between the third and fourth laser emitting elements 5830 and 5840 may be set such that the light density of the overlap region at the distance at which the third and fourth laser beams 5831 and 5841 overlap does not exceed the light density of each of the third and fourth laser beams 5831 and 5841 at the reference distance, but the present disclosure is not limited thereto.

Also, the first and second laser emitting elements 5810 and 5820 and the third and fourth laser emitting elements 5830 and 5840 may emits laser beams at the same time or at different times. For example, the first to fourth laser emitting elements 5810, 5820, 5830, and 5840 may emits the first to fourth laser beams 5811, 5821, 5831, and 5841 at the same time. Alternatively, the third and fourth laser emitting elements 5830 and 5840 may emits the third and fourth laser beams 5831 and 5841 after the first and second laser emitting elements 5810 and 5820 emit the first and second laser beams 5811 and 5821, but the present disclosure is not limited thereto.

Also, the difference between the first steering angle and the third steering angle may be smaller than the first divergence angle and the third divergence angle such that the first laser beam 5811 and the third laser beam 5831 overlap. In this case, the light density may increase by the region where the first and third laser beams 5811 and 5831 overlap when the first and third laser beams 5811 and 5831 are emitted at the same time.

Also, in this case, the size of the region where the first and second laser beams 5811 and 5821 overlap may be greater than the size of the region where the first and third laser beams 5811 and 5831 overlap.

Also, the difference between the first steering angle and the third steering angle may be greater than the first divergence angle and the third divergence angle such that the first laser beam 5811 and the third laser beam 5831 do not overlap. In this case, the region where the first and third laser beams 5811 and 5831 overlap may not be formed even when the first and third laser beams 5811 and 5831 are emitted at the same time.

Also, although not shown in FIG. 120, the distance between the first laser emitting element 5810 and the third laser emitting element 5830 may be shorter than the distance between the first laser emitting element 5810 and the second laser emitting element 5820. Even in this case, the region where the first and second laser beams 5811 and 5821 overlap may be greater than the region where the first and third laser beams 5811 and 5831 overlap.

Figure 121:
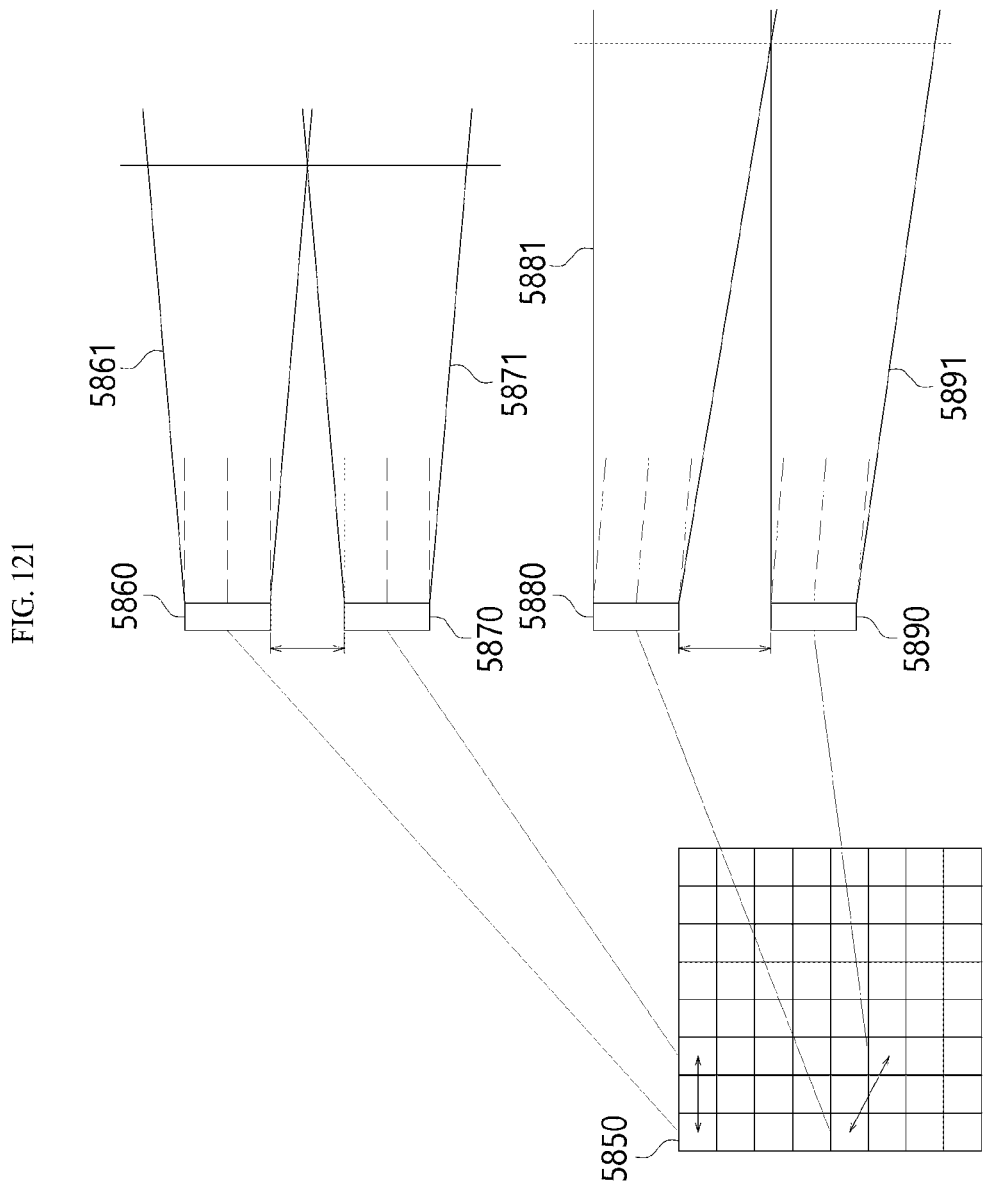
FIG. 121 is a diagram illustrating a laser beam output unit according to an embodiment.

FIG. 121 is a diagram illustrating a laser emitting unit according to an embodiment.

Referring to FIG. 121, a laser emitting unit 5850 according to an embodiment may include a first laser emitting element 5860, a second laser emitting element 5870, a third laser emitting element 5880, and a fourth laser emitting element 5890. The first, second, third, and fourth laser emitting elements 5860, 5870, 5880, and 5890 may emits first, second, third, and fourth laser beams 5861, 5871, 5881, and 5891, respectively. Also, each of the laser emitting elements may include a collimation component and a steering component. For example, the laser emitting unit may include a first layer including the laser emitting elements, a second layer including the collimation component, and a third layer including the steering component, but the present disclosure is not limited thereto.

Also, the above description is applicable to the first to fourth laser emitting elements 5860, 5870, 5880, and 5890, and thus a detailed description thereof will be omitted.

As shown in FIG. 121, the first and second laser emitting elements 5860 and 5870 may be not adjacent to each other in the laser emitting unit 5850. In this case, the distance between the first and second laser emitting elements 5860 and 5870 may be set such that the distance at which the first and second laser beams 5861 and 5871 overlap is farther than the reference distance for eye safety. For example, the distance between the first and second laser emitting elements 5860 and 5870 may be set such that the light density of the overlap region at the distance by which the first and second laser beams 5861 and 5871 overlap does not exceed the light density of each of the first and second laser beams 5861 and 5871 at the reference distance.

Also, as shown in FIG. 121, the third and fourth laser emitting elements 5880 and 5890 may be not adjacent to each other in the laser emitting unit 5850. In this case, the distance between the third and fourth laser emitting elements 5880 and 5890 may be set such that the distance by which the third and fourth laser beams 5881 and 5891 overlap is farther than the reference distance for eye safety. For example, the distance between the third and fourth laser emitting elements 5880 and 5890 may be set such that the light density of the overlap region at the distance by which the third and fourth laser beams 5881 and 5891 overlap does not exceed the light density of each of the third and fourth laser beams 5881 and 5891 at the reference distance, but the present disclosure is not limited thereto.

Also, as shown in FIG. 121, the distance between the first and second laser emitting elements 5860 and 5870 may be different from the distance between the third and fourth laser emitting elements 5880 and 5890. For example, the distance between the first and second laser emitting elements 5860 and 5870 may be shorter than the distance between the third and fourth laser emitting elements 5880 and 5890, but the present disclosure is not limited thereto.

Also, since the distance between the first and second laser emitting elements 5860 and 5870 is different from the distance between the third and fourth laser emitting elements 5880 and 5890, the distance at which the first and second laser beams 5861 and 5871 overlap may be different from the distance at which the third and fourth laser beams 5881 and 5891 overlap. For example, when the distance between the first and second laser emitting elements 5860 and 5870 is shorter than the distance between the third and fourth laser emitting elements 5880 and 5890, the distance at which the first and second laser beams 5861 and 5871 overlap may be shorter than the distance at which the third and fourth laser beams 5881 and 5891 overlap.

Also, since the distance between the first and second laser emitting elements 5860 and 5870 is different from the distance between the third and fourth laser emitting elements 5880 and 5890, the region where the first and second laser beams 5861 and 5871 overlap may be different from the region where the third and fourth laser beams 5881 and 5891 overlap at the same distance. For example, when the distance between the first and second laser emitting elements 5860 and 5870 is shorter than the distance between the third and fourth laser emitting elements 5880 and 5890, the region where the first and second laser beams 5861 and 5871 overlap may be larger than the region where the third and fourth laser beams 5881 and 5891 overlap at the same distance.

Also, the first and second laser emitting elements 5860 and 5870 and the third and fourth laser emitting elements 5880 and 5890 may emits laser beams at the same time or at different times. For example, the first to fourth laser emitting elements 5860, 5870, 5880, and 5890 may emits the first to fourth laser beams 5861, 5871, 5881, and 5891 at the same time. Alternatively, the third and fourth laser emitting elements 5880 and 5890 may emits the third and fourth laser beams 5881 and 5891 after the first and second laser emitting elements 5860 and 5870 emit the first and second laser beams 5861 and 5871, but the present disclosure is not limited thereto.

Also, the difference between the first steering angle and the third steering angle may be smaller than the first divergence angle and the third divergence angle such that the first laser beam 5861 and the third laser beam 5881 overlap. In this case, the light density may increase in the region where the first and third laser beams 5861 and 5881 overlap when the first and third laser beams 5861 and 5861 are emitted at the same time.

Also, in this case, the size of the region where the first and second laser beams 5861 and 5871 overlap may be greater than the size of the region where the first and third laser beams 5861 and 5881 overlap.

Also, the difference between the first steering angle and the third steering angle may be greater than the first divergence angle and the third divergence angle such that the first laser beam 5861 and the third laser beam 5881 do not overlap. In this case, the region where the first and third laser beams 5861 and 5881 overlap may not be formed even when the first and third laser beams 5861 and 5881 are emitted at the same time.

Also, although not shown in FIG. 121, the distance between the first laser emitting element 5860 and the third laser emitting element 5880 may be shorter than the distance between the first laser emitting element 5860 and the second laser emitting element 5870. Even in this case, the region where the first and second laser beams 5861 and 5871 overlap may be greater than the region where the first and third laser beams 5861 and 5881 overlap.

Figure 122:
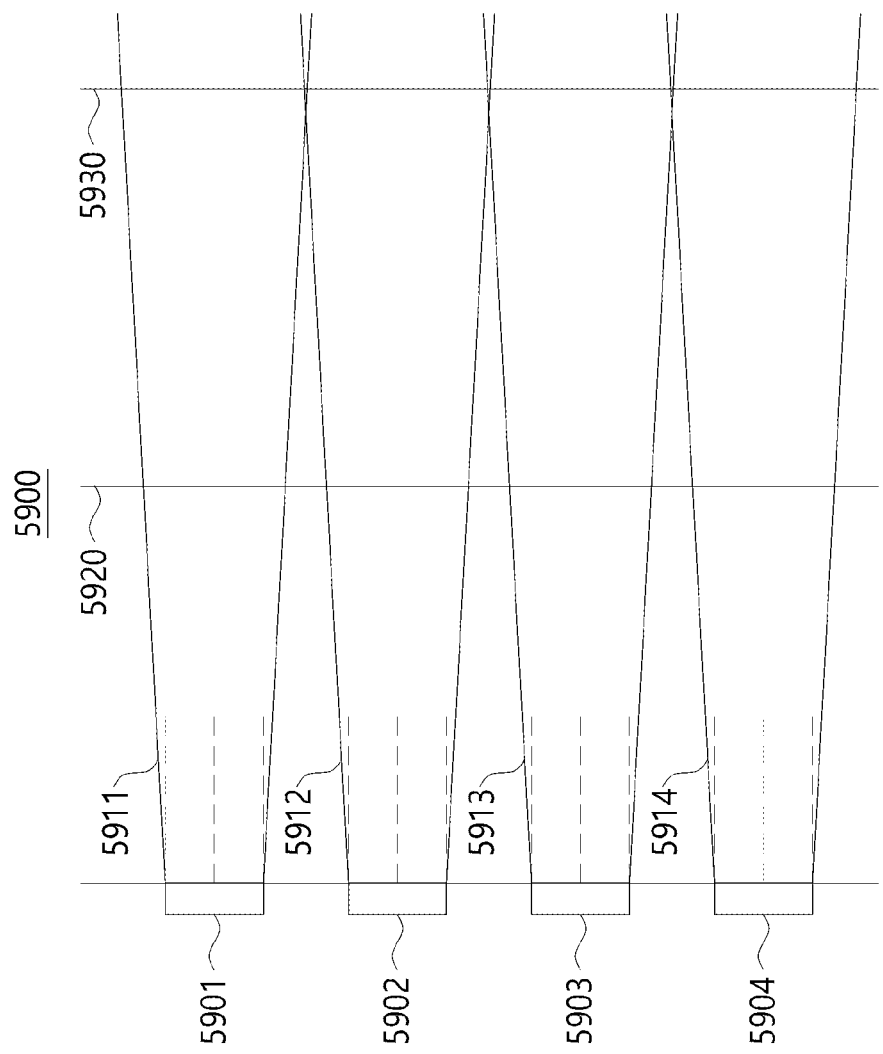
FIG. 122 is a diagram illustrating a laser beam output unit according to an embodiment.

FIG. 122 is a diagram illustrating a laser emitting unit according to an embodiment.

Referring to FIG. 122, a laser emitting unit 5900 according to an embodiment may include a first laser emitting element 5901, a second laser emitting element 5902, a third laser emitting element 5903, and a fourth laser emitting element 5904. The first, second, third, and fourth laser emitting elements 5901, 5902, 5903, and 5904 may emits first, second, third, and fourth laser beams 5911, 5912, 5913, and 5914, respectively. Also, each of the laser emitting elements may include a collimation component and a steering component. For example, the laser emitting unit may include a first layer including the laser emitting elements, a second layer including the collimation component, and a third layer including the steering component, but the present disclosure is not limited thereto.

Also, the first to fourth laser beams may have first to fourth divergence angles, and the first to fourth divergence angles may be the same. However, the present disclosure is not limited thereto, and or some all of the divergence angles may be different.

Also, the first to fourth laser beams may have first to fourth steering angles, and the first to fourth steering angles may be the same. However, the present disclosure is not limited thereto, and the first to fourth steering angles may be different, or at least some of the steering angles may be the same. For example, as shown in FIG. 122, the first, second, third, and fourth steering angles may be the same.

Also, in order to increase the measurable distance of the LiDAR device including the laser emitting unit 5900, the laser emitting unit 5900 may include the second, third, and fourth laser emitting elements 5902, 5903, and 5904 having the same steering angle as the first laser emitting element 5901. That is, it is possible to make the first laser beam 5911 overlap the second, third, and fourth laser beams 5912, 5913, and 5914 by using the second, third, and fourth laser emitting elements 5902, 5903, and 5904 having second, third, and fourth steering angles which are the same as the first steering angle, and it is also possible to increase the measurable distance of the LiDAR device by using the overlap region.

Also, the first to fourth laser emitting elements 5901, 5902, 5903, and 5904 may emits laser beams at the same time or at different times, and at least two of the laser emitting elements may emits laser beams at the same time.

Also, when it is assumed that two of the first to fourth laser emitting elements 5901, 5902, 5903, and 5904 are operated to emit laser beams at the same time, the relationship between the two laser emitting elements for increasing the measurable distance of the LiDAR device while preventing the laser beams emitted from the two laser emitting elements from affecting human eye health has been described, and a detailed description thereof will be omitted.

Also, for convenience of description, the first, second, and third laser emitting elements 5901, 5902, and 5903 will be used to describe a case in which three of the first to fourth laser emitting elements 5901, 5902, 5903, and 5904 are operated to emit laser beams at the same time. However, the present disclosure is not limited thereto, and it can be fully understood that the following description is applicable to other laser emitting elements.

The first, second, and third laser beams 5911, 5912, and 5913 emitted from the first, second, and third laser emitting elements 5901, 5902, and 5903 may have first, second, and third light densities at a first distance 5920. In this case, the first distance 5920 may be a reference distance for eye safety, and the first, second, and third light densities may be light densities that do not affect human eye health.

Accordingly, the first, second, and third laser beams 5911, 5912, and 5913 may not affect human eye health.

Also, the first, second, and third laser beams 5911, 5912, and 5913 emitted from the first, second, and third laser emitting elements 5901, 5902, and 5903 may have fifth, sixth, and seventh light densities at a second distance 5930. In this case, the second distance 5930 may be a distance at which the first and second laser beams 5911 and 5912 overlap and at which the second and third laser beams 5912 and 5913 overlap. However, the second distance may include a second-one distance at which the first and second laser beams 5911 and 5912 overlap and a second-two distance at which the second and third laser beams 5912 and 5913 overlap, but the distances may be collectively referred to as the second distance 5930 for convenience of description.

Accordingly, in order to avoid affecting human eye health, the sum of the fifth and sixth light densities may be less than or equal to the first or second light density, and the sum of the sixth and seventh light densities may be less than or equal to the second or third light density. In this case, the sum of the light densities may refer to a linear sum operation. However, the present disclosure is not limited thereto, and the sum may refer to the light density of the overlap region.

For example, when the first, second, and third light densities are the same and are the maximum light density that does not affect human eyes, the fifth, sixth, and seventh light densities may be less than or equal to 50% of the first light density. In this case, the sum of the fifth and sixth light densities may be less than or equal to the first light density, and the sum of the sixth and seventh light densities may be less than or equal to the first light density, but the present disclosure is not limited thereto.

Also, the first, second, and third laser beams 5911, 5912, and 5913 emitted from the first, second, and third laser emitting elements 5901, 5902, and 5903 may have ninth, tenth, and eleventh light densities at a third distance (not shown). In this case, the third distance (not shown) may be a distance at which the first and third laser beams 5911 and 5913 overlap. That is, the third distance (not shown) may refer to a distance at which all of the first, second, and third laser beams 5911, 5912, and 5913 overlap.

Accordingly, in order to avoid affecting human eye health, the sum of the ninth, tenth, and eleventh light densities may be less than or equal to the first, second, or third light density. In this case, the sum of the light densities may refer to a linear sum operation. However, the present disclosure is not limited thereto, and the sum may refer to the light density of the overlap region.

For example, when the first, second, and third light densities are the same and are the maximum light density that does not affect human eyes, the ninth, tenth, and eleventh light densities may be less than or equal to ⅓ of the first light density. In this case, the sum of the ninth, tenth, and eleventh light densities is less than or equal to the first light density, but the present disclosure is not limited thereto.

Also, through the above description, it can be fully understood that in order to emit a laser beam that satisfies the above-described light density condition, the divergence angles of laser beams and the intervals between laser emitting elements may be adjusted.

Also, the relationship between the first to fourth laser emitting elements 5901, 5902, 5903, and 5904 in order to operate all of the first to fourth laser emitting elements 5901, 5902, 5903, and 5904 and increase the measurable distance of the LiDAR device while preventing laser beams emitted from a plurality of laser emitting elements operating at the same time from affecting human eye health will be described.

The first, second, third, and fourth laser beams 5911, 5912, 5913, and 5914 emitted from the first, second, third, and fourth laser emitting elements 5901, 5902, 5903, and 5904 may have first, second, third, and fourth light densities at the first distance 5920. In this case, the first distance 5920 may be a reference distance for eye safety, and the first, second, third, and fourth light densities may be light densities that do not affect human eye health.

Also, the relationship between the second distance 5930 and the third distance (not shown) has been described above, and a detailed description thereof will be omitted. However, the third distance may include a third-one distance, which is a distance by which the first and third laser beams 5911 and 5913 overlap and by which all of the first, second, and third laser beams 5911, 5912, and 5913 overlap and a third-two distance, which is a distance by which the second and fourth laser beams 5912 and 5914 overlap and by which all of the second, third, and fourth laser beams 5912, 5913, and 5914 overlap. In this case, the third-one distance and the third-two distance may be different from each other. However, the second distance may include a second-one distance by which the first and second laser beams 5911 and 5912 overlap, a second-two distance by which the second and third laser beams 5912 and 5913 overlap, and a second-three distance by which the third and fourth laser beams 5913 and 5914. In this case, the second-one distance, the second-two distance, and the second-three distance may be different from each other.

The first, second, third, and fourth laser beams 5911, 5912, 5913, and 5914 emitted from the first, second, third, and fourth laser emitting elements 5901, 5902, 5903, and 5904 may have thirteenth, fourteenth, fifteenth, and sixteenth light densities at a fourth distance (not shown). In this case, the fourth distance (not shown), which is a distance at which the first and fourth laser beams 5591 and 5914, overlap may refer to a distance at which all of the first to fourth laser beams 5911, 5912, 5913, and 5914 overlap.

Accordingly, in order to avoid affecting human eye health, the sum of the thirteenth, fourteenth, fifteenth, and sixteenth light densities may be less than or equal to the first, second, third, or fourth light density. In this case, the sum of the light densities may refer to a linear sum operation. However, the present disclosure is not limited thereto, and the sum may refer to the light density of the overlap region.

For example, when the first, second, third, and fourth light densities are the same and are the maximum light density that does not affect human eyes, the thirteenth, fourteenth, fifteenth, and sixteenth light densities may be less than or equal to ¼ of the first light density. In this case, the sum of the thirteenth, fourteenth, fifteenth, and sixteenth light densities is less than or equal to the first light density, but the present disclosure is not limited thereto.

Also, through the above description, it can be fully understood that in order to emit a laser beam that satisfies the above-described light density condition, the divergence angles of laser beams and the intervals between laser emitting elements may be adjusted.

Also, when the first to fourth laser emitting elements 5901, 5902, 5903, and 5904 are designed to emit laser beams at the same time, the first to fourth laser emitting elements 5901, 5902, 5903, and 5904 may be operated to emit laser beams at the same time, or at least one of the laser emitting elements may be operated to emit laser beams.

For example, among the first to fourth laser emitting elements 5901, 5902, 5903, and 5904, two laser emitting elements emitting laser beams can increase the measurable distance of the LiDAR device more than one laser emitting element emitting laser beams. Three laser emitting elements emitting laser beams can increase the measurable distance of the LiDAR device more than two laser emitting elements emitting laser beams. Four laser emitting elements emitting laser beams can increase the measurable distance of the LiDAR device more than three laser emitting elements emitting laser beams.

Accordingly, at least some of the plurality of laser emitting elements may be operated depending on a distance to a point measured by the LiDAR device.

For example, the LiDAR device may operate the laser emitting elements such that the first and second laser emitting elements 5901 and 5902 emit first and second laser beams 5911 and 5912 to the same zone when the LiDAR device does not acquire a distance to an object using the first laser beam 5911 after the first laser emitting element 5901 emits the first laser beam 5911. The LiDAR device may operate the laser emitting elements such that the first, second, and third laser emitting elements 5901, 5902, and 5903 emit first, second, and third laser beams 5911, 5912, and 5913 to the same zone at the same time when the LiDAR device does not acquire a distance to an object using the first and second laser beams 5911 and 5912. The LiDAR device may operate the laser emitting elements such that the first, second, third, and fourth laser emitting elements 5901, 5902, 5903, and 5904 emit first, second, third, and fourth laser beams 5911, 5912, 5913, and 5914 to the same zone at the same time when the LiDAR device does not acquire a distance to an object using the first, second, and third laser beams 5911, 5912, and 5913.

Figure 123:
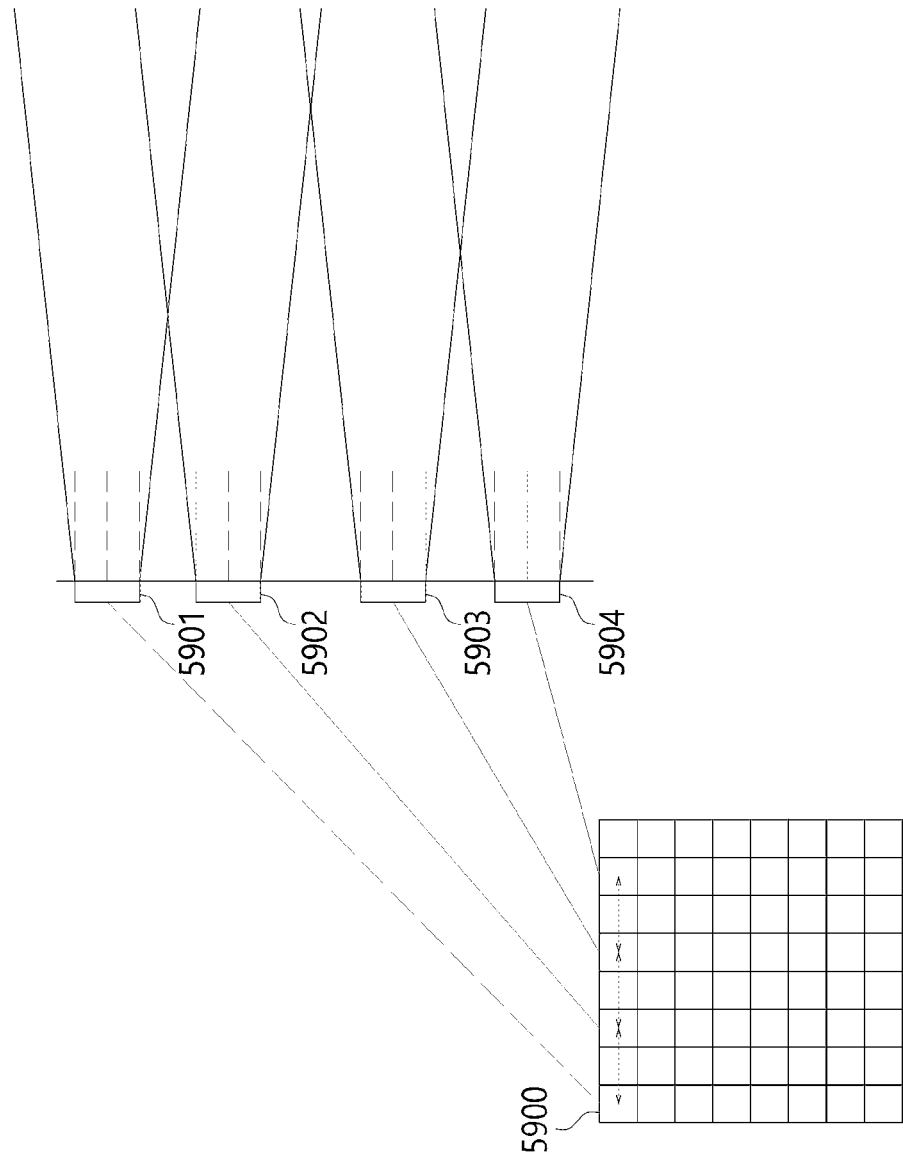
FIG. 123 is a diagram illustrating a layout of a laser beam output unit according to an embodiment.

Also, the first, second, third, and fourth laser emitting elements 5901, 5902, 5903, and 5904 may be disposed at the same spacing. For example, FIG. 123 shows a diagram illustrating a layout of a laser emitting unit according to an embodiment. As shown in FIG. 123, the distance between the first and second laser emitting elements 5901 and 5902, the distance between the second and third laser emitting elements 5902 and 5903, and the distance between the third and fourth laser emitting elements 5903 and 5904 may be the same.

Figure 124:
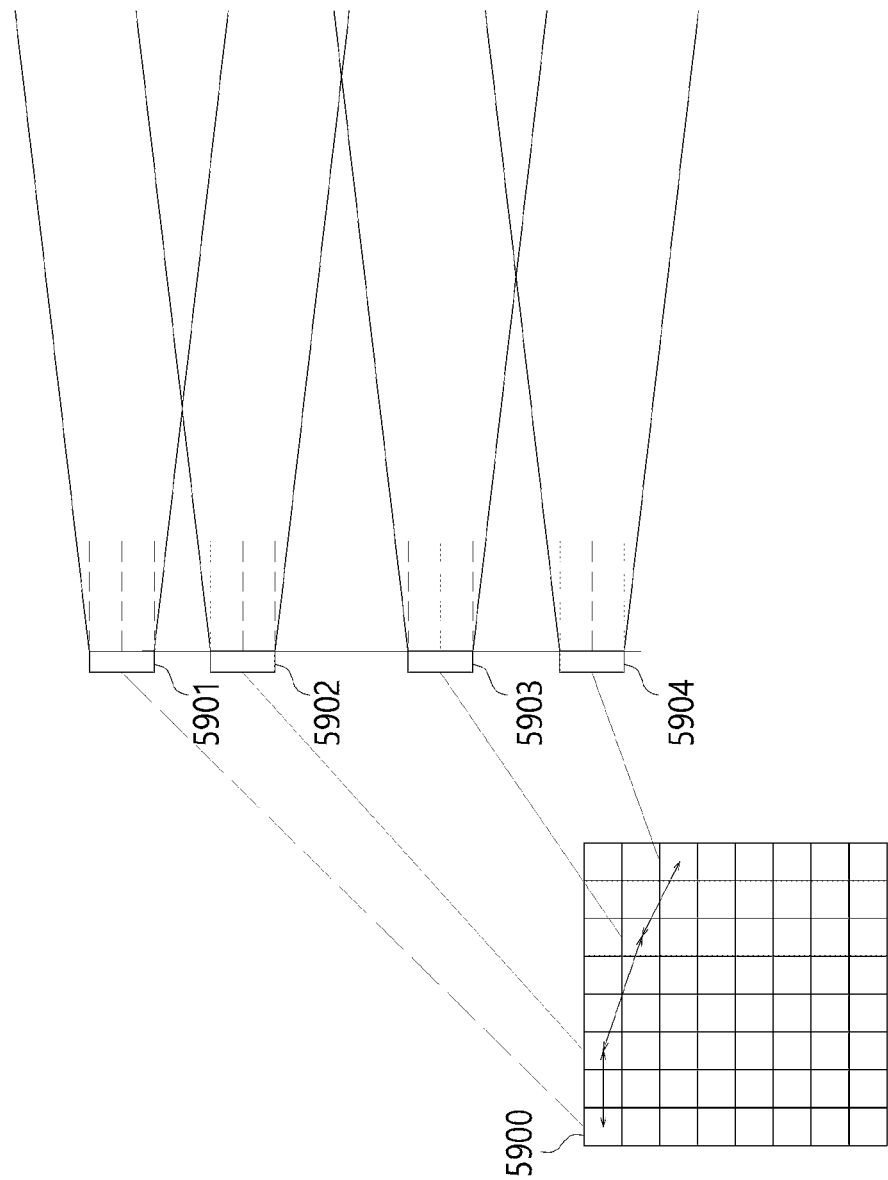
FIG. 124 is a diagram illustrating a layout of a laser beam output unit according to another embodiment.

Also, the first, second, third, and fourth laser emitting elements 5901, 5902, 5903, and 5904 may be disposed at different spacings. For example, FIG. 124 shows a diagram illustrating a layout of a laser emitting unit according to another embodiment. As shown in FIG. 124, the distance between the first and second laser emitting elements 5901 and 5902, the distance between the second and third laser emitting elements 5902 and 5903, and the distance between the third and fourth laser emitting elements 5903 and 5904 may be different. In detail, the distance between the third and fourth laser emitting elements 5903 and 5904 may be shorter than the distance between the second and third laser emitting elements 5902 and 5903 and farther than the distance between the first and second laser emitting elements 5901 and 5902, but the present disclosure is not limited thereto.

Figure 125:
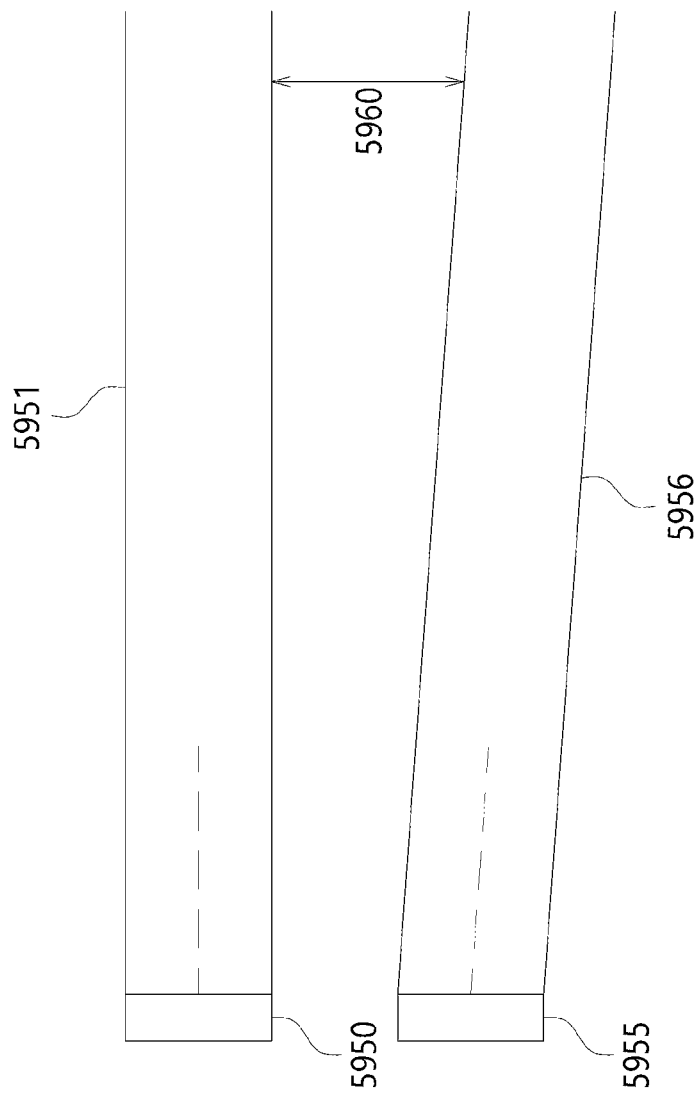
FIG. 125 is a diagram showing laser beams with a certain divergence angle or less and a laser beam output unit configured to output the laser beams according to an embodiment.
Figure 126:
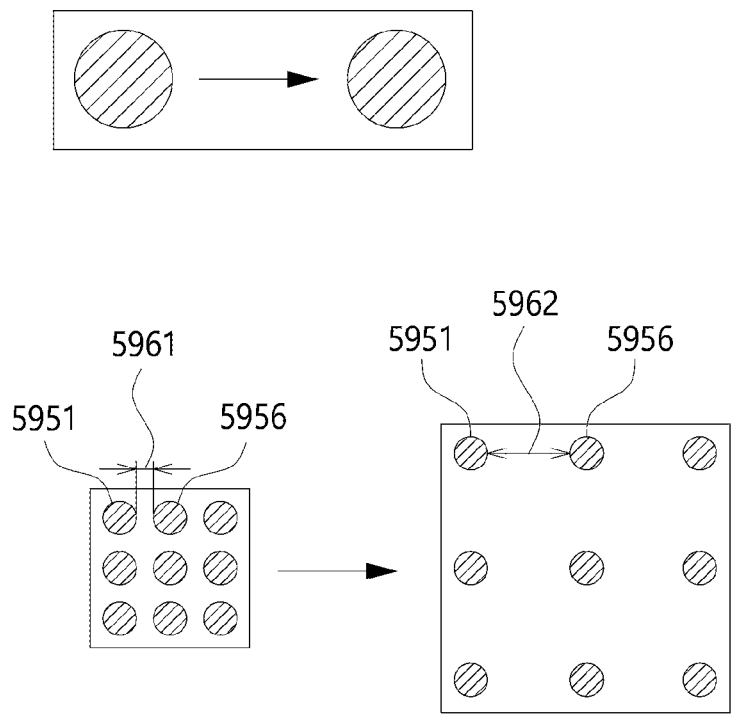
FIG. 126 is a diagram illustrating a distance between the laser beams shown in FIG. 125.

FIG. 125 is a diagram showing laser beams with a certain divergence angle or less and a laser emitting unit configured to emit the laser beams according to an embodiment, and FIG. 126 is a diagram illustrating a distance between the laser beams shown in FIG. 125.

Referring to FIGS. 125 and 126, a laser emitting unit according to an embodiment may include a first laser emitting element 5950 and a second laser emitting element 5955, and the first and second laser emitting elements 5950 and 5955 may emits first and second laser beams 5951 and 5956, respectively. Also, each of the laser emitting elements may include a collimation component and a steering component. For example, the laser emitting unit may include a first layer including the laser emitting elements, a second layer including the collimation component, and a third layer including the steering component, but the present disclosure is not limited thereto.

Also, the first and second laser beams 5951 and 5956 may have first and second divergence angles, respectively, and the first and second divergence angles may be the same. However, the present disclosure is not limited thereto, and the divergence angles may be different.

Also, the first and second laser beams 5951 and 5956 may have first and second steering angles, respectively, and the first and second steering angles may be different.

In this case, as shown in FIG. 125, the first and second divergence angles may be smaller than the difference between the first and second steering angles.

Accordingly, when the first and second divergence angles are smaller than the difference between the first and second steering angles, a distance 5960 between the first laser beam 5951 and the second laser beam 5956 may increase as the distance from the laser emitting unit increases.

In detail, referring to FIG. 126, a distance 5961 between the first and second laser beams 5951 and 5956 at a first distance from the laser emitting unit may be shorter than a distance 5962 between the first and second laser beams 5951 and 5956 at a second distance greater than the first distance. For example, when the first and second divergence angles are 0 degrees and the difference between the first and second steering angles is 1.2 degrees, the distance between the first and second laser beams 5951 and 5956 at a distance of about 10 m from the laser emitting unit may be about 21 cm, and the distance between the first and second laser beams 5951 and 5956 at a distance of about 100 m from the laser emitting unit may be about 2.1 m, but the present disclosure is not limited thereto.

Also, as described above, when the distance 5960 between the first and second laser beams 5951 and 5956 increases as the distance from the laser emitting unit increases, a region where no laser beam is emitted may increase depending on the distance. Thus, a region where the LiDAR device including the laser emitting unit cannot detect an object may increase.

Accordingly, laser beams emitted from the laser emitting unit included in the LiDAR device may need to be designed to have a certain divergence angle or greater.

Figure 127:
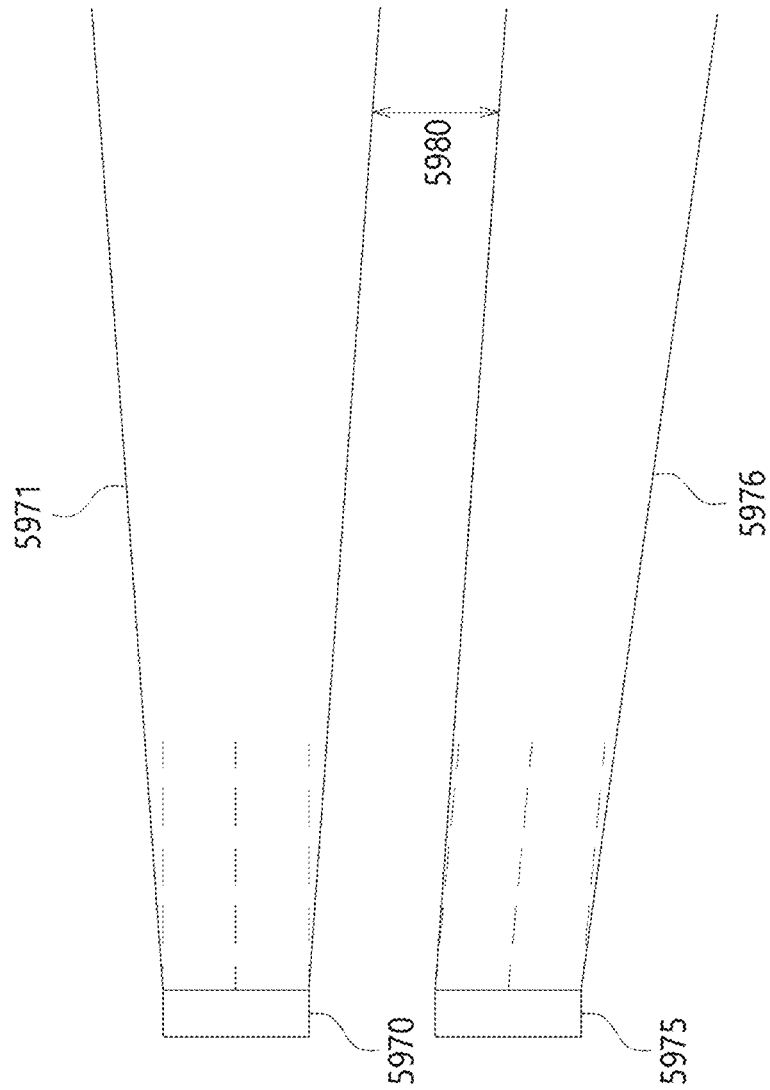
FIG. 127 is a diagram showing laser beams with a certain divergence angle or greater and a laser beam output unit configured to output the laser beams according to an embodiment.
Figure 128:
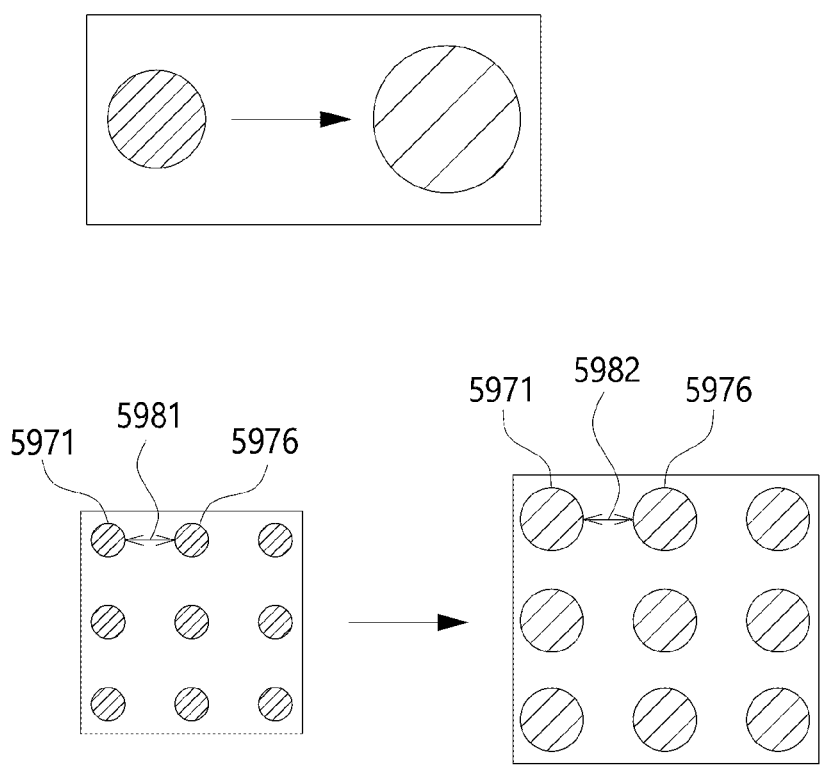
FIG. 128 is a diagram illustrating a distance between the laser beams shown in FIG. 127.

FIG. 127 is a diagram showing laser beams with a certain divergence angle or greater and a laser emitting unit configured to emit the laser beams according to an embodiment, and FIG. 128 is a diagram illustrating a distance between the laser beams shown in FIG. 127.

Referring to FIGS. 127 and 128, a laser emitting unit according to an embodiment may include a first laser emitting element 5970 and a second laser emitting element 5975, and the first and second laser emitting elements 5970 and 5975 may emits first and second laser beams 5971 and 5976. Also, each of the laser emitting elements may include a collimation component and a steering component. For example, the laser emitting unit may include a first layer including the laser emitting elements, a second layer including the collimation component, and a third layer including the steering component, but the present disclosure is not limited thereto.

Also, the first and second laser beams 5971 and 5976 may have first and second divergence angles, respectively, and the first and second divergence angles may be the same. However, the present disclosure is not limited thereto, and the divergence angles may be different.

Also, the first and second laser beams 5971 and 5976 may have first and second steering angles, respectively, and the first and second steering angles may be different.

In this case, as shown in FIG. 127, the first and second divergence angles may be equal to or greater than the difference between the first and second steering angles.

Accordingly, when the first and second divergence angles are equal to the difference between the first and second steering angles, a distance 5980 between the first laser beam 5971 and the second laser beam 5976 may be constant as the distance from the laser emitting unit increases.

In detail, although not shown, a distance 5981 between the first and second laser beams 5971 and 5976 at a first distance from the laser emitting unit may be equal to the distance 5972 between the first and second laser beams 5971 and 5976 at a second distance farther than the first distance. For example, it is assumed that the first and second divergence angles are 1.2 degrees, the difference between the first and second steering angles is 1.2 degrees, and the distance between the first and second laser emitting elements 5970 and 5975 is 1 mm. In this case, the distance between the first and second laser beams 5951 and 5956 at a distance of about 10 m from the laser emitting unit may be about 1 mm, and the distance between the first and second laser beams 5951 and 5956 at a distance of about 100 m from the laser emitting unit may also be about 1 mm, but the present disclosure is not limited thereto.

Also, when the first and second divergence angles are greater than the difference between the first and second steering angles, the distance 5980 between the first laser beam 5971 and the second laser beam 5976 may decrease as the distance from the laser emitting unit increases.

In detail, referring to FIG. 128, the distance 5981 between the first and second laser beams 5971 and 5976 at the first distance from the laser emitting unit may be farther than the distance 5972 between the first and second laser beams 5971 and 5976 at a second distance greater than the first distance. For example, it is assumed that the first and second divergence angles are 1.3 degrees, the difference between the first and second steering angles is 1.2 degrees, and the distance between the first and second laser emitting elements 5970 and 5975 is 1 cm. In this case, the distance between the first and second laser beams 5951 and 5956 at a distance of about 10 m from the laser emitting unit may be about 0.2 cm, and the first and second laser beams 5951 and 5956 may overlap at a distance of about 100 m from the laser emitting unit.

Also, as described above, when the distance 5980 between the first and second laser beams 5971 and 5976 is constant or decreases as the distance from the laser emitting unit increases, a region where no laser beam is emitted may decrease depending on the distance. Thus, a region where the LiDAR device including the laser emitting unit cannot detect an object may decrease.

Accordingly, in order to decrease the number of objects that are not detected by the LiDAR device including the laser emitting unit, a laser beam emitted from the laser emitting unit may be designed to have a certain divergence angle or greater. In detail, the laser beam may be designed such that the first and second divergence angles are greater than or equal to the difference between the first and second steering angles or such that the sum of ½ of the first divergence angle and ½ of the second divergence angle is greater than or equal to the difference between the first and second steering angles, but the present disclosure is not limited thereto.

A laser emitting unit according to an embodiment of the present disclosure will be described below.

However, for convenience of description, the following description will be provided using a VCSEL, but it is obvious that other laser emitting elements can be used in addition to the VCSEL.

Figure 129:
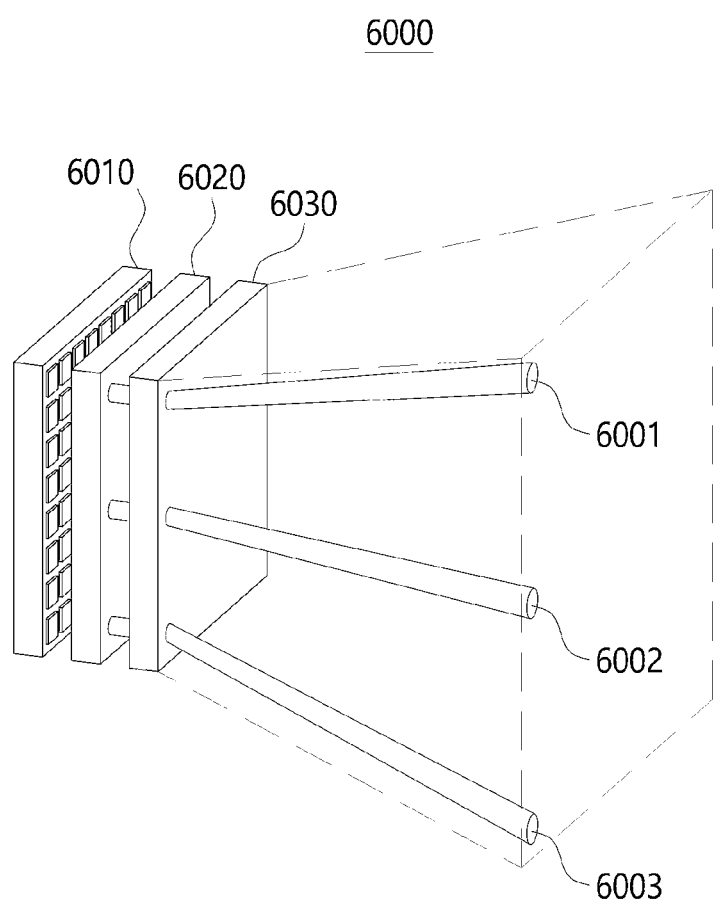
FIG. 129 is a diagram illustrating a laser beam output unit according to an embodiment.

FIG. 129 is a diagram illustrating a laser emitting unit according to an embodiment.

Referring to FIG. 129, a laser emitting unit 6000 according to an embodiment may include at least one of a VCSEL array 6010, a collimation component 6020, and a steering component 6030, but the present disclosure is not limited thereto.

In this case, the VCSEL array 6010 may include at least one VCSEL emitter or may include at least one VCSEL unit consisting of at least one VCSEL emitter.

Also, the VCSEL array 6010 may emits laser beams. For example, a laser beam may be emitted from a VCSEL emitter included in the VCSEL array 6010, and a laser beam may be emitted from a VCSEL unit including at least one VCSEL emitter, but the present disclosure is not limited thereto.

Also, the collimation component 6020 may collimate the laser beam emitted from the VCSEL array 6010.

In detail, the collimation component 6020 may collimate a laser beam emitted from a VCSEL emitter included in the VCSEL array 6010. However, the present disclosure is not limited thereto, and the collimation component 6020 may collimate a laser beam emitted from a VCSEL unit included in the VCSEL array 6010.

In this case, the divergence angle of the laser beam emitted from the VCSEL array 6010 may decrease.

For example, a laser beam emitted from the VCSEL emitter included in the VCSEL array 6010 may be collimated by the collimation component 6020, and thus the divergence angle of the laser beam emitted from the VCSEL emitter included in the VCSEL array 6010 may decrease to 1.2 degrees or less, but the present disclosure is not limited thereto.

Also, for example, a laser beam emitted from the VCSEL unit included in the VCSEL array 6010 may be collimated by the collimation component 6020, and thus the divergence angle of the laser beam emitted from the VCSEL unit included in the VCSEL array 6010 may decrease to 1.2 degrees or less, but the present disclosure is not limited thereto.

Also, the angle to which the divergence angle decrease may include various angles such as 0 degrees, 0.1 degrees, 0.2 degrees, 0.3 degrees, 0.4 degrees, 0.5 degrees, 0.6 degrees, 0.7 degrees, 0.8 degrees, 0.9 degrees, 1.0 degree, 1.2 degrees, 1.3 degrees, 1.4 degrees, 1.5 degrees, 1.6 degrees, 1.7 degrees, 1.8 degrees, 1.9 degrees, and 2.0 degrees, but the present disclosure is not limited thereto.

Also, the collimation component 6020 may be implemented as an array.

For example, the collimation component 6020 may include at least one or more collimation elements and may be implemented in a form in which the collimation elements are arranged in an array, but the present disclosure is not limited thereto.

Also, for example, the collimation component 6020 may include at least one or more collimation units each including at least one collimation element and may be implemented in a form in which the collimation units are arranged in an array, but the present disclosure is not limited thereto.

Also, the collimation component 6020 may be formed to correspond to the VCSEL array 6010.

For example, the collimation component 6020 may be arranged in an array to correspond to the VCSEL array 6010, but the present disclosure is not limited thereto.

Also, for example, the collimation component 6020 may include a collimation element corresponding to the VCSEL emitter included in the VCSEL array 6010, but the present disclosure is not limited thereto.

Also, for example, the collimation component 6020 may include a collimation unit corresponding to the VCSEL unit included in the VCSEL array 6010, but the present disclosure is not limited thereto.

Also, for example, the collimation component 6020 may include a collimation element corresponding to the VCSEL unit included in the VCSEL array 6010, but the present disclosure is not limited thereto.

Also, the steering component 6030 may steer a laser beam collimated by the collimation component 6020.

For example, when a laser beam emitted from the VCSEL emitter included in the VCSEL array 6010 is collimated by the collimation component 6020, the steering component 6030 may steer the laser beam emitted from the VCSEL emitter and collimated by the collimation component 6020 to a predetermined angle, but the present disclosure is not limited thereto.

Also, for example, when a laser beam emitted from the VCSEL emitter included in the VCSEL array 6010 is collimated by the collimation component 6020, the steering component 6030 may steer the laser beam emitted from a VCSEL unit including the VCSEL emitter and collimated by the collimation component 6020 to a predetermined angle, but the present disclosure is not limited thereto.

Also, for example, when a laser beam emitted from the VCSEL unit included in the VCSEL array 6010 is collimated by the collimation component 6020, the steering component 6030 may steer the laser beam emitted from the VCSEL unit and collimated by the collimation component 6020 to a predetermined angle, but the present disclosure is not limited thereto.

Also, the angle to which the laser beam is steered may include various angles such as 0 degrees, 1 degree, 2 degrees, 3 degrees, 4 degrees, 5 degrees, 6 degrees, 7 degrees, 8 degrees, 9 degrees, 10 degrees, 20 degrees, 30 degrees, 40 degrees, 50 degrees, 60 degrees, 70 degrees, 80 degrees, 90 degrees, 100 degrees, 110 degrees, 120 degrees, 130 degrees, 140 degrees, 150 degrees, 160 degrees, 170 degrees, and 180 degrees, but the present disclosure is not limited thereto.

Also, the steering component 6030 may be implemented as an array.

For example, the steering component 6030 may include at least one or more steering elements and may be implemented in a form in which the steering elements are arranged in an array, but the present disclosure is not limited thereto.

Also, for example, the steering component 6030 may include at least one or more steering units each including at least one steering element and may be implemented in a form in which the steering units are arranged in an array, but the present disclosure is not limited thereto.

Also, the steering component 6030 may be formed to correspond to the VCSEL array 6010.

For example, the steering component 6030 may be arranged in an array to correspond to the VCSEL array 6010, but the present disclosure is not limited thereto.

Also, for example, the steering component 6030 may include a steering element corresponding to the VCSEL emitter included in the VCSEL array 6010, but the present disclosure is not limited thereto.

Also, for example, the steering component 6030 may include a steering unit corresponding to the VCSEL unit included in the VCSEL array 6010, but the present disclosure is not limited thereto.

Also, for example, the steering component 6030 may include a steering element corresponding to the VCSEL unit included in the VCSEL array 6010, but the present disclosure is not limited thereto.

Also, the steering component 6030 may be formed to correspond to the collimation component 6020.

For example, the steering component 6030 may be arranged in an array to correspond to the collimation component 6020, but the present disclosure is not limited thereto.

Also, for example, the steering component 6030 may include a steering element corresponding to the collimation element, but the present disclosure is not limited thereto.

Also, for example, the steering component 6030 may include a steering element corresponding to the collimation unit, but the present disclosure is not limited thereto.

Also, for example, the steering component 6030 may include a steering unit corresponding to the collimation unit, but the present disclosure is not limited thereto.

Also, the steering component 6030 may steer a laser beam emitted from the VCSEL array 6010 in various directions.

For example, the steering component 6030 may steer a first laser beam 6001 in a first direction, steer a second laser beam 6002 in a second direction, and steer a third laser beam 6003 in a third direction.

In this case, as shown in FIG. 129, the first laser beam 6001 may be a laser beam emitted from an upper right portion of the VCSEL array 6010, the second laser beam 6002 may be a laser beam emitted from a right portion of the VCSEL array 6010, and the third laser beam 6003 may be a laser beam emitted from a lower right portion of the VCSEL array 6010, but the present disclosure is not limited thereto.

Also, as shown in FIG. 129, the first direction in which the first laser beam 6001 is steered may refer to an upward and rightward direction of the FOV, the second direction in which the second laser beam 6002 is steered may refer to a rightward direction of the FOV, and the third direction in which the third laser beam 6003 is steered may refer to a downward and rightward direction of the FOV, but the present disclosure is not limited thereto.

Also, as shown in FIG. 129, the laser emitting unit 6000 may be formed to make a location from which a laser beam is emitted correspond to a direction in which the laser beam is steered.

Also, as shown in FIG. 129, when the laser emitting unit 6000 is formed to make a location from which a laser beam is emitted correspond to a direction in which the laser beam is steered, the laser emitting unit 6000 may have a focal .region formed by an extension line of the steered laser beam.

Also, the focal region may be used as a distance measurement origin.

Figure 130:
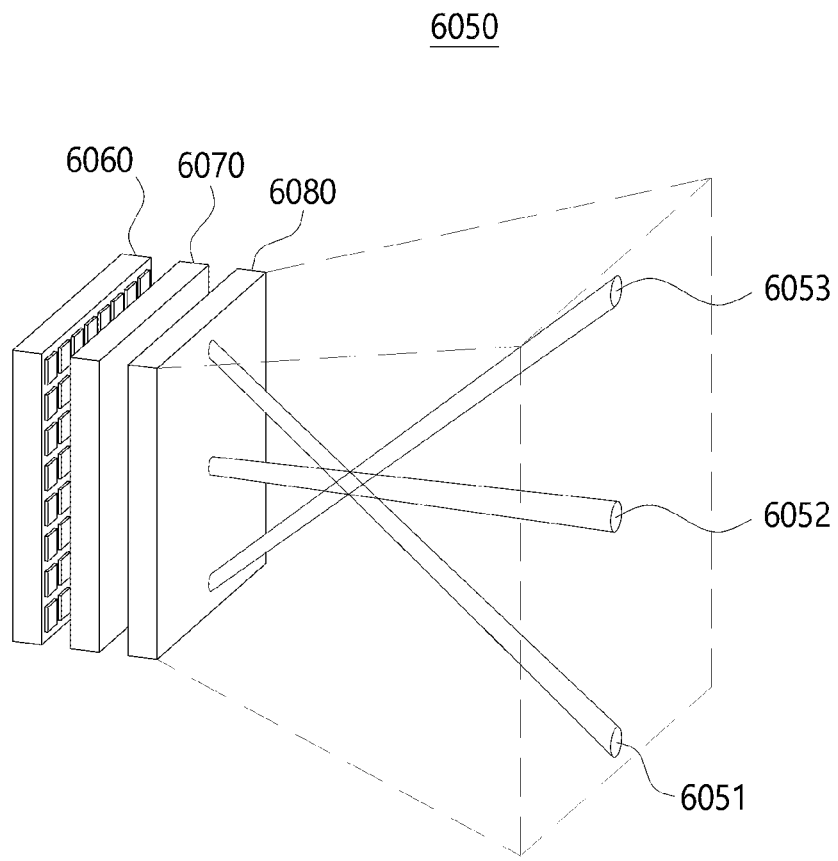
FIG. 130 is a diagram illustrating a laser beam output unit according to an embodiment.

FIG. 130 is a diagram illustrating a laser emitting unit according to an embodiment.

Referring to FIG. 130, a laser emitting unit 6050 according to an embodiment may include at least one of a VCSEL array 6060, a collimation component 6070, and a steering component 6080, but the present disclosure is not limited thereto.

In this case, the above description is applicable to the VCSEL array 6060, the collimation component 6070, and the steering component 6080, and a redundant description thereof will be omitted.

Meanwhile, the steering component 6080 may steer a laser beam emitted from the VCSEL array 6060 in various directions.

For example, the steering component 6080 may steer a first laser beam 6051 in a first direction, steer a second laser beam 6052 in a second direction, and steer a third laser beam 6053 in a third direction.

In this case, as shown in FIG. 130, the first laser beam 6051 may be a laser beam emitted from an upper portion of the VCSEL array 6060, the second laser beam 6052 may be a laser beam emitted from a central portion of the VCSEL array 6060, and the third laser beam 6053 may be a laser beam emitted from a lower portion of the VCSEL array 6060, but the present disclosure is not limited thereto.

Also, as shown in FIG. 130, the first direction in which the first laser beam 6051 is steered may refer to a downward direction of the FOV, the second direction in which the second laser beam 6052 is steered may refer to a central direction of the FOV, and the third direction in which the third laser beam 6053 is steered may refer to an upper direction of the FOV, but the present disclosure is not limited thereto.

Also, as shown in FIG. 130, the laser emitting unit 6050 may be formed to make a location from which a laser beam is emitted opposite to a direction in which the laser beam is steered.

Also, as shown in FIG. 130, when the laser emitting unit 6050 is formed so that a location from which a laser beam is emitted is opposite to a direction in which the laser beam is steered, the laser emitting unit 6050 may have a focal region in which the steered laser beam converges.

Also, the focal region may be used as a distance measurement origin.

Figure 131:
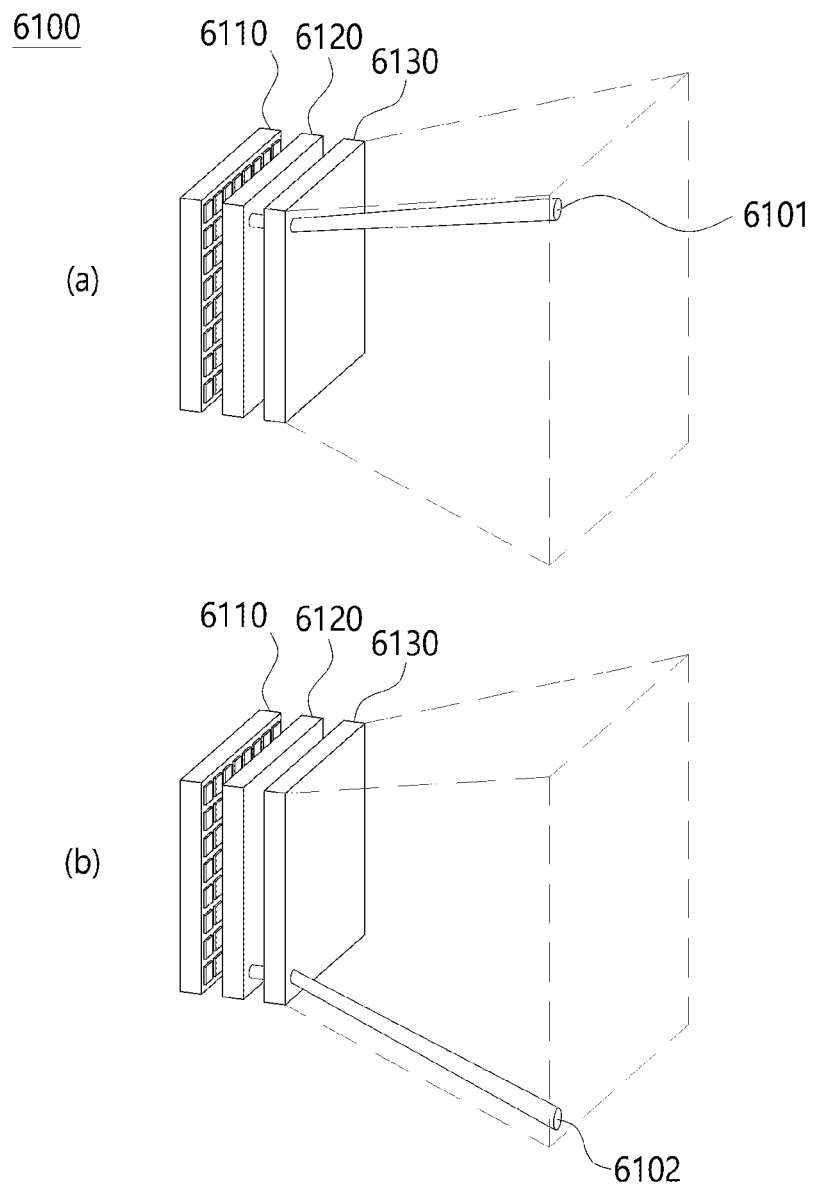
FIG. 131 is a diagram illustrating a laser beam output unit according to an embodiment.

FIG. 131 is a diagram illustrating a laser emitting unit according to an embodiment.

Referring to FIG. 131, a laser emitting unit 6100 according to an embodiment may include at least one of a VCSEL array 6110, a collimation component 6120, and a steering component 6130, but the present disclosure is not limited thereto.

In this case, the above description is applicable to the VCSEL array 6110, the collimation component 6120, and the steering component 6130, and a redundant description thereof will be omitted.

Meanwhile, only some of the at least one or more VCSEL emitters included in the VCSEL array 6110 may operate in the VCSEL array 6110.

For example, the VCSEL array 6110 may operate for each predetermined group. In detail, VCSEL emitters included in the VCSEL array 6110 may operate individually, and a VCSEL unit including at least one VCSEL emitters may operate as one group, but the present disclosure is not limited thereto.

Also, the VCSEL array 6110 may operate at a different time for each predetermined group. In detail, among VCSEL emitters included in the VCSEL array 6110, a first VCSEL emitter may operate first, and then the second VCSEL emitter may operate. Alternatively, among VCSEL units included in the VCSEL array 6110, a first VCSEL unit may operate first, and then a second VCSEL unit may operate. However, the present disclosure is not limited thereto.

For example, as shown in FIG. 131, a first laser beam 6101 may be emitted at a first time point, and a second laser beam 6102 may be emitted at a second time point. In this case, the first laser beam 6101 may be a laser beam emitted from the first VCSEL emitter or the first VCSEL unit, and the second laser beam 6102 may be a laser beam emitted from the second VCSEL emitter or the second VCSEL unit, but the present disclosure is not limited thereto.

Also, the steering component 6130 may steer a laser beam emitted from the VCSEL array 6110 in various directions.

For example, the steering component 6130 may steer a first laser beam 6101 in a first direction and steer a second laser beam 6102 in a second direction.

Also, as shown in FIG. 131, the first laser beam 6101 may be a laser beam emitted from a first group located at an upper right portion of the VCSEL array 6110, and the second laser beam 6102 may be a laser beam emitted from a second group located at a lower right portion of the VCSEL array 6110, but the present disclosure is not limited thereto.

Also, each of the first and second groups may refer to one VCSEL emitter or one VCSEL unit including at least one VCSEL emitter, but the present disclosure is not limited thereto.

Also, as shown in FIG. 131, the first laser beam 6101 and the second laser beam 6102 may be emitted at different times. For example, the first laser beam 6101 may be emitted from the first group at a first time point, and the second laser beam 6102 may be emitted from the second group at a second time point, but the present disclosure is not limited thereto.

Also, the laser beam emitted from the laser emitting unit 6100 may have an irradiation direction varying over time. For example, the first laser beam 6101 emitted at the first time point may be emitted in an upward and rightward direction of the FOV, and the second laser beam 6102 emitted at the second time point may be emitted in a downward and rightward direction of the FOV.

Accordingly, designing the laser emitting unit 6100 such that the irradiation direction varies over time in this way can expand a scannable range without mechanical operation, and thus it is possible to implement a LiDAR device where the laser emitting unit 6100 is placed as a solid-state LiDAR device.

The configuration of a laser emitting unit according to an embodiment of the present disclosure will be described in detail below. However, for convenience of description, the laser emitting array may be referred to as a VCSEL array, and the collimation component may be referred to as a microlens. However, the present disclosure is not limited thereto, and various laser emitting arrays and collimation components may be applicable.

FIG. 132 is a diagram illustrating the configuration of a laser emitting unit according to an embodiment.

Referring to FIG. 132, a laser emitting unit 6200 according to an embodiment may include a VCSEL array 6210 and a collimation component 6220, but the present disclosure is not limited thereto.

In this case, the VCSEL array 6210 may include at least one VCSEL emitter. For example, the VCSEL array 6210 may include a first VCSEL emitter 6211.

Also, the collimation component 6220 may include a microlens array. The microlens array may include at least one microlens element and may include a microlens unit including at least one microlens element.

Also, referring to FIG. 132(a), the collimation component 6220 may collimate a laser beam emitted from the VCSEL array 6210. However, the above description is applicable to this case, and thus a redundant description thereof will be omitted.

Also, referring to FIG. 132(a), the collimation component 6220 may be formed to correspond to the VCSEL array 6210. For example, a microlens element included in the collimation component 6220 may be formed to correspond to a VCSEL emitter included in the VCSEL array 6210, but the present disclosure is not limited thereto.

Also, the VCSEL array 6210 and the collimation component 6220 may be disposed in a predetermined relationship in order to increase the collimation efficiency of the collimation component 6220.

Accordingly, the layout of the VCSEL array 6210 and the collimation component 6220 will be described in detail below.

Referring to FIG. 132(b), the first VCSEL emitter 6211 included in the VCSEL array 6210 may have a first diameter 6230. In this case, the first diameter 6230 may refer to the size of the first VCSEL emitter 6211 and may be a side length, a diameter, or the like for expressing the size of the first VCSEL emitter 6211 in one dimension.

Also, referring to FIG. 132(b), a first VCSEL emitter 6211 and a second VCSEL emitter 6212 included in the VCSEL array 6210 may be disposed at a first interval 6250. In this case, the first interval 6250 may be for expressing the distance between the first VCSEL emitter 6211 and the second VCSEL emitter 6212 in one dimension.

Also, referring to FIG. 132(b), a first microlens element 6221 included in the collimation component 6220 may have a second diameter 6240. In this case, the second diameter 6240 may refer to the size of the first microlens element 6221 and may be a side length, a diameter, or the like for expressing the size of the first microlens element 6221 in one dimension.

Also, referring to FIG. 132(b), the first microlens element 6221 may be disposed to correspond to the first VCSEL emitter 6211 in order to collimate a laser beam emitted from the first VCSEL emitter 6211.

Also, referring to FIG. 132(b), in order to increase collimation efficiency, the second diameter 6240 of the first microlens element 6221 may be greater than the first diameter 6230 of the first VCSEL emitter 6211. For example, the first diameter 6230 of the first VCSEL emitter 6211 may be 14 μm, and the second diameter 6240 of the first microlens element 6221 may be 140 μm, but the present disclosure is not limited thereto.

Also, referring to FIG. 132(b), in order to increase collimation efficiency, the second diameter 6240 of the first microlens element 6221 may correspond to the first interval 6250. For example, the first interval 6250 may be 140 μm, and the second diameter 6240 may be 140 μm, but the present disclosure is not limited thereto.

Also, referring to FIG. 132(b), in order to increase collimation efficiency, the first interval 6250 may be greater than the first diameter 6230 of the first VCSEL emitter 6211. For example, the first diameter 6230 of the first VCSEL emitter 6211 may be 14 μm, and the first interval 6250 may be 140 μm, but the present disclosure is not limited thereto.

Also, referring to FIG. 132(b), in order to increase collimation efficiency and decrease thermal density, the first interval 6250 may be greater than the first diameter 6230 of the first VCSEL emitter 6211 by a certain value or greater. For example, the first interval 6250 may be five times or more the first diameter 6230 of the first VCSEL emitter 6211, but the present disclosure is not limited thereto.

FIG. 133 is a diagram illustrating the configuration of a laser emitting unit according to an embodiment.

Referring to FIG. 133, a laser emitting unit 6300 according to an embodiment may include a VCSEL array 6310 and a collimation component 6320, but the present disclosure is not limited thereto.

In this case, the VCSEL array 6310 may include at least one VCSEL emitter. For example, the VCSEL array 6310 may include a first VCSEL emitter 6311, a second VCSEL emitter 6312, and a third VCSEL emitter 6313.

Also, the collimation component 6320 may include a microlens array. The microlens array may include at least one microlens element and may include a microlens unit including at least one microlens element.

Also, referring to FIG. 133(a), the collimation component 6320 may collimate a laser beam emitted from the VCSEL array 6310. However, the above description is applicable to this case, and thus a redundant description thereof will be omitted.

Also, referring to FIG. 133(a), the collimation component 6320 may be formed to correspond to the VCSEL array 6210. For example, a microlens element included in the collimation component 6320 may be formed to correspond to a VCSEL unit included in the VCSEL array 6310, but the present disclosure is not limited thereto.

Also, the VCSEL array 6310 and the collimation component 6320 may be disposed in a predetermined relationship in order to increase the collimation efficiency of the collimation component 6320.

Accordingly, the layout of the VCSEL array 6310 and the collimation component 6320 will be described in detail below.

Referring to FIG. 133(b), the first VCSEL emitter 6311 included in the VCSEL array 6310 may have a first diameter 6330. In this case, the first diameter 6330 may refer to the size of the first VCSEL emitter 6311 and may be a side length, a diameter, or the like for expressing the size of the first VCSEL emitter 6311 in one dimension.

Also, referring to FIG. 133(b), a first VCSEL unit including the first VCSEL emitter 6311, the second VCSEL emitter 6312, and the third VCSEL emitter 6313 included in the VCSEL array 6310 may have a second diameter 6350. In this case, the second diameter 6350 may refer to the size of the first VCSEL unit and may be a side length, a diameter, or the like for expressing the size of the first VCSEL unit in one dimension.

Also, referring to FIG. 133(b), a first microlens element 6321 included in the collimation component 6320 may have a third diameter 6340. In this case, the third diameter 6340 may refer to the size of the first microlens element 6321 and may be a side length, a diameter, or the like for expressing the size of the first microlens element 6321 in one dimension.

Also, referring to FIG. 133(b), the first microlens element 6321 may be disposed to correspond to the first VCSEL unit in order to collimate a laser beam emitted from the first VCSEL unit.

Also, referring to FIG. 133(b), in order to increase collimation efficiency, the third diameter 6340 of the first microlens element 6321 may be greater than the second diameter 6350 of the first VCSEL unit. For example, the second diameter 6350 of the first VCSEL unit may be 1.3 mm, and the third diameter 6340 of the first microlens element 6321 may be 1.4 mm, but the present disclosure is not limited thereto.

Figure 134:
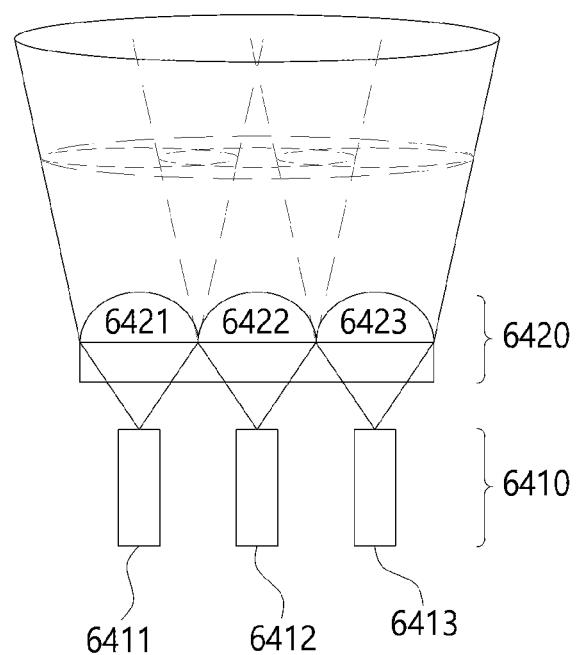
FIG. 134 is a diagram illustrating the configuration of a laser beam output unit according to an embodiment.

FIG. 134 is a diagram illustrating the configuration of a laser emitting unit according to an embodiment.

Referring to FIG. 134, a laser emitting unit 6400 according to an embodiment may include a VCSEL array 6410 and a collimation component 6420, but the present disclosure is not limited thereto.

In this case, the VCSEL array 6410 may include at least one VCSEL emitter. For example, the VCSEL array 6410 may include a first VCSEL emitter 6411, a second VCSEL emitter 6412, and a third VCSEL emitter 6413.

Also, the VCSEL array 6410 may include a VCSEL unit including at least one VCSEL emitter. For example, the VCSEL array 6410 may include a first VCSEL unit including the first VCSEL emitter 6411, the second VCSEL emitter 6412, and the third VCSEL emitter 6413.

Also, the collimation component 6420 may include a microlens array. The microlens array may include at least one microlens element. For example, the collimation component 6420 may include a first microlens element 6421, a second microlens element 6422, and a third microlens element 6423.

Also, the collimation component 6420 may include a microlens unit including at least one microlens element. For example, the collimation component 6420 may include a first microlens unit including the first microlens element 6421, the second microlens element 6422, and the third microlens element 6423.

Also, referring to FIG. 134, the collimation component 6420 may collimate a laser beam emitted from the VCSEL array 6410. However, the above description is applicable to this case, and thus a redundant description thereof will be omitted.

Also, referring to FIG. 134, a laser beam emitted from the VCSEL array 6410 and collimated through the collimation component 6420 may have a divergence angle greater than or equal to a certain angle. For example, a laser beam emitted from the VCSEL array 6410 and collimated through the collimation component 6420 may have a divergence angle of 1.2 degrees, but the present disclosure is not limited thereto.

Also, referring to FIG. 134, at least one laser beam emitted from at least one VCSEL emitter included in the VCSEL unit may form one beam profile. For example, first, second, and third laser beams emitted from the first, second, and third VCSEL emitters 6411, 6412, and 6413 may be collimated by the first, second, and third microlens elements 6421, 6422, and 6423 to form one beam profile, but the present disclosure is not limited thereto.

Also, referring to FIG. 134, at least two laser beams emitted from at least two VCSEL emitters included in the VCSEL unit may at least partially overlap and may form one beam profile based on the overlap region. For example, the first, second, and third laser beams may be collimated with a certain divergence angle through the first, second, and third microlens elements 6421, 6422, and 6423, may at least partially overlap due to the divergence angle, and may form one beam profile based on the overlap region, but the present disclosure is not limited thereto.

Figure 135:
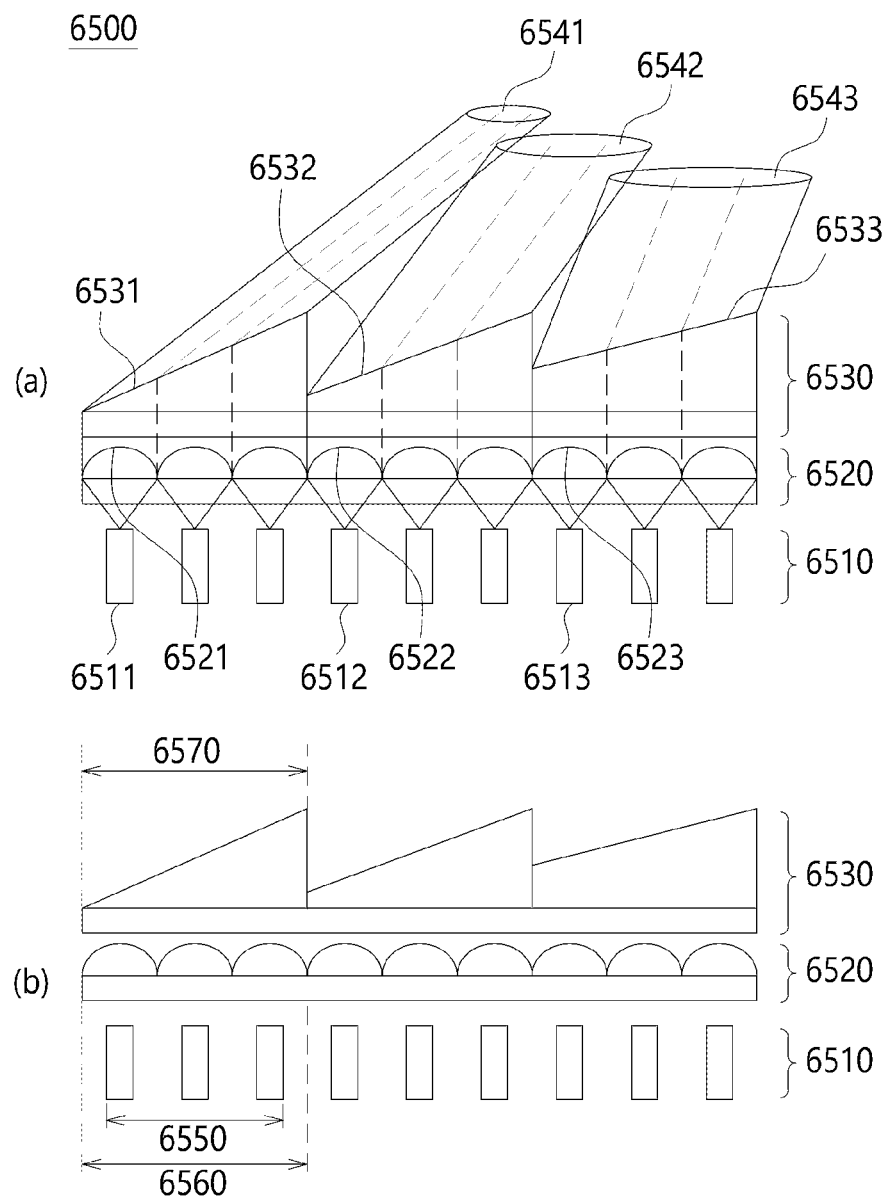
FIG. 135 is a diagram illustrating the configuration of a laser beam output unit according to an embodiment.

FIG. 135 is a diagram illustrating the configuration of a laser emitting unit according to an embodiment.

Referring to FIG. 135, a laser emitting unit 6500 according to an embodiment may include a VCSEL array 6510, a collimation component 6520, and a steering component 6530, but the present disclosure is not limited thereto.

In this case, the VCSEL array 6510 may include at least one VCSEL emitter. For example, the VCSEL array 6510 may include a first VCSEL emitter 6511, a second VCSEL emitter 6512, and a third VCSEL emitter 6513.

Also, the VCSEL array 6510 may include a VCSEL unit including at least one VCSEL emitter. For example, the VCSEL array 6510 may include a first VCSEL unit including the first VCSEL emitter 6511, a second VCSEL unit including the second VCSEL emitter 6512, and a third VCSEL unit including the third VCSEL emitter 6513.

Also, the collimation component 6520 may include a microlens array. The microlens array may include at least one microlens element. For example, the collimation component 6520 may include a first microlens element 6521, a second microlens element 6522, and a third microlens element 6523.

Also, the collimation component 6520 may include a microlens unit including at least one microlens element. For example, the collimation component 6520 may include a first microlens unit including the first microlens element 6521, a second microlens unit including the second microlens element 6522, and a third microlens unit including the third microlens element 6523.

Also, the steering component 6530 may include a prism array, and the prism array may include at least one prism element. For example, the steering component 6530 may include a first prism element 6531, a second prism element 6532, and a third prism element 6533.

Also, referring to FIG. 135(*a*), the collimation component 6520 may collimate a laser beam emitted from the VCSEL array 6510. However, the above description is applicable to this case, and thus a redundant description thereof will be omitted.

Also, referring to FIG. 135(*a*), the steering component 6530 may steer a laser beam emitted from the VCSEL array 6510 and collimated through the collimation component 6520. However, the above description is applicable to this case, and thus a redundant description thereof will be omitted.

Also, referring to FIG. 135(*a*), the steering component 6530 may steer a laser beam emitted from the VCSEL emitter included in the VCSEL array 6510. For example, the first prism element 6531 included in the steering component 6530 may steer a laser beam emitted from the first VCSEL emitter, but the present disclosure is not limited thereto.

Also, referring to FIG. 135(*a*), the steering component 6530 may steer a laser beam emitted from the VCSEL unit included in the VCSEL array 6510. For example, the first prism element 6531 included in the steering component 6530 may steer a laser beam emitted from the first VCSEL unit including the first VCSEL emitter 6511, but the present disclosure is not limited thereto.

Also, referring to FIG. 135(*a*), the steering component 6530 may steer a laser beam group including at least one laser beam emitted from a VCSEL unit included in the VCSEL array 6510 to the same angle. For example, the first prism element 6531 included in the steering component 6530 may steer a first laser beam group 6541 emitted from the first VCSEL unit including the first VCSEL emitter 6511 to a first angle, but the present disclosure is not limited thereto.

Also, referring to FIG. 135(*a*), the steering component 6530 may steer at least two laser beam groups emitted from at least two VCSEL units included in the VCSEL array 6510 to different angles. For example, the first prism element 6531 may steer a first laser beam group 6541 emitted from a first VCSEL unit including the first VCSEL emitter 6511 to a first angle, the second prism element 6532 may steer a second laser beam group 6542 emitted from a second VCSEL unit including the second VCSEL emitter 6512 to a second angle, and the third prism element 6533 may steer a third laser beam group 6543 emitted from a third VCSEL unit including the third VCSEL emitter 6513 to a third angle, but the present disclosure is not limited thereto.

Also, the above description is applicable to the layout of the VCSEL array 6510 and the collimation component 6520, and thus a redundant description thereof will be omitted.

Meanwhile, in order to increase the steering efficiency of the steering component 6530, the VCSEL array 6510, the collimation component 6520, and the steering component 6530 may be disposed in a predetermined relationship.

Accordingly, the layout of the VCSEL array 6510, the collimation component 6520, and the steering component 6530 will be described in detail below.

Referring to FIG. 135(b), the first VCSEL unit including the first VCSEL emitter 6511 included in the VCSEL array 6510 may have a first diameter 6550. In this case, the first diameter 6550 may refer to the size of the first VCSEL unit and may be a side length, a diameter, or the like for expressing the size of the first VCSEL unit in one dimension.

Also, referring to FIG. 135(b), a first microlens unit including the first microlens element 6521 included in the collimation component 6520 may have a second diameter 6560. In this case, the second diameter 6560 may refer to the size of the first microlens unit and may be a side length, a diameter, or the like for expressing the size of the first microlens unit in one dimension.

Also, referring to FIG. 135(b), the first prism element 6531 included in the steering component 6530 may have a third diameter 6570. In this case, the third diameter 6570 may refer to the size of the first prism element 6531 and may be a side length, a diameter, or the like for expressing the size of the first prism element 6531 in one dimension.

Also, referring to FIG. 135(b), the first prism element 6531 may be disposed to correspond to the first VCSEL unit in order to steer a first laser beam group emitted from the first VCSEL unit.

Also, referring to FIG. 135(b), in order to increase steering efficiency, the third diameter 6570 of the first prism element 6531 may be greater than the first diameter 6550 of the first VCSEL unit. For example, the first diameter 6550 of the first VCSEL unit may be 1.3 mm, and the third diameter 6570 of the first prism element 6531 may be 1.4 mm, but the present disclosure is not limited thereto.

Also, referring to FIG. 135(b), the first prism element 6531 may be disposed to correspond to the first microlens unit in order to steer the first laser beam group emitted from the first VCSEL unit and collimated through the first microlens unit.

Also, referring to FIG. 135(b), in order to increase steering efficiency, the third diameter 6570 of the first prism element 6531 may be greater than or equal to the second diameter 6560 of the first microlens unit. For example, the second diameter 6560 of the first microlens unit may be 1.4 mm, and the third diameter 6570 of the first prism element 6531 may be 1.4 mm, but the present disclosure is not limited thereto.

Figure 136:
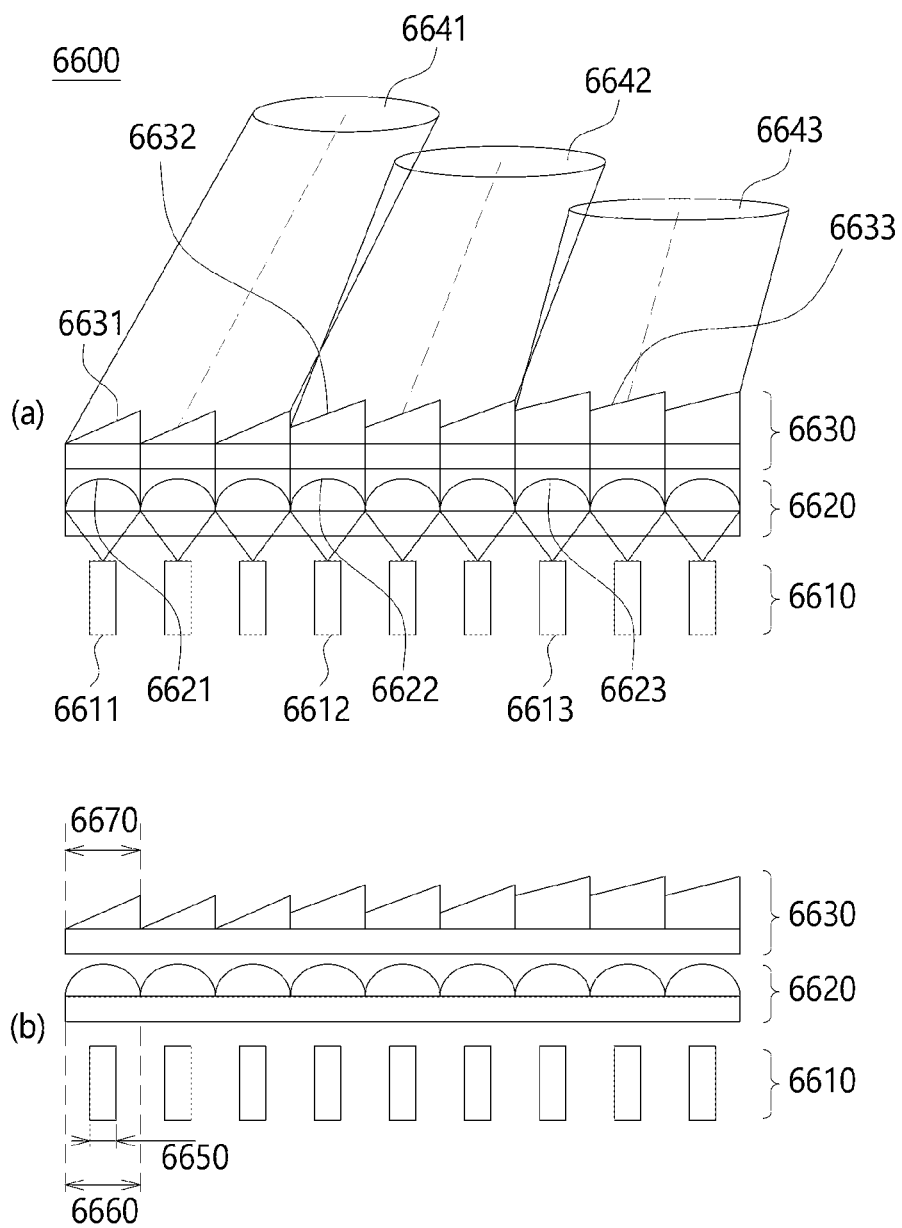
FIG. 136 is a diagram illustrating the configuration of a laser beam output unit according to an embodiment.

FIG. 136 is a diagram illustrating the configuration of a laser emitting unit according to an embodiment.

Referring to FIG. 136, a laser emitting unit 6600 according to an embodiment may include a VCSEL array 6610, a collimation component 6620, and a steering component 6630, but the present disclosure is not limited thereto.

In this case, the VCSEL array 6610 may include at least one VCSEL emitter. For example, the VCSEL array 6610 may include a first VCSEL emitter 6611, a second VCSEL emitter 6612, and a third VCSEL emitter 6613.

Also, the VCSEL array 6610 may include a VCSEL unit including at least one VCSEL emitter. For example, the VCSEL array 6610 may include a first VCSEL unit including the first VCSEL emitter 6611, a second VCSEL unit including the second VCSEL emitter 6612, and a third VCSEL unit including the third VCSEL emitter 6613.

Also, the collimation component 6620 may include a microlens array. The microlens array may include at least one microlens element. For example, the collimation component 6620 may include a first microlens element 6621, a second microlens element 6622, and a third microlens element 6623.

Also, the collimation component 6620 may include a microlens unit including at least one microlens element. For example, the collimation component 6620 may include a first microlens unit including the first microlens element 6621, a second microlens unit including the second microlens element 6622, and a third microlens unit including the third microlens element 6623.

Also, the steering component 6630 may include a prism array, and the prism array may include at least one prism element. For example, the steering component 6630 may include a first prism element 6631, a second prism element 6632, and a third prism element 6633.

Also, the steering component 6630 may include a prism unit including at least one prism element. For example, the steering component 6630 may include a first prism unit including the first prism element 6631, a second prism unit including the second prism element 6632, and a third prism unit including the third prism element 6633.

Also, referring to FIG. 136(a), the collimation component 6620 may collimate a laser beam emitted from the VCSEL array 6610. However, the above description is applicable to this case, and thus a redundant description thereof will be omitted.

Also, referring to FIG. 136(a), the steering component 6630 may steer a laser beam emitted from the VCSEL array 6610 and collimated through the collimation component 6620. However, the above description is applicable to this case, and thus a redundant description thereof will be omitted.

Also, referring to FIG. 136(a), the steering component 6630 may steer a laser beam emitted from the VCSEL emitter included in the VCSEL array 6610. For example, the first prism element 6631 included in the steering component 6630 may steer a laser beam emitted from the first VCSEL emitter, but the present disclosure is not limited thereto.

Also, referring to FIG. 136(a), the steering component 6630 may steer a laser beam emitted from the VCSEL unit included in the VCSEL array 6610. For example, the first prism unit including the first prism element 6631 included in the steering component 6630 may steer a laser beam emitted from the first VCSEL unit including the first VCSEL emitter 6611, but the present disclosure is not limited thereto.

Also, referring to FIG. 136(a), the steering component 6630 may steer a laser beam group including at least one laser beam emitted from a VCSEL unit included in the VCSEL array 6610 to the same angle. For example, the first prism unit including the first prism element 6631 included in the steering component 6630 may steer a first laser beam group 6641 emitted from the first VCSEL unit including the first VCSEL emitter 6611 to a first angle.

Also, referring to FIG. 136(a), the steering component 6630 may steer at least two laser beam groups emitted from at least two VCSEL units included in the VCSEL array 6610 to different angles. For example, the first prism unit including the first prism element 6631 may steer the first laser beam group 6641 emitted from the first VCSEL unit including the first VCSEL emitter 6611 to the first angle, the second prism unit including the second prism element 6632 may steer a second laser beam group 6642 emitted from the second VCSEL unit including the second VCSEL emitter 6612 to a second angle, and the third prism unit including the third prism element 6633 may steer a third laser beam group 6643 emitted from the third VCSEL unit including the third VCSEL emitter 6613 to a third angle, but the present disclosure is not limited thereto.

Also, the above description is applicable to the layout of the VCSEL array 6610 and the collimation component 6620, and thus a redundant description thereof will be omitted.

Meanwhile, in order to increase the steering efficiency of the steering component 6630, the VCSEL array 6610, the collimation component 6620, and the steering component 6630 may be disposed in a predetermined relationship.

Accordingly, the layout of the VCSEL array 6610, the collimation component 6620, and the steering component 6630 will be described in detail below.

Referring to FIG. 136(*b*), the first VCSEL emitter 6611 included in the VCSEL array 6610 may have a first diameter 6650. In this case, the first diameter 6650 may refer to the size of the first VCSEL emitter 6611 and may be a side length, a diameter, or the like for expressing the size of the first VCSEL unit in one dimension.

Also, referring to FIG. 136(*b*), the first microlens element 6621 included in the collimation component 6620 may have a second diameter 6660. In this case, the second diameter 6660 may refer to the size of the first microlens element 6621 and may be a side length, a diameter, or the like for expressing the size of the first microlens element 6621 in one dimension.

Also, referring to FIG. 136(*b*), the first prism element 6631 included in the steering component 6630 may have a third diameter 6670. In this case, the third diameter 6670 may refer to the size of the first prism element 6631 and may be a side length, a diameter, or the like for expressing the size of the first prism element 6631 in one dimension.

Also, referring to FIG. 136(*b*), the first prism element 6631 may be disposed to correspond to the first VCSEL emitter 6611 in order to steer a laser beam emitted from the first VCSEL emitter 6611.

Also, referring to FIG. 136(*b*), in order to increase steering efficiency, the third diameter 6670 of the first prism element 6631 may be greater than the first diameter 6650 of the first VCSEL emitter 6611. For example, the first diameter 6650 of the first VCSEL emitter 6611 may be 14 μm, and the third diameter 6670 of the first prism element 6631 may be 140 μm, but the present disclosure is not limited thereto.

Also, referring to FIG. 136(*b*), the first prism element 6631 may be disposed to correspond to the first microlens element 6621 in order to steer a laser beam emitted from the first VCSEL emitter 6611 and collimated through the first microlens element 6621.

Also, referring to FIG. 136(*b*), in order to increase steering efficiency, the third diameter 6670 of the first prism element 6631 may be greater than or equal to the second diameter 6660 of the first microlens element 6621. For example, the second diameter 6660 of the first microlens element 6621 may be 140 μm, and the third diameter 6670 of the first prism element 6631 may be 141 μm, but the present disclosure is not limited thereto.

Figure 137:
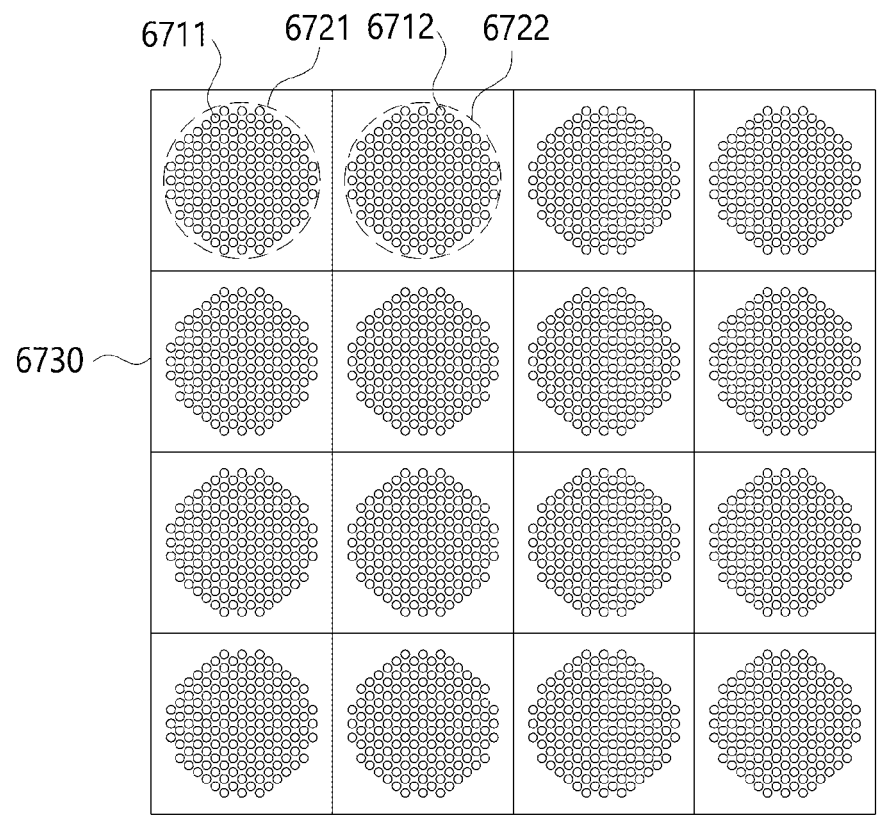
FIG. 137 is a diagram illustrating a laser beam output unit according to an embodiment.

FIG. 137 is a diagram illustrating a laser emitting unit according to an embodiment.

Referring to FIG. 137, a laser emitting unit 6700 according to an embodiment may include a VCSEL array 6730.

In this case, the VCSEL array 6730 may include at least one VCSEL emitter. For example, the VCSEL array 6730 may include a first VCSEL emitter 6711 and a second VCSEL emitter 6712, but the present disclosure is not limited thereto.

Also, the VCSEL array 6730 may include a VCSEL unit including at least one VCSEL emitter. For example, the VCSEL array 6730 may include a first VCSEL unit 6721 including the first VCSEL emitter 6711 and a second VCSEL unit 6722 including the second VCSEL emitter 6712, but the present disclosure is not limited thereto.

Also, at least one VCSEL emitter included in the VCSEL array 6730 may operate independently to emit laser beams independently. For example, the first VCSEL emitter 6711 and the second VCSEL emitter 6712 included in the VCSEL array 6730 may operate independently to emit laser beams independently, but the present disclosure is not limited thereto.

Also, at least one VCSEL unit included in the VCSEL array 6730 may operate independently to emit laser beams independently. For example, the first VCSEL unit 6721 and the second VCSEL unit 6722 included in the VCSEL array 6730 may operate independently to emit laser beams independently, but the present disclosure is not limited thereto.

Also, individual VCSEL emitters included in the VCSEL unit may operate in connection with each other to emit laser beams at the same time. For example, the first VCSEL emitter 6711 included in the first VCSEL unit 6721 and at least one VCSEL emitter other than the first VCSEL emitter 6711 may operate in connection to each other to emit laser beams at the same time, but the present disclosure is not limited thereto.

Also, laser beams emitted from individual VCSEL emitters included in the VCSEL unit may form a laser beam group. For example, laser beams emitted from the first VCSEL emitter 6711 included in the first VCSEL unit 6721 and at least one VCSEL emitter other than the first VCSEL emitter 6711 may form a first laser beam group, and laser beams emitted from the second VCSEL emitter 6712 included in the second VCSEL unit 6722 and at least one VCSEL emitter other than the second VCSEL emitter 6712 may form a second laser beam group, but the present disclosure is not limited thereto.

Also, in order to increase the emission efficiency, collimation efficiency, and steering efficiency of the laser emitting unit 6700, the interval between VCSEL units included in the VCSEL array 6730 may be greater than the interval between VCSEL emitters included in each VCSEL unit. For example, the interval between the first VCSEL unit 6721 and the second VCSEL unit 6722 may be greater than the interval between adjacent VCSEL emitters included in the first VCSEL unit 6721, but the present disclosure is not limited thereto.

Also, when the interval between the VCSEL units is greater than the interval between adjacent VCSEL emitters as described above, the VCSEL array 6730, the collimation component, and the steering component may have a predetermined layout. This will be described in detail below.

Figure 138:
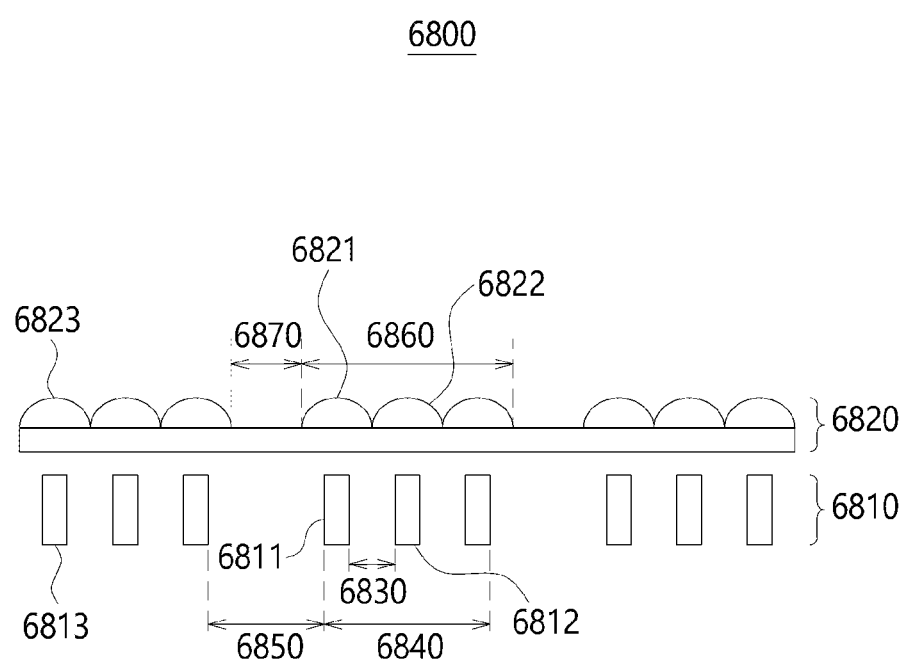
FIG. 138 is a diagram illustrating the configuration of a laser beam output unit according to an embodiment.

FIG. 138 is a diagram illustrating the configuration of a laser emitting unit according to an embodiment.

Referring to FIG. 138, a laser emitting unit 6800 according to an embodiment may include a VCSEL array 6810 and a collimation component 6820, but the present disclosure is not limited thereto.

In this case, the VCSEL array 6810 may include at least one VCSEL emitter. For example, the VCSEL array 6810 may include a first VCSEL emitter 6811, a second VCSEL emitter 6812, and a third VCSEL emitter 6813.

Also, the VCSEL array 6810 may include a VCSEL unit including at least one VCSEL emitter. For example, the VCSEL array 6810 may include a first VCSEL unit including the first VCSEL emitter 6811 and the second VCSEL emitter 6812 and a second VCSEL unit including the third VCSEL emitter 6813.

Also, the collimation component 6820 may include a microlens array. The microlens array may include at least one microlens element. For example, the collimation component 6820 may include a first microlens element 6821, a second microlens element 6822, and a third microlens element 6823.

Also, the collimation component 6820 may include a microlens unit including at least one microlens element. For example, the collimation component 6820 may include a first microlens unit including the first microlens element 6821 and the second microlens element 6822 and a second microlens unit including the third microlens element 6823.

Also, referring to FIG. 138, the first VCSEL emitter 6811 and the second VCSEL emitter 6812 may be disposed at a first interval 6830. In this case, the first interval 6830 may be for expressing the distance between the first VCSEL emitter 6811 and the second VCSEL emitter 6812 in one dimension.

Also, referring to FIG. 138, the first VCSEL unit may have a first diameter 6840. In this case, the first diameter 6840 may refer to the size of the first VCSEL unit and may be a side length, a diameter, or the like for expressing the size of the first VCSEL unit in one dimension.

Also, referring to FIG. 138, the first VCSEL unit and the second VCSEL unit may be disposed at a second interval 6850. In this case, the second interval 6850 may be for expressing the distance between the first VCSEL unit and the second VCSEL unit in one dimension.

Also, referring to FIG. 138, the first microlens unit may have a second diameter 6860. In this case, the second diameter 6860 may refer to the size of the first microlens unit and may be a side length, a diameter, or the like for expressing the size of the first microlens unit in one dimension.

Also, referring to FIG. 138, the first microlens unit and the second microlens unit may be disposed at a third interval 6870. In this case, the third interval 6870 may be for expressing the distance between the first microlens unit and the second microlens unit in one dimension.

Also, referring to FIG. 138, in order to reduce interference between laser beams emitted from different VCSEL units, the second interval 6850 may be greater than or equal to the first interval 6830.

Also, referring to FIG. 138, in order to increase collimation efficiency, the second interval 6850 may be greater than or equal to the third interval 6870.

Also, referring to FIG. 138, in order to increase the collimation efficiency of laser beams emitted from different VCSEL units, the third interval 6870 may be greater than or equal to the first interval 6830.

Also, referring to FIG. 138, in order to decrease the size of the laser emitting unit 6800, the second interval 6850 may be smaller than or equal to the first diameter 6840.

Also, referring to FIG. 138, in order to decrease the size of the laser emitting unit 6800, the third interval 6870 may be smaller than or equal to the second diameter 6860.

Figure 139:
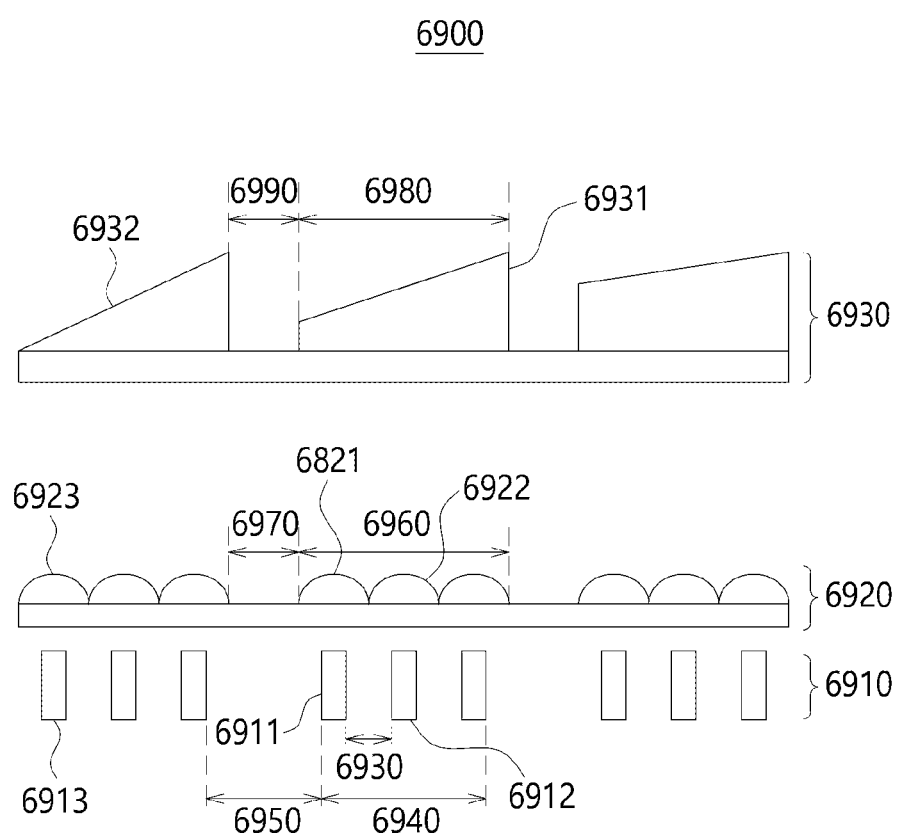
FIG. 139 is a diagram illustrating the configuration of a laser beam output unit according to an embodiment.

FIG. 139 is a diagram illustrating the configuration of a laser emitting unit according to an embodiment.

Referring to FIG. 139, a laser emitting unit 6900 according to an embodiment may include a VCSEL array 6910, a collimation component 6920, and a steering component 6930, but the present disclosure is not limited thereto.

In this case, the VCSEL array 6910 may include a first VCSEL emitter 6911, a second VCSEL emitter 6912, and a third VCSEL emitter 6913 and may include a first VCSEL unit including the first and second VCSEL emitters 6911 and 6912 and a second VCSEL unit including the third VCSEL emitter 6913. The above description is applicable to this case, and thus a redundant description thereof will be omitted.

Also, the collimation component 6920 may include a first microlens element 6921, a second microlens element 6922, and a third microlens element 6923 and may include a first microlens unit including the first and second microlens elements 6921 and 6922 and a second microlens unit including the third microlens element 6923. The above description is applicable to this case, and thus a redundant description thereof will be omitted.

Also, the steering component 6930 may include a prism array, and the prism array may include at least one prism element. For example, the steering component 6930 may include a first prism element 6931 and a second prism element 6932.

Also, the above description is applicable to a first interval 6930, which is an interval between the first VCSEL emitter 6911 and the second VCSEL emitter 6912, a first diameter 6940, which is the diameter of the first VCSEL unit, a second interval 6950, which is the interval between the first VCSEL unit and the second VCSEL unit, a second diameter 6960, which is the diameter of the first microlens unit, and a third interval 6970, which is an interval between the first and second microlens units, and thus a redundant description thereof will be omitted.

Meanwhile, the first prism element 6931 may have a third diameter 6980. In this case, the third diameter 6980 may refer to the size of the first prism element 6931 and may be a side length, a diameter, or the like for expressing the size of the first prism element 6931 in one dimension.

Also, the first prism element 6931 and the second prism element 6932 may be disposed at a fourth interval 6990. In this case, the fourth interval 6990 may be for expressing the distance between the first prism element 6931 and the second prism element 6932 in one dimension.

Also, referring to FIG. 139, in order to increase steering efficiency, the second interval 6950 may be greater than or equal to the fourth interval 6990.

Also, referring to FIG. 139, in order to increase the steering efficiency of a collimated laser beam, the third interval 6970 may be greater than or equal to the fourth interval 6990.

Also, referring to FIG. 139, in order to decrease the size of the laser emitting unit 6900, the fourth interval 6990 may be smaller than or equal to the first diameter 6940.

Also, referring to FIG. 139, in order to decrease the size of the laser emitting unit 6900, the fourth interval 6990 may be smaller than or equal to the second diameter 6960.

Also, referring to FIG. 139, in order to decrease the size of the laser emitting unit 6900, the fourth interval 6990 may be smaller than or equal to the third diameter 6980.

Also, referring to FIG. 139, in order to increase collimation and steering efficiency, the first diameter 6940 may be smaller than or equal to the second diameter 6960, and the second diameter 6960 may be smaller than or equal to the third diameter 6980.

Also, referring to FIG. 139, distances between prism elements may be different from each other, but the present disclosure is not limited thereto.

Figure 140:
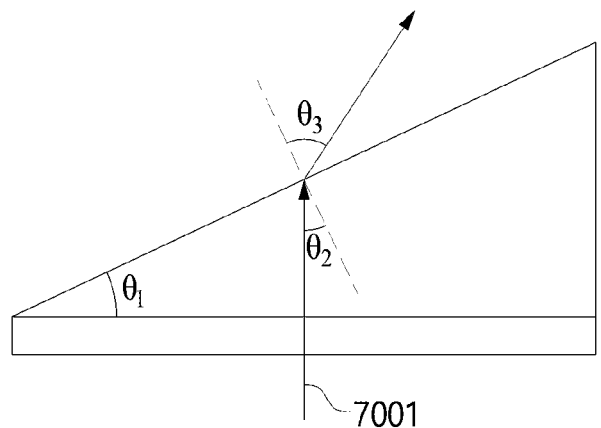
FIG. 140 is a diagram illustrating a steering component according to an embodiment.

FIG. 140 is a diagram illustrating a steering component according to an embodiment.

Referring to FIG. 140, a steering component 7000 according to an embodiment may include a prism.

Also, the prism may be formed at a first angle 61, but the present disclosure is not limited thereto.

Also, the prism may acquire a laser beam 7001, and the acquired laser beam 7001 may be steered to a certain angle.

Also, the laser beam 7001 acquired by the prism may be incident on one face of the prism at a second angle $\theta_2$.

In this case, the second angle $\theta_2$ may be the same as the first angle $\theta_1$.

Also, the laser beam 7001 may be steered to a third angle $\theta_3$ from a normal line with respect to one face of the prism.

In this case, the third angle $\theta_3$ may be determined by the law of refraction.

In detail, when the refractive index of the prism is n2 and the refractive index of air is n3, the third angle $\theta_3$ may be determined by Equation 1 below.

$$\theta_3 = \sin^{-1}\left(\frac{n_2 \sin\theta_2}{n_3}\right) \qquad \text{Equation 1}$$

Also, the first angle $\theta_1$ may satisfy Equation 2 below so that the steered laser beam can be emitted to the outside.

$$\theta_1 \le \sin^{-1}\left(\frac{n_3}{n_2}\right) \qquad \text{Equation 2}$$

Figure 141:
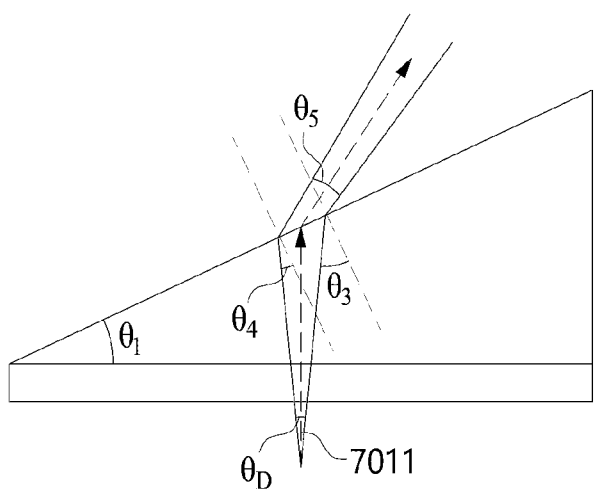
FIG. 141 is a diagram illustrating a steering component according to an embodiment.

FIG. 141 is a diagram illustrating a steering component according to an embodiment.

Referring to FIG. 141, a steering component 7010 according to an embodiment may include a prism.

Also, the prism may be formed at a first angle $\theta_1$, but the present disclosure is not limited thereto.

Also, the prism may acquire a laser beam 7011, and the acquired laser beam 7011 may be steered to a certain angle.

Also, the laser beam 7011 may have a certain divergence angle $\theta_D$ but the present disclosure is not limited thereto.

Also, the laser beam 7011 acquired by the prism may be incident on one face of of the laser beam 7011, at the prism at a second angle. Due to the divergence angle least a portion of the laser beam 7011 may be incident on one face of the prism at a third angle $\theta_3$, and at least another portion of the laser beam 7011 may be incident on one face of the prism at a fourth angle $\theta_4$, but the present disclosure is not limited thereto.

In this case, the third angle $\theta_3$ may become $$\theta_1 + \frac{\theta_D}{2}.$$

Also, the fourth angle $\theta_4$ may become $$\theta_1 - \frac{\theta_D}{2}.$$

Also, at least a portion of the laser beam 7011 may be steered to a fifth angle $\theta_5$ from a normal line with respect to one face of the prism.

In this case, the fifth angle $\theta_5$ may be determined by the law of refraction.

In detail, when the refractive index of the prism is n2 and the refractive index of air is n3, the fifth angle $\theta_5$ may be determined by Equation 3 below.

$$\theta_5 = \sin^{-1}\left(\frac{n_2 \sin\theta_3}{n_3}\right) \qquad \text{Equation 3}$$

Also, the first angle $\theta_1$ may satisfy Equation 4 below so that the steered laser beam can be emitted to the outside and so that a change in beam profile can be decreased.

$$\theta_1 \le \sin^{-1}\left(\frac{n_3}{n_2}\right) - \frac{\theta_D}{2} \qquad \text{Equation 4}$$

FIG. 142 is a diagram illustrating a steering component according to an embodiment.

Referring to FIG. 142, a steering component 7020 according to an embodiment may include a prism.

In this case, the prism may acquire a laser beam 7021, and the acquired laser beam 7021 may be steered to a certain angle.

Also, at least a portion of the laser beam 7021 may be reflected while the laser beam 7021 passes through an interface.

For example, the s-polarization portion of the laser beam 7021 may have a reflectance determined according to Equation 5, and the p-polarization portion of the laser beam 7021 may have a reflectance determined according to Equation 6.

$$r_s = \frac{\cos\theta - \sqrt{n^2 - \sin^2\theta}}{\cos\theta + \sqrt{n^2 - \sin^2\theta}} \qquad \text{Equation 5}$$

$$r_p = \frac{-n^2\cos\theta + \sqrt{n^2 - \sin^2\theta}}{n^2\cos\theta + \sqrt{n^2 - \sin^2\theta}} \qquad \text{Equation 6}$$

At this time, $\theta$ may denote the angle of incidence, and n may denote n2/n1 when a laser beam proceeds from a medium with a refractive index of n1 to a medium with a refractive index of n2.

Also, as shown in FIG. 142, the laser beam 7021 steered through the prism may pass through at least two interfaces.

A first interface may denote an interface through which a light beam travels from air to the prism, and when the angle of incidence of the prism is a first angle $\theta_1$ and the refractive index of the prism is n1, the reflectance of the first interface may be determined by Equation 7 and Equation 8.

$$r_s = \frac{\cos\theta_1 - \sqrt{n_1^2 - \sin^2\theta_1}}{\cos\theta_1 + \sqrt{n_1^2 - \sin^2\theta_1}} \qquad \text{Equation 7}$$

$$r_p = \frac{-n_1^2\cos\theta + \sqrt{n_1^2 - \sin^2\theta_1}}{n_1^2\cos\theta + \sqrt{n_1^2 - \sin^2\theta_1}} \qquad \text{Equation 8}$$

Also, a second interface may denote an interface through which a light beam travels from the prism to air, and when the angle of incidence of the air is a second angle $\theta_2$ and the refractive index of the prism is n1, the reflectance of the second interface may be determined by Equation 9 and Equation 10.

$$r_s = \frac{\cos\theta_2 - \sqrt{\frac{1^2}{n_1} - \sin^2\theta_2}}{\cos\theta_2 + \sqrt{\frac{1^2}{n_1} - \sin^2\theta_2}} \qquad \text{Equation 9}$$

$$r_s = \frac{-\frac{1^2}{n_1}\cos\theta_2 + \sqrt{\frac{1^2}{n_1} - \sin^2\theta_2}}{\frac{1^2}{n_1}\cos\theta_2 + \sqrt{\frac{1^2}{n_1} - \sin^2\theta_2}} \qquad \text{Equation 10}$$

Also, a third angle $\theta_3$, which indicates the steering angle of the laser beam 7021, may be determined by Equation 11 when the refractive index of the prism is n1.

$$\theta_3 = \sin^{-1}(n_1 \sin\theta_2) - \theta_2 \qquad \text{Equation 11}$$

Accordingly, in consideration of the above descriptions, a relationship between the third angle $\theta_3$ and reflectivity can be derived.

FIG. 142B is a graph showing a relationship between the third angle $\theta_3$ and the reflectivity.

Referring to FIG. 142B, a prism according to an embodiment has a reflectivity of 5% when the third angle is less than or equal to 15 degrees, but the present disclosure is not limited thereto.

Accordingly, in order to emit laser beams under conditions that increase steering efficiency and minimize reflectivity, the third angle $\theta_3$ may be less than or equal to 15 degrees such that the reflectivity is less than 5% or may be less than or equal to 25 degrees such that the reflectivity is less than 10%, but the present disclosure is not limited thereto.

Figure 143:
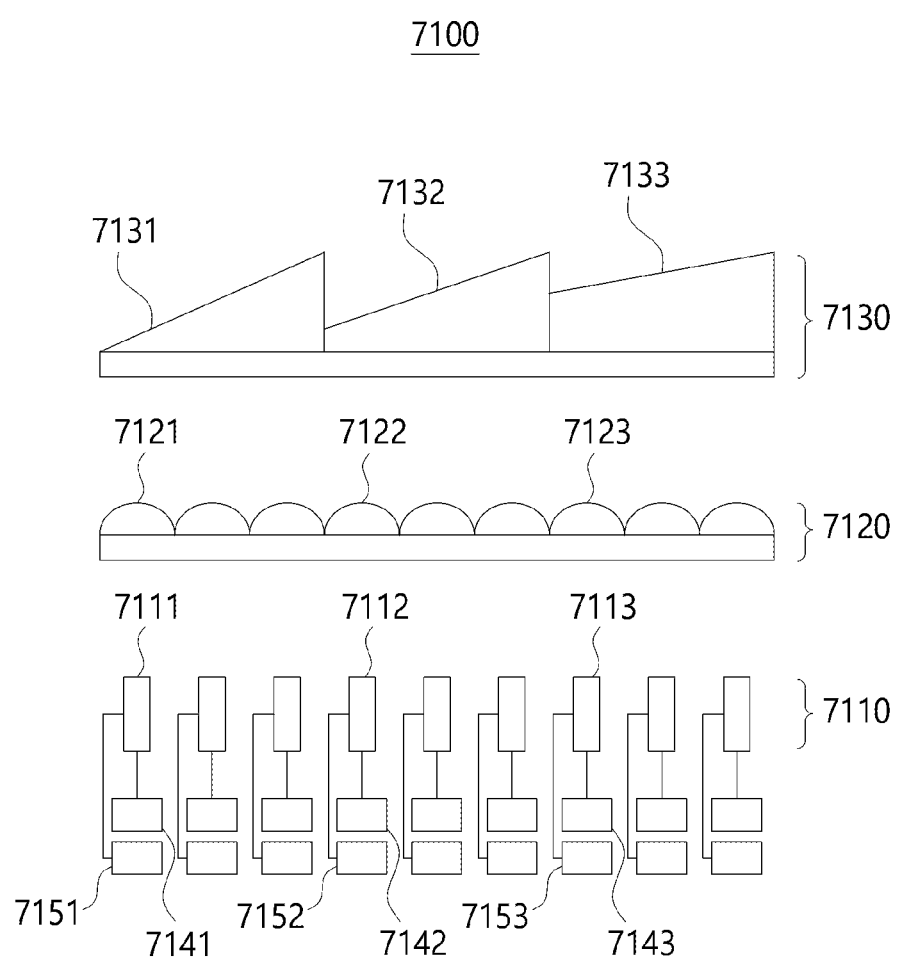
FIG. 143 is a diagram illustrating the configuration of a laser beam output unit according to an embodiment.

FIG. 143 is a diagram illustrating the configuration of a laser emitting unit according to an embodiment.

Referring to FIG. 143, a laser emitting unit 7100 according to an embodiment may include a VCSEL array 7110, a collimation component 7120, and a steering component 7130, but the present disclosure is not limited thereto.

In this case, the VCSEL array 7110 may include at least one VCSEL emitter. For example, the VCSEL array 7110 may include a first VCSEL emitter 7111, a second VCSEL emitter 7112, and a third VCSEL emitter 7113.

Also, the VCSEL array 7110 may include a VCSEL unit including at least one VCSEL emitter. For example, the VCSEL array 7110 may include a first VCSEL unit including the first VCSEL emitter 7111, a second VCSEL unit including the second VCSEL emitter 7112, and a third VCSEL unit including the third VCSEL emitter 7113.

Also, the collimation component 7120 may include a microlens array. The microlens array may include at least one microlens element. For example, the collimation component 7120 may include a first microlens element 7121, a second microlens element 7122, and a third microlens element 7123.

Also, the collimation component 7120 may include a microlens unit including at least one microlens element. For example, the collimation component 7120 may include a first microlens unit including the first microlens element 7121, a second microlens unit including the second microlens element 7122, and a third microlens unit including the third microlens element 7123.

Also, the steering component 7130 may include a prism array, and the prism array may include at least one prism element. For example, the steering component 7130 may include a first prism element 7131, a second prism element 7132, and a third prism element 7133.

Also, the collimation component 7120 may collimate a laser beam emitted from the VCSEL array 7110. However, the above description is applicable to this case, and thus a redundant description thereof will be omitted.

Also, the steering component 7130 may steer a laser beam emitted from the VCSEL array 7110 and collimated through the collimation component 7120. However, the above description is applicable to this case, and thus a redundant description thereof will be omitted.

Also, each VCSEL emitter included in the VCSEL array 7110 may be connected to an independent electric contact and controlled independently. For example, the first VCSEL emitter 7111 may be connected to a first contact 7141 and a second contact 7151, the second VCSEL emitter 7112 may be connected to a third contact 7142 and a fourth contact 7152, and the third VCSEL emitter 7113 may be connected to a fifth contact 7143 and a sixth contact 7153, but the present disclosure is not limited thereto.

Also, the first, third, and fifth contacts 7141, 7142, and 7143 may be P-contacts, and the second, fourth, and sixth contacts 7151, 7152, and 7153 may be N-contacts, but the present disclosure is not limited thereto.

Also, the VCSEL emitters included in the VCSEL array 7110 may operate at different times. For example, the first VCSEL emitter 7111 may operate through the first contact 7141 and the second contact 7151 at a first time point to emit a first laser beam, the second VCSEL emitter 7112 may operate through the third contact 7142 and the fourth contact 7152 at a second time point to emit a second laser beam, and the third VCSEL emitter 7113 may operate through the fifth contact 7143 and the sixth contact 7153 at a third time point to emit a third laser beam, but the present disclosure is not limited thereto.

Figure 144:
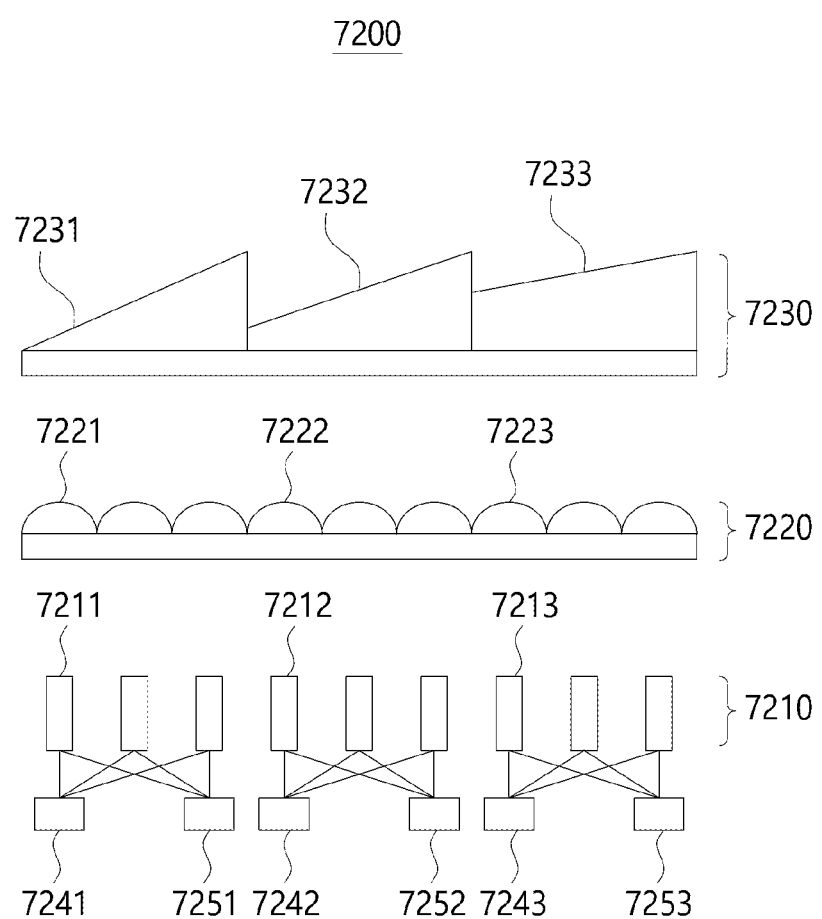
FIG. 144 is a diagram illustrating the configuration of a laser beam output unit according to an embodiment.

FIG. 144 is a diagram illustrating the configuration of a laser emitting unit according to an embodiment.

Referring to FIG. 144, a laser emitting unit 7200 according to an embodiment may include a VCSEL array 7210, a collimation component 7220, and a steering component 7230, but the present disclosure is not limited thereto.

In this case, the VCSEL array 7210 may include at least one VCSEL emitter. For example, the VCSEL array 7210 may include a first VCSEL emitter 7211, a second VCSEL emitter 7212, and a third VCSEL emitter 7213.

Also, the VCSEL array 7210 may include a VCSEL unit including at least one VCSEL emitter. For example, the VCSEL array 7210 may include a first VCSEL unit including the first VCSEL emitter 7211, a second VCSEL unit including the second VCSEL emitter 7212, and a third VCSEL unit including the third VCSEL emitter 7213.

Also, the collimation component 7220 may include a microlens array. The microlens array may include at least one microlens element. For example, the collimation component 7220 may include a first microlens element 7221, a second microlens element 7222, and a third microlens element 7223.

Also, the collimation component 7220 may include a microlens unit including at least one microlens element. For example, the collimation component 7220 may include a first microlens unit including the first microlens element 7221, a second microlens unit including the second microlens element 7222, and a third microlens unit including the third microlens element 7223.

Also, the steering component 7230 may include a prism array, and the prism array may include at least one prism element. For example, the steering component 7230 may include a first prism element 7231, a second prism element 7232, and a third prism element 7233.

Also, the collimation component 7220 may collimate a laser beam emitted from the VCSEL array 7210. However, the above description is applicable to this case, and thus a redundant description thereof will be omitted.

Also, the steering component 7230 may steer a laser beam emitted from the VCSEL array 7210 and collimated through the collimation component 7220. However, the above description is applicable to this case, and thus a redundant description thereof will be omitted.

Also, each VCSEL unit included in the VCSEL array 7210 may be connected to an independent electric contact and controlled independently. For example, the first VCSEL emitter 7211 may be connected to a first contact 7241 and a second contact 7251, the second VCSEL emitter 7212 may be connected to a third contact 7242 and a fourth contact 7252, and the third VCSEL emitter 7213 may be connected to a fifth contact 7243 and a sixth contact 7253, but the present disclosure is not limited thereto.

Also, the VCSEL emitters of each of the VCSEL units included in the VCSEL array 7210 may share an electric contact so that the VCSEL emitters can be controlled for each VCSLE unit. For example, VCSEL emitters included in the first VCSEL unit may share the first contact 7241 and the second contact 7251, VCSEL emitters included in the second VCSEL unit may share the third contact 7242 and the fourth contact 7252, and VCSEL emitters included in the third VCSEL unit may share the fifth contact 7243 and the sixth contact 7253, but the present disclosure is not limited thereto.

Also, the VCSEL emitters included in the VCSEL array 7210 may operate at different times. For example, the first VCSEL emitter 7211 may operate through the first contact 7241 and the second contact 7251 at a first time point to emit a first laser beam, the second VCSEL emitter 7212 may operate through the third contact 7242 and the fourth contact 7252 at a second time point to emit a second laser beam, and the third VCSEL emitter 7213 may operate through the fifth contact 7243 and the sixth contact 7253 at a third time point to emit a third laser beam, but the present disclosure is not limited thereto.

Also, the VCSEL units included in the VCSEL array 7210 may operate at different times. For example, the first VCSEL unit may operate through the first contact 7241 and the second contact 7251 at a first time point to emit a first laser beam group, the second VCSEL unit may operate through the third contact 7242 and the fourth contact 7252 at a second time point to emit a second laser beam group, and the third VCSEL unit may operate through the fifth contact 7243 and the sixth contact 7253 at a third time point to emit a third laser beam group, but the present disclosure is not limited thereto.

Advantageous effects of the disclosure are not limited to the aforementioned effects, and other advantageous effects that are not described herein will be clearly understood by those skilled in the art from the following description and the accompanying drawings.

While the elements and features of the present disclosure have been described with reference to embodiments of the present invention, the present disclosure is not limited thereto. It will be obvious to those skilled in the art that various changes or modifications may be made therein without departing from the spirit and scope of the present disclosure. Accordingly, such changes or modifications are intended to fall within the scope of the appended claims.

Although the present disclosure has been described with reference to specific embodiments and drawings, it will be appreciated that various modifications and changes can be made from the disclosure by those skilled in the art. For example, appropriate results may be achieved although the described techniques are performed in an order different from that described above and/or although the described components such as a system, a structure, a device, or a circuit are combined in a manner different from that described above and/or replaced or supplemented by other components or their equivalents.

Therefore, other implementations, embodiments, and equivalents are within the scope of the following claims.

What is claimed is:

1. A laser emitting array comprising:
   a first sub-array including a first laser emitting element and a second laser emitting element arranged along a first axis;
   a first side contact electrically connected to a first power supply configured to provide a first voltage to the first sub-array, wherein the first side contact is electrically connected to the first laser emitting element and the second laser emitting element;
   a second side contact electrically connected to a second power supply configured to provide a second voltage to the first sub-array, wherein the second side contact is electrically connected to the first laser emitting element and the second laser emitting element;
   a second sub-array including a third laser emitting element and a fourth laser emitting element arranged along the first axis;
   a third side contact electrically connected to a third power supply configured to provide a third voltage to the second sub-array, wherein the third side contact is electrically connected to the third laser emitting element and the fourth laser emitting element; and
   a fourth side contact electrically connected to a fourth power supply configured to provide a fourth voltage to the second sub-array, wherein the fourth side contact is electrically connected to the third laser emitting element and the fourth laser emitting element,
   wherein a first distance is defined as a distance of an electrical path from the first side contact to the first laser emitting element, wherein a second distance is defined as a distance of an electrical path from the first side contact to the second laser emitting element, wherein a third distance is defined as a distance of an electrical path from the second side contact to the first laser emitting element, wherein a fourth distance is defined as a distance of an electrical path from the second side contact to the second laser emitting element,
   wherein the first laser emitting element and the second laser emitting element are arranged so that the first distance is shorter than the second distance, and the third distance is greater than the fourth distance, wherein a fifth distance is defined as a distance of an electrical path from the third side contact to the third laser emitting element, wherein a sixth distance is defined as a distance of an electrical path from the third side contact to the fourth laser emitting element, wherein a seventh distance is defined as a distance of an electrical path from the fourth side contact to the third laser emitting element, wherein an eighth distance is defined as a distance of an electrical path from the fourth side contact to the fourth laser emitting element, and wherein the third laser emitting element and the fourth laser emitting element are arranged so that the fifth distance is shorter than the sixth distance, and the seventh distance is greater than the eighth distance.

2. The laser emitting array of claim 1, wherein the first power supply and the second power supply are the same.

3. The laser emitting array of claim 1, wherein the first voltage and the second voltage are the same.

4. The laser emitting array of claim 1, wherein the first side contact is arranged to be closer to the first laser emitting element than the second laser emitting element, and wherein the second side contact is arranged to be closer to the second laser emitting element than the first laser emitting element.

5. A light detection and ranging (LiDAR) device comprising:
a laser emitting array;
a laser detecting array; and
a controller configured to control the laser emitting array and the laser detecting array,
wherein the laser emitting array comprises:
a first sub-array including a first laser emitting element and a second laser emitting element arranged along a first axis;
a first side contact electrically connected to a first power supply configured to provide a first voltage to the first sub-array, wherein the first side contact is electrically connected to the first laser emitting element and the second laser emitting element;
a second side contact electrically connected to a second power supply configured to provide a second voltage to the first sub-array, wherein the second side contact is electrically connected to the first laser emitting element and the second laser emitting element;
a second sub-array including a third laser emitting element and a fourth laser emitting element arranged along the first axis;
a third side contact electrically connected to a third power supply configured to provide a third voltage to the second sub-array, wherein the third side contact is electrically connected to the third laser emitting element and the fourth laser emitting element; and
a fourth side contact electrically connected to a fourth power supply configured to provide a fourth voltage to the second sub-array, wherein the fourth side contact is electrically connected to the third laser emitting element and the fourth laser emitting element,
wherein a first distance is defined as a distance of an electrical path from the first side contact to the first laser emitting element, wherein a second distance is defined as a distance of an electrical path from the first side contact to the second laser emitting element, wherein a third distance is defined as a distance of an electrical path from the second side contact to the first laser emitting element, wherein a fourth distance is defined as a distance of an electrical path from the second side contact to the second laser emitting element, wherein the first laser emitting element and the second laser emitting element are arranged so that the first distance is shorter than the second distance, and the third distance is greater than the fourth distance, wherein a fifth distance is defined as a distance of an electrical path from the third side contact to the third laser emitting element, wherein a sixth distance is defined as a distance of an electrical path from the third side contact to the fourth laser emitting element, wherein a seventh distance is defined as a distance of an electrical path from the fourth side contact to the third laser emitting element, wherein an eighth distance is defined as a distance of an electrical path from the fourth side contact to the fourth laser emitting element, and wherein the third laser emitting element and the fourth laser emitting element are arranged so that the fifth distance is shorter than the sixth distance, and the seventh distance is greater than the eighth distance.

6. The LiDAR device of claim 5, wherein the first power supply and the second power supply are the same.

7. The LiDAR device of claim 5, wherein the first voltage and the second voltage are the same.

8. The LiDAR device of claim 5, wherein the first side contact is arranged to be closer to the first laser emitting element than the second laser emitting element, and
wherein the second side contact is arranged to be closer to the second laser emitting element than the first laser emitting element.

9. The LiDAR device of claim 5, wherein the first sub-array is configured to emit a laser, wherein the laser detecting array is configured to detect a portion of the laser, and
wherein the controller is configured to obtain at least two distance values corresponding to at least two different detectors included in the laser detecting array.

10. The LiDAR device of claim 5,
wherein, when a fifth voltage is supplied to the first sub-array only through the first side contact, a difference between a power of a laser emitted from the first laser emitting element and a power of a laser emitted from the second laser emitting element is defined as a first difference value, and when the fifth voltage is supplied to the first sub-array through the first side contact and the second side contact, a difference between a power of a laser emitted from the first laser emitting element and a power of a laser emitted from the second laser emitting element is defined as a second difference value, and
wherein the second difference value is less than the first difference value.

11. The LiDAR device of claim 5,
wherein the first sub-array comprises a plurality of laser emitting elements configured to emit lasers at the same time.

12. The LiDAR device of claim 5, wherein the laser emitting array further comprises:
a first upper connection line extending along the first axis and electrically connected to the first sub-array; and
a second upper connection line extending along the first axis and physically separated from the first upper connection line, wherein the second upper connection line is electrically connected to the second sub-array, wherein the first side contact is connected to the first upper connection line through a first wire in contact with a first end of the first upper connection line, wherein the second side contact is connected to the first upper connection line through a second wire in contact with a second end of the first upper connection line, wherein the third side contact is connected to the second upper connection line through a third wire in contact with a third end of the second upper connection line, wherein the fourth side contact is connected to the second upper connection line through a fourth wire in contact with a fourth end of the second upper connection line, wherein the first side contact and the second side contact are respectively connected to the first end and the second end of the first upper connection line, wherein both the first side contact and the second side contact are configured to apply a voltage to the first sub-array to cause a difference in voltage applied to each laser emitting element of the first sub-array to be minimized, wherein the third side contact and the fourth side contact are respectively connected to the third end and the fourth end of the second upper connection line, wherein both the third side contact and the fourth side contact are configured to apply a voltage to the second sub-array to cause a difference in voltage applied to each laser emitting element of the second sub-array to be minimized, and wherein the first side contact and the third side contact are physically separated from each other, and the second side contact and the fourth side contact are physically separated from each other, to ensure that a first timing when a voltage is applied to the first sub-array through both the first side contact and the second side contact is different from a second timing when a voltage is applied to the second sub-array through both the third side contact and the fourth side contact.

13. A light detection and ranging (LiDAR) device comprising:
a laser emitting array;
a laser detecting array; and
a controller configured to control the laser emitting array and the laser detecting array,
wherein the laser emitting array comprises:
a first sub-array including a first laser emitting element and a second laser emitting element arranged along a first axis;
a first side contact and a second side contact each electrically connected to a first power supply configured to provide a voltage to the first sub-array, wherein each of the first side contact and the second side contact is electrically connected to the first laser emitting element and the second laser emitting element;
a second sub-array including a third laser emitting element and a fourth laser emitting element arranged along the first axis; and
a third side contact and a fourth side contact each electrically connected to a second power supply configured to provide the voltage to the second sub-array, wherein each of the third side contact and the fourth side contact is electrically connected to the third laser emitting element and the fourth laser emitting element,
wherein a first distance is defined as a distance of an electrical path from the first side contact to the first laser emitting element, wherein a second distance is defined as a distance of an electrical path from the first side contact to the second laser emitting element, wherein a third distance is defined as a distance of an electrical path from the second side contact to the first laser emitting element, wherein a fourth distance is defined as a distance of an electrical path from the second side contact to the second laser emitting element, wherein the first laser emitting element and the second laser emitting element are arranged so that the first distance is shorter than the second distance, and the third distance is greater than the fourth distance, wherein a fifth distance is defined as a distance of an electrical path from the third side contact to the third laser emitting element, wherein a sixth distance is defined as a distance of an electrical path from the third side contact to the fourth laser emitting element, wherein a seventh distance is defined as a distance of an electrical path from the fourth side contact to the third laser emitting element, wherein an eighth distance is defined as a distance of an electrical path from the fourth side contact to the fourth laser emitting element, and wherein the third laser emitting element and the fourth laser emitting element are arranged so that the fifth distance is shorter than the sixth distance, and the seventh distance is greater than the eighth distance.

14. The LiDAR device of claim 13,
wherein the first sub-array and the second sub-array are configured to operate at the same time.

15. The LiDAR device of claim 13,
wherein the first sub-array and the second sub-array are configured to operate independently from each other.

16. The LiDAR device of claim 15,
wherein the first laser emitting element and the second laser emitting element are configured to emit lasers at the same time,
wherein the third laser emitting element and the fourth laser emitting element are configured to emit lasers at the same time,
wherein the first laser emitting element and the third laser emitting element are configured to emit lasers at different times, and
wherein the second laser emitting element and the fourth laser emitting element are configured to emit lasers at different times.

17. The LiDAR device of claim 13, wherein the laser emitting array further comprises:
a first upper connection line extending along the first axis and electrically connected to the first sub-array; and
a second upper connection line extending along the first axis and physically separated from the first upper connection line, wherein the second upper connection line is electrically connected to the second sub-array,
wherein the first side contact is connected to the first upper connection line through a first wire in contact with a first end of the first upper connection line,
wherein the second side contact is connected to the first upper connection line through a second wire in contact with a second end of the first upper connection line,
wherein the third side contact is connected to the second upper connection line through a third wire in contact with a third end of the second upper connection line,
wherein the fourth side contact is connected to the second upper connection line through a fourth wire in contact with a fourth end of the second upper connection line,
wherein the first side contact and the second side contact are respectively connected to the first end and the second end of the first upper connection line, wherein both the first side contact and the second side contact are configured to apply a voltage to the first sub-array to cause a difference in voltage applied to each laser emitting element of the first sub-array to be minimized, wherein the third side contact and the fourth side contact are respectively connected to the third end and the fourth end of the second upper connection line, wherein both the third side contact and the fourth side contact are configured to apply a voltage to the second sub-array to cause a difference in voltage applied to each laser emitting element of the second sub-array to be minimized, and wherein the first side contact and the third side contact are physically separated from each other, and the second side contact and the fourth side contact are physically separated from each other, to ensure that a first timing when a voltage is applied to the first sub-array through both the first side contact and the second side contact is different from a second timing when a voltage is applied to the second sub-array through both the third side contact and the fourth side contact.

* * * * *